(12) United States Patent
Teig et al.

(10) Patent No.: US 6,907,593 B2
(45) Date of Patent: *Jun. 14, 2005

(54) METHOD AND APPARATUS FOR PRE-COMPUTING ATTRIBUTES OF ROUTES

(75) Inventors: Steven Teig, Menlo Park, CA (US); Joseph L. Ganley, Vienna, VA (US)

(73) Assignee: Cadence Design Systems, Inc., San Jose, CA (US)

( * ) Notice: Subject to any disclaimer, the term of this patent is extended or adjusted under 35 U.S.C. 154(b) by 76 days.

This patent is subject to a terminal disclaimer.

(21) Appl. No.: 10/046,864

(22) Filed: Jan. 13, 2002

(65) Prior Publication Data

US 2002/0199165 A1 Dec. 26, 2002

Related U.S. Application Data

(63) Continuation of application No. 10/013,819, filed on Dec. 7, 2001, and a continuation-in-part of application No. 10/013, 816, filed on Oct. 19, 2001, and a continuation-in-part of application No. 09/732,181, filed on Dec. 6, 2000.
(60) Provisional application No. 60/337,504, filed on Dec. 6, 2001, provisional application No. 60/325,748, filed on Jan. 19, 2001, and provisional application No. 60/314,580, filed on Aug. 23, 2001.

(51) Int. Cl.[7] .............................................. G06F 17/50
(52) U.S. Cl. ........................... 716/13; 716/12; 716/14
(58) Field of Search .............................. 716/13, 12, 14

(56) References Cited

U.S. PATENT DOCUMENTS

| | | | | |
|---|---|---|---|---|
| 4,593,363 A | * | 6/1986 | Burstein et al. | ............... 716/10 |
| 4,615,011 A | * | 9/1986 | Linsker | ........................ 716/13 |
| 4,673,966 A | | 6/1987 | Shimoyama | |

(Continued)

FOREIGN PATENT DOCUMENTS

| | | | |
|---|---|---|---|
| JP | 64-15947 | 1/1989 | |
| JP | H03-173471 A | 7/1991 | |
| JP | 04000677 | 1/1992 | |
| JP | H05-102305 A | 4/1993 | |
| JP | H05-243379 A | 9/1993 | |
| JP | H07-86407 A | 3/1995 | |
| JP | H09-162279 A | 6/1997 | |
| JP | 411296560 A | * 10/1999 | ........... G06F/17/50 |
| JP | 2000-82743 A | 3/2000 | |

OTHER PUBLICATIONS

"Chip Model with Wiring Cost Map", \Aug. 1983, IBM Technical Disclosure Bulletin, vol. 26, issu. 3A, pp. 929–933.*

"Partitioning Logic On to Graph Structure", IBM Technical Disclosure Bulletin, Feb. 1990, vol. 32, iss. 9A, pp. 469–475.*

Wang et al., "Modeling and Minimization of Routing Congestion", Jan. 2000, IEEE proceddings of ASP–DAC, Asia and South Pacific, pp. 185–190.*

U.S. Appl. No. 09/737,220, filed Dec. 13, 2000, Steven Teig et al.

U.S. Appl. No. 09/737,245, filed Dec. 13, 2000, Steven Teig et al.

(Continued)

*Primary Examiner*—A. M. Thompson
*Assistant Examiner*—Sun James Lin
(74) *Attorney, Agent, or Firm*—Stattler, Johansen & Adeli LLP

(57) ABSTRACT

Some embodiments provide a method of pre-computing attributes of routes for nets in a region of a design layout. The pre-computed attributes are used by an electronic design automation application that partitions a design-layout region into a plurality of sub-region.

12 Claims, 74 Drawing Sheets

U.S. PATENT DOCUMENTS

| | | |
|---|---|---|
| 4,782,193 A | 11/1988 | Linsker |
| 4,855,929 A | 8/1989 | Nakajima |
| 5,097,422 A | 3/1992 | Corbin, II et al. |
| 5,251,147 A | 10/1993 | Finnerty |
| 5,267,176 A | 11/1993 | Antreich et al. |
| 5,281,151 A | 1/1994 | Arima et al. |
| 5,360,948 A | 11/1994 | Thornberg |
| 5,375,069 A | 12/1994 | Satoh et al. |
| 5,532,934 A | 7/1996 | Rostoker |
| 5,566,078 A | 10/1996 | Ding et al. |
| 5,578,840 A | 11/1996 | Scepanovic |
| 5,587,923 A * | 12/1996 | Wang ................... 716/13 |
| 5,618,744 A | 4/1997 | Suzuki et al. |
| 5,633,479 A | 5/1997 | Hirano |
| 5,634,093 A | 5/1997 | Ashida et al. |
| 5,635,736 A | 6/1997 | Funaki et al. |
| 5,636,125 A | 6/1997 | Rostoker et al. |
| 5,637,920 A | 6/1997 | Loo |
| 5,640,327 A | 6/1997 | Ting |
| 5,650,653 A | 7/1997 | Rostoker et al. |
| 5,657,242 A | 8/1997 | Sekiyama et al. |
| 5,663,891 A | 9/1997 | Bamji et al. |
| 5,723,908 A | 3/1998 | Fuchida et al. |
| 5,742,086 A | 4/1998 | Rostoker et al. |
| 5,757,089 A | 5/1998 | Ishizuka |
| 5,757,656 A | 5/1998 | Hershberger et al. |
| 5,777,360 A | 7/1998 | Rostoker et al. |
| 5,784,289 A | 7/1998 | Wang |
| 5,798,936 A | 8/1998 | Cheng |
| 5,811,863 A | 9/1998 | Rostoker et al. |
| 5,822,214 A | 10/1998 | Rostoker et al. |
| 5,838,583 A | 11/1998 | Varadarajan et al. |
| 5,859,449 A | 1/1999 | Kobayashi et al. |
| 5,889,677 A | 3/1999 | Yasuda et al. |
| 5,898,597 A | 4/1999 | Scepanovic et al. |
| 5,914,887 A | 6/1999 | Scepanovic et al. |
| 5,973,376 A | 10/1999 | Rostoker et al. |
| 5,980,093 A | 11/1999 | Jones et al. |
| 6,035,108 A | 3/2000 | Kikuchi |
| 6,058,254 A | 5/2000 | Scepanovic et al. |
| 6,067,409 A | 5/2000 | Scepanovic et al. |
| 6,068,662 A | 5/2000 | Scepanovic et al. |
| 6,070,108 A | 5/2000 | Andreev et al. |
| 6,123,736 A | 9/2000 | Pavisic et al. |
| 6,128,767 A | 10/2000 | Chapman |
| 6,134,702 A | 10/2000 | Scepanovic et al. |
| 6,150,193 A | 11/2000 | Glenn |
| 6,155,725 A | 12/2000 | Scepanovic et al. |
| 6,175,950 B1 | 1/2001 | Scepanovic |
| 6,209,123 B1 | 3/2001 | Maziasz et al. |
| 6,216,252 B1 | 4/2001 | Dangelo et al. |
| 6,219,832 B1 | 4/2001 | Buzbee |
| 6,226,560 B1 | 5/2001 | Hama et al. |
| 6,230,306 B1 | 5/2001 | Raspopovic et al. |
| 6,247,167 B1 | 6/2001 | Raspopovic et al. |
| 6,249,902 B1 | 6/2001 | Igusa et al. |
| 6,253,363 B1 | 6/2001 | Gasanov et al. |
| 6,260,179 B1 | 7/2001 | Ohsawa et al. |
| 6,262,487 B1 | 7/2001 | Igarashi et al. |
| 6,289,495 B1 | 9/2001 | Raspopovic |
| 6,295,634 B1 * | 9/2001 | Matsumoto ................. 716/12 |
| 6,301,686 B1 | 10/2001 | Kikuchi et al. |
| 6,307,256 B1 | 10/2001 | Chiang et al. |
| 6,316,838 B1 | 11/2001 | Ozawa et al. |
| 6,324,674 B2 | 11/2001 | Andreev et al. |
| 6,324,675 B1 | 11/2001 | Dutta et al. |
| 6,327,693 B1 | 12/2001 | Cheng et al. |
| 6,327,694 B1 | 12/2001 | Kanazawa |
| 6,330,707 B1 | 12/2001 | Shinomiya et al. |
| 6,378,121 B2 | 4/2002 | Hiraga |
| 6,385,758 B1 | 5/2002 | Kikuchi et al. |
| 6,401,234 B1 | 6/2002 | Alpert et al. |
| 6,405,358 B1 | 6/2002 | Nuber |
| 6,407,434 B1 | 6/2002 | Rostoker et al. |
| 6,412,097 B1 | 6/2002 | Kikuchi et al. |
| 6,412,102 B1 | 6/2002 | Andreev et al. |
| 6,415,422 B1 | 7/2002 | Mehrotra et al. |
| 6,436,804 B2 | 8/2002 | Igarashi et al. |
| 6,442,743 B1 | 8/2002 | Sarrafzadeh et al. |
| 6,446,245 B1 | 9/2002 | Xing et al. |
| 6,448,591 B1 | 9/2002 | Juengling |
| 6,473,891 B1 | 10/2002 | Shively |
| 6,480,991 B1 | 11/2002 | Cho et al. |
| 6,490,713 B2 * | 12/2002 | Matsumoto ................. 716/12 |
| 6,516,455 B1 | 2/2003 | Teig et al. |
| 6,519,751 B2 | 2/2003 | Sriram et al. |
| 6,543,043 B1 | 4/2003 | Wang et al. |
| 6,546,540 B1 | 4/2003 | Igarashi et al. |
| 6,557,145 B2 | 4/2003 | Boyle et al. |
| 6,567,967 B2 | 5/2003 | Greidinger et al. |
| 2001/0003843 A1 | 6/2001 | Scepanovic et al. |
| 2001/0009031 A1 | 7/2001 | Nitta et al. |
| 2002/0069397 A1 | 6/2002 | Teig et al. |
| 2002/0073390 A1 | 6/2002 | Teig et al. |
| 2002/0100007 A1 | 7/2002 | Teig et al. |
| 2002/0124231 A1 | 9/2002 | Teig et al. |
| 2002/0133798 A1 | 9/2002 | Teig et al. |
| 2002/0147958 A1 | 10/2002 | Teig et al. |
| 2002/0157075 A1 | 10/2002 | Teig et al. |
| 2002/0166105 A1 | 11/2002 | Teig et al. |
| 2002/0170027 A1 | 11/2002 | Teig et al. |
| 2002/0174412 A1 | 11/2002 | Teig et al. |
| 2002/0182844 A1 | 12/2002 | Igarashi et al. |
| 2003/0005399 A1 | 1/2003 | Igarashi et al. |
| 2003/0018947 A1 | 1/2003 | Teig et al. |
| 2003/0023943 A1 | 1/2003 | Teig et al. |
| 2003/0025205 A1 | 2/2003 | Shively |
| 2003/0043827 A1 | 3/2003 | Teig et al. |
| 2003/0056187 A1 | 3/2003 | Teig et al. |
| 2003/0063568 A1 | 4/2003 | Teig et al. |
| 2003/0063614 A1 | 4/2003 | Teig et al. |
| 2003/0064559 A1 | 4/2003 | Teig et al. |
| 2003/0066042 A1 | 4/2003 | Teig et al. |
| 2003/0066043 A1 | 4/2003 | Teig et al. |
| 2003/0066044 A1 | 4/2003 | Teig et al. |
| 2003/0066045 A1 | 4/2003 | Teig et al. |
| 2003/0079193 A1 | 4/2003 | Teig et al. |
| 2003/0088841 A1 | 5/2003 | Teig et al. |
| 2003/0088844 A1 | 5/2003 | Teig et al. |
| 2003/0088845 A1 | 5/2003 | Teig et al. |
| 2003/0101428 A1 | 5/2003 | Teig et al. |
| 2003/0115566 A1 | 6/2003 | Teig |
| 2003/0121015 A1 | 6/2003 | Teig et al. |

OTHER PUBLICATIONS

U.S. Appl. No. 09/739,460, filed Dec. 15, 2000, Steven Teig et al.

U.S. Appl. No. 09/739,589, filed Dec. 15, 2000, Steven Teig et al.

U.S. Appl. No. 09/742,171, filed Dec. 19, 2000, Steven Teig et al.

A.H. Farrahi, et al., Quality of EDA CAD Tools: Definitions, Metrics and Directions, Quality Electronic Design, 2000, Proceedings of the first International Symposium on Mar. 2000, pp. 395–405.

A. Vannelli, et al., An adaptation of the interior point method for solving the global routing problem, Feb. 1991, IEEE pp 193–203.

B. Berger, et al., Nearly Optimal Algorithms and Bounds for Multilayer Channel Routing, Journal of the Association for Computing Machinery, pp. 500–542, Mar. 1995.

C. Chiang, et al., Wirability of Knock–Knee Layouts with 45° Wires, IEEE Transactions on Circuits and Systems, vol. 38, Issue 6, pp 613–624, Jun. 1991.

G. Overtone, EDA Underwriter 2 Finding Space in a Multi Layer Board, Electronic Engineering, Morgan–Grampian LTD, vol. 67, No. 819, pp 29–30.

G.D. Hachtel et al., Linear Complexity Algorithms for Hierarchical Routing, 1/89, IEEE pp 64–80.

J.D. Cho, et al., Four–Bend Top Down Global Routing, IEEE, pp 793–802, 1998.

J. Su et al., Post Route Optimization for Improved Yield Using Rubber–Band Wiring Model, 1997 International Conference on Computer–Aided Design, pp 700–706, Nov. 1997.

J. Vicente, RSR: A New Reclilinear Steiner Minimum Tree Approximation for FPGA Placement and Global Routing, Proceedings of the $24^{th}$ Euro Micro Conference, pp 192–195, Aug. 1998.

K. Powers et al., The 60° Grid: Routing Channels in Width d/square root 3, VLSI, 1991, Proceedings., First Great Lakes Symposium on Kalamazoo, MI, USA, pp 214–291, Mar. 1991.

M. Alexander et al., Performance–Oriented Placement and Routing for field–programmable gate arrays, Proceedings of the European Design Automation Conference, pp 80–85, 1995.

M. Alexander et al., Placement and Routing for Performance–Oriented FPGA Layout, VLSI Design, vol. 7, No. 1, 1998.

M. Igarashi et al., A Diagonal–Interconnect Architecture and Its Application to RISC Core Design, 2002 IEEE Solid–Sate Circuits Conference, pp 210–460, Feb. 2002.

P. Dood, et al., A Two–Dimensional Topological Compactor with Octagonal Geometry, $28^{th}$ ACM/IEEE Design Automation Conference, pp 727–731, Jul. 1991.

P. Parakh, et al., Congestion Driven Quadratic Placement, Proceedings of Design Automation Conference, 1998, pp 275–278.

R. Putatunda et al., Vital: Fully Automatic Placement Strategies for Very Large Semicustom Designs, Proceedings of the International Conference on Computer Design: VLSI in Computers and Processors, pp 434–439 Oct. 1988.

Y. Sekiyama et al., Timing–Oriented Routers for PCB Layout Design of High–Performance Computers, International Conference on Computer Aided Design, pp 332–335, Nov. 1991.

C. Leiserson et al., Algorithm for Routing and Testing Routability of Planar VLSI Layouts, pp 69–78, May 1985.

S. Das et a., Channel Routing in Manhattan–Diagonal Model, $9^{th}$ International Conference on VLSI Design, Jan. 1996. pp 43–48.

W. Wei–Ming Dai et a., Routability of a Rubber–Band Sketch. $28^{th}$ ACM/IEEE Design Automation Conference, 1999. pp 45–65.

H. Chen, Routing L–Shaped Channels in Nonslicing–Structure Placement. $24^{th}$ ACM/IEEE Design Automation Conference, pp 152–165, 1987.

I. Tollis, Techniques for Wiring in Non–Square Grids, pp 66–69. May 1989.

E. Lodi et al., A 2d Channel Router for the Diagonal Model, pp 111–125, Apr. 1991.

E. Lodi et al., Routing in Times Square Mode, pp 41–48, Jun. 1990.

K. Cheng–Kok et al., Manhattan or Non Manhattan? A Study of Alternative VLSI Routing Architectures. pp 47–52, 2000.

E. Lodi et al., Routing Multiterminal Nets in a Diagonal Model, pp 899–902, 1988.

D. Staepelaere et al., Surf: A Rubber–Band Routing System for Multichip Modules. pp 18–26, 1993.

S. Das et al., Routing of L–Shaped Channels, Switch boxes and Staircases in Manhattan–Diagonal Model, pp 65–70m Jan. 1998.

W. Schiele et al., A Gridless Router for Industrial Design Rule, $27^{th}$ ACM/IEEE Design Automation Conference, pp. 626–631, 1990.

J. Nester, A New Look at Hardware Maze Routing, Proceedings of the $12^{th}$ ACM Symposium on Great Lakes Symposium on VLSI, pp 142–147, Apr. 2002.

Ahuja, R. et al., Faster Algorithms for the Shortest Path Problem, Journal of the Association for Computing Machinery, vol. 37, No. 2, Apr. 1990, pp. 213–223.

Brady, L. et al., Channel Routing on a 60° Grid, extended abstract, pp. 956–931.

Brambilla, A. et al., Statistical Method for the Analysis of Interconnects Delay in Submicrometer Layouts, IEEE, Aug. 2001, pp. 957–966.

Carothers, K., A Method of Measuring Nets Routability for MCM's General Area Routing Problems, 1999, pp. 186–192.

Chen, H. et al., Physical Planning of On–Chip Interconnect Architectures, 2002, IEEE, International Conference, pp. 30–35.

Cheng, K., Steiner Problem in Octilinear Routing Model, a Thesis Submitted for the Degree of Master of Science, National University Singapore, 1995, pp. 1–122.

Cong, J. et al., Efficient Heuristics for the Minimum Shortest Path Steiner Arborescence Problem with Applications to VLSI Physical Design, Cadence Design Systems and UCLA Compter Science Department, pp. 88–95.

Cong, J. et al., Performance–Driven Multi–Layer General Routing for PCB/MCM Designs, UCLA Computer Science Department, 1998, pp. 356–361.

Enbody, R. et al., Near–Optimal η–Layer Channel Routing, $23^{rd}$ Design Automation Conference, 1986, pp. 708–714.

Fang, S. et al., Constrained Via Minimization with Practical Considerations for Multi–Layer VLSI/PCB Routing Problems, $28^{th}$ ACM/IEEE Design Automation Conference, 1991, pp. 60–65.

Horn, I. et al., Estimation of the Number of Routing Layers and Total Wirelength in a PCB Through Wiring Distribution Analysis, 1996, pp. 1–6.

Hong, X. et al., Performance–Driven Steiner Tree Algorithms for Global Routing, $30^{th}$ ACM/IEEE Design Automation Conference, 1993, pp. 177–181.

Hu, J. et al., A Timing–Constrained Algorithm for Simultaneous Global Routing of Multiple Nets, IEEE/ACM International Conference on Computer Aided Design. ICCAD—2000. IEEE/ACM Digest of Technical Papers (CAT. No. 00CH37140), Proceedings of International Conference on Computer Aided Design (ICCAD), San Jose, CA, USA, Nov. 5–9, Nov. 2000, pp. 99–103.

Kastner, R. et al, Predictable Routing, IEEE/ACM International Conference on Computer Aided Design. ICCAD—2000. IEEE/ACM Digest of Technical Papers (CAT. No. 00CH37140), Proceedings of International Conference on Computer Aided Design (ICCAD), San Jose, CA, USA, Nov. 5–9, 2000. pp. 110–113.

Khoo, K. et al., An Efficient Multilayer MCM Router Based on Four–Via Routing, $30^{th}$ ACM/IEEE Design Automation Conference, 1993, pp. 590–595.

Lillis, J. et al., Table–Lookup Methods for Improved Performance–Driven Routing, 1998, pp. 368–373.

Lipski, W. et al., A Unified Approach to Layout Wirability, Mathimatical Systems Theory, 1987, pp. 189–203.

Lodi, E. et al., A Preliminary Study of a Diagonal Channel–Routing Model, Algorithmica, 1989, pp. 585–597.

Lodi, E. et al., Lecture Notes in Computer Sciences, A 4d Channel Router for a Two Layer Diagonal Model, pp. 464–476, Jul. 1988.

Naclerio, N. et al., Via Minimization for Gridless Layouts, $24^{th}$ ACM/IEEE Design Automation Conference, 1987, pp. 159–165.

Nam, G. et al, Satisfiability–Based Layout Revisited: Detailed Routing of Complex FPGAs Via Search–Based Boolean SAT, 1999, pp. 167–175.

Oh, J. et al., Constructing Lower and Upper Bounded Delay Routing Trees Using Linear Programming, $33^{rd}$ Design Automation Conference, 1996.

Phillips, N., Channel Routing by Constraint Logic, Department of Computer Science Southern Illinois University, ACM, 1992.

Takashima, Y. et al, Routability of FPGAs with Extremal Switch–Block Structures, IEICE Trans. Fundamentals, vol. E81–A, No. 5, May 1998, pp. 850–856.

Thakur, S. et al., Algorithms for a Switch Module Routing Problem, 1994, pp. 265–270.

Theune, D. et al., HERO: Hierarchical EMC–constrained routing, Nov. 1992, IEEE pp 468–472.

Tseng, H., Timing and Crosstalk Driven Area Routing, pp. 378–381.

Wang, D., Novel Routing Schemes for IC Layout, Part I: Two–Layer Channel Routing, $28^{th}$ ACM/IEEE Automation Conference, 1991, pp. 49–53.

Wood, G. et al., FPGA Routing and Routability Estimation Via Boolean Satisfiability, Department of Electrical and Computer Engineering Carnegie Mellon University, Pittsburgh, PA, pp. 119–125.

Zhang, C.X. et al., Floorplan Design Using a Hierarchical Neutral Learning Algorithm, IEEE, Jun. 1991. pp. 2060–2063.

Zhou, H. et al., An Optimal Algorithm for River Routing with Crosstalk Constraints, 1996.

Zhou, H. et al.,Global Routing with Crosstalk Constraints, Department of Computer Sciences, University of Texas, 1998, pp. 374–377.

Zhou, H. et al., Optimal River Routing with Crosstalk Constraints, ACM Transactions on Design Automation of Electronic Systems, vol. 3, No. 3, Jul. 1998, pp. 496–514.

* cited by examiner

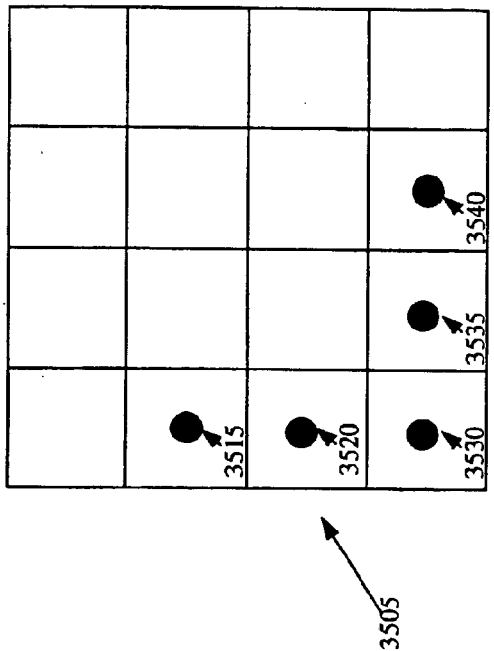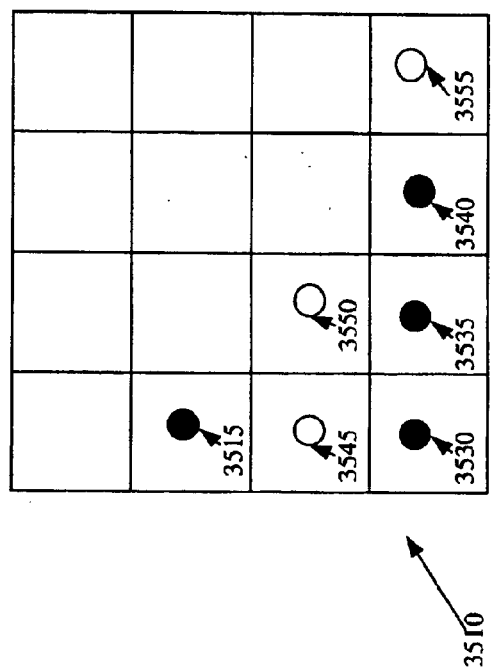

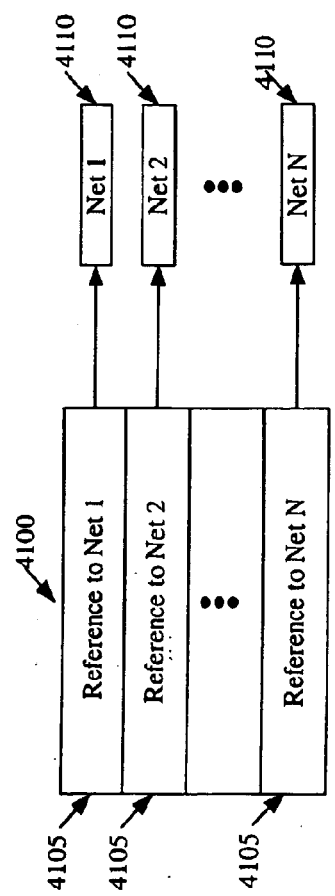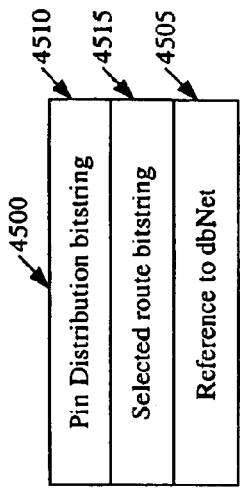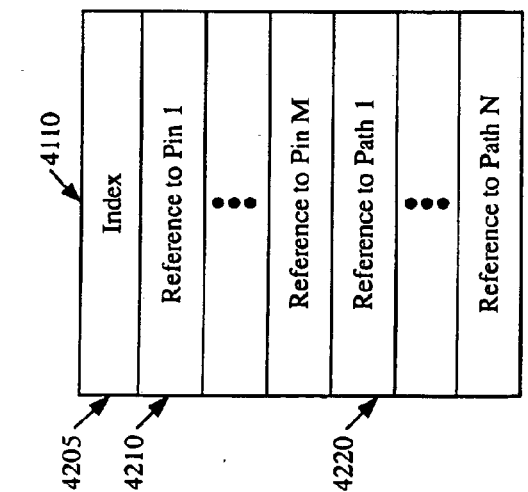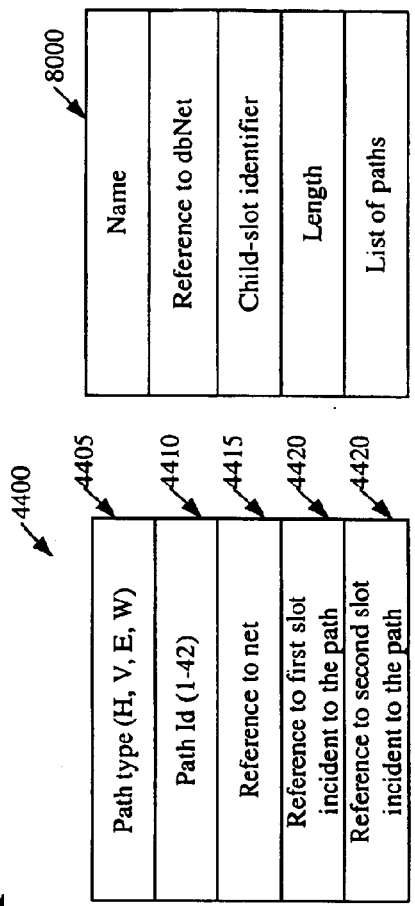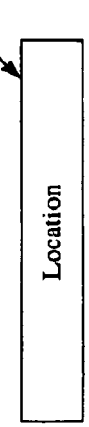
Figure 45
Figure 80
Figure 41
Figure 44
Figure 43
Figure 42

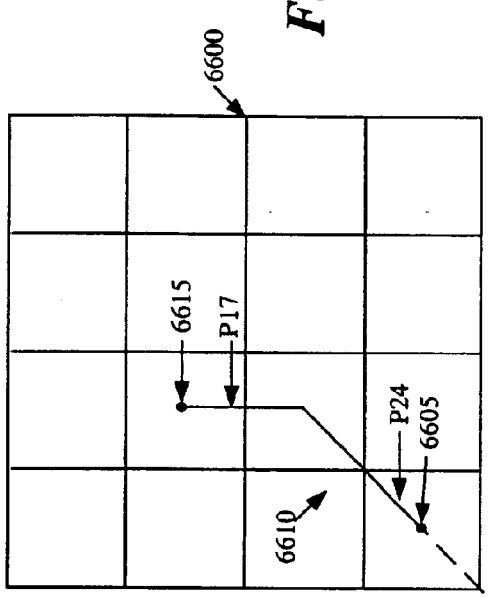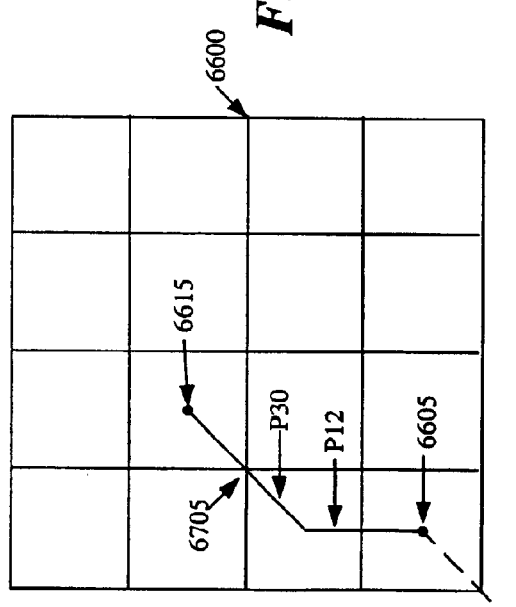

METHOD AND APPARATUS FOR PRE-COMPUTING ATTRIBUTES OF ROUTES

CLAIM OF BENEFIT TO PRIOR APPLICATIONS

This patent application claims the benefit of the earlier-field U.S. Provisional Patent Application entitled "Method and Apparatus that Utilize Diagonal Routes", having Ser. No. 60/325,748, and filed Jan. 19, 2001; U.S. Provisional Patent Application entitled "Routing Method and Apparatus", having Ser. No. 60/314,580, and filed Aug. 23, 2001; and U.S. Provisional Patent Application entitled "Routing Method and Apparatus", having Ser. No. 60/337, 504, and filed Dec. 6, 2001. This application is a continuation application of United States Patent Application entitled "Routing Method and Apparatus that Utilize Diagonal Routes," filed on Dec. 7, 2001, and having Ser. No. 10/013, 819. This patent application is a continuation-in-part application of United States Patent Application entitled "Recursive Partitioning Placement Method and Apparatus," filed on Dec. 6, 2000, and having the Ser. No. 09/732,181. This patent application is also a continuation-in-part application of U.S. patent application Ser. No. 10/013,816, filed Oct. 19, 2001.

FIELD OF THE INVENTION

The invention provides method and apparatus for pre-computing attributes of routes.

BACKGROUND OF THE INVENTION

An integrated circuit ("IC") is a device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of wiring ("wiring layers") that interconnect its electronic and circuit components. For instance, many IC's are currently fabricated with metal or polysilicon wiring layers (collectively referred to below as "metal layers") that interconnect its electronic and circuit components. One common fabrication model uses five metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. Many IC's use the Manhattan wiring model, which specifies alternating layers of preferred-direction horizontal and vertical wiring. In this wiring model, the majority of the wires can only make 90° turns. However, occasional diagonal jogs are sometimes allowed on the preferred horizontal and vertical layers.

Design engineers design IC's by transforming circuit description of the IC's into geometric descriptions, called layouts. To create layouts, design engineers typically use electronic design automation ("EDA") applications. These applications provide sets of computer-based tools for creating, editing, and analyzing IC design layouts.

EDA applications create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes. For the sake of simplifying the discussion, these geometric objects are shown as rectangular blocks in this document.

Also, in this document, the phrase "circuit module" refers to the geometric representation of an electronic or circuit IC component by an EDA application. EDA applications typically illustrate circuit modules with pins on their sides. These pins connect to the interconnect lines.

A net is typically defined as a collection of pins that need to be electrically connected. A list of all or some of the nets in a layout is referred to as a net list. In other words, a net list specifies a group of nets, which, in turn, specify the interconnections between a set of pins.

FIG. 1 illustrates an example of an IC layout 100. This layout includes five circuit modules 105, 110, 115, 120, and 125 with pins 130–160. Four interconnect lines 165–180 connect these modules through their pins. In addition, three nets specify the interconnection between the pins. Specifically, pins 135, 145, and 160 define a three-pin net, while pins 130 and 155, and pins 140 and 150 respectively define two two-pin nets. As shown in FIG. 1, a circuit module (such as 105) can have multiple pins on multiple nets.

The IC design process entails various operations. Some of the physical-design operations that EDA applications commonly perform to obtain the IC layouts are: (1) circuit partitioning, which partitions a circuit if the circuit is too large for a single chip; (2) floor planning, which finds the alignment and relative orientation of the circuit modules; (3) placement, which determines more precisely the positions of the circuit modules; (4) routing, which completes the interconnects between the circuit modules; (5) compaction, which compresses the layout to decrease the total IC area; and (6) verification, which checks the layout to ensure that it meets design and functional requirements.

Routing is a key operation in the physical design cycle. It is generally divided into two phases: global routing and detailed routing. For each net, global routing generates a "loose" route (also called path or routing areas) for the interconnect lines that are to connect the pins of the net. The "looseness" of a global route depends on the particular global router used. After global routes have been created, the detailed routing creates specific individual routing paths for each net.

While some commercial global routers today might allow an occasional diagonal jog, these routers do not typically explore diagonal routing paths consistently when they are specifying the routing geometries of the interconnect lines. This, in turn, increases the total wirelength (i.e., total length of interconnect lines) needed to connect the nets in the layout. Therefore, there is a need for routing method and apparatus that considers diagonal routing paths.

SUMMARY OF THE INVENTION

Some embodiments provide a method of pre-computing attributes of routes for nets in a region of a design layout. The pre-computed attributes are used by an electronic design automation application that partitions a design-layout region into a plurality of sub-region.

In some embodiments, a number of edges exist between the sub-regions. In these embodiments, the method identifies a first set of potential routes for a first set of sub-regions. Each route in the first set traverses the first set of sub-regions. For each particular edge between the sub-regions, the method identifies an edge-intersect cost that is dependent on the number of routes in the first set of routes that intersect the particular edge. Different embodiments define different edge-intersect costs. For instance, the edge-intersect cost of a particular edge (1) can be the number of first-set routes that intersect the particular edge, (2) can be an edge-intersect probability that equals the number of first-set routes that intersect the particular edge divided by the total number of first-set routes, or (3) can be a cost derived from the edge-intersect probability. Other embodiments might define other edge-intersect costs. The method stores each identified edge-intersect cost for the first set of sub-regions.

In other embodiments, a number of paths exist between the sub-regions. In these embodiments, the method identifies a first set of potential routes for a first set of sub-regions. Each route in the first set traverses the first set of sub-regions. For each particular path between the sub-regions, the method identifies a path-use cost that is dependent on the number of routes in the first set of routes that use the particular path. Different embodiments define different path-use costs. For instance, the path-use cost of a particular path (1) can be the number of first-set routes that use the particular path, (2) can be a path-use probability that equals the number of first-set routes that use the particular path divided by the total number of first-set routes, or (3) can be a cost derived from the path-use probability. Other embodiments might define other path-use costs. The method stores each identified path-use cost for the first set of sub-regions.

BRIEF DESCRIPTION OF THE DRAWINGS

The novel features of the invention are set forth in the appended claims. However, for purpose of explanation, several embodiments of the invention are set forth in the following figures.

FIG. 15 illustrates a length grid that decomposes each congestion-grid child slots of the grid of FIG. 13 into 4 slots, while

FIG. 17 illustrates that the partitioning of FIG. 15 creates 6 paths for routing between the resulting 4 slots in each congestion-graph child slot, while

FIG. 35A and FIG. 35B illustrate examples of closed and open node configurations.

FIG. 41 illustrates the data structure for a net list.

FIG. 42 illustrates a dbNet data structure.

FIG. 43 illustrates a simple pin data structure.

FIG. 44 illustrates a path data structure.

FIG. 45 illustrates a slot-net data structure.

FIGS. 66 and 67 present two examples that conceptually illustrate one manner of counting the number of vias.

FIGS. 79 and 80 illustrate one manner of enumerating and costing the propagations.

DETAILED DESCRIPTION OF THE INVENTION

The invention is directed towards routing method and apparatus that utilize diagonal routes. In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Several embodiments of the invention's routing method and apparatus are described below. However, before discussing these embodiments, several diagonal wiring architectures that can be used with these embodiments are described in Section I.

I. Diagonal Wiring Architecture

Different embodiments of the invention can be used with different wiring models. For instance, some embodiments are used with wiring models that include diagonal, horizontal, and vertical interconnect wires. In the discussion below, interconnect wires are also referred to as interconnects or interconnect lines. Also, as used in this document, an interconnect line is "diagonal" if it forms an angle other than zero or ninety degrees with respect to the layout boundary. On the other hand, an interconnect line is "horizontal" or "vertical" if it forms an angle of 0° or 90° with respect to one of the sides of the layout (e.g., forms an angle of 0° or 90° with respect to the width of the layout).

Figure 1:
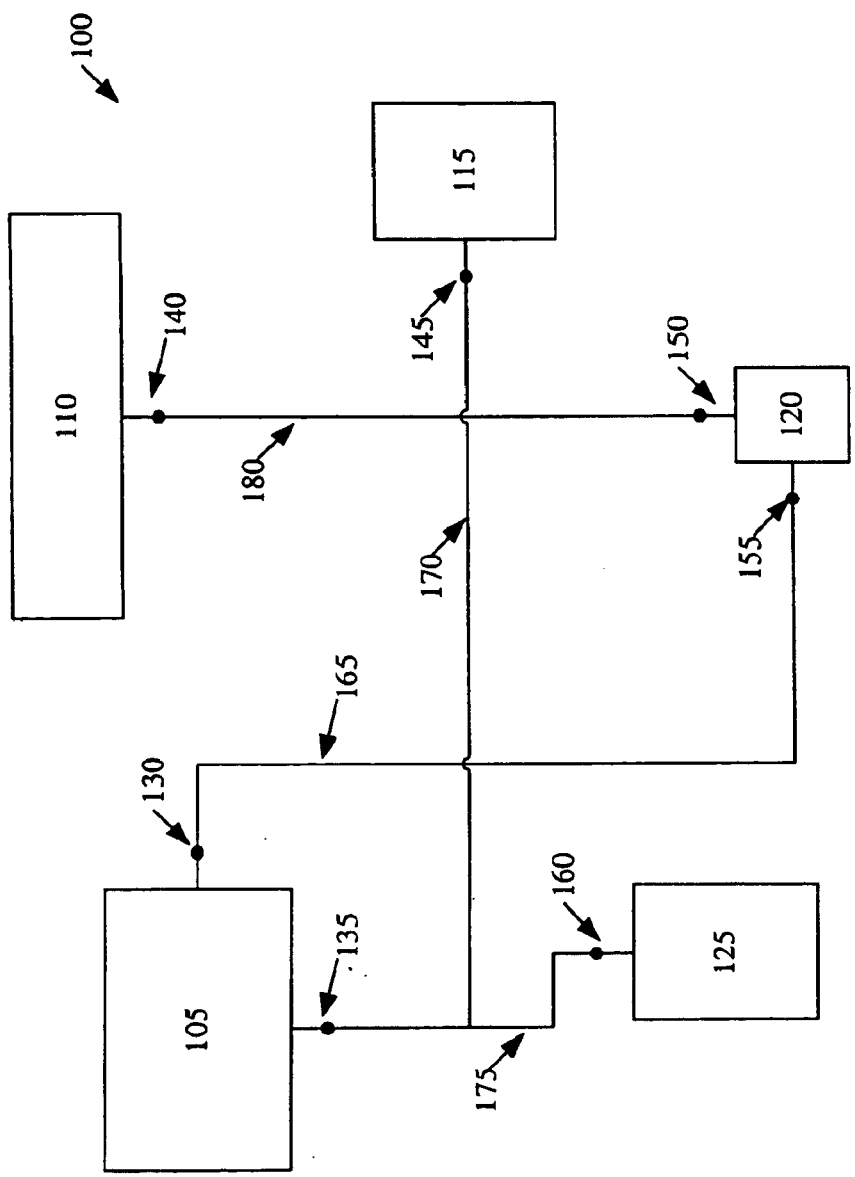
FIG. 1 illustrates an example of an IC layout.
Figure 2:
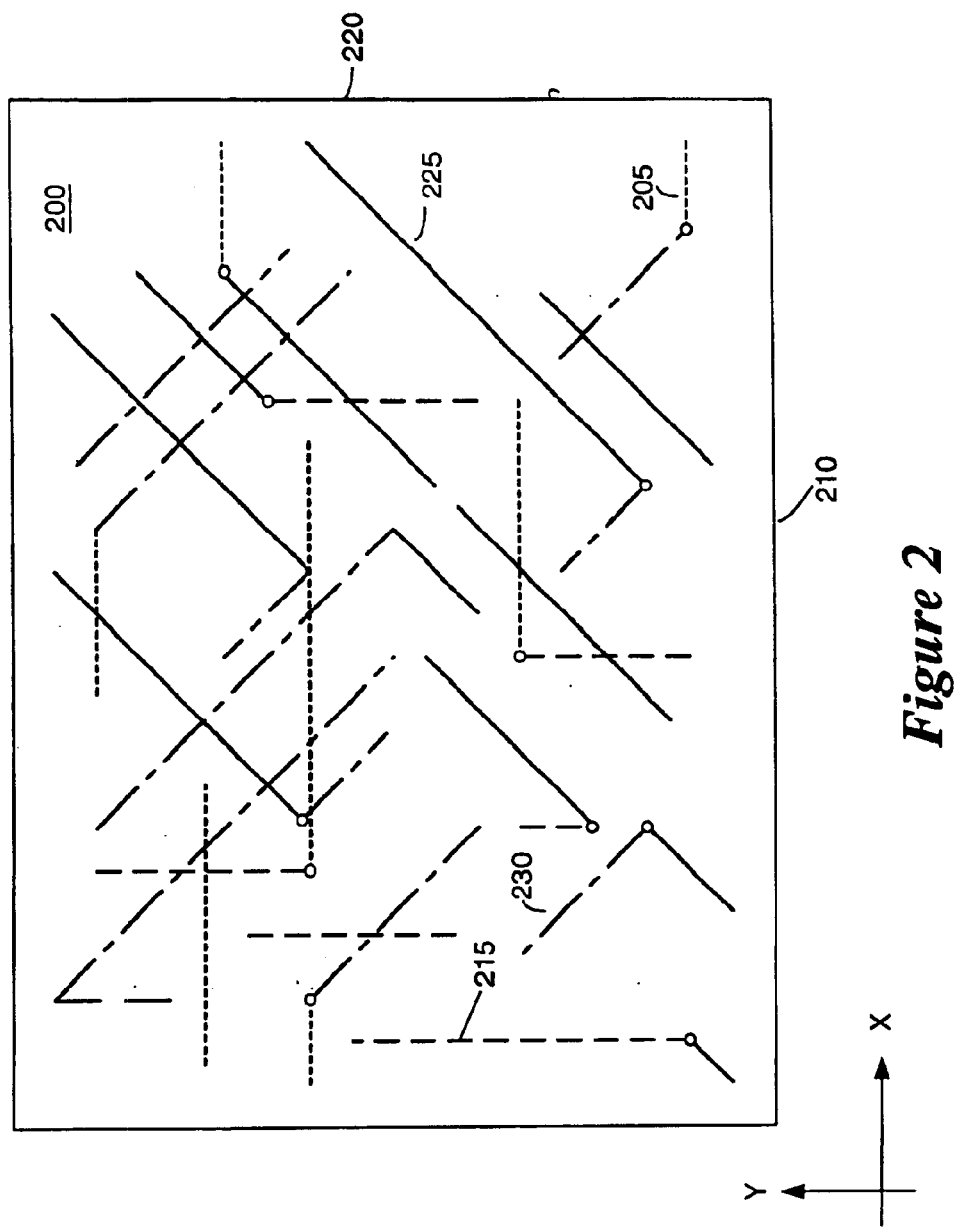
FIG. 2 illustrates an IC layout that utilizes horizontal, vertical, and 45° diagonal interconnect lines.

FIG. 2 illustrates an IC layout 200 that utilizes horizontal, vertical, and 45° diagonal interconnect lines. In this figure, the horizontal lines 205 are the lines that are parallel (i.e., are at 0°) to the x-axis, which is defined to be parallel to the width 210 of the layout. The vertical lines 215 are parallel to the y-axis, which is defined to be parallel to the height 220 of the layout. In other words, the vertical interconnect lines 215 are perpendicular (i.e., are at 90°) to the width of the IC layout. In addition, one set 225 of diagonal lines are at +45° with respect to the width of the IC layout, while another set 230 are at −45° with respect to the width of the IC layout. In this document, the phrase "octagonal wiring model" is used to refer to a wiring model that includes horizontal, vertical, and 45° diagonal interconnect lines.

Figure 3:
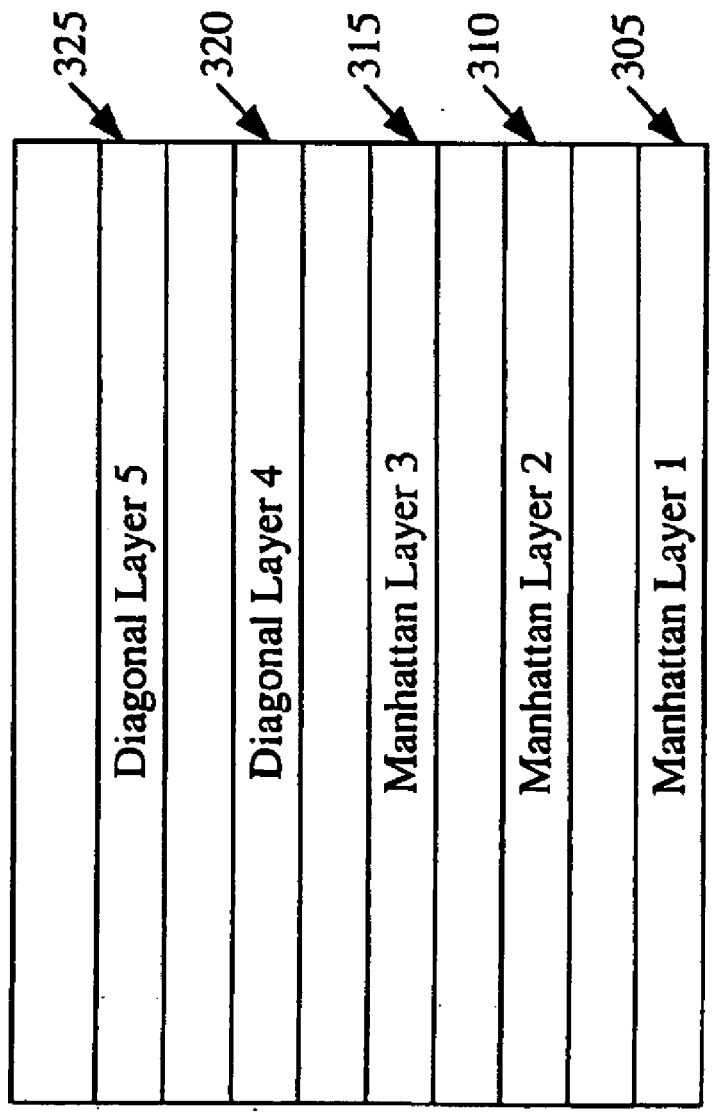
FIG. 3 illustrates one manner of implementing an octagonal wiring model.

FIG. 3 illustrates one manner of implementing the octagonal wiring model. The wire model illustrated in this figure uses the notion of having one preferred-wiring direction per layer. Specifically, FIG. 3 illustrates five wire layers with each layer having its own preferred direction. The first three layers 305–315 are Manhattan layers. In other words, the preferred direction for the interconnect lines in these layers is either the horizontal direction or the vertical direction. The preferred wiring direction in these three layers typically alternates so that no two consecutive layers have the same preferred wiring direction. However, in some cases, the wiring in consecutive layers is in the same direction.

The next two layers 320 and 325 are diagonal layers. The preferred directions for the interconnect lines in the diagonal layers are ±45°. Also, as in the first three layers, the wiring directions in the fourth and fifth layer are typically orthogonal (i.e., one layer is +45° and the other is −45°), although they do not have to be.

Several embodiments are described below with reference to the octagonal wiring model illustrated in FIG. 3. However, one of ordinary skill will understand that the invention can be used with any wiring model. For instance, the invention can be used with wiring architectures that are strictly diagonal (i.e., wiring architectures that do not have horizontal and vertical direction wiring).

Also, some embodiments are used with non-45° diagonal wiring. For example, some embodiments are used with wiring models that utilize horizontal, vertical and ±120° diagonal interconnect lines. In addition, some embodiments are used with wire models that do not specify a preferred direction for some or all the wire layers. For instance, some embodiments use an octagonal wiring model that allows horizontal, vertical, and 45° lines to exist on all wire layers.

II. Conceptual Flow

Figure 4:
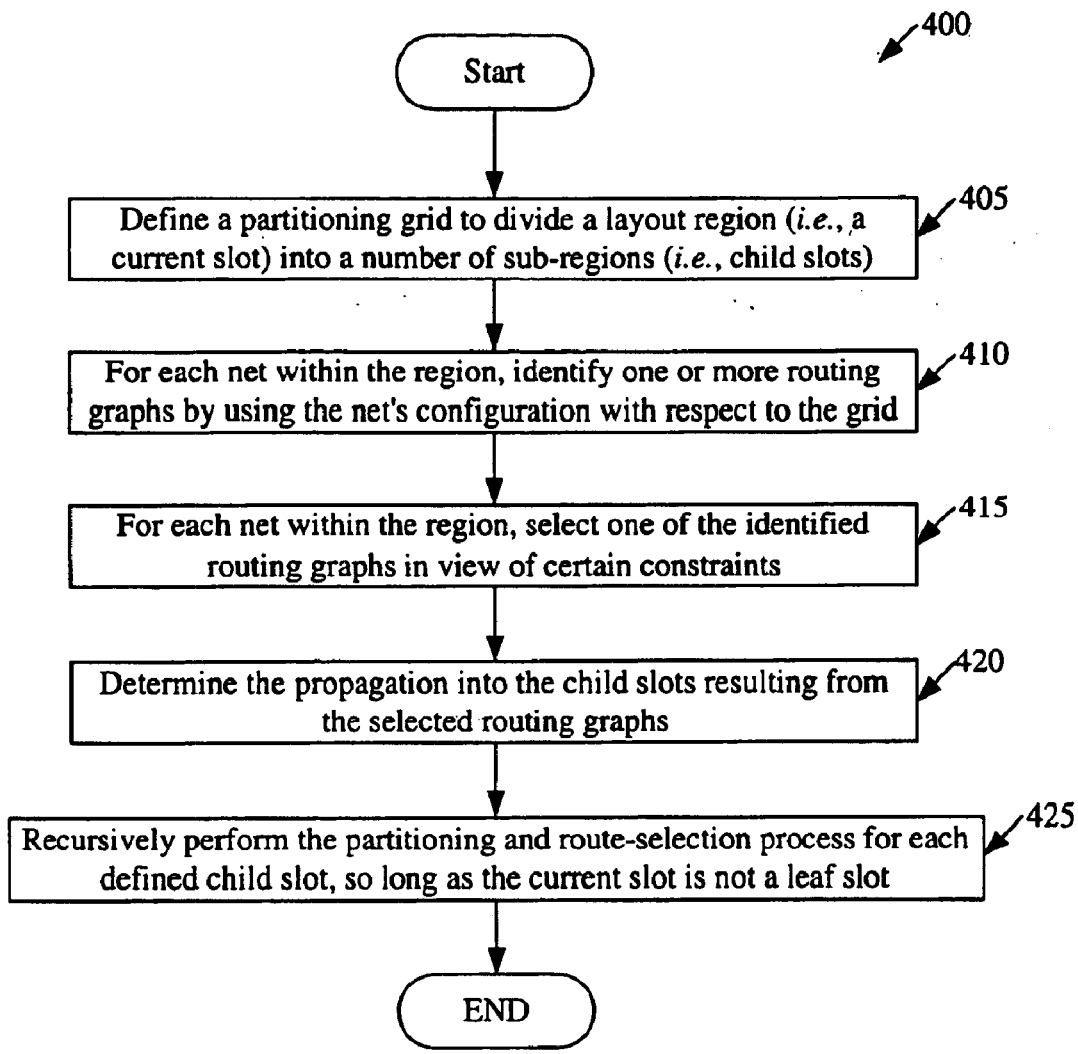
FIG. 4 presents a conceptual illustration of a recursive routing process performed by some embodiments of the invention.

FIG. 4 presents a conceptual illustration of a recursive routing process performed by some embodiments of the invention. This routing process hierarchically defines routes for nets within a design region (also called a slot) of an IC layout. This region can be the entire IC layout, or a portion of this layout. Likewise, the IC layout can be a layout for the entire integrated-circuit chip or chips, or it can be a layout for a block (i.e., a portion) of an integrated-circuit chip.

The process initially defines (at 405) a partitioning grid that divides the IC region into several sub-regions. In the discussion below, the partitioned region is also referred to as the current slot, and the sub-regions resulting from the partitioning are also referred to as the current slot's child slots.

In some embodiments, the partitioning grid is formed by intersecting cut lines. In some of these embodiments, the intersecting partitioning lines are N horizontal and M vertical lines that divide the IC region into (N+1)(M+1) sub-regions, where N and M can equal any integer. For instance, these horizontal and vertical lines divide the received IC region into (1) four child slots when N and M equal 1, (2) nine child slots when N and M equal 2, (3) sixteen child slots when N and M equal 3, or (4) twenty child slots when either N or M equals 4 and the other equals 5.

Figure 5:
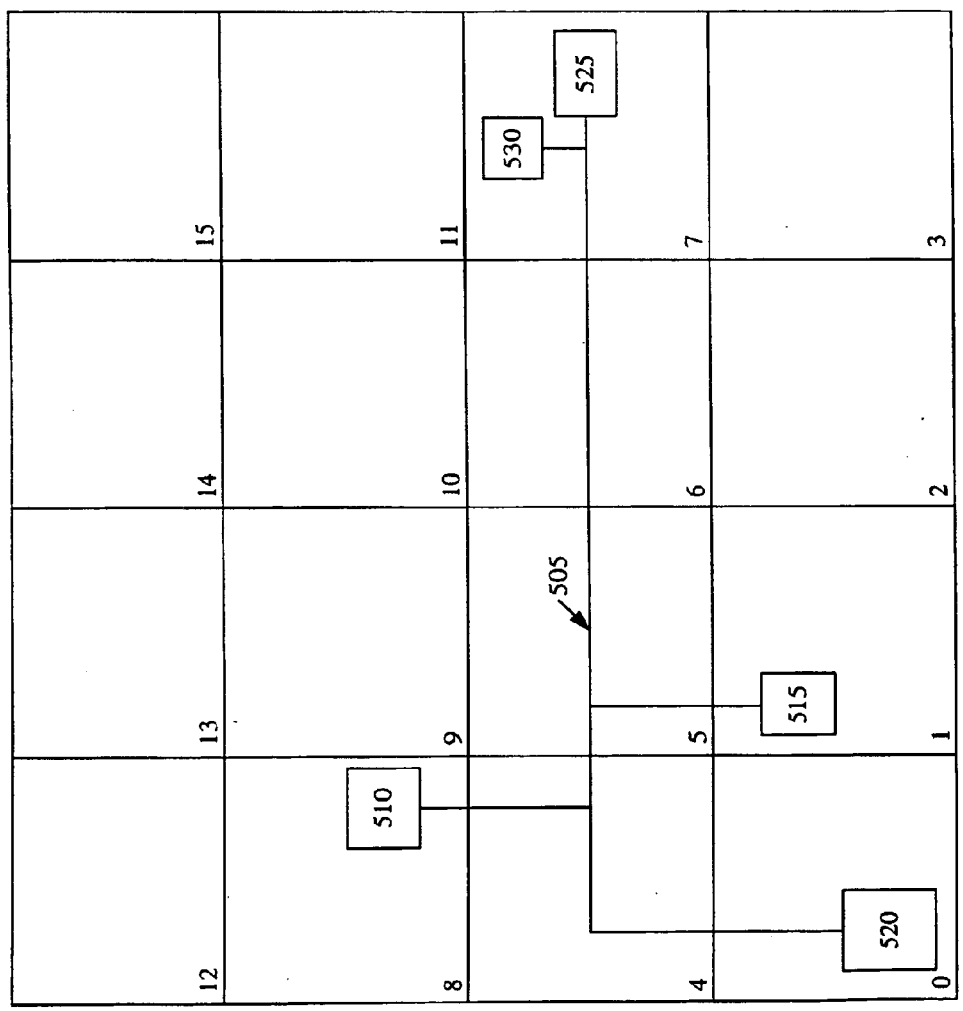
FIG. 5 illustrates a design region of an IC layout that has been divided into sixteen sub-regions.

FIG. 5 illustrates a design region 500 that has been divided into sixteen sub-regions (i.e., into child slots 0–15) by sets of three horizontal and vertical partitioning lines. This figure also shows a net 505 that includes five circuit modules 510, 515, 520, 525, and 530, which fall into four of the sixteen sub-regions. These four sub-regions are slots 0, 1, 7, and 8.

Each net within the partitioned region (i.e., within the current slot) has one or more actual or virtual pins in the sub-regions defined by the partitioning grid. A net's actual pins are pins of circuit modules in the design region, whereas the net's virtual pins are artificial pins that are set to account for the propagation of higher level routes into lower level child slots, as further described below. For each net, the set of sub-regions that contain that net's actual or virtual pins represents the net's configuration with respect to the partitioning grid.

For each particular net within the partitioned region, the process 400 uses (at 410) the net's configuration to identify one or more routes (also called routing graphs or connection graphs) for the net. Each route of a net provides a set of interconnect lines that connects the child slots (i.e., the sub-regions) that contain the net's pins.

To model each net's configuration with respect to the grid, each child slot that contains one or more of the net's pins is treated as a node (also called a vertex or point) of the routing graph. The nodes of the graph are then connected by edges (also called lines). According to some embodiments, the routing graph can have edges that are completely or partially diagonal.

Figure 6:
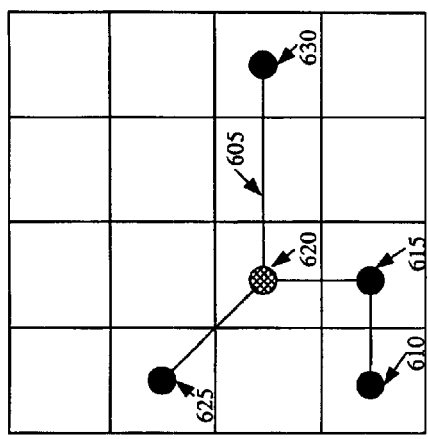
FIGS. 6–8 illustrate three Steiner trees for a net illustrated in FIG. 5.
Figure 8:
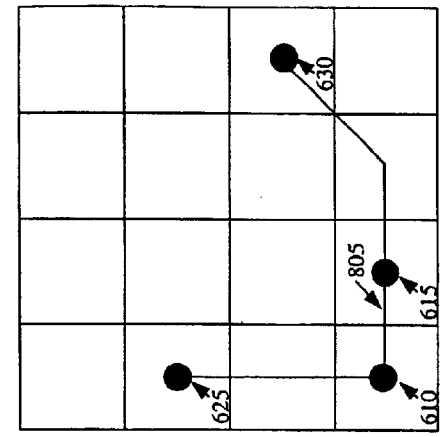
Figure 7:
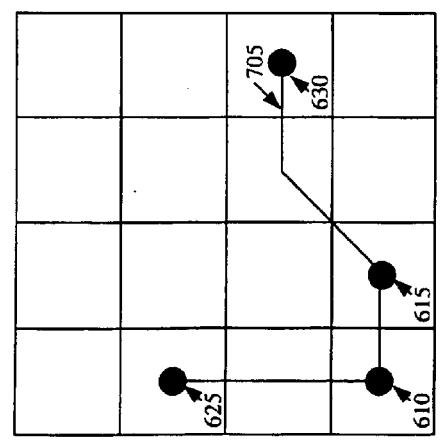

Different embodiments use different types of graphs to define the interconnect routes. In the embodiments described below, trees (e.g., Steiner trees) are used as the routing graphs that connect the child slots containing the related net pins. FIGS. 6–8 illustrate three optimal Steiner trees 605, 705, and 805 for the net 505 in FIG. 5. These Steiner trees all have the same length. One of these trees (605) has a Steiner node (620). In addition, each of these trees has at least one edge that is at least partially diagonal. In these examples, the router uses the octagonal wiring model and therefore the diagonal edges are at 45° degrees with respect to the layout boundary.

Before process 400 starts, some embodiments pre-compute and store routes for different configuration of child slots in a data storage. At run-time, the router in these embodiments identifies (at 410) some or all of the routes for a net by (1) identifying the configuration of each net with respect to the partitioning grid, and (2) retrieving from the data storage the routes for the identified-configurations. Such an approach frees the router from having to construct in real-time routes for each net configuration. One such approach is described below in Section V.

Other embodiments, on the other hand, use net configurations to generate routes in run time. Yet other embodiments use net configurations to retrieve and generate routes. For instance, some embodiments use net configurations to retrieve pre-tabulated routes for certain nets while generating routes for other nets. One such approach is described below in Section V.

In some embodiments, the pre-tabulated or generated routes are optimal routes. Some of these embodiments also have the router identify sub-optimal routes for each net configuration in the layout, in order to increase the number of possible solutions for each net. One such approach is described below in Section VI.

For each net, the process 400 selects (at 415) one of the routes identified for the net as the net's route at the current recursion level. The process selects the routes that optimize certain objectives, such as reducing wirelength and congestion. When the current slot's child slots are to be partitioned to define smaller child slots, the process 400 then determines (at 420) the propagation of the selected routes into the smaller child slots. At this stage, the process might also add virtual pins to certain nets to account for such propagation.

Finally, when the child slots defined at 405 are not the slots resulting from the last recursion operation, the process 400 recursively repeats for each child slot defined at 405. By recursively repeating for each defined child slot, the process 400 defines more and more detailed routes for the nets in the current region. In other words, this recursive process 400 defines the routes in a hierarchical manner, where the process defines more detailed routes as the levels of the recursion hierarchy increase.

Some embodiments use different shaped partitioning grids for different levels in the recursion process. The embodiments described below, however, use same shaped partitioning grids for all the recursion levels. At each recursion level, these embodiments simply adjust the coordinates of the partitioning grid to match the coordinates of the IC region at that recursion level. Using the same shaped partitioning grids for all the recursion levels has several advantages. For instance, the process can re-use the same set of pre-tabulated information for all levels of the recursion process.

III. Multiple Grids

Some embodiments use one or more grids in addition to the partitioning grid.

A. Multiple Congestion Grids.

Figure 9:
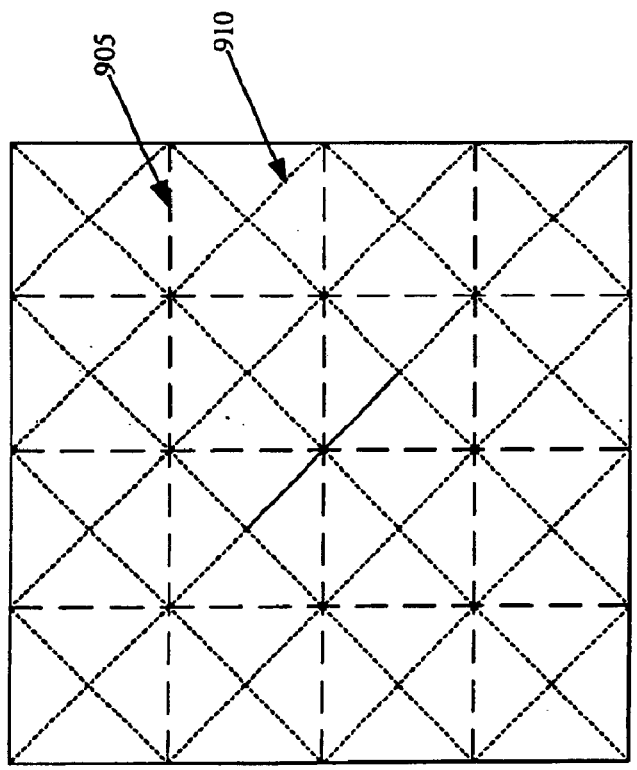
FIG. 9 illustrates two congestion grids.

Some embodiments use multiple congestion grids as the conceptual model for quantifying the capacity, and measuring the congestion, of routing paths between the sub-regions that are defined by the partitioning grid. FIG. 9 illustrates two such congestion grids. Some embodiments described below use these two grids in conjunction with the octagonal wiring model illustrated in FIG. 3.

In FIG. 9, the two grids are: (1) grid 905, which is formed by 3 horizontal and 3 vertical lines, and (2) grid 910, which is formed by seven +45° diagonal lines and seven −45° diagonal lines. Grid 905 is used to specify the capacity and measure the congestion of horizontal and vertical routing paths, while grid 910 is used to specify the capacity and measure the congestion of diagonal routing paths.

Figure 10:
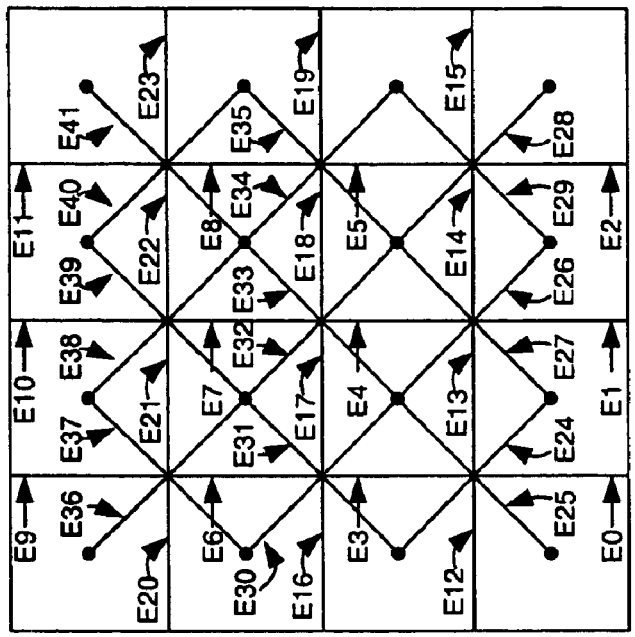
FIG. 10 illustrates edges defined by the congestion grids of FIG. 9.

Specifically, as shown in FIG. 10, the grid 905 defines 12 vertical edges (E0–E11) and 12 horizontal edges (E12–E23), while the grid 910 defines 9 −45° edges (E24, E26, E28, E30, E32, E34, E36, E38, E40) and 9 +45° edges (E25, E27, E29, E31, E33, E35, E37, E39, E41). In FIG. 10, the diagonal edges are shown to have endpoints, in order to simplify the identification of these edges as they abut each other.

Figure 11:
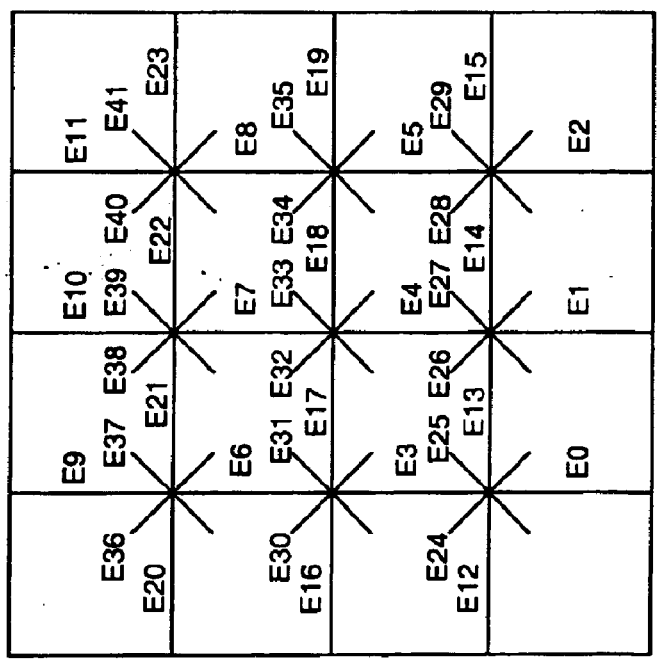
FIG. 11 shows the diagonal edges of FIG. 10 slightly smaller.

As shown in FIG. 10, each diagonal edge traverses the distance between the centers of two sub-regions that are defined by the first grid and that are at diagonally adjacent positions with respect to each other. In other words, each diagonal edge connects the centers of two sub-regions that are aligned diagonally such that they abut at only one of their corners. FIG. 11 shows the diagonal edges slightly smaller, in order to simplify the appearance of these edges.

Figure 12:
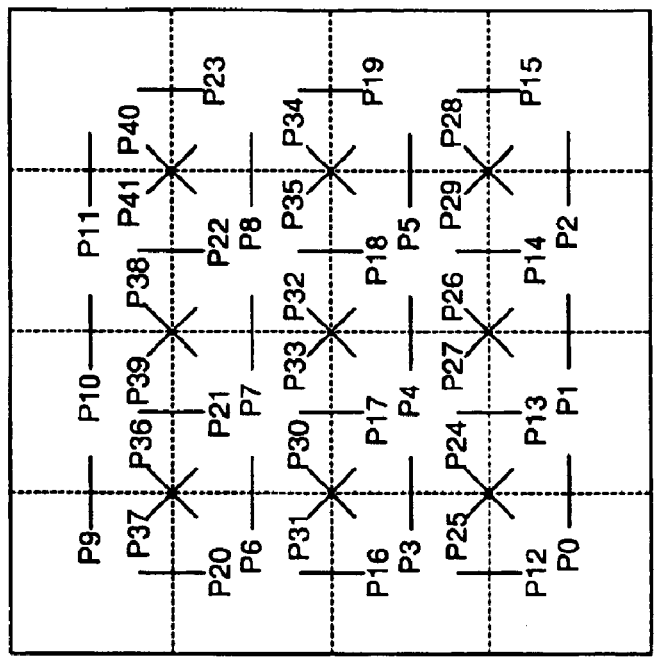
FIG. 12 illustrates wiring paths across the edges of FIG. 10.

In some embodiments, grids 905 and 910 are also used to define routing paths between the child slots of a partitioned region. Specifically, orthogonal to each edge defined by grids 905 and 910 is a routing path that can be used by a routing tree to connect the abutting slots (i.e., the abutting sub-regions). For instance, FIG. 12 illustrates 42 wiring paths across the 42 edges of FIG. 10. Horizontal paths P0–P11 are defined across vertical edges E0–E11, vertical paths P12–P23 are defined across horizontal edges E12–E23 that vertical routing paths will intersect, +45° paths P24, P26, P28, P30, P32, P34, P36, P38, P40 are defined across −45° edges E24, E26, E28, E30, E32, E34, E36, E38, E40, and −45° paths P25, P27, P29, P31, P33, P35, P37, P39, P41 are defined across +45° edges E25, E27, E29, E31, E33, E35, E37, E39, E41.

The congestion problem can be expressed and analyzed in terms of either the edge capacities or the path capacities, as these two sets of capacities are intertwined. The processes described below analyze the capacity issue in terms of the path capacities. One of ordinary skill will realize, however, that analogous processes can be used to analyze the capacity issue in terms of edge capacities.

As further described below, some embodiments derive the capacity of each path from the size of the edge that the path intersects. For instance, some embodiments calculate the capacity of each particular path by dividing the size of the corresponding orthogonal edge (i.e., the size of the edge orthogonal to the particular path) with the pitch of metal layer corresponding to the particular path. Some embodiments define the pitch of a metal layer as the line-to-via pitch. Some embodiments define the line-to-via pitch as the minimum required distance between interconnect lines on that metal layer, plus ½ the width of the line, plus ½ the width of the via including the metal overlap.

In some embodiments, the capacities of the diagonal paths differ from the capacities of the Manhattan paths. This can be due to the differing size of the edges that are orthogonal to the diagonal and Manhattan paths. It can also be due to the pitch of the diagonal lines being different from the pitch of the Manhattan lines. It can further be due to the pitch of one layer being different than the pitch of another layer. For example, in some embodiments, the capacities of the −45° diagonal paths differ from the capacities of the 45° diagonal paths, when the pitch of the −45° metal layer differs from the pitch of the 45° metal layer.

In FIG. 9, the grid 905 is the same as the partitioning grid illustrated in FIG. 5. However, one of ordinary skill will appreciate that both congestion grids can differ from the partitioning grid. In addition, even though FIG. 9 illustrates two congestion grids 905 and 910 for some embodiments, one of ordinary skill will appreciate that other multi-grid arrangements can be used by other embodiments.

Some embodiments generally define the number and structure of congestion grids based on the number of wiring directions and wiring levels of the wiring model used to design the design layout and/or the IC. For instance, some embodiments use a wiring model that allows routing in horizontal, vertical, +120° diagonal, and −120° diagonal directions. For such a wiring model, two congestion grids can be used. Like grid 905, the first grid could be formed by intersecting horizontal and vertical lines, in order to define the capacity and measure the congestion of vertical and horizontal routing paths. The second grid could be used to define the capacity and measure the congestion of ±120° diagonal routing paths. This second grid could be similar to the first grid, except that the axis of the second grid would be rotated 120° with respect to the axis of the first grid. In other words, this second grid could be formed by a number of intersecting ±30° lines.

B. Congestion and Length Grids.

Some embodiments use (1) a first grid to partition an IC region and measure congestion in this region, and (2) a second grid to measure wirelength costs in the region. FIGS. 13–18 illustrate several such embodiments. These embodiments use the wiring model that includes horizontal, vertical, and ±45° interconnect lines. One of ordinary skill will understand that other embodiments use other wiring models (such as ones that use ±120° lines).

Figure 14:
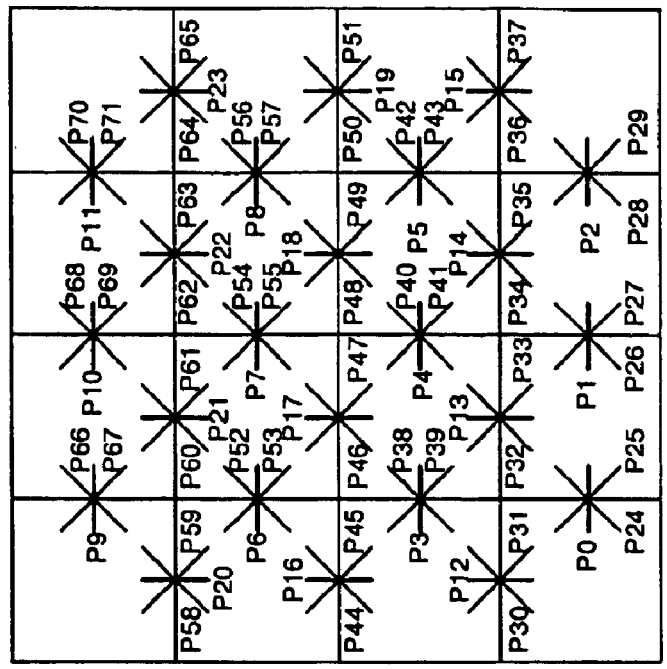
FIG. 14 illustrates Manhattan and diagonal paths defined across edges created by the grid of FIG. 13.
Figure 13:
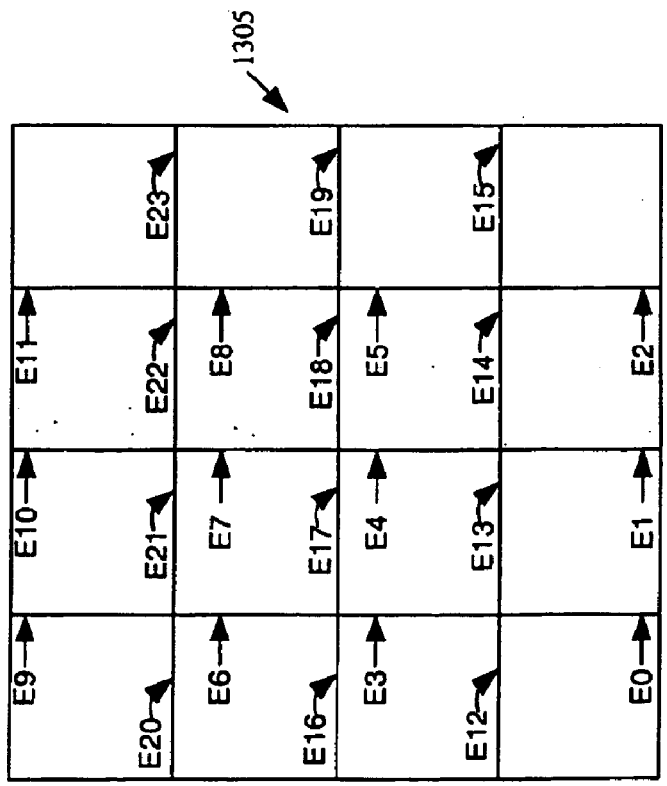
FIG. 13 illustrates a partitioning grid used by some embodiments.

FIG. 13 illustrates a first grid 1305 that some embodiments use to partition an IC region into 16 sub-regions. This grid also defines 24 edges E0–E23 that are used to measure congestion of Manhattan and non-Manhattan interconnect lines in the region. As shown in FIG. 14, 24 Manhattan paths P0–P23 and 48 diagonal paths P24–P71 are defined across these 24 edges E0–E23. Each path represents one or more tracks of wiring in the path's direction across the path's corresponding edge.

Vertical edges E0–E11 are used to measure congestion of wires (i.e., of interconnect lines) that cross these vertical edges in the direction of horizontal paths P0–P11 and ±45° diagonal paths P24–P29, P38–P43, P52–P57, and P66–P71. Similarly, horizontal edges E12–E23 are used to measure congestion of wires that cross these horizontal edges in the direction of vertical paths P12–P23 and ±45° diagonal paths P30–P37, P44–P51, and P58–P65.

Some embodiments define each route in terms of the paths P0–P71. Paths P0–P71 are also used to measure congestion in the IC region. In some embodiments, the capacity along the diagonal paths P24–P71 is less than the capacity along the Manhattan paths P0–P23. For instance, some embodiments specify that (1) each Manhattan path represents 8-tracks of wires at the lowest-level child slot (i.e., at the Gcell level), and (2) each diagonal path represents 5-tracks of wires at the Gcell level when the diagonal and Manhattan layers have the same pitch. Some embodiments specify less than 5-tracks for a diagonal path at the Gcell level, when the pitch of the diagonal path's layer is greater than the pitch of a Manhattan path layer.

Figure 15:
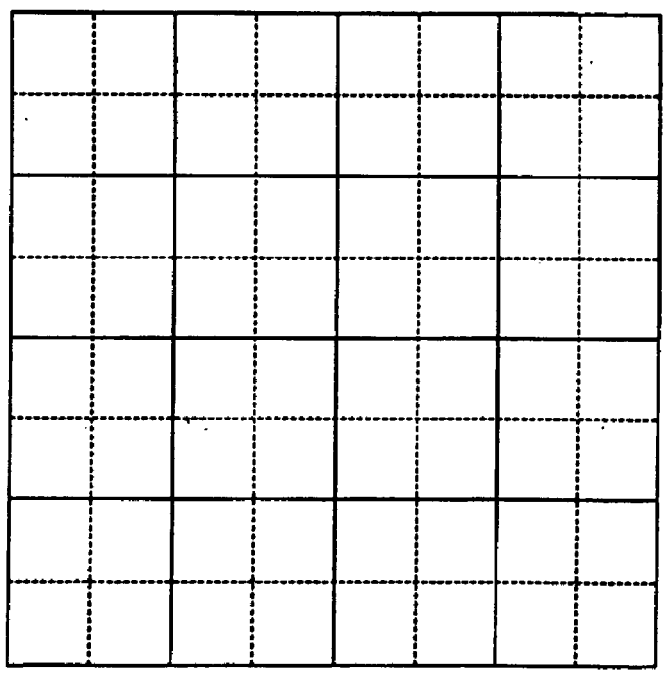
Figure 16:
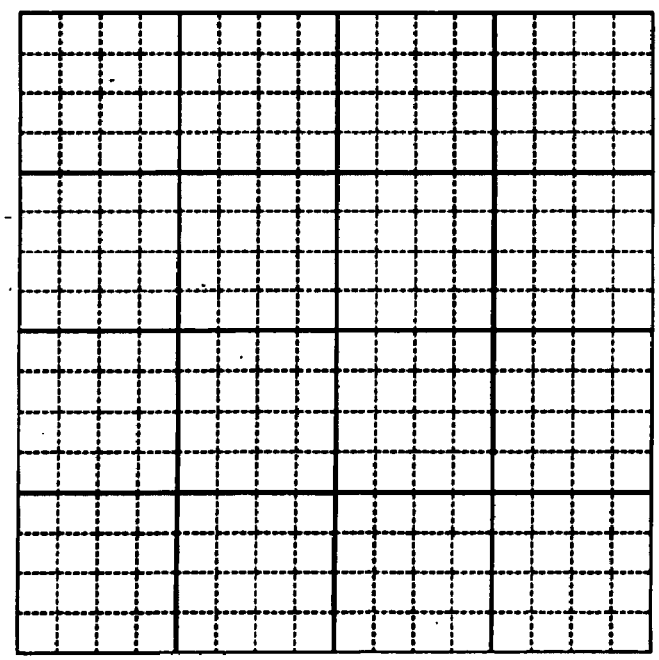
FIG. 16 illustrates a length grid that decomposes each of these child slots into 16 slots.

As mentioned above, some embodiments use a second grid to measure the wirelength costs of the routes in the region. This length grid decomposes each congestion-grid child slot into smaller slots. For instance, FIG. 15 illustrates a length grid that decomposes each of the 16 congestion-grid child slots of grid 1305 into 4 slots, while FIG. 16 illustrates a length grid that decomposes each of the 16 congestion-grid child slots of grid 1305 into 16 slots. Other embodiments use other types of grids (e.g., a 3×5 grid) to decompose the congestion-grid child slots.

Figure 17:
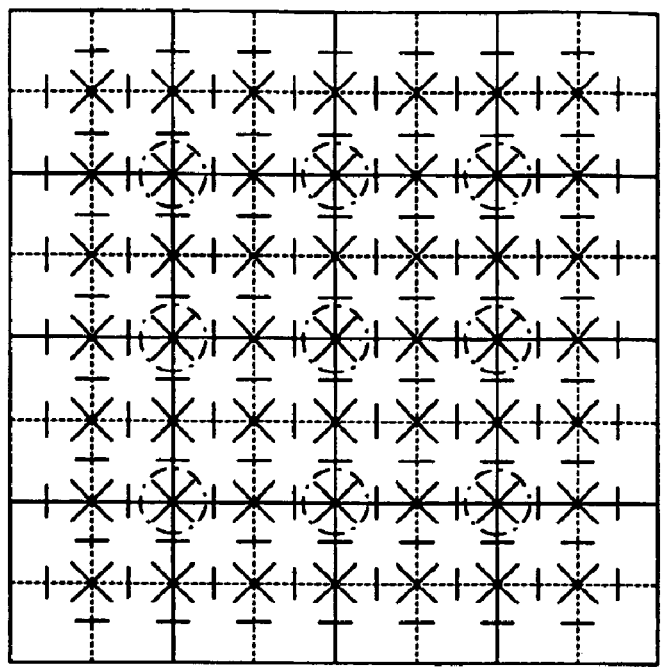
Figure 18:
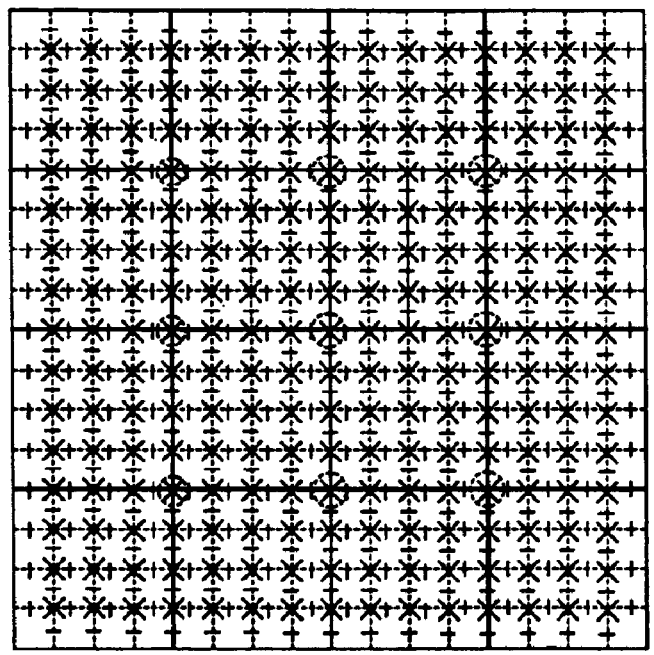
FIG. 18 illustrates that the partitioning of FIG. 16 creates 42 paths for routing between the ID resulting 16 slots of each congestion-graph child slot.

FIG. 17 illustrates that the 2×2 partitioning of FIG. 15 define 6 paths for routing between the resulting 4 slots in each congestion-graph child slot, while FIG. 18 illustrates that the 4×4 partitioning of FIG. 16 defines 42 paths for routing between the resulting 16 slots of each congestion-graph child slot. In addition, each type of partitioning defines several paths between the length-grid slots of adjacent congestion-grid child slots. These paths will be further described below.

The length grid can be used to estimate the wirelength cost of each net's route by identifying one or more segments that traverse the length-grid paths to connect all of the net's pins. In other words, for a net's route, an estimated wirelength cost is the length of a set of length-grid paths that (1) connect the length-grid slots that contain the net's pins, and (2) cross the same congestion-graph edges in the same direction as the congestion-graph paths used by the net's route. The wirelength cost of a set of length-grid paths includes the cost of the interior paths (i.e., length-grid paths inside congestion-grid slots) that connect the length-grid slots containing the net's pins, plus the cost of the periphery length-grid path(s) that cross the incident congestion-graph edge(s).

In some embodiments, propagating a congestion-grid path to a periphery length-grid path (i.e., a length-grid path between congestion grid slots) might require the setting of a virtual pin in the net's pin configuration with respect to the length grid. Accordingly, the interior length-grid paths connect the length-grid slots that contain actual or virtual pins of the net. Also, as mentioned above, the periphery length-grid paths (i.e., the length-grid paths across congestion-graph edges) cross the congestion-graph edges in the same direction as the congestion-graph paths used by the net's route.

FIGS. 17 and 18 illustrate diagonal length-grid paths between the length-grid slots of diagonally-adjacent congestion-grid child slots. In these figures, such diagonal length-grid paths are circled with dashed lines. Some embodiments define such diagonal length-grid paths while others do not.

Also, some of the embodiments that have diagonal length-grid paths between diagonally-adjacent congestion-grid child slots use a particular convention to correlate these diagonal length-grid paths with the diagonal congestion-graph paths. In some embodiments, such −45° length-grid paths are tied either to their corresponding bottom and left congestion-graph paths or to their corresponding top and right congestion-graph paths. For instance, when a −45° length grid path is used between congestion-graph child slots 9 and 12, some embodiments increment the path-usage of paths 53 and 59 by one, while other embodiments increment the path-usage of paths 61 and 67 by one. (Paths 53, 59, 61, and 67 are illustrated in FIG. 14.)

Analogously, some embodiments tie +45° length-grid paths either to their corresponding bottom and right congestion-graph paths or to their corresponding top and left congestion-graph paths. For instance, when a +45° length grid path is used between congestion-graph child slots 8 and 13, some embodiments increment the path-usage of paths 58 and 66 by one, while other embodiments increment the path-usage of paths 52 and 60 by one. (Paths 52, 58, 60, and 66 are illustrated in FIG. 14.)

Alternatively, some embodiments tie diagonal length-grid paths between diagonally-adjacent congestion-grid child slots to only one of the four surrounding congestion-graph paths, and assign one additional track to the capacity of this congestion-graph path. Some embodiments tie a −45° length-grid path to its corresponding left congestion-graph path, and tie +45° length-grid path to its corresponding right congestion-graph path. Under this approach, some embodiments associate the −45° length grid path between congestion-graph child slots 9 and 12 with path 59, and assign a capacity of 6 to path 59 at the Gcell level while assigning a capacity of 5 to path 53.

Yet other embodiments do not correlate the diagonal length-grid paths between congestion-graph child slots with the diagonal congestion-graph paths P0–P71. Instead, these embodiments define 18 additional diagonal congestion-graph paths between the 18 pairs of diagonally-adjacent congestion graph slots. Each of these 18 additional congestion paths corresponds to a particular length-grid path. Also, at the Gcell level, some embodiments define each of these 18 additional paths to be 1-track wide.

Different embodiments use the congestion and length grids differently. For instance, some embodiments identify routes based on net configurations with respect to the congestion grid 1305, and then use the length and congestion grids to compute wirelength and congestion costs of the identified routes. Other embodiments successively expand a route for a net through the length grid. For each expansion or potential expansion, these embodiments use the length grid to cost the expansion or potential expansion. If the expansion or potential expansion crosses one of the congestion grid edges, these embodiments factor a congestion cost for it. Also, as mentioned above, some embodiments only define each route eventually in terms of the paths P0–P71 defined across the congestion grid, while others do not.

IV. Adaptive Selection of Wiring Model

Figure 19:
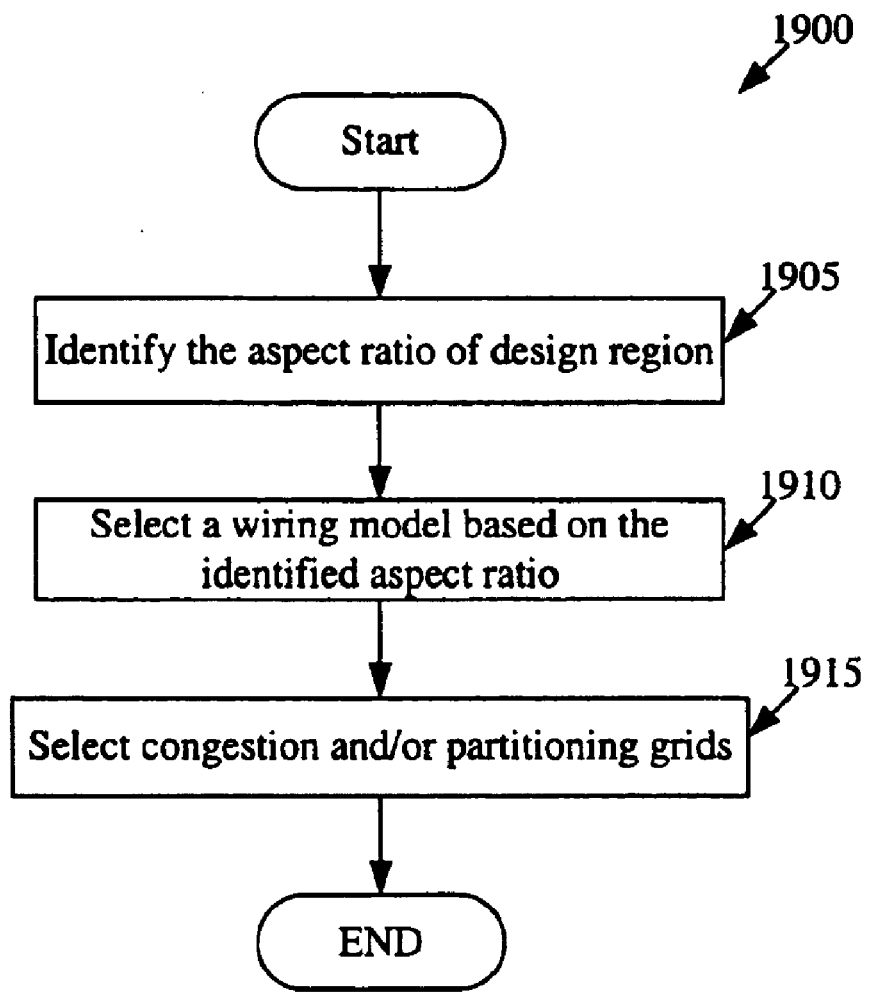
FIG. 19 illustrates a process for adaptively selecting the wiring model, as well as the congestion and/or partitioning grids.

Some embodiments adaptively select their wiring model based on the aspect ratio (height-to-width ratio) of the design region (i.e., the region being designed). FIG. 19 illustrates a process 1900 for making such an adaptive selection. This process is typically performed before defining the partitioning grid at 405 of process 400. In some embodiments, the designer performs some or all operations of this process manually, while in other embodiments the router performs some or all the operations of this process in an automated fashion.

This process initially identifies (at 1905) the aspect ratio of the design region. To identify the aspect ratio, the process can calculate this ratio based on the dimensions of the design region, or it can retrieve a pre-tabulated aspect ratio for the design block. The process next selects (at 1910) a wiring model based on the identified aspect ratio. In some embodiments, the process 1900 then adaptively selects (at 1915) the partitioning and/or congestion grids. In some embodiments, the process adaptively selects the partitioning and/or congestion grids based on the wiring model.

Adaptive selection of the wiring model allows a design region to be routed with a view to achieving certain design objectives (e.g., minimizing wirelength and congestion). For instance, when designing a circuit block that has a relatively large aspect ratio (i.e., a circuit block that is tall and skinny), some embodiments adaptively select a wiring model that allows routing in horizontal, vertical, ±120° diagonal directions, because such a wiring model reduces wirelength and congestion for routing such a circuit block. For such a wiring model, some embodiments use a first congestion grid (like grid 905 of FIG. 9) that is formed by intersecting horizontal and vertical lines, and a second congestion grid that is formed by intersecting ±30° lines, as described above.

Also, for such a wiring model and IC region, some embodiments use a partitioning grid that divides the IC region into smaller regions that have large aspect ratio. In some such embodiments, diagonally-adjacent partitioned regions have their centers offset by 120° from each other, so that their centers can be connected by 120° diagonal lines.

Numerous other wiring models can be used for a design block with a large aspect ratio. For instance, another wiring model would be one that would allow routing in the horizontal, vertical, ±45° diagonal, and ±120 diagonal directions. For such a wiring model, some embodiments might use the following three congestion grids: (1) a first grid that is for horizontal and vertical paths and that is formed (like grid 905 of FIG. 9) by intersecting horizontal and vertical lines, (2) a second grid that is for ±120° paths and that is formed by intersecting ±30° lines, and (3) a third grid that is for ±45° paths and that is formed by intersecting ±45° diagonal lines.

Similarly, numerous wiring models can be used for a design block with a small aspect ratio (i.e., a block that is short and wide). For instance, some embodiments might adaptively select for such a block a wiring model that allows routing in horizontal, vertical, ±30° diagonal directions. For such a wiring model, some embodiments use the following two congestion grids (1) a first grid that is for horizontal and vertical paths and that is formed (like grid 905 of FIG. 9) by intersecting horizontal and vertical lines, and (2) a second grid that is for ±30° diagonal paths and that is formed by intersecting ±120° lines.

For such a wiring model and congestion grid, some embodiments use a partitioning grid that divides the IC region into smaller regions that have small aspect ratio. In some such embodiments, diagonally-adjacent partitioned regions have their centers offset by 30° from each other, so that their centers can be connected by 30° diagonal lines.

Another wiring model for such a block would be one that would allow routing in the horizontal, vertical, ±45° diagonal, and ±30° diagonal directions. For such a wiring model, some embodiments use the following three congestion grids: (1) a first grid that is for horizontal and vertical paths and that is formed (like grid 905 of FIG. 9) by intersecting horizontal and vertical lines, (2) a second grid that is for ±30° diagonal paths and that is formed by intersecting ±120° lines, and (3) a third grid that is for ±45° diagonal paths and that is formed (like grid 910 of FIG. 9) by intersecting ±45° lines.

When the design block is square, some embodiments might select a perfectly symmetrical wiring model, such as the five-layer octagonal wiring model discussed above by reference to FIG. 3. However, in this situation, other embodiments might select more complicated wiring models. For instance, some embodiments might select a nine-layer wiring model, which includes the first five layers illustrated in FIG. 3 plus another four layers that are similar to layers 2–5 illustrated in FIG. 3. One set of congestion grids for such a wiring model can include the above-mentioned grids 905 and 910 for layers 2–5, and another two grids similar to grids 905 and 910 for layers 6–9.

Another complicated symmetrical wiring model that some embodiments might use is similar to the 9-layer model described above, except that the preferred directions in the last four layers (i.e., layers 6–9) have been shifted by 22.5° in the same direction. This would result in a wiring model that would provide 16-directions of routing from any given point, where each routing-path direction is 22.5° from its neighboring routing-path directions. One set of congestion grids for such a wiring model can include grids 905 and 910 mentioned above for layers 1–5, and another two grids that are 22.5°-shifted versions of grids 905 and 910 for layers 6–9.

V. Pre-Tabulating Routing Information

As mentioned above, some embodiments pre-compute and store routes for different configuration of child slots in a storage structure. At run-time, the router in these embodiments identifies some or all of the routes for a net by (1) identifying the configuration of each net with respect to the partitioning grid, and (2) retrieving from the storage structure the routes for the identified-configurations. One manner of pre-tabulating Steiner-tree routes is described below by reference to FIGS. 20–34.

Other embodiments, on the other hand, use net configurations to generate routes in real time. Yet other embodiments use net configurations to retrieve and generate routes. For instance, some embodiments use net configurations to retrieve pre-tabulated routes for certain nets and to generate routes for other nets. One such approach is described below by reference to FIGS. 35–38.

A. Pre-tabulating Steiner-Tree Routes

FIGS. 20–34 illustrate one manner of pre-tabulating Steiner trees that model possible net configurations with respect to the partitioning grid. The pre-tabulation of attributes of these trees are also described below. As mentioned above, a router can use such pre-tabulated routes and/or attributes during the routing process. Other EDA applications can also use these routes and/or attributes. For instance, as disclosed in U.S. patent application entitled "Recursive Partitioning Placement Method and Apparatus", filed on Dec. 6, 2000, and having the Ser. No. 09/732,181, placers might use pre-tabulated wirelength, path-count values, and/or path-probability values to measure the cost of a placement.

1. Calculating the Length of an Interconnect Line Connecting Two Nodes of a Tree.

Figure 20:
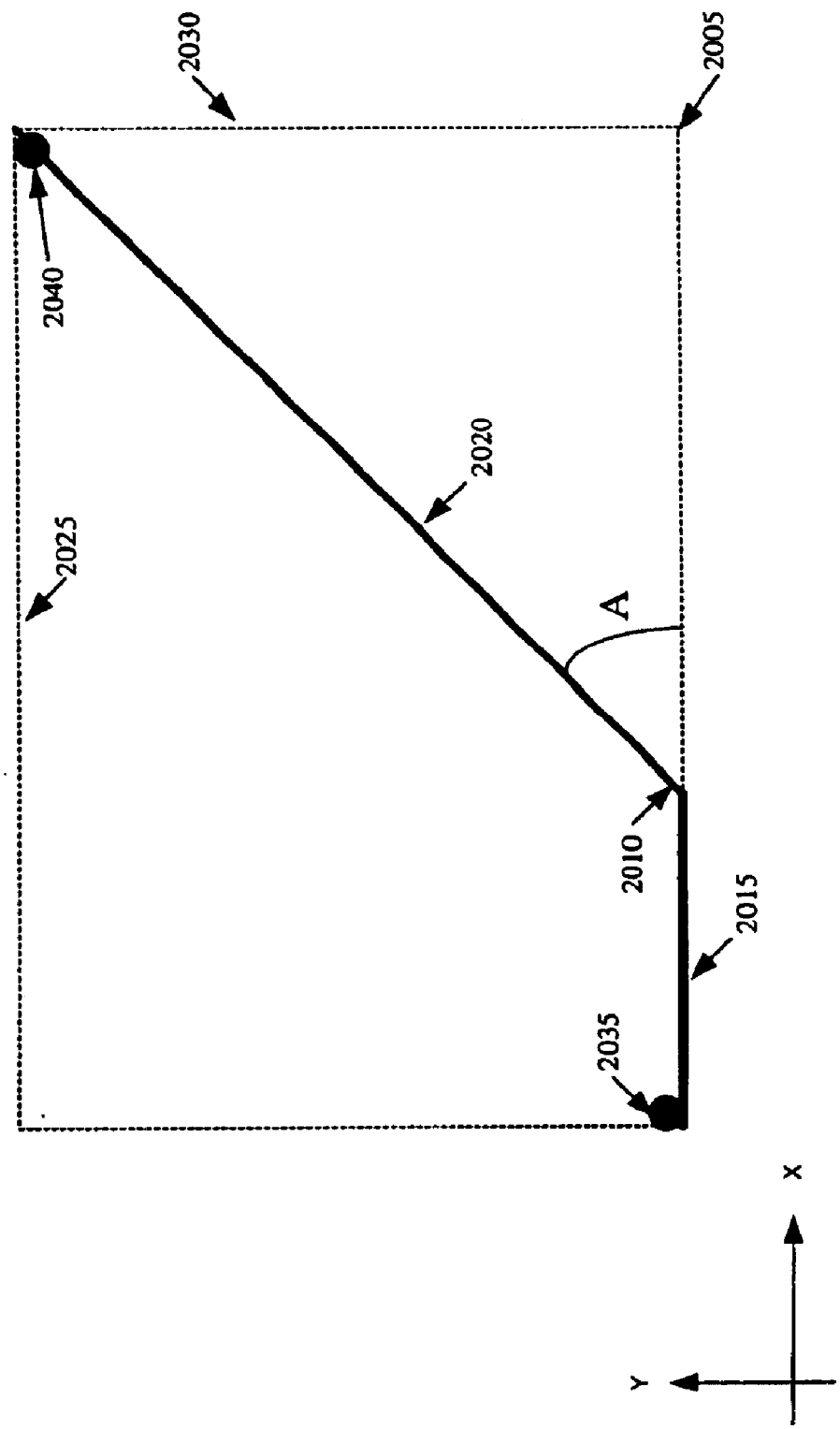
FIGS. 20 and 21 illustrate how some embodiments calculate the length of an interconnect line connecting two nodes of a tree.
Figure 21:
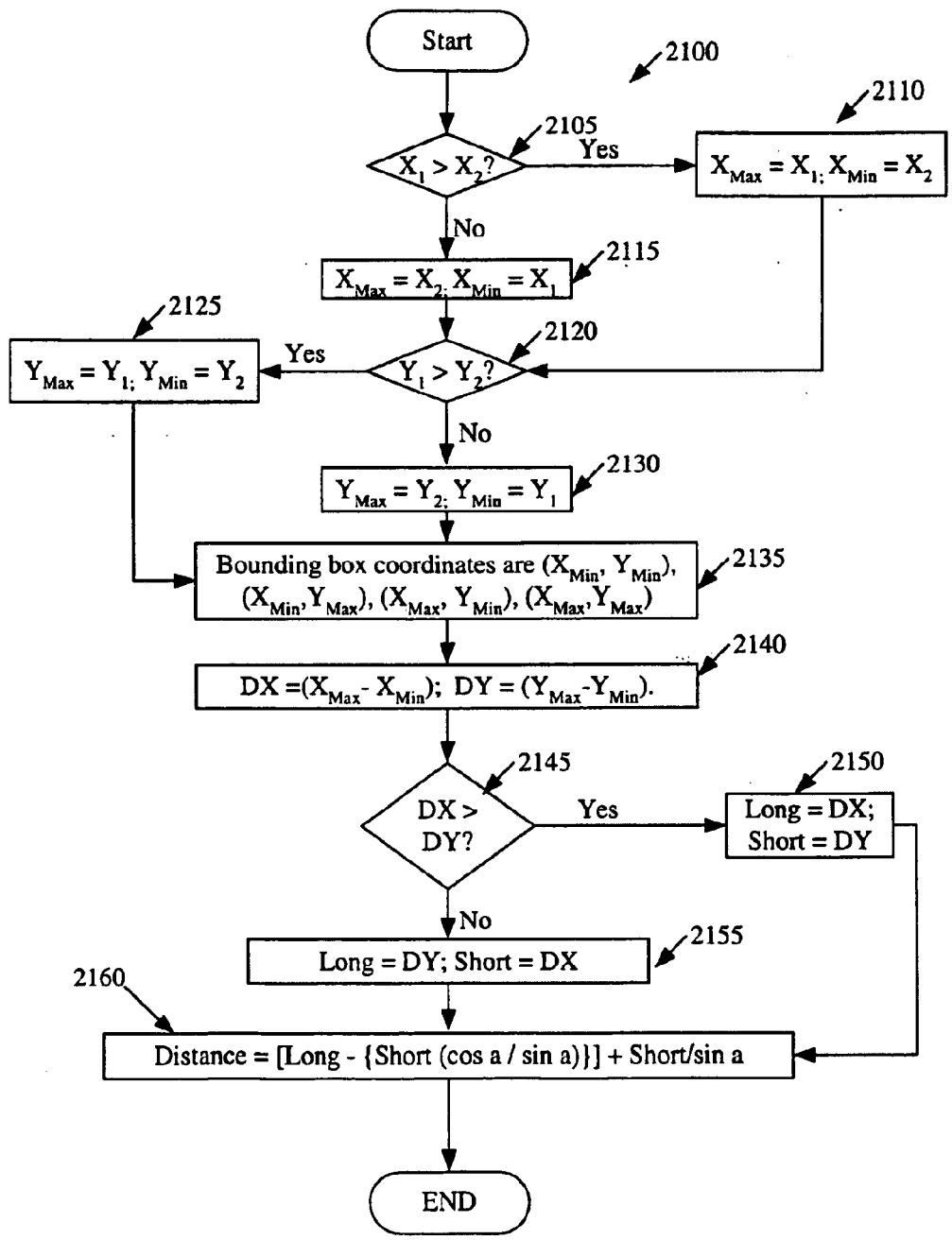

FIGS. 20 and 21 illustrate how some embodiments calculate the length of an interconnect line connecting two nodes of a tree. These embodiments perform these operations by treating the two nodes as opposing corners of a bounding box that has a long side (L) and a short side (S).

FIGS. 20 presents an example of a bounding-box 2005 for two nodes 2035 and 2040. As shown in this figure, the line 2010 traverses the shortest distance between nodes 2035 and 2040 for layouts that utilize horizontal, vertical, and diagonal interconnect lines. This line is partially diagonal. Specifically, in this example, one segment 2020 of this line is diagonal, while another segment 2015 is horizontal.

Equation (A) below provides the distance traversed by line 2010 (i.e., the minimum distance between the nodes 2035 and 2040).

$$\text{Distance} = [L - \{S(\cos A/\sin A)\}] + S/\sin A \tag{A}$$

In this equation, "L" is the box's long side, which in this example is the box's width 2025 along the x-axis, while "S" is the box's short side, which in this example is its height 2030 along the y-axis. Also, in this equation, "A" is the angle that the diagonal segment 2020 makes with respect to the long side of the bounding box. In some embodiments, this angle A corresponds to the direction of some of the diagonal interconnect lines in the layout. For instance, in some embodiments, the angle A equals 45° when the layout uses the octagonal wiring model illustrated in FIG. 3.

Equations (B)–(D) below illustrate how Equation (A) is derived. The length of the line 2010 equals the sum of the lengths of its two segments 2015 and 2020. Equation (B) provides the length of the horizontal segment 2015, while Equation (C) provides the length of the diagonal segment 2020.

$$\text{Length of } 2015 = L - (\text{Length of } 2020) * (\cos A) \quad \text{(B)}$$

$$\text{Length of } 2020 = S/\sin A \quad \text{(C)}$$

Equations (B) and (C) can be combined to obtain Equation (D) below, which when simplified provides Equation (A) above.

$$\begin{aligned} \textit{Distance} &= \text{Length of } 2015 + \text{Length of } 2020 \quad \text{(D)} \\ &= L - S/\sin A * (\cos A) + S/\sin A \end{aligned}$$

When the angle A equals 45°, Equation (A) simplifies to Equation (E) below.

$$\textit{Distance} = L + S*(\text{sqrt}(2)-1) \quad \text{(E)}$$

When the bounding box has no width or height, then the bounding box is just a line, and the minimum distance between the opposing corners of this line is provided by the box's long (and only) side, which will be a horizontal or vertical line. When the bounding box has equal sized height and width (i.e., when it is a square) and the angle A is 45°, a line that is completely diagonal specifies the shortest distance between the box's two opposing corners.

FIG. 21 illustrates a process 2100 that identifies a bounding box for two nodes of a tree, and calculates the length of an interconnect line connecting the two nodes based on the bounding box's dimensions and Equation (A). This process initially (at 2105) determines whether the x-coordinate ($X_1$) of the first node is greater than the x-coordinate ($X_2$) of the second node. If so, the process defines (at 2110) the x-coordinate ($X_1$) of the first node as the maximum x-coordinate ($X_{Max}$), and the x-coordinate ($X_2$) of the second node as the minimum x-coordinate ($X_{Min}$). Otherwise, the process defines (at 2115) the x-coordinate ($X_2$) of the second node as the maximum x-coordinate ($X_{Max}$), and the x-coordinate ($X_1$) of the first node as the minimum x-coordinate ($X_{Min}$).

Next, the process determines (at 2120) whether the y-coordinate ($Y_1$) of the first node is greater than the y-coordinate ($Y_2$) of the second node. If so, the process defines (at 2125) the y-coordinate ($Y_1$) of the first node as the maximum y-coordinate ($Y_{Max}$), and the y-coordinate ($Y_2$) of the second node as the minimum y-coordinate ($Y_{Min}$). Otherwise, the process defines (at 2130) the y-coordinate ($Y_2$) of the second node as the maximum y-coordinate ($Y_{Max}$), and the y-coordinate ($Y_1$) of the first node as the minimum y-coordinate ($Y_{Min}$).

The process then defines (at 2135) the four coordinates of the bounding box as ($X_{MIN}$, $Y_{MIN}$), ($X_{MIN}$, $Y_{MAX}$), ($X_{MAX}$, $Y_{MIN}$), and ($X_{MAX}$, $Y_{MAX}$). Next, the process determines (at 2140) the bounding-box's width and height. The process determines (1) the width by taking the difference between the box's maximum and minimum x-coordinates, and (2) the height by taking the difference between the box's maximum and minimum y-coordinates. The process then determines (at 2145) whether the computed width is greater than the computed height. If so, the process defines (2150) the width as the long side and the height as the short side. Otherwise, the process defines (at 2155) the width as the short side and the height as the long side.

After 2150 or 2155, the process then uses (at 2160) the above-described Equation (A) to compute the length of the shortest interconnect line that connects the two nodes. The process then ends.

2. Constructing Steiner Trees for All Possible Net Configurations and Pre-tabulating Length and Wiring Path Information for Each Tree.

Figure 22:
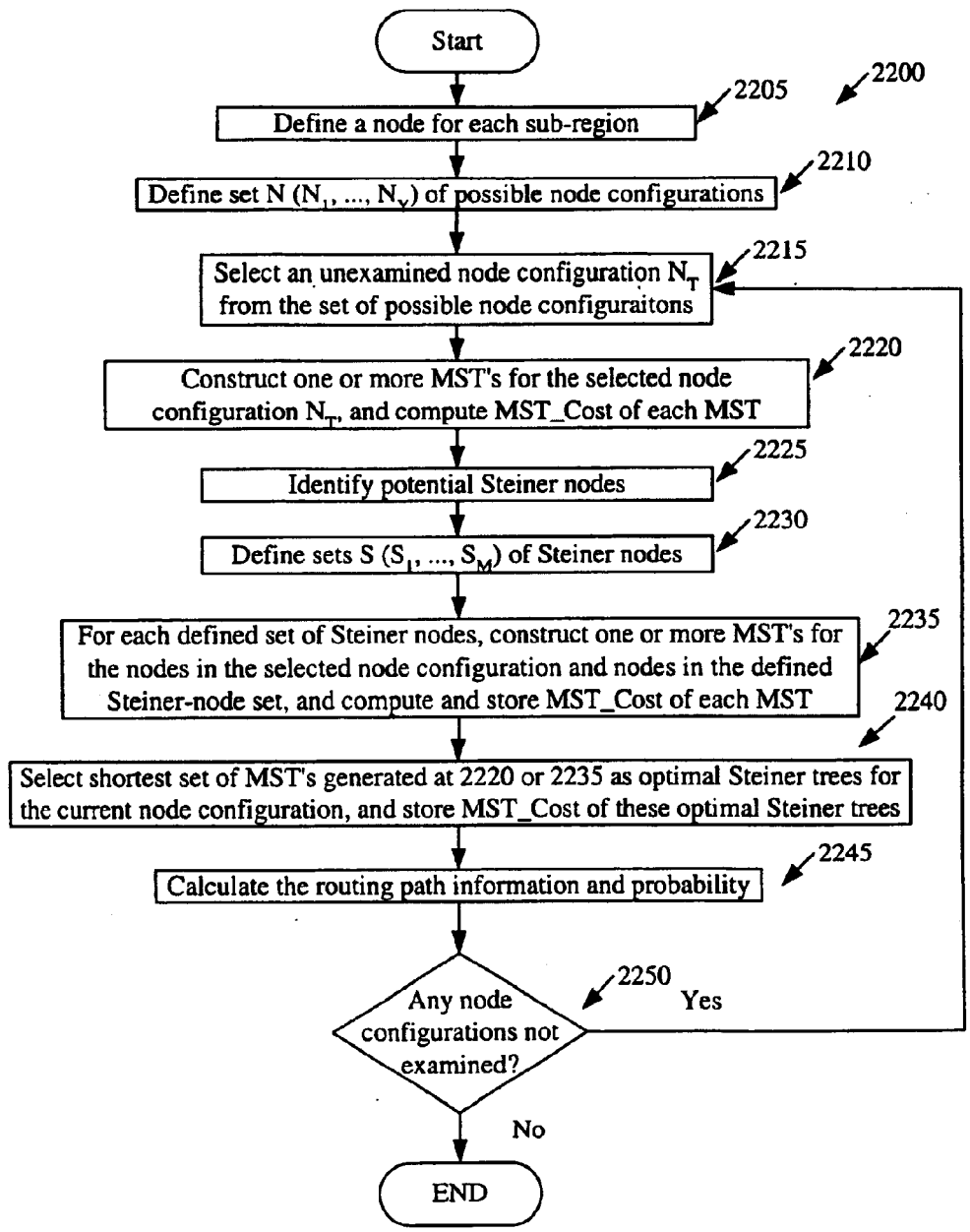
FIG. 22 illustrates a process that constructs one or more optimal Steiner trees for each possible net configuration with respect to a partitioning grid, and stores the trees and their attributes.

FIG. 22 illustrates a process 2200 that (1) constructs one or more optimal Steiner trees for each possible net configuration with respect to a partitioning grid, (2) stores the length of each constructed Steiner tree in a storage structure, such as a look-up table ("LUT"), (3) computes and stores the probability of the trees using each wire path in the grid, and (4) stores the identity of each tree by storing the wire paths for each tree in the storage structure.

This process 2200 is performed before the router starts its operation, so that the router does not have to construct in real-time Steiner trees for each net configuration. Instead, because of process 2200, the router needs only (1) to identify the configuration of each net with respect to the partitioning grid, and (2) to retrieve stored attributes for the identified configuration.

Figure 23:
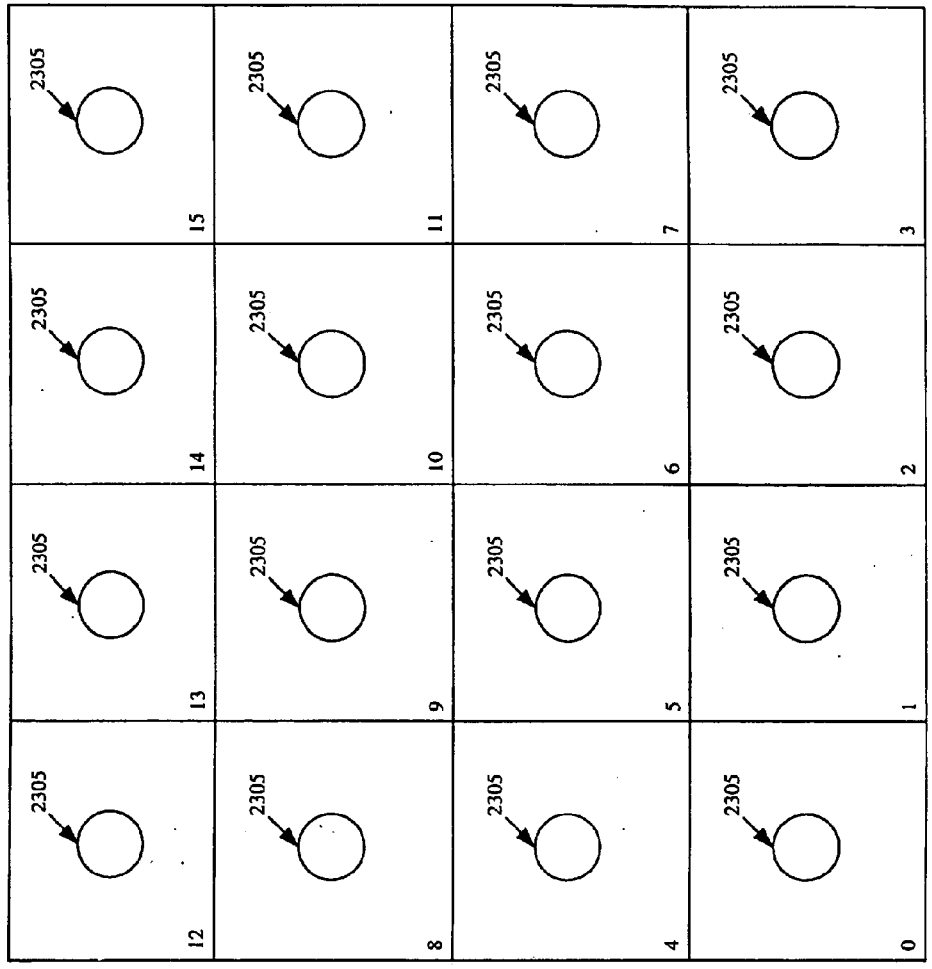
FIG. 23 pictorially illustrates sixteen tree nodes for sixteen slots created by a 4-by-4 partitioning grid.

As shown in FIG. 22, process 2200 initially starts (at 2205) by defining a tree node for each sub-region (also called slot) defined by a particular partitioning grid. FIG. 23 pictorially illustrates sixteen tree nodes 2305 for sixteen slots created by a 4-by-4 partitioning grid. These nodes represent all the potential nodes of trees that model the interconnect topologies of all the net configurations. In FIG. 23, the identified nodes are positioned at the center of each slot. In other embodiments, the nodes can uniformly be defined at other locations in the slots (e.g., can be uniformly positioned at one of the corners of the slots).

Next, the process 2200 defines (at 2210) a set N of possible node configurations. When the partitioning grid defines Y (e.g., four, nine, sixteen, twenty, etc.) sub-regions, set N includes $2^Y$ node configurations. After defining the set N of possible node configurations, the process 2200 select (at 2215) one of the possible node configurations $N_T$ from this set.

Figure 25A:
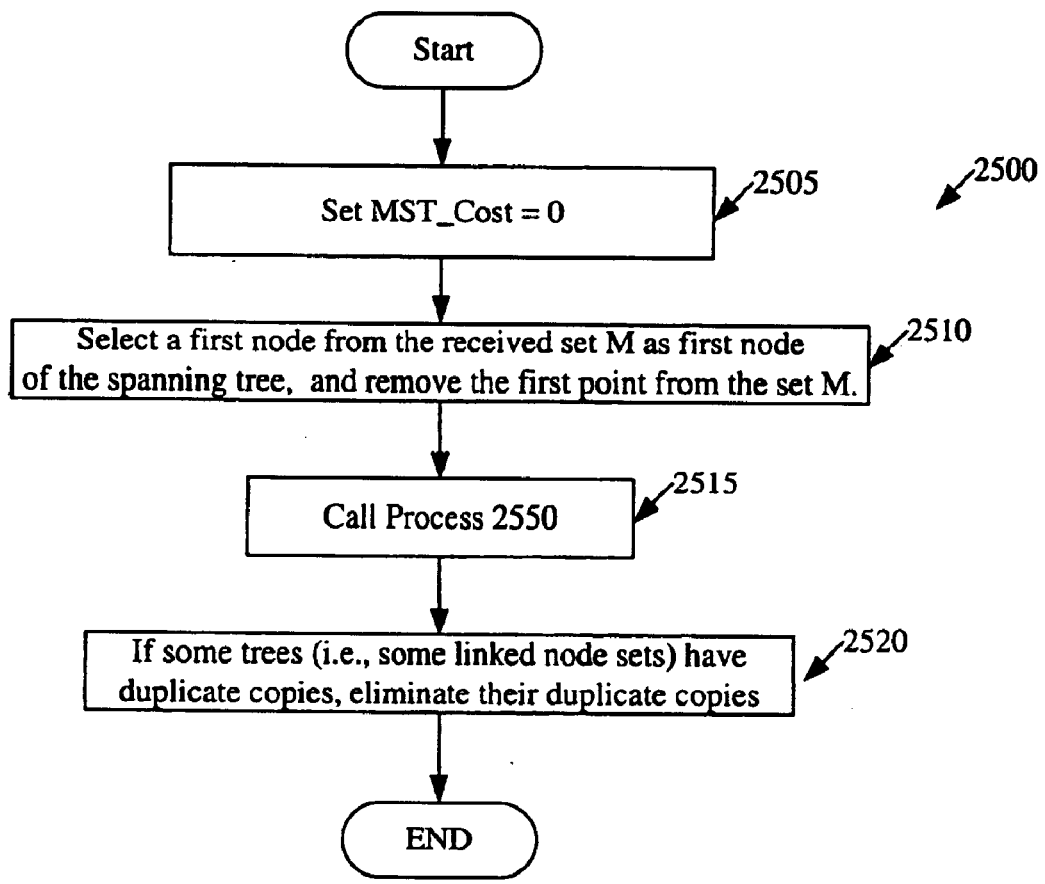
FIGS. 25A and 25B illustrate a process for that constructing one or more minimum spanning trees (MST's) and computing each MST's length for node configurations with two or more nodes.

The process then constructs (at 2220) one or more minimum spanning trees ("MST's") for the node configuration selected at 2215, and computes each constructed tree's length (MST_Cost). As further described below, each constructed MST can have edges that are completely or partially diagonal. A node configuration that has less than two nodes does not have a MST, and accordingly its MST_Cost is zero. In addition, FIG. 25A illustrates a process 2500 that constructs one or more MST's and computes each MST's length for node configurations with two or more nodes. This process 2500 will be described further below.

After 2220, the process 2200 identifies (at 2225) potential Steiner nodes, and then defines (at 2230) all possible sets of Steiner nodes. One manner of identifying potential Steiner nodes will be explained below by reference to FIG. 24. Each set of Steiner nodes that is defined at 2230 includes one or more of the Steiner nodes identified at 2225. Also, each defined set of Steiner nodes has a maximum size that is two nodes less than the number of nodes in the selected node configuration.

For each set of Steiner nodes identified at 2230, the process then (at 2240) (1) constructs one or more MST's of the nodes in the selected node configuration and the selected Steiner-node set, and (2) computes and stores each MST's length (MST_Cost). Each constructed MST can use edges that are completely or partially diagonal. As mentioned above, a node configuration that has less than two nodes does not have a MST, and accordingly its MST_Cost is zero. In addition, FIG. 25A illustrates a process 2500 that constructs one or more MST's and computes each MST's length for node configurations with two or more nodes. This process 2500 will be described further below.

Next, the process 2200 selects (at 2240) the shortest set of the MST's generated at 2220 or 2235 as the optimal Steiner trees for the current node configuration. In other embodiments, this process uses other criteria to select its set of Steiner trees. At 2240, the process also stores in a storage structure (such as a LUT) the length (MST_Cost) of the Steiner tree or trees identified at 2240.

After selecting one or more Steiner trees for the current node configuration at 2240, the process 2200 calls (at 2245) a process 2600 to calculate the routing-path information and the path-usage probabilities resulting from the selected Steiner trees. This process will be described below by reference to FIG. 26.

The process 2200 next determines (at 2250) whether it has examined all the node configurations in the set N defined at 2210. If not, the process returns to 2215 to select an unexamined node configuration from this set and then repeat operations 2220–45 for the newly selected node configuration. Otherwise, the process ends.

Figure 24:
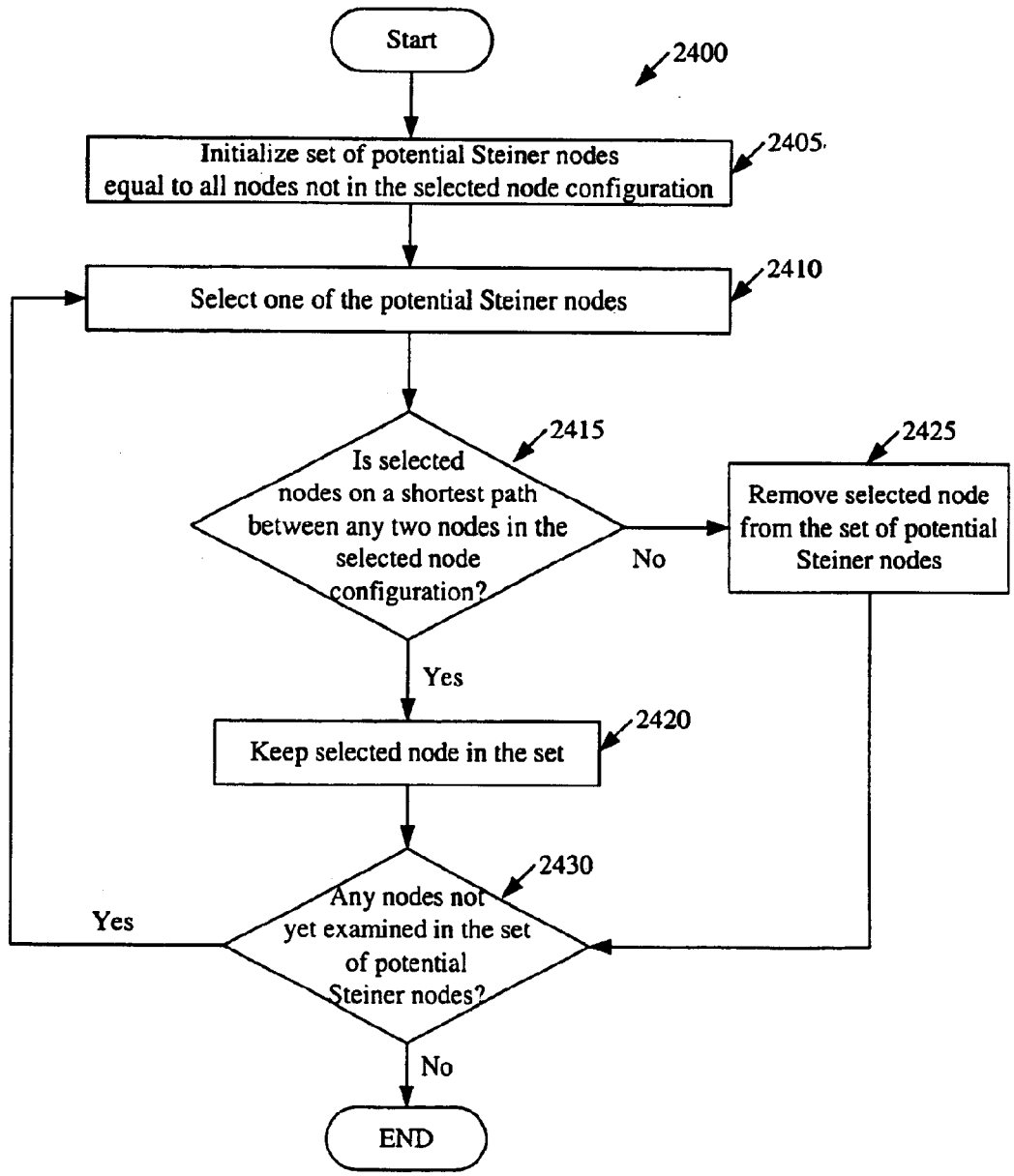
FIG. 24 illustrates a process for identifying potential Steiner nodes.

FIG. 24 illustrates a process 2400 for identifying potential Steiner nodes. The process 2400 of FIG. 24 only needs to be performed for node configurations with three or more nodes, because each set of Steiner nodes defined at 2220 has a maximum size that is two nodes less than the number of nodes in the selected node configuration (i.e., because Steiner-node sets are not defined at 2220 for node configurations with two or fewer nodes).

The process 2400 starts (at 2405) by initializing a set P of potential Steiner nodes equal to all the nodes defined at 2205 that are not part of the node configuration selected at 2215. This process then selects (at 2410) one of the potential Steiner nodes. Next, the process 2400 determines (at 2415) whether the node (Q) selected at 2410 is on a shortest path between any two nodes in the selected node configuration. To make this to determination, the process determines whether any two nodes (B and C) exit in the node configuration such that the distance between the two nodes (B and C) equals the sum of (1) the distance between the first node (B) and the selected node (Q), and (2) the distance between the second node (C) and the selected node (Q). In some embodiments, the process uses the above-described process 2100 and Equation (A) to calculate the distance between any pair of nodes.

If the process determines that the node Q selected at 2410 lies on a shortest path between any two nodes in the node configuration, the process keeps (at 2420) the selected node in the set P of potential Steiner nodes, flags this node as a node that it has examined, and transitions to 2430, which is described below. On the other hand, if the selected node (Q) is not on the shortest path between any two nodes in the selected node configuration, the process removes (at 2425) the selected node from the set P of potential Steiner nodes, and transitions to 2430.

At 2430, the process determines whether it has examined all the nodes in the set of potential Steiner nodes. If not, the process returns to 2410 to select another node in this set so that it can determine at 2415 whether this node is on a shortest path between any two nodes in the selected node configuration. When the process determines (at 2430) that it has examined all the nodes in the set of potential Steiner nodes, it ends.

FIG. 25A illustrates a process 2500 that the process 2200 of FIG. 22 uses at 2220 and 2235 to construct minimum spanning trees. A minimum spanning tree for a SD node configuration is a tree that has N−1 edges that connect (i.e., span) the N nodes of the configuration through the shortest route, which only branches (i.e., starts or ends) at the nodes.

In some embodiments of the invention, the edges of the MST's can be horizontal, vertical, or diagonal. The diagonal edges can be completely or partially diagonal. Also, when the layouts use diagonal interconnect lines (e.g., ±45° interconnect lines), the diagonal edges of the MST's can be in the same direction (e.g., can be in ±45° direction) as some of the diagonal interconnect lines in the layout. For instance, when the layout uses an octagonal wiring model (i.e., uses horizontal, vertical, and 45° diagonal lines), some embodiments construct MST's that have horizontal, vertical, and 45° diagonal edges.

By treating the two nodes of each edge of an MST as two opposing corners of a bounding box, the length of each edge can be obtained by using the above-described process 2100 and Equation (A).

$$\text{Distance} = [L - \{S(\cos A/\sin A)\}] + S/\sin A \quad (A)$$

As described above, in this equation, "L" is the box's long side, "S" is the box's short side, and "A" is the angle that the diagonal segment of the edge makes with respect to the long side of the bounding box.

The process 2500 starts whenever the process 2200 calls it (at 2220 or 2235) (1) to construct one or more MST's for a set M of nodes, and (2) to calculate the length of each constructed MST. This process initially (at 2505) sets the MST length (MST_Cost) to zero. Next, the process (at 2510) (1) selects a node from the received set M of nodes as the first node of the spanning tree, and (2) removes this node from this set M.

Figure 25B:
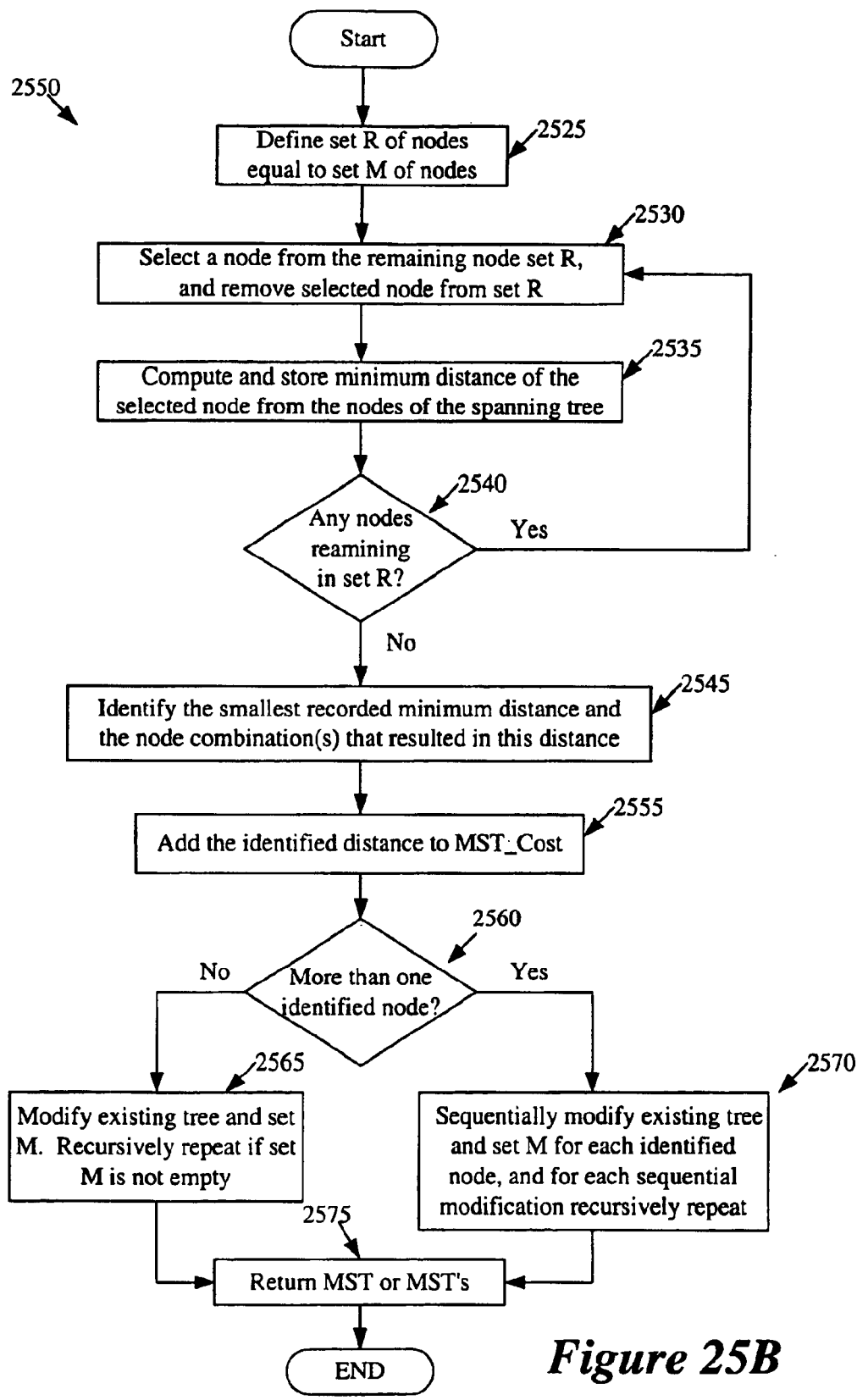

The process 2500 then calls (at 2515) a process 2550 illustrated in FIG. 25B, in order to identify one or more linked set of nodes that represent one or more complete MST's. The process 2550 is a recursive process that, when called, receives (1) a set of nodes that represents an incomplete MST, and (2) a set of nodes M that are the nodes of the node configuration that have not yet been added to the received incomplete MST. When the process 2500 calls the process 2550, it supplies the process 2550 the first node selected at 2510, and the modified set of remaining nodes M. In response, the recursive process 2550 returns one or more linked set of nodes that represent one or more MST's, as further described below. The process 2550 might return more than one copy of the same linked node set. Accordingly, after the process 2500 receives one or more linked node sets from process 2550, the process 2500 eliminates (at 2520) any duplicate copy of the same received linked node set, so that there is only one copy of each received node set. After 2520, the process 2500 returns the constructed MST's and their lengths, and then ends.

As shown in FIG. 25B, the process 2550 defines (at 2525) a remainder set R of nodes equal to the set M of nodes that it received when it was called. At 2530, the process 2550 selects a node from the remaining node set R, and removes the selected node from the set of remaining nodes. The process then computes and stores (at 2535) the distance between the node selected at 2530 and each current node of the received incomplete MST. The distance between the selected node and each node can be traversed by an edge that is completely or partially diagonal. Hence, in some embodiments, the process 2550 uses the above-described process 2100 and Equation (A) to compute the minimum distance between the selected node and each node.

Next, the process determines (at 2540) whether there is any node remaining in set R. If so, the process returns to 2530 to select another node from this set, so that it can compute (at 2535) the distance between this node and the current nodes of the spanning tree. Otherwise, the process (at 2545) identifies the smallest distance recorded at 2535, and identifies the node pair or pairs (where, in each pair one node is from the received set M and one node is from the received MST) that resulted in this distance.

The process 2550 then (at 2555) adds the identified smallest distance to the MST length (MST_Cost). Next, the process determines (at 2560) whether it identified more than one pair of closest nodes. If not (i.e., if the identified minimum distance is between only one node in set M and only one node in the MST), the process (at 2565) (1) defines a tree node corresponding to the set-M node identified at 2545, (2) removes the identified node from set M, and (3) links the defined tree node to the MST node identified at 2545. At 2565, the process 2550 also recursively calls itself and supplies the modified MST and the modified set M, when set M is empty after the removal of the identified node. On the other hand, when the modified set M is empty, the process 2550 transitions from 2565 to 2575, where it returns one set of nodes that represents one complete MST that was completed by the linking at 2565. After 2575, the process 2550 terminates.

If the process 2550 determines (at 2560) that it identified (at 2545) more than one "closest" node pairs, it sequentially and recursively tries to obtain a complete MST based on each identified closest node pair. In other words, this process initially selects one of the identified node pairs, and then (1) removes the selected pair's set-M node from set M, (2) links the removed node to the pair's MST node, and (3) recursively repeats for the modified MST and the modified set M. Once the process 2550 receives the results of this recursion (i.e., when this process receives the complete MST's for the selected node pair), it then selects the next identified node pair, and performs the same three operations in order to obtain complete MST's based on this node pair. The process continues in this manner until it generates the MST's based on each of the identified "closest" node pairs. After sequentially processing each identified node pair, the process returns (at 2575) the MST's, and then terminates.

Figure 26:
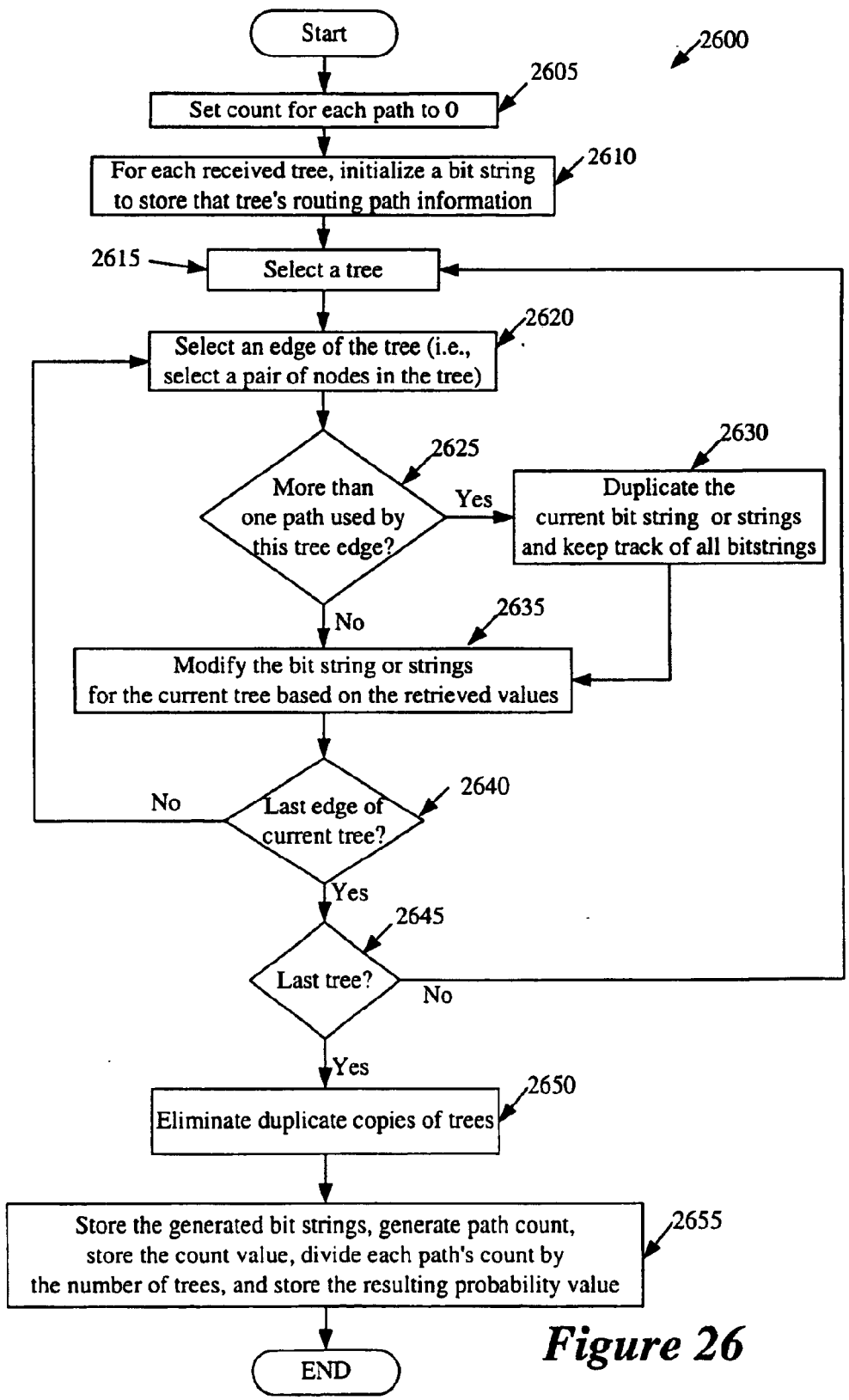
FIG. 26 illustrates a process that calculates the routing-path information and the path-usage probabilities.

FIG. 26 illustrates a process 2600 that calculates the routing-path information and the path-usage probabilities resulting from the Steiner trees selected at 2250. This process 2600 starts each time process 2200 calls it at 2245 and provides it with a set of Steiner trees.

The process 2600 starts by initializing (at 2605) a global count variable that stores a count value for each path. For each received tree, the process initializes (at 2610) a bit string for storing that tree's routing path information. The process then selects (at 2615) a received Steiner tree, and selects (at 2620) one of the edges in the tree (i.e., selects a pair of linked nodes in the tree, where these nodes were linked at 2565 or 2570 of process 2550). Next, the process determines (at 2625) whether more than one set of paths exist to route the selected tree edge (i.e., to connect the selected pair of nodes). In some embodiments, the process retrieves the path values for the selected tree edge from a storage structure (e.g., a LUT) that stores path-usage values for any combination of the tree slot nodes. In other words, this storage structure maps the endpoints of each possible tree edge within the grid to a set of path-usage values.

When the tree edge endpoints are not adjacent (i.e., when the pair of nodes selected at 2620 are not adjacent), more than one optimal route might exist between the endpoints (i.e., between the node pairs). Hence, the path-usage values in the LUT might specify values for multiple optimal routes.

Two sets of node connections that could represent, the three Steiner trees shown in FIGS. 6–8 are (1) node set formed by node 610-node 615-Steiner node 620-node 625-node 630 for the Steiner tree 605 of FIG. 6, and (2) the node set formed by node 625-node 610-node 615-node 635 for the Steiner trees of FIGS. 7 or 8.

In the first set of nodes representing the Steiner tree 605 of FIG. 6, only one route exists between any two connected pairs of nodes. Hence, for any pair from this set, the mapping LUT would return 42 values, with all the values equal to 0 except the value for the path between the selected node pair. This non-zero value would be 1 to indicate that only one route exists between the selected node pair.

On the other hand, for the second set of nodes representing either Steiner tree 705 or 805, two routes exist between nodes 615 and 630. The Steiner tree 705 uses one of these routes, while the Steiner tree 805 uses the other. For this node pair (i.e., for nodes 615 and 630) in this node set, the mapping LUT would return two 42-bit strings, one for Steiner tree 705 and one for Steiner tree 805. The bit string for tree 805 has values for paths 1 and 28 set to 1 and the remaining values set to 0, while the bit string for tree 705 will have values for paths 5 and 26 set to 1 and the remaining values set to 0.

If the process did not retrieve more than one bit string at 2625, it transitions to 2635, which will be described below. Otherwise, when the process retrieves N bit strings (where N is an integer equal or greater than 2) for N routes for routing the selected tree edge (i.e., for connecting the selected pair of nodes), the process makes N−1 duplicate copies of the current bit string or strings of the current tree, and embeds the different routes among the copies of the tree.

In other words, the process makes (at 2630) N−1 duplicate copies of the bit string or strings of the current tree; a bit string for the current tree was initialized at 2610, and the current tree will have multiple bit strings if its bit string was previously duplicated at 2630. From 2630, the process transitions to 2635.

At 2635, the process modifies the bit string or strings for the current tree with the bit string or strings (retrieved at 2625) for the selected tree edge. Next, the process determines (at 2640) whether it has examined the last edge of the current tree (i.e., whether it has examined the last linked node pair in the current tree). If not, the process transitions back to 2620 to select the next tree edge (i.e., the next linked node pair).

When the process determines (at 2640) that it has examined the last tree edge, it then determines (2645) whether it has examined the last tree supplied by the process 2200. If not, the process returns to 2615 to select another tree and then determine the path-usage for this tree. Otherwise, the process transitions to 2650.

By the time the process 2600 reaches 2650, it has generated bit-string representation of one or more trees. Each tree's bit-string representation is a 42-bit string. As mentioned above, one node-representation of a tree might result in multiple bit-string representations when the tree's node set has one or more pairs of linked nodes that are not adjacent and one or more sets of paths exist between the non-adjacent linked pairs.

In addition, a node configuration selected at 2215 might result in different MST node representations (i.e., different node-represented MST's) that produce identical MST bit representations (i.e., produce identical bit-represented MST's). Accordingly, at 2650, the process examines all the bit-string-represented trees and eliminates any duplicate copy of the same bit-string-represented tree.

When a node configuration selected at 2215 results in a large number of bit-string-represented trees, the process 2600 can use a binary search tree ("BST") to quickly sort and search the trees and thereby quickly identify and eliminate duplicate copies of the same tree. One such BST is described below by reference to FIGS. 32 and 33.

All the bit-represented trees that remain after 2650 are unique. Hence, after eliminating duplicate copies of the same trees, the process 2600 stores (at 2655) all bit-string-represented trees that remain in a storage structure (such as a LUT). As described in the example below, each bit string specifies the route of a routing tree for the current node configuration. Specifically, as described in the example below, each stored bit string specifies the routing paths that a routing tree for the current node configuration traverses. At 2655, the process increments each path value of the global count variable with each bit-string-represented tree's corresponding path value, in order to generate a total count value for each path. The process then records this usage count for each path. Also, for each particular path, the process (at 2650) (1) divides the usage count by the number of the trees remaining after 2650 in order to obtain the usage probability value of the particular path, and then (2) stores this resulting probability value. The process then ends.

For the Steiner trees shown in FIGS. 6–8, the process 2600 would identify three strings of 42-bits that specify the routing path information for the three trees 605, 705, 805. These three bits strings for trees 605, 705, and 805 would respectively be:

000000000010000000000000000010000000110001;
000000000000000100000000010001000000100001;
000000000000001000000000001000100000000011.

Figure 28:
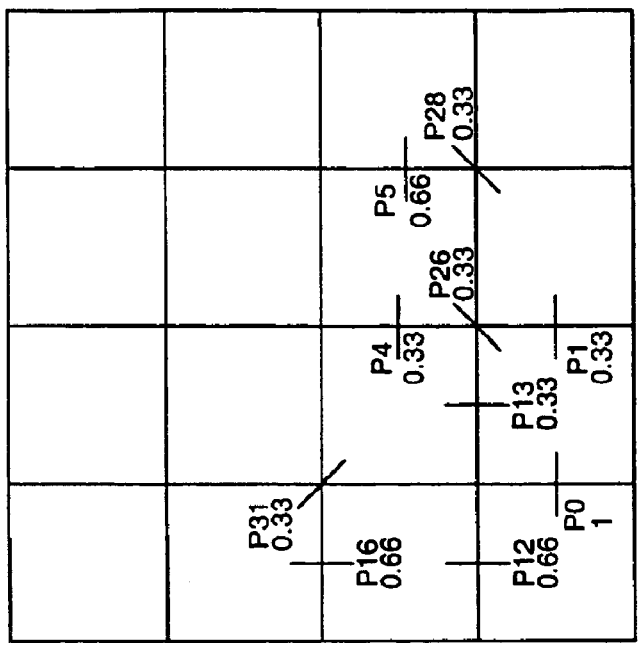
FIGS. 27 and 28 respectively illustrate examples of path-usage counts and path-usage probabilities for the Steiner trees of FIGS. 6–8.
Figure 27:
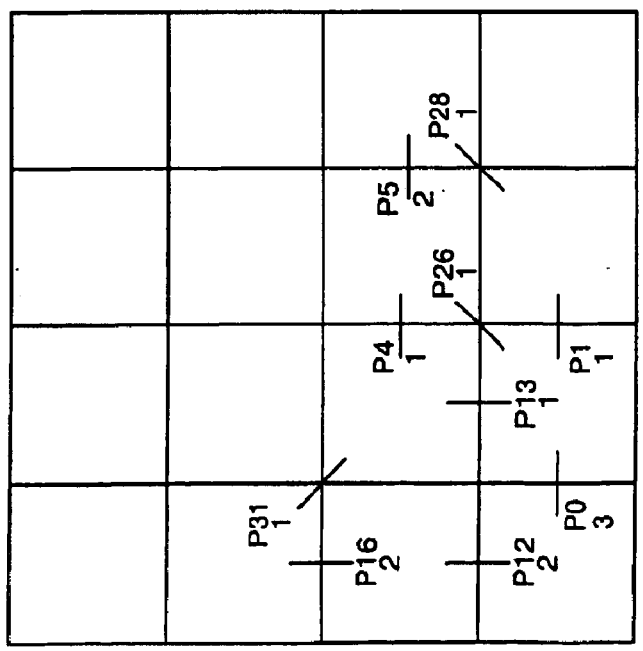

(In this document, the least significant bit ("LSB") of a bitstring is the rightmost bit, and the most significant bit ("MSB") of the bitstring is the leftmost bit.) FIGS. 27 and 28 respectively illustrate examples of path-usage counts and path-usage probabilities for the Steiner trees 605, 705, and 805 of FIGS. 6–8. In the discussion below, path-usage probability values are referred to as "probabilistic Steiner tree values."

3. Retrieving Steiner Trees

When the Steiner-tree routes are pre-tabulated according to process 2200, a router at run-time identifies one or more Steiner-tree attributes (e.g., routes) for a net in the following manner. The router first identifies the net's configuration with respect to the partitioning grid. It then uses the identified configuration to retrieve one or more attributes (e.g., routes) that are stored for the identified configuration in the storage structure.

In some embodiments, the storage structure is a look-up table ("LUT") of floating point numbers. In some of these embodiments, the LUT is indexed by a configuration code. In other words, to retrieve a particular attribute for a particular net configuration, the configuration code for the net configuration is identified, and this configuration code is used to identify the entry in the LUT that stores the desired attribute.

Some embodiments use the octagonal wiring model illustrated in FIG. 3, and specify each net's routing path in terms of the 42 diagonal and Manhattan routing paths illustrated in FIG. 12. In some of these embodiments, the LUT stores 42-bits for each route, where each bit represents one of the 42 paths. Also, each net's configuration code is a 16-bit number, where each bit represents a sub-region defined by the 4×4 partitioning grid. Each configuration-code bit is set (e.g., equals 1) when the associated net has a pin in the sub-region represented by the configuration-code bit, and is not set (e.g., equals 0) when the associated net does not have a pin in this sub-region. Also, in these embodiments, there are $2^{16}$ configuration codes that represent the $2^{16}$ possible net configurations.

For instance, the net configuration code is 0000010000000001, when the net has a pin in slots 0 and 9. For such a configuration, some embodiments pre-tabulate two trees, one that uses paths P17 and P24, and another that uses paths P12 and P30. Each of these trees can be specified by a string of 42 bits. The bit string for the first tree is,

000000000000000001000000100000000000000000, while the bit string for the second tree is,

000000000001000000000000000000001000000000000.

Some embodiments store these two bit strings in a LUT, and retrieve these two bit strings by using the 16-bit configuration code of the net configuration 0000010000000001.

4. Storing Steiner Trees in a Compressed Form

Figure 29:
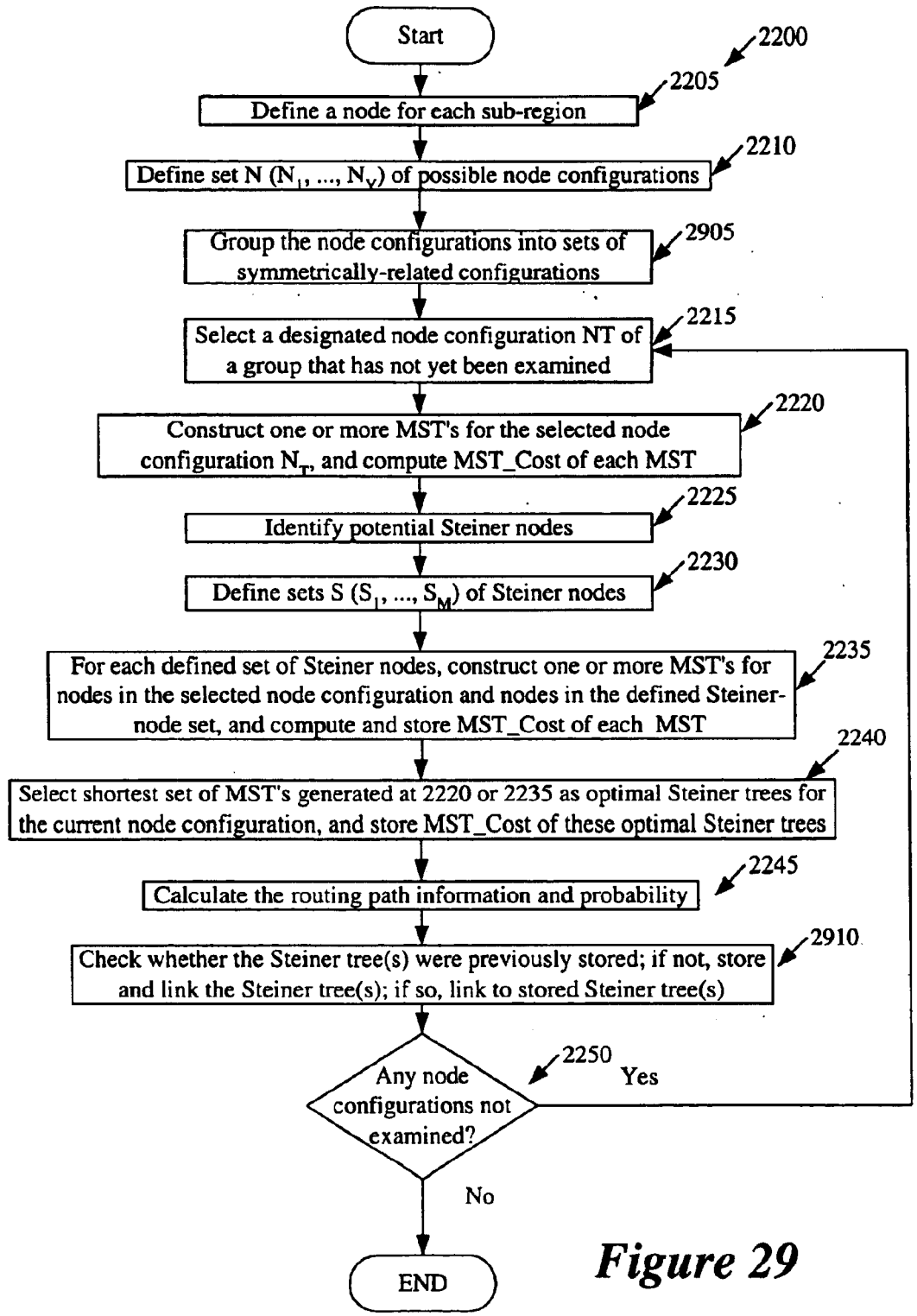
FIG. 29 illustrates a compression technique for storing Steiner-tree routes for sets of net configurations.

A variety of compression techniques can be employed to store and use Steiner-tree routes for sets of net configurations. One such technique is illustrated in FIG. 29. The process 2900 of this figure is similar to the process 2200 described above, except that the process 2900 has two additional operations 2905 and 2910, and has slightly different operations 2215 and 2250. Operations 2205, 2210, and 2220–2245 of process 2900 are identical to similarly numbered operations 2205, 2210, and 2220–2245 of process 2200. Accordingly, these operations 2205, 2210, and 2220–2245 will not be further described below, in order not to obscure the description of the invention with unnecessary detail.

The process 2900 performs the additional operations 2905 and 2910 to reduce the amount of information that is pre-tabulated. The first operation 2905 reduces the number of potential net configurations for which the process 2900 pre-tabulates routes, while the second operation 2910 ensures that the process 2900 stores each Steiner-tree route only once.

Both of these operations are further described below. One of ordinary skill, however, will realize that some embodiments do not use both these operations. For instance, some embodiments might only perform 2910 to ensure that each Steiner-tree route is only stored once.

a. Symmetrical Net Configurations

The operation 2905 groups the potential net configuration identified at 2210 into sets of symmetrical net configurations. From 2215–2250, the process 2900 then generates and stores one set of Steiner trees for one designated net configuration of each group of symmetrical configurations. This flow is directed by 2215 and 2250. At 2215, the process 2900 selects a designated node configuration that it has not previously examined. At 2250, the process determines whether it has examined the designated node configuration for each group of symmetric node configurations. At run-time, the designated configuration of each group directly uses the pre-tabulated routes for its group, while the non-designated configurations of each group generate their routes from the pre-tabulated routes for their group.

Figure 30:
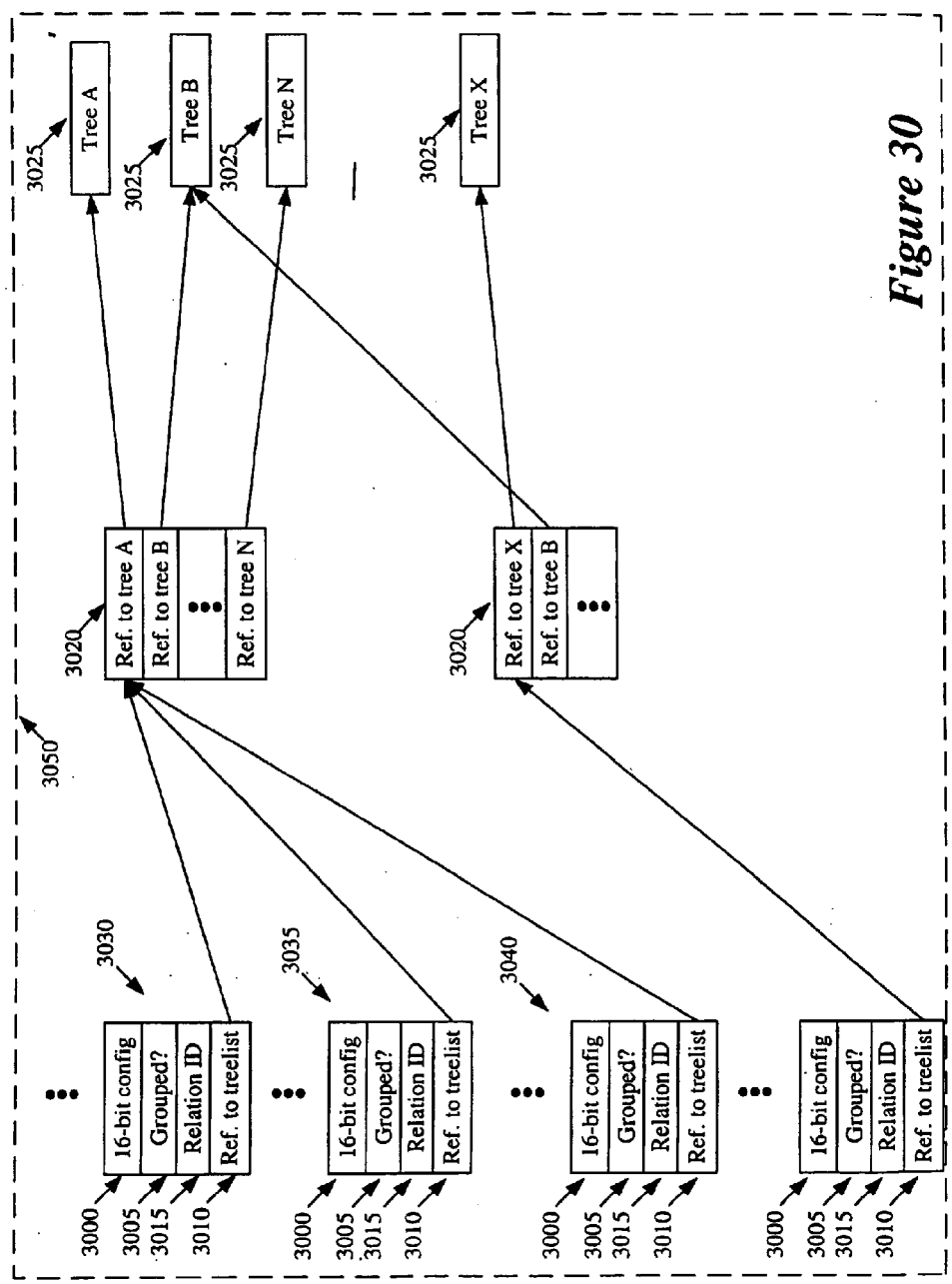
FIGS. 30 and 31 illustrate one technique for grouping node configurations.
Figure 31:
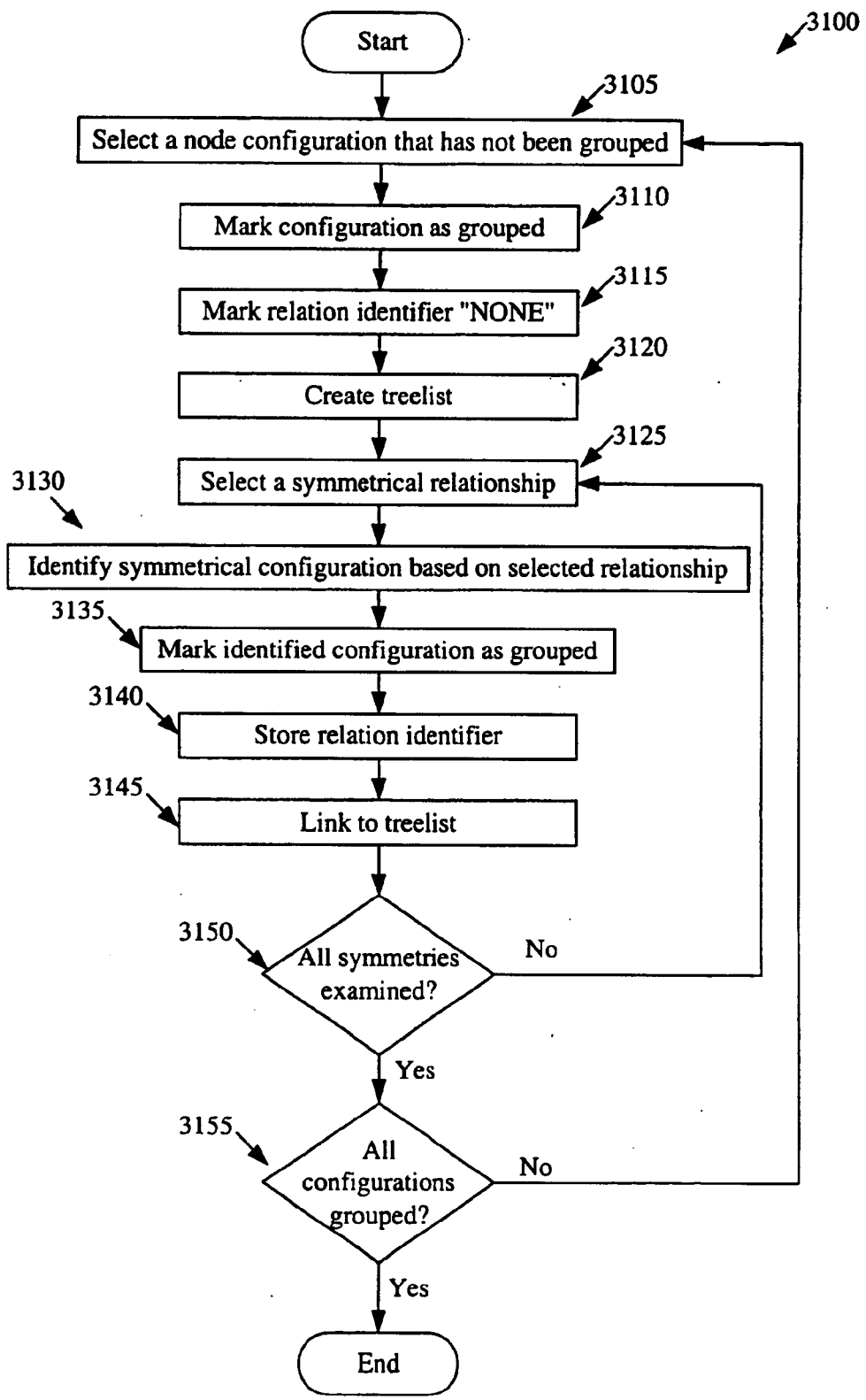

FIGS. 30 and 31 illustrate one technique for performing this grouping. This technique is performed for FIG. 5's 4×4 partitioning grid. In this grid, each net configuration is symmetrical with respect to seven other net configurations. These seven symmetrical configurations can be identified by (1) rotating the net configuration by 90°, (2) rotating it by 180°, (3) rotating it by 270°, (4) flipping the net configuration about the x-axis, (5) rotating the net configuration by 90° and flipping the result about the x-axis, (6) rotating it by 180° and flipping the result about the x-axis, (7) rotating it by 270° and flipping the result about the x-axis.

In the embodiments described below, the rotation and flip operations are defined with respect to a Cartesian coordinate system that has (1) an x-axis parallel to the width of the 4×4 partitioning grid (i.e., width of the layout), (2) a y-axis parallel to the height of the grid, and (3) an origin at the intersection of grid's slots 5, 6, 9, and 10, which are illustrated in FIG. 5. Specifically, the rotation is defined in terms of a clockwise rotation about the origin. The flipping of a configuration involves changing the sign of the y-coordinate of each configuration slot. Table 1 below illustrates an example of eight net configurations that are related based on the above-described symmetrical relationship.

TABLE 1

| Configuration | Slots With Pins | Description of Symmetry |
|---|---|---|
| 0000000100000001 | 0, 9 | Original configuration |
| 0000101000000000 | 10, 12 | Rotate by 90° |
| 1000000000100000 | 6, 15 | Rotate by 180° |
| 0000000000101000 | 3, 5 | Rotate by 270° |
| 0000001000001000 | 5, 12 | Flip about x-axis |
| 1000000100000000 | 0, 6 | Rotate by 90° and flip about x-axis |
| 0001000000100000 | 3, 10 | Rotate by 180° and flip about x-axis |
| 0000000001000001 | 9, 15 | Rotate by 270° and flip about x-axis |

FIG. 31 illustrates a process 3100 for grouping net configurations according to the symmetries described above. FIG. 30 illustrates four data fields that the process 3100 stores for each configuration. The first field 3000 stores the configuration's 16-bit pin distribution (i.e., its net/node configuration). The second field 3005 specifies whether the process 3100 has already grouped the configuration with other configurations.

The third field 3010 is a reference (e.g., a pointer) to a treelist 3020, which includes one or more references to one or more Steiner-tree routes 3025 for the configuration's group. Each configuration in a group refers to the same treelist 3020. For instance, FIG. 30 illustrates three grouped configurations 3030, 3035, and 3040 that refer to the same treelist. The fourth field 3015 stores the symmetrical-relation identifier. This identifier specifies how to obtain trees for the net configuration from the trees stored for the group. In other words, each configuration's identifier specifies how to transform one or more trees that are pre-tabulated for the configuration's group into one or more trees for the configuration.

The process 2900 performs process 3100 at 2905 after the process 2900 defines (at 2210) all sets of potential node configurations. As shown in FIG. 31, the process 3100 initially selects (at 3105) one of the node configurations that was defined at 2210. It then marks (at 3110) this configuration as grouped in its configurations field 3005.

Next, the process records (at 3115) "NONE" in this configuration's relation-identifier field 3015. This marking indicates that the pre-tabulated trees specified for this configuration (i.e., the trees that will be referred to by this configuration's treelist 3020) do not need to be transformed in any manner for the selected node configuration. In each group of configurations, the configuration that has "NONE" recorded in its relation-identifier field is the designated configuration for the group (i.e., it is the configuration that can directly use the Steiner trees that are generated for the group).

At 3120, the process then creates a treelist 3020 for this configuration's group, and links this configuration's reference field 3010 to this treelist. To this treelist, the process 2900 will add (at 2910) references that refer to the trees for this configuration's group.

The process 3100 then selects (at 3125) one of the seven symmetrical relationships described above. It next uses (at 3130) the selected symmetrical relationship to identify one of the seven configurations that are symmetrically related to the configuration selected at 3105. Some embodiments have seven LUT's, one for each symmetrical-transform relationship. Each LUT provides a one-to-one mapping that specifies a symmetrical node for each potential node of a designated node configuration. For instance, Table 2 below identifies the corresponding nodes for the symmetrical configuration that can be obtained by rotating the designated node configuration by 90°.

TABLE 2

| Node of Designated Configuration | Corresponding Node of the 90° Rotated Symmetrical Configuration |
|---|---|
| Slot 0 | Slot 12 |
| Slot 1 | Slot 8 |
| Slot 2 | Slot 4 |
| Slot 3 | Slot 0 |
| Slot 4 | Slot 13 |
| Slot 5 | Slot 9 |
| Slot 6 | Slot 5 |
| Slot 7 | Slot 1 |
| Slot 8 | Slot 14 |
| Slot 9 | Slot 10 |
| Slot 10 | Slot 6 |
| Slot 11 | Slot 2 |
| Slot 12 | Slot 15 |
| Slot 13 | Slot 11 |
| Slot 14 | Slot 7 |
| Slot 15 | Slot 3 |

At 3135, the process then marks the configuration identified at 3130 as grouped in the configuration's field 3005. It next records (at 3140) the identity of the relationship selected at 3125 (e.g., rotated by 90°) in the configuration's relationship-identifier field 3015. This operation can be used at run-time to transform one or more trees that are pre-tabulated for the configuration's group into one or more trees for the configuration identified at 3130.

The process then links (at 3145) the reference field 3010 of the identified configuration to the treelist 3020 for this configuration's group. At 3150, the process then determines whether it has generated all seven configurations that are symmetrically related to the one selected at 3105. If not, the process selects (at 3125) another symmetrical relationship, and then performs 3130–3145 to identify the related configuration and populate its group fields.

When the process determines (at 3150) that it has generated all seven configurations related to the configuration selected at 3105, it determines (at 3155) whether it has examined all node configurations that the process 2900 generated at 2210 (i.e., whether it has marked all generated node configurations as "grouped"). If not, the process transitions to 3105 to select a node configuration that has not yet been marked as "grouped," and repeats the above-described operations for the newly selected configuration and its symmetrically-related configurations. When the process determines (at 3155) that it has examined all node configurations, it ends.

b. Storing Each Tree Only Once

At 2910, the process ensures that the process 2900 stores each Steiner-tree route only once for any node configuration that might use such a route. Like process 2200 of FIG. 22, the process 2900 calls (at 2245) the process 2600 to calculate the routing-path information for the Steiner tree or trees that the process 2900 identified for a node configuration. The process 2600 identifies one or more bit strings to represent each Steiner tree identified by process 2900. The process 2600 also (1) eliminates (at 2650) any duplicate copies of each bit-represented tree that it generates for the same node configuration, and then (2) stores (at 26555) each remaining bit-represented tree.

However, when the process 2600 works in conjunction with process 2900, it does not permanently store (at 2655) each generated bit string. Instead, it returns the generated bit strings to process 2900. The process 2900 then checks (at 2910) whether it previously stored each returned bit string (i.e., each returned Steiner tree) in the storage structure for previous node configuration (i.e., for a node configuration that was previously selected at 2215). If so, the process does not re-store this bit string, but rather links one of the references in the node configuration's treelist 3020 to the previously-stored bit string. If not, the process stores this bit string in the storage structure 3050 of FIG. 30 and links one of the references in the node configuration's treelist 3020 to the newly-stored bit string.

A variety of different techniques can be used to check (at 2910) whether the process 2900 previously stored a bit string in the storage structure 3050. The embodiments described below use a binary-search tree to perform this checking operation.

Figure 32:
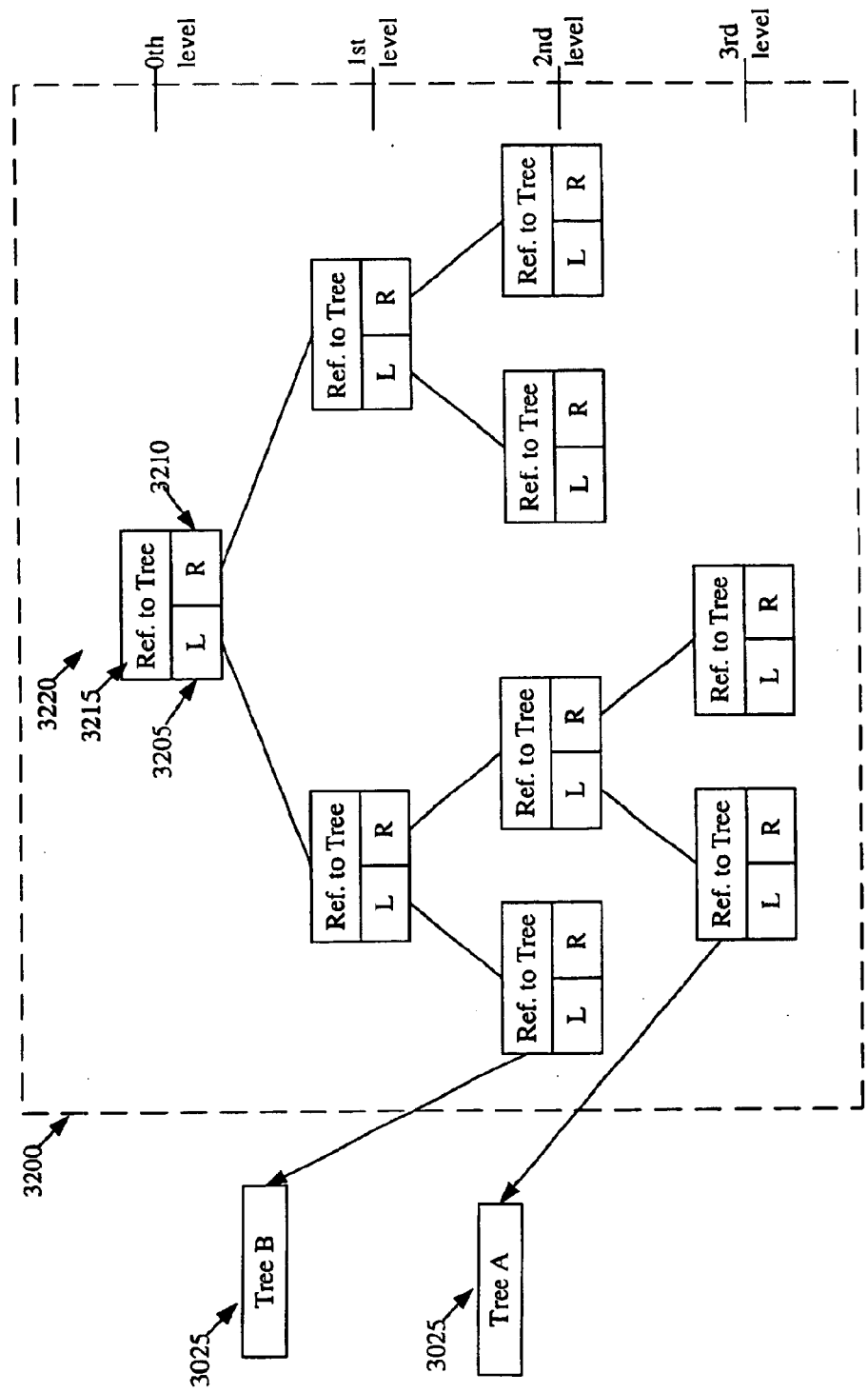
FIG. 32 illustrates a binary-search tree ("BST") used for sorting stored trees.

FIG. 32 illustrates one such binary-search tree ("BST"). This tree 3200 has numerous nodes 3220, with each node having zero or two child nodes. Each node in the tree includes two references 3205 and 3210 for referring to the node's left and right child nodes. Each node also has a reference 3215 for referring to a 42-bit Steiner tree that corresponds to the node.

The BST has forty-two levels, where each level corresponds to one of the bits in the 42-bit string for representing Steiner trees. The BST levels are in the same order as the bits in the bit string. Accordingly, the BST's $0^{th}$ level corresponds to the string's $0^{th}$ bit (i.e., the bit corresponding to path 0), the BST's $1^{st}$ level corresponds to the string's $1^{st}$ bit (i.e., the bit corresponding to path 1), the BST's $2^{nd}$ level corresponds to the string's $2^{nd}$ bit (i.e., the bit corresponding to path 2), etc. At each level, the value of the string bit corresponding to that level determines the branching.

Figure 33:
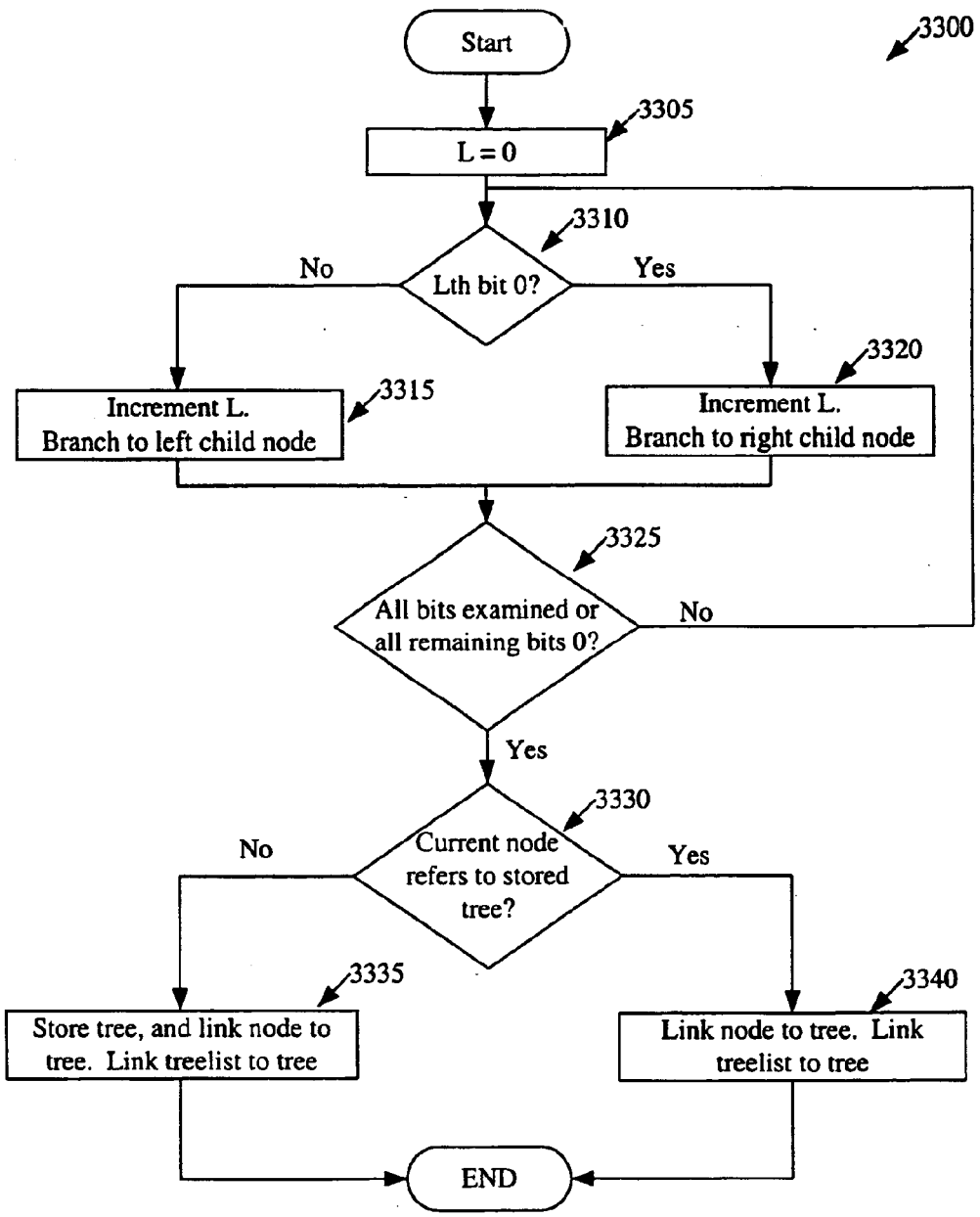
FIG. 33 illustrates a process used to traverse the BST to determine whether a tree was previously stored in the storage structure.

FIG. 33 illustrates a process 3300 that the process 2900 uses (at 2910) to traverse the BST 3200 to determine whether a Steiner tree was previously stored in the storage structure. As shown in FIG. 33, the process 3300 initially sets (at 3305) a variable L to 0. This variable specifies the BST's level that the process 3300 is currently examining. At 3310, the process determines whether the $L^{th}$ bit in the bit string is a 0. If not, the process (at 3315) increments the variable L by one, and defines the current node's left child node as the current node. If so, the process increments (at 3320) the variable L by one, and defines the current node's right child node as the current node.

From 3315 or 3320, the process transitions to 3325. Here, the process determines whether it has examined all the bits in the bit string, and if not, whether all the remaining unexamined bits (i.e., the $L^{th}$ bit to the $41^{st}$ bit of the bitstring) are 0. If all the bits have not been examined and one or more of the unexamined bits have a value of 1, the process returns to 3310 to examine the current node.

On the other hand, if all the bits have been examined or all of the unexamined bits are 0, the process has found the node that should store the bit string. Accordingly, the process determines (at 3330) whether the current node's tree reference 3215 refers to a stored tree (i.e., a stored bit string). If not, the process stores (at 3335) the bit string in the storage structure 3050 and links the current node's tree reference 3215 to this structure. The process also links (at 3335) one of the references in the node configuration's treelist 3020 to the newly-stored bit string. If the process determines (at 3330) that the current node's tree reference 3215 refers to a previously-stored bit string, the process just links (at 3340) one of the references in the node configuration's treelist 3020 to the previously-stored bit string. After 3335 or 3340, the process ends.

c. Identifying Routes from the Compressed Pre-Tabulated Table

When the Steiner-tree routes are pre-tabulated according to process 2900, a router at run-time identifies one or more Steiner-tree routes for a net in the following manner. The router first identifies the net's configuration with respect to the partitioning grid. From the storage structure 3050, it then retrieves one or more routes 3025 specified by the treelist 3020 of the identified configuration.

The process then identifies the symmetrical relationship between the identified net configuration and the designated configuration for its group. It next uses this relationship to identify one or more routes for the identified net configuration from the retrieved routes. To do this, some embodiments use seven LUT's, one for each symmetrical-transform relationship. Each LUT provides a one-to-one mapping that specifies a path that is symmetrical to each potential path that a route of the designated node configuration can use.

For instance, the net configuration might be 0001010000000000, which indicates the net having a pin in slot 10 and 12. This configuration is symmetrically related to the net configuration 0000001000000001, which indicates the net having a pin in slot 0 and 9. Specifically, the configuration 0001010000000000 is obtained when the configuration 0000001000000001 is rotated by 90°.

When the net configuration 0000001000000001 is the designated configuration, some embodiments pre-tabulate two trees, one that uses paths P17 and P24 and another that uses paths P12 and P30. By rotating these tees by 90°, the router can identify two routes for the configuration 0001010000000000. To rotate each tree by 90°, the router (1) identifies each path used by the tree (i.e., identifies each set bit in the 42-bit string specifying the tree), and (2) from the 90°-rotation LUT, identifies the paths that are symmetrically related to the identified paths for a 90° rotation of the partitioning grid.

Accordingly, from the 90°-rotation LUT, the router identifies path 37 as the path related to path 24 through a 90° rotation, and identifies path 7 as the path related to path 17 through a 90° rotation. From the 90°-rotation LUT, the router identifies path 9 as the path related to path 12 through a 90° rotation, and identifies path 39 as the path related to path 30 through a 90° rotation. In this manner, the router identifies two trees for the configuration 0001010000000000. One tree uses paths 7 and 37, and the other uses paths 9 and 39.

One of ordinary skill in the art will realize that other embodiments do not identify trees for symmetrical-node configurations by using LUT's. For instance, some embodiments might mathematically identify trees for symmetrical-node configurations. For each symmetrical relationship, these embodiments might use a different mathematical equation to map the paths of the pre-tabulated tree to the paths of the symmetrically-related tree.

5. Pre-Tabulating Steiner Trees for Different Wiring Models.

Figure 34:
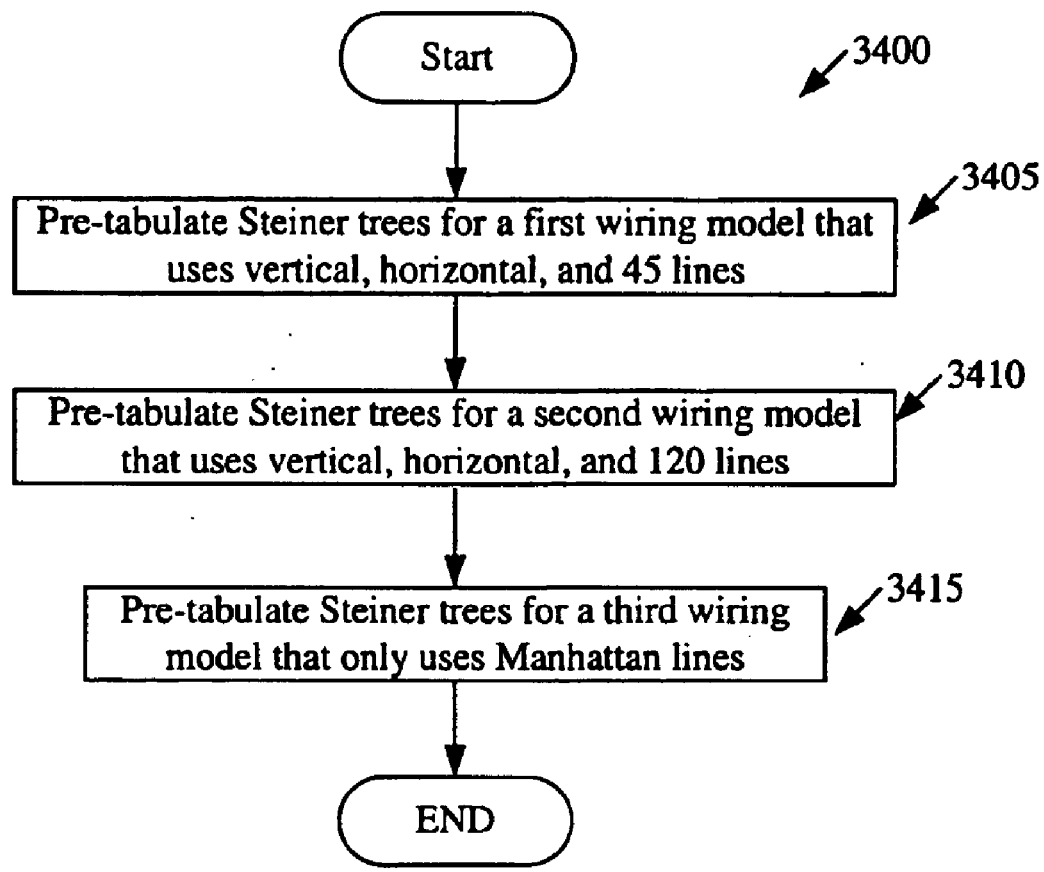
FIG. 34 illustrates a process that pre-tabulates routes and route attributes for multiple wiring models.

Some embodiments of the invention pre-tabulate several sets of Steiner trees for several different wiring models. For instance, FIG. 34 illustrates a process 3400 that performs the process 2200 or process 2900 (1) once (at 3405) for a wiring model that has horizontal, vertical, and ±45° lines, (2) once (at 3410) for a wiring model that has horizontal, vertical, and ±120° lines, and (3) once (at 3415) for a wiring model that has horizontal and vertical lines.

To model all possible net configurations for a wiring model that uses horizontal, vertical, and ±45° lines, this process calculates (at 3405) the length, routing path, and path-usage values of Steiner trees with potential 45° diagonal edges. In other words, at 3405, the process 3400 uses 45° as the angle A in Equation (A) that is used by processes 2400 and 2500 of process 2200 or 2900.

To model all possible net configurations for a wiring model that uses horizontal, vertical, and ±120° lines, this process calculates (at 3410) the length, routing path, and path-usage values of Steiner trees with potential 120° diagonal edges. In other words, at 3410, the process 3400 uses 120° as the angle A in Equation (A) that is used by processes 2400 and 2500 of process 2200 or 2900.

To model all possible net configurations for a wiring model that uses horizontal and vertical lines, these embodiments calculate (at 3415) the length, routing path, and path-usage values of Manhattan Steiner trees. In other words, at 3415, the process 3400 uses 90° as the angle A in Equation (A) that is used by processes 2400 and 2500 of process 2200 or 2900.

B. Pre-Tabulating and Generating Trees

Some embodiments use net configurations to retrieve and generate routes. For instance, some embodiments use net configurations to retrieve pre-tabulated routes for certain nets while generating routes for other nets. Several such embodiments will now be described by reference to FIGS. 35–38.

These embodiments pre-tabulate routes, referred to below as "minimum closed trees" or MCT's, for closed node configurations. An MCT is a MST for a close node configuration. In other words, an MCT is a minimal tree that has N−1 edges that span the N nodes of the configuration through the shortest route, which only branches (i.e., starts or ends) at the nodes. For open node configurations, these embodiments pre-tabulate certain related closed node configurations. The terms closed node configurations and open node configurations will be described below by reference to FIGS. 35A and 35B.

FIG. 35A illustrates an example of a closed node configuration 3505 (including nodes 3515, 3520, 3530, 3535, and 3540), while FIG. 35B illustrates an example of an open node configuration 3510 (including nodes 3515, 3530, 3535, and 3540). The node configuration 3505 is a closed one since all the nodes in this configuration are adjacent to at least one other node in the configuration. The node configuration 3510 is an open one since node 3515 is not adjacent to another node in the configuration; in this configuration, node 3515 has node 3545 between it and the next closest node 3530.

Node configuration 3510 has several related closed node configurations. Two such configurations that do not result in MCT's with an "antenna" node are (1) a first configuration that includes 3515, 3545, 3530, 3535, and 3540, and (2) a second configuration that includes 3515, 3550, 3530, 3535, and 3540. The first configuration is obtained by adding node 3545 to configuration 3510, while the second configuration is obtained by adding node 3550 to configuration 3510.

A configuration that is obtained by adding node 3555 and either node 3545 or 3550 to the configuration 3510 is a related closed configuration that will always result in MCT's that have node 3555 as an antenna node. An antenna node in an MCT of a closed node configuration that is obtained by adding one set of nodes to an open node configuration, is a node that is part of the added set and that has only one of the MCT's edges incident upon it. As further described below, the first two node configurations (configuration 3515, 3545, 3530, 3535, and 3540, and configuration 3515, 3550, 3530, 3535, and 3540) are related closed node configurations that can be pre-tabulated for the open node configuration 3515, 3530, 3535, and 3540. The third configuration (3515, 3530, 3535, 3540, and 3555), on the other hand, should not be pre-tabulated for this open configuration since it leads to an antenna node.

1. Pre-tabulating MCT's

Figure 36:
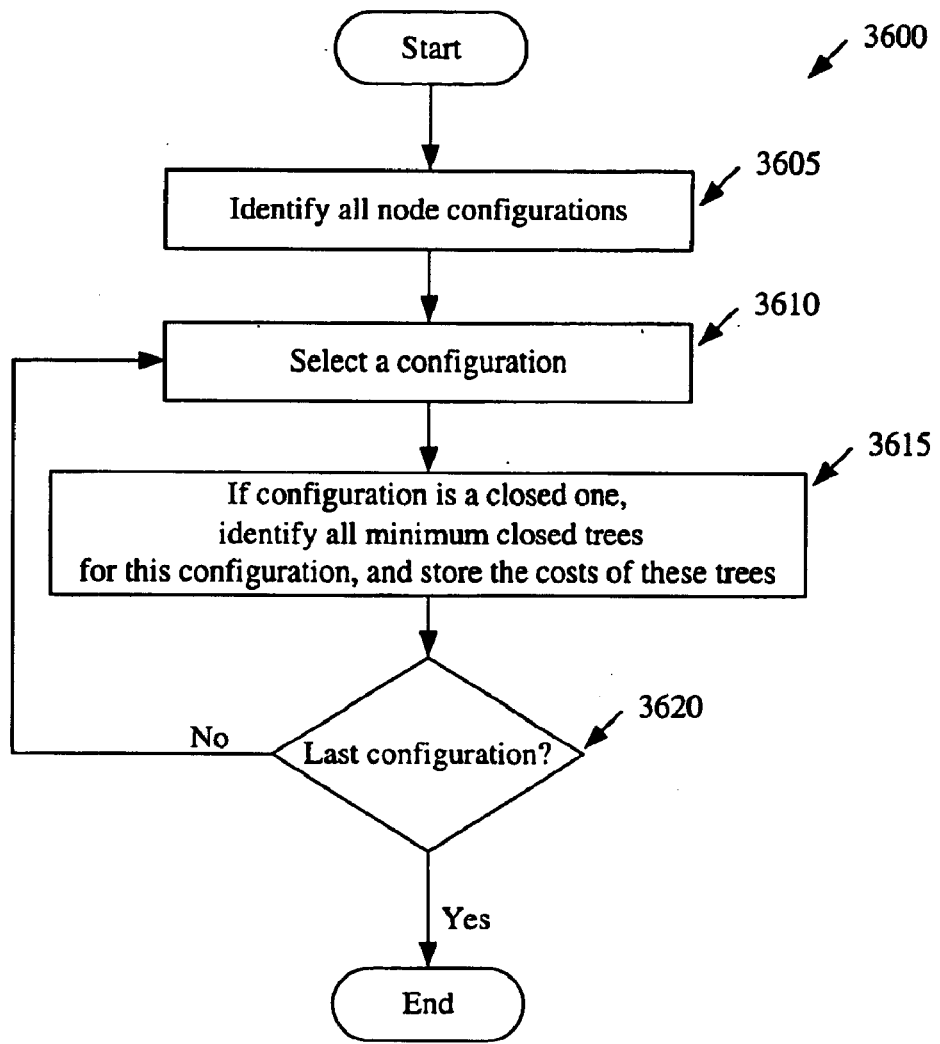
FIG. 36 illustrates a process that pre-tabulates minimum closed trees.

FIG. 36 illustrates a process 3600 that pre-tabulates MCT's for all node configurations within a particular partitioning grid, such as the 4-by-4 grid of FIG. 5. As shown in FIG. 36, the process 3600 initially identifies (3605) all potential node configurations.

It then selects (at 3610) a configuration. If the selected configuration is a closed one, the process next identifies (at 3615) all MCT's for the selected configuration. As mentioned above, a node configuration is a closed one if each node in the configuration is adjacent to at least one other node in the configuration. One of ordinary skill will appreciate that the process 3600 can identify each MCT for the selected configuration directly based on the sets of paths (e.g., the 42 paths illustrated in FIG. 12) that exist between the nodes of the selected closed node configuration. Each MCT is a unique combination of N−1 of such paths that connect all N nodes of the closed node configuration through the shortest route. Such MCT's can be identified through a recursive operation that explores all shortest paths between nodes of the closed configuration; in some embodiments, such a recursive operation would be similar to the one explained above by reference to FIGS. 25A and 25B, except that it specifies each MCT directly based on the interconnecting paths.

At 3615, the process also computes the cost of each MCT identifies at 3615. In some embodiments, the process computes each MCT's cost by (1) assigning costs to the Manhattan and diagonal paths that connects the adjacent slots of the partitioning grid, (2) identifying the paths used by the MCT, and (3) summing up the path costs. A node configuration that has less than two nodes does not have a MCT, and accordingly its MCT cost is zero.

After 3615, the process determines (at 3620) whether it has examined all the configurations. If not, the process returns to 3610 to select another one. Otherwise, the process ends.

2. Pre-tabulating Related Closed Node Configurations

Figure 37:
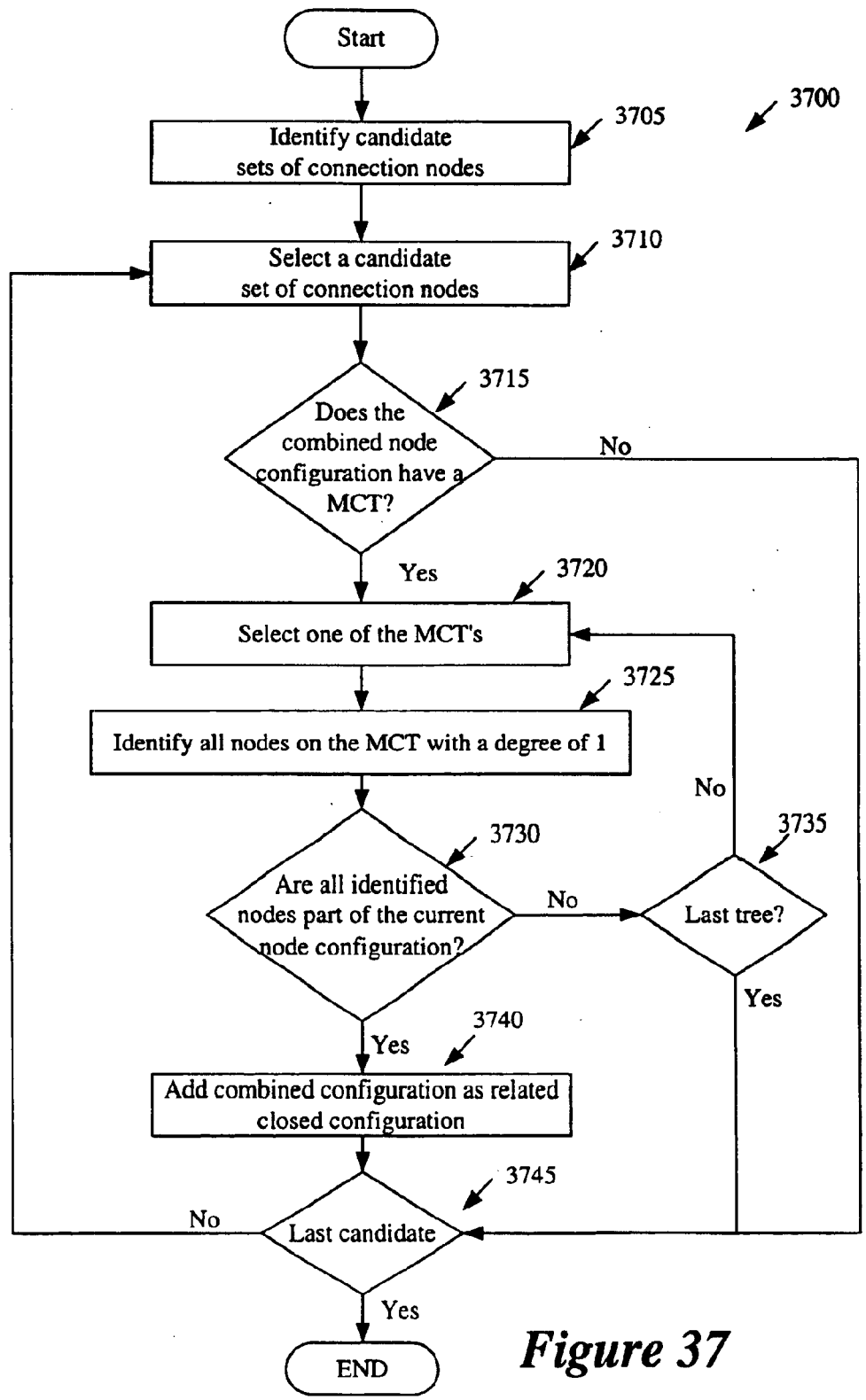
FIG. 37 illustrates a process that, for an open node configuration, pre-tabulates related closed node configurations that do not have antenna nodes.

FIG. 37 illustrates a process 3700 that, for an open node configuration, pre-tabulates certain related closed node configurations. This process initially identifies (at 3705) candidate sets of connection nodes. Each candidate set does not include any of the nodes of the open node configuration. Also, the candidate sets include all possible node configurations that can be obtained without the nodes of the open node configuration.

Next, the process selects (at 3710) a candidate set of connection nodes. The process then determines (at 3715) whether the combined configuration, resulting from the addition of the selected candidate set and the open node configuration, has one or more pre-tabulated MCT's. If not, the process transitions to 3745, which is described below.

If the combined configuration has one or more pre-tabulated MCT's, the process then performs 3720–3740 to determine whether the combined node configuration results in at least one MCT without antenna nodes. If all the MCT's have an antenna nodes, then the combined configuration obtained for the candidate connection node selected at 3710 is not stored as a related closed configuration for the open node configuration.

Specifically, at 3720, the process selects one of the MCT's of the combined configuration. It then identifies (at 3725) all nodes of this MCT that have a degree 1 (i.e., all nodes that have only one of the MCT's path incident upon them). Next, the process determines (at 3730) whether all the identified nodes are part of the open node configuration. If so, the process accepts the combined configuration obtained with the candidate set selected at 3710, and stores (at 3740) the combined configuration (obtained by combining the candidate set selected at 3710 with the open node configuration) as a related closed node configuration for the open node configuration. From 3740, the process transitions to 3745, which will be described below.

On the other hand, if the process determines (at 3730) that at least one of the node identified at 3725 is not part of the open node configuration, the process determines whether it has examined all the MCT's for the combined node configuration. If not, the process returns to 3720 to select another MCT. Otherwise, the process transitions to 3745. At 3745, the process determines whether it has examined all the candidate set of connection nodes. If not, the process transitions back to 3710 to select and examine another candidate set. Otherwise, the process ends.

3. Generating MCT's During Run-Time

Figure 38:
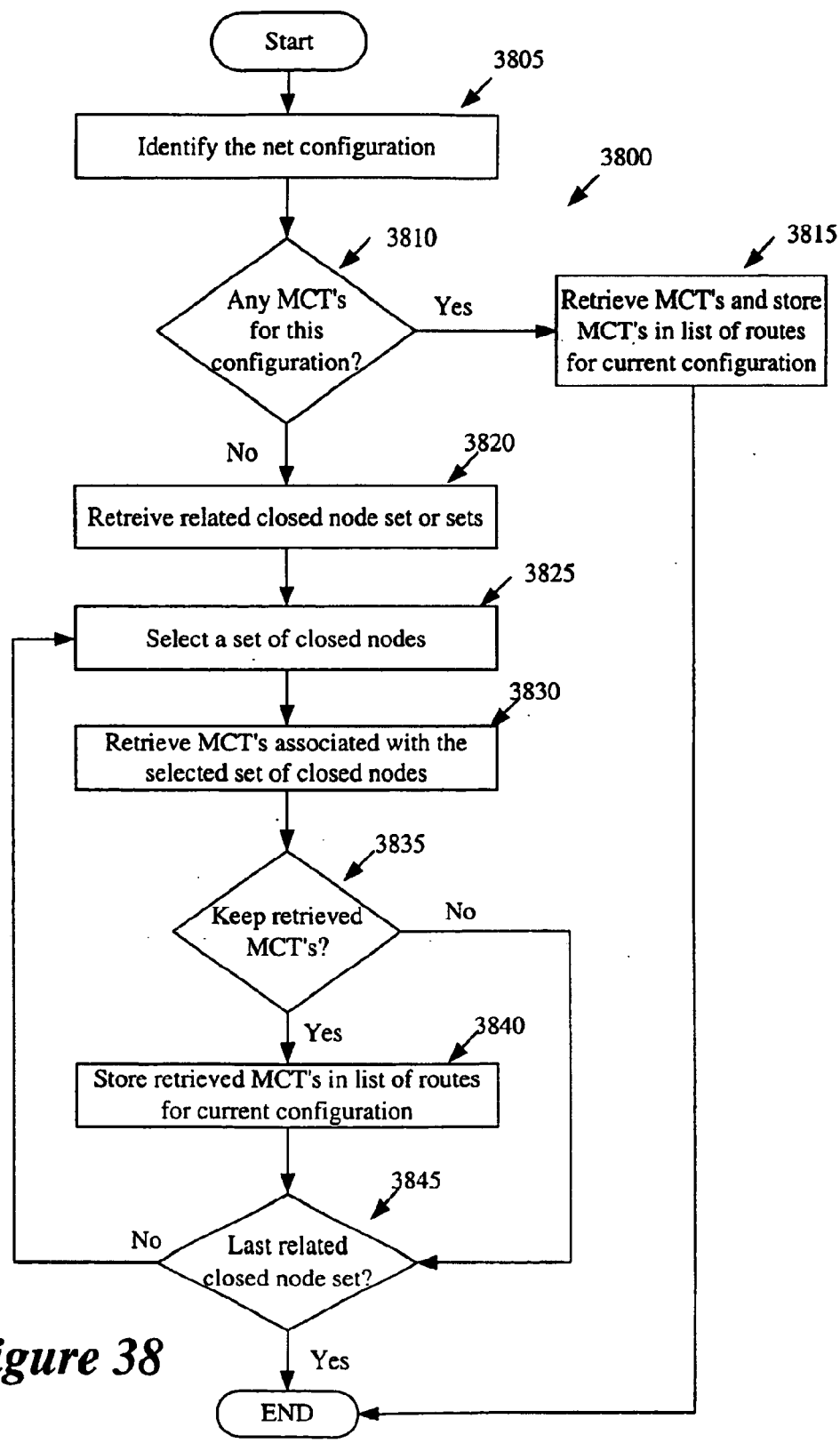
FIG. 38 illustrates a process that identifies one or more Steiner-tree routes for a net when the routes and closed node configurations are pre-tabulated according to the processes of FIGS. 36 and 37.

When the routes and closed node configurations are pre-tabulated according to processes 3600 and 3700, a router at run-time identifies one or more routes for a net according to the process 3800 of FIG. 38. As shown in this figure, the process first identifies (at 3805) the net's configuration with respect to the partitioning grid.

The router then determines (at 3810) whether the storage structure stores one or more MCT's for the identified configuration. If so, the process retrieves (at 3815) the stored MCT's for the configuration and stores them in the list of routes for the net. After 3815, the process then ends.

On the other hand, if the process determines (at 3810) that the storage structure does not store any MCT's for the identified configuration, the process retrieves (at 3820) the related closed node configurations for the identified configuration. It then selects (at 3825) one of the retrieved closed configurations.

Next, the process retrieves (at 3830) the MCT's for the selected closed configuration. It then determines (at 3835) whether to store the retrieved MCT's for the identified node configuration. In some embodiments, the process makes this determination based purely on the wirelength cost of the MCT's. In other words, in these embodiments, the process stores the MCT's only if they are the shortest MCT's that the process has examined thus far for the identified node configuration. In other embodiments, however, the process decides whether to store the MCT's based on other factors such as the estimated congestion of the routing paths, the estimated number of vias, the number of MCT's selected thus far, etc. Also, in some embodiments, the process 3700 sorts an open node configuration's closed node configurations in a particular order. For instance, the process 3700 might sort the closed configurations that produce the shorter MCT's first. In these embodiments, the process 3800 examines the closed node configurations according to the stored order, and once it identifies the R number of routes, the process 3800 terminates.

If the process decides not to store the retrieved MCT's, the process transitions to 3845, which is described below. However, if the process decides (at 3830) to store the retrieved MCT's, its stores these MCT's in a list of routes for the net configuration. The process then determines (at 3840) whether it has examined all the related closed node configurations for the identified net configuration. If not, the process returns to 3820 to select another closed configuration; in some embodiments, the process might not return to 3820 to select another closed configuration if it has already identifies a certain number of MCT's. When the process determines that it has examined all the related closed node configurations, the process ends.

VI. Recursive 4-By-4 Partitioning Router

A. Software Architecture.

Figure 39:
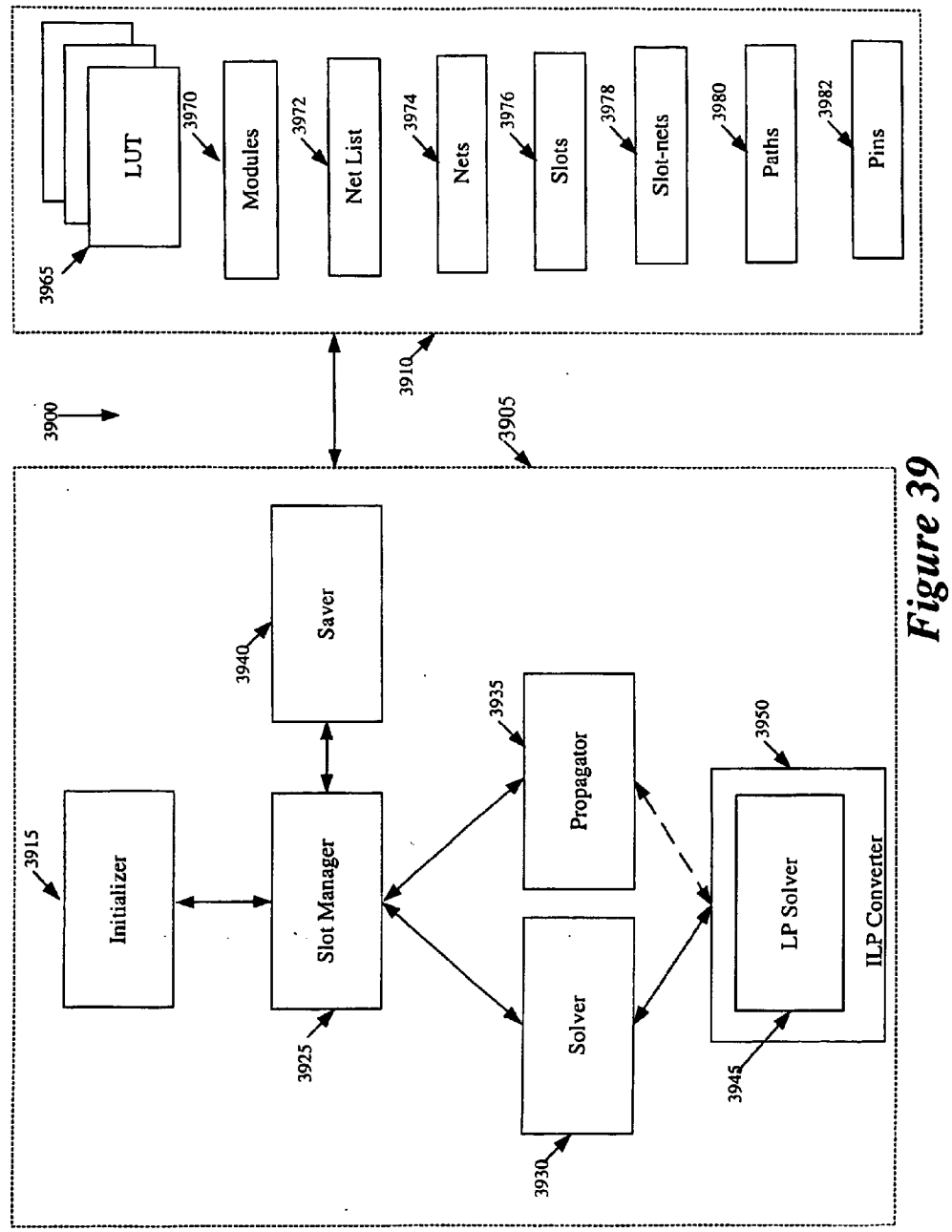
FIG. 39 illustrates the software architecture of a router of some embodiments of the invention.

FIG. 39 illustrates the software architecture of a router 3900 of some embodiments of the invention. This router can operate with a variety of different wiring architectures. It can also operate with different partitioning, congestion, and path-defining grids. However, in the embodiments described below, the router is primarily described to work in conjunction with (1) the octagonal wiring model that is illustrated in FIG. 3, (2) the partitioning grid that is illustrated in FIG. 5, and (3) the congestion grids and their associated 42 paths that are illustrated in FIGS. 9–12.

The software architecture of FIG. 39 includes several software modules 3905 and several data constructs 3910. The software modules include an initializer 3915, a slot manager 3925, a solver 3930, a propagator 3935, a saver 3940, a linear-programming ("LP") solver 3945, an integer-linear-programming ("ILP") converter 3950, while the data constructs 3910 include LUT's 3965, circuit modules 3970, net list 3972, nets 3974, slots 3976, slot-nets 3978, paths 3980, and pins 3982.

Figure 40:
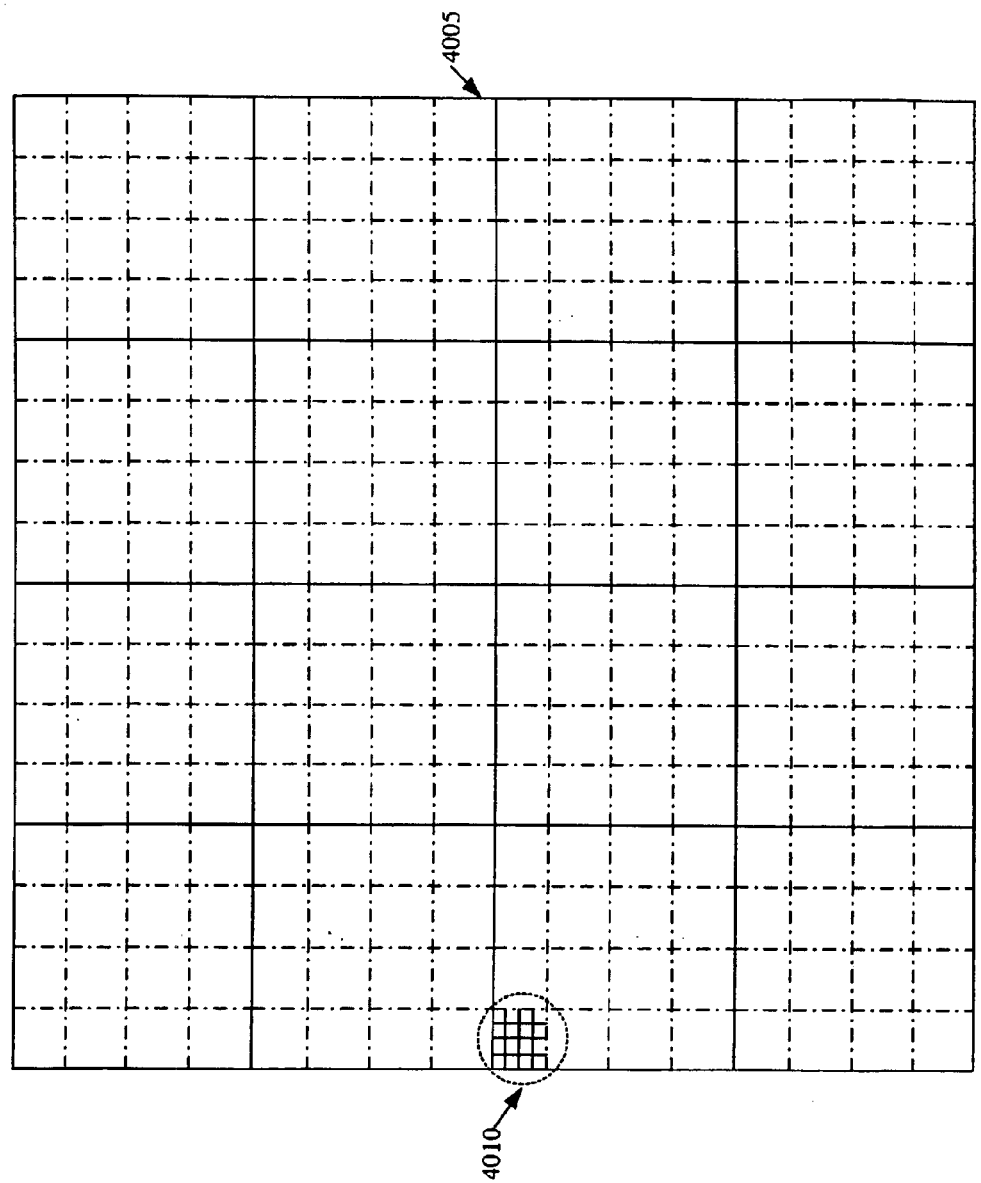
FIG. 40 illustrates a design region that is recursively divided into sets of 16 sub-regions.

The router 3900 defines partitioning grids that recursively divide a design region (i.e., the IC layout or a region of the IC layout) into smaller and smaller sub-regions. In the embodiments described below, the router uses 3 evenly-spaced horizontal lines and 3 evenly-spaced vertical lines to recursively divide the design regions into 16 identically-sized sub-regions (i.e., 16 identically-sized slots). FIG. 40 illustrates a design region 4005 that is recursively divided into sets of 16 sub-regions. Specifically, the design region is divided initially into 16 sub-regions, each of these sub-regions is further divided into 16 smaller sub-regions, and one of the smaller sub-regions 4010 is further sub-divided into 16 sub-regions. At each recursion level, the router simply adjusts the coordinates of the partitioning grid to match the coordinates of the IC region at that recursion level. In other embodiments, the router can use different shaped partitioning grids for all or some recursion levels.

The router 3900 defines in a hierarchical, top-down manner the wiring path values for each net in the design region. The router's initializer 3915 initially determines the number of recursion levels, and the number of slots resulting from this number of recursion levels. The initializer also creates data structures for these slots. In addition, for each slot, the initializer creates a slot-net data structure for each net in the slot, and this slot-net data structure stores the net's configuration within that slot. For each slot, the initializer also identifies all the circuit modules that intersect this slot.

In some embodiments, the initializer also defines the capacities of routing paths within each slot and stores these capacities in the slot's data structure. In the embodiments described below, however, the slot manager defines these capacities as it directs the routing of each slot.

For each slot that is partitioned into smaller child slots, the slot manager directs the solver 3930 to select a route for each net that has actual or virtual pins in the slot. The solver uses each net's configuration (1) to identify one or more optimal routes for each net, and at times (2) to generate fake configuration to identify one or more sub-optimal routes for each net. The solver identifies one or more routes for a particular configuration based on any one of the approaches described above in Section V.

The solver then formulates an LP problem and feeds these solutions to the LP solver 3945, which, in turn, returns a number of real-number solutions. These real-number solutions are then converted into integer solutions by the ILP solver 3950. These integer solutions specify a particular route for each net, and the solver stores each net's route information in the net's slot-net data structure for the current slot.

After the solver specifies the route for each net that has an actual or virtual pin in the current slot, the slot manager 3925 calls the propagator 3935 if the current slot is not a leaf slot. A leaf slot is a slot that has child slots, but its child slots do not have any child slots (i.e., its child slots are not partitioned). The child slots of a leaf-level slot are called Gcells.

When called by the slot manager, the propagator determines how the routing paths specified by the solver for the current routing level propagate down into the child slots of the current slot. For slots that are after the top-level slot and before the leaf-level slot, the propagator also performs a follow-up propagation operation that propagates the routing paths specified by the propagator at the previous routing level one level further down.

For each net in the current slot, the propagator has to determine the net's pin distribution within all child slots affected by the net's routing paths. The propagation process often entails adding virtual pins in the current slot's grandchild slots (i.e., the child slots of the current slot's child slots). In other words, the propagator might modify the net's configuration within the child slots of the current slot.

Different embodiments of the invention use different propagators. Two different propagators are described below. The first propagator enumerates several propagation solutions for each net's route and then uses the LP solver 3945 and ILP converter 3950 to select a propagation solution for each net. The second propagator, on the other hand, is a sequential propagator that uses a greedy approach to select and embed a propagation for the route of each net in the current slot. In the embodiments described below, both these propagators use a sequential propagator to perform the follow-up propagation, when applicable.

The identified propagations for each net's route specify a particular configuration for the net within each affected child slot, and the propagator stores the net's configuration in the net's slot-net data structure for the affected child slots. The embodiments described below specify each net's configuration by a string of 16 bits, where each bit corresponds to a child slot of a slot.

After the solver has specified the route for each net in a leaf slot, the slot manager calls the saver 3940 to link the path structures of each net's route to their respective net's main data structures. The saver also links to the main net data structures the path data structures of the propagation paths that the propagator specifies for a parent slot of a leaf-level slot (i.e., for a grandparent slot of a Gcell). These propagation paths include paths that the propagator identified (1) for the routing paths specified by the solver and (2) for the routing paths specified by the propagator at the previous routing level.

In this manner, the path data structures linked to a net's main data structure collectively represent the final route for the net that the router specifies. In some embodiments, such a route is a global route for a net. FIGS. 49–83 further describe the software modules 3905. However, before describing these software modules, the data constructs 3910 will be described below by reference to FIGS. 41–48.

B. Data Constructs.

1. LUT's.

The LUT's 3965 store information (such as routing paths, lengths, path-usage, etc.) about the routes that connect the sub-regions containing the circuit modules of the nets. Some of these routes have edges that are completely or partially diagonal. In the embodiments described below, the LUT's store the length, routing paths, and path-usage probability values of the routes for all possible net configurations. Several processes for selecting routes and pre-tabulating their length, routing paths, and path-usage probabilities were discussed above in Section V. One of ordinary skill will understand that other embodiments also store other attributes of trees. In the embodiments that utilize the route-generating process 3800 of FIG. 38, the LUT's store for each open node configuration one or more related closed node configurations.

In some embodiments, the router 3900 can operate with different wiring architectures. In these embodiments, different LUT's can be used to store route attributes for the different wiring models. For instance, the LUT's can store routing information for (1) a first wiring model that uses Manhattan and ±45° diagonal lines, (2) a second wiring model that uses Manhattan and ±120° diagonal lines, (3) a third wiring model that only uses Manhattan lines, etc. Once the wiring model is selected, the routing information for each net configuration can be retrieved from the LUT that is appropriate for the selected wiring model.

In the embodiments where the router can operate with different wiring models, the router typically selects the wiring model at the beginning of the design process. For instances, in some embodiments, the process 400 selects the wiring model at 405 before it selects the partitioning grid. Also, some embodiments might switch from one wiring model to another for different portions of the design process or at lower levels of the design hierarchy.

In the embodiments described below, the router uses the octagonal wiring model that is illustrated in FIG. 3 throughout the routing process. The router uses a LUT that stores routing information (e.g., routes, lengths, path-usage values, trees for closed-sets of slots, sets of nodes, etc.) for the congestion grids and their associated 42 paths that are illustrated in FIGS. 9–12.

2. Net List, dbNet, Slot-Net, Pin, and Path Structures.

FIG. 41 illustrates the data structure for a net list 4100. This list includes one or more fields 4105, each of which refers (e.g., points) to a dbNet data structure 4110. Each net has a dbNet data structure, which serves as the main data structure for the net. FIG. 42 illustrates the dbNet data structure. This data structure includes an index field 4205 that contains a value that some of the software modules (e.g., the propagator) use to identify the net. This data structure also includes a number of fields 4210 that refer (e.g., point) to pin data structures.

FIG. 43 illustrates a simple pin data structure 4300 that includes a location field that specifies the pins location. In some embodiments, the pin's location is provided as a three-dimensional location that not only specifies its x and y location, but also specifies its layer. Other embodiments, however, store the pin's layer as part of a pin macro. This pin macro can be stored as part of the circuit macro which is referenced by the slot-data structure as described below.

The dbNet data structure also includes one or more fields 4220, each of which refers (e.g., points) to a path data structure 4400 such as the one illustrated in FIG. 44. In some embodiments, the saver links the path data structures that specify the final lowest-level route paths for each net to the dbNet of their respective nets through reference field 4220.

The path data structure includes a field 4405 that specifies the path type as horizontal (H), vertical (V), a first diagonal direction (E), or a second diagonal direction (W). This structure also includes a field 4410 to store the path id, which is a number from 0 to 41 that identifies the data structure's path as one of the 42 paths defined in the two-grids. In addition, this data structure includes a field 4415 that refers (e.g., points) to the dbNet associated with the path. Finally, this data structure has two fields 4420 that refer to the data structures of the two slots that the path is incident upon. These two fields can be used during a verification process to ensure the continuity of the routes specified by the router 3900.

For each slot, the router 3900 defines a slot-net data structure for each net that has an actual or virtual pin in the slot, and this slot-net data structure stores the net's configuration within that slot. FIG. 45 illustrates this slot-net data structure. This structure includes a field 4505 that refers (e.g., points) to the dbNet of its net. It also includes a field 4510 that stores a bit string that specifies its net's pin distribution in the slot. As discussed further below, the initializer initially sets this field based on all the actual pins of the net within the slot. During the recursion process, the propagator might modify the bit string in this field 4510 to account for virtual pins. The slot-net data structure also includes a field 4515 that stores the 42-bit selected-route string. The solver sets this bit string after it selects a route for net in the slot.

3. Slot.

Figure 46:
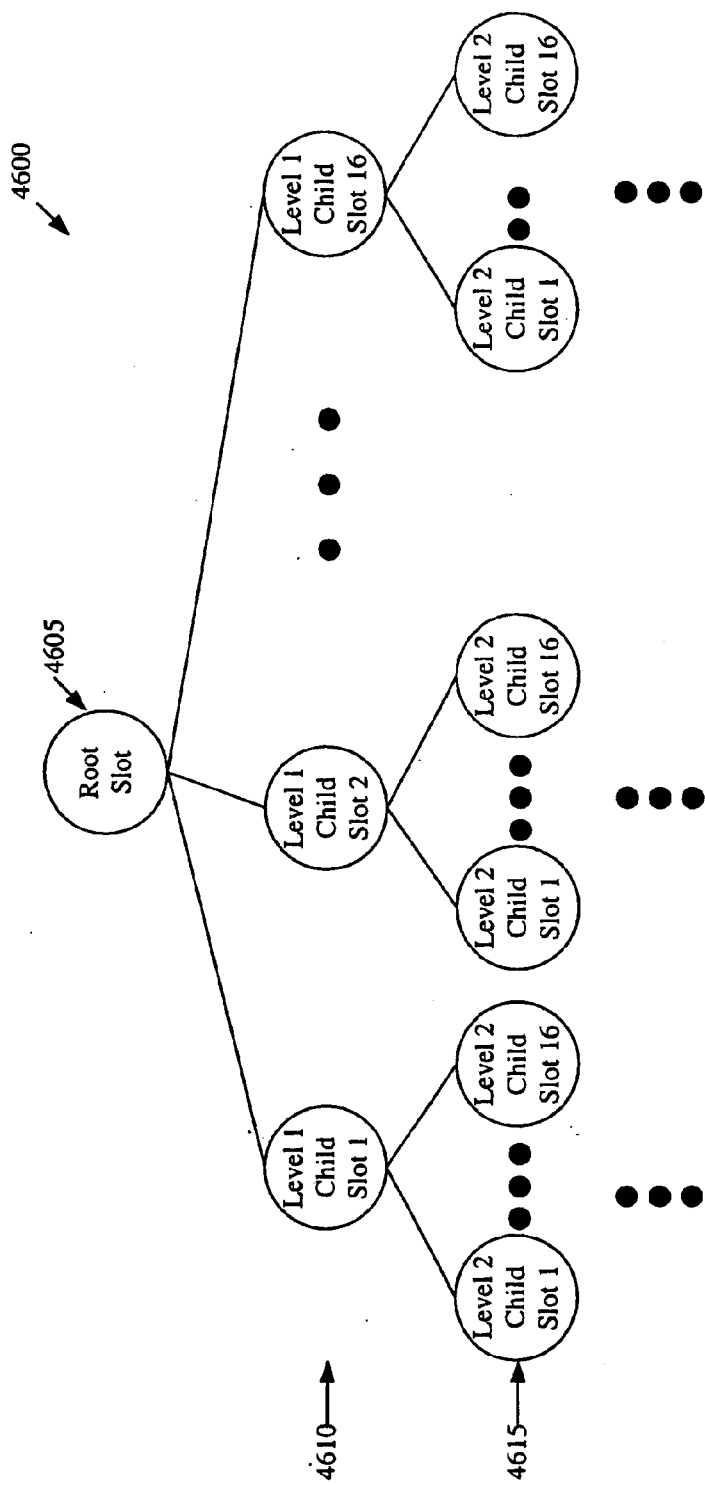
FIG. 46 presents a graph that conceptually illustrates the hierarchy of slots defined by the router.

The router 3900 recursively divides the design region into sets of 16 sub-regions or slots. FIG. 46 presents a graph that conceptually illustrates the hierarchy of slots (i.e., sub-regions) defined by the router. This graph 4600 illustrates two levels 4610 and 4615 of the recursion process. In this graph, each node represents an IC region at a particular stage within the recursion process. Also, in this graph, the root node represents the entire design region, while each non-root node represents a portion of the design region.

In a slot-hierarchy, each node has either 0 child nodes or 16 child nodes. A node has 16 child nodes when the router partitions that node's region into 16 sub-regions. Conversely, a node does not have child nodes when its corresponding region is not partitioned.

Figure 47:
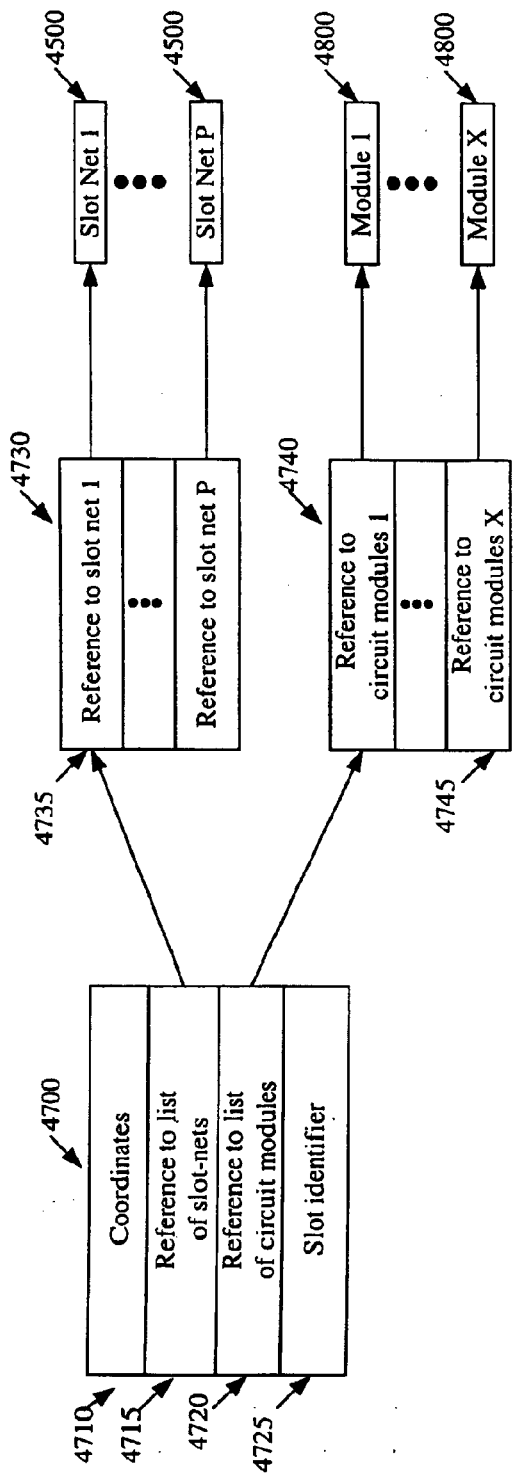
FIG. 47 presents a slot data structure.

In some embodiments, the router 3900 defines a slot data structure to represent each node in a slot-hierarchy. FIG. 47 presents one such data structure 4700 for a slot. This data structure specifies the coordinates 4710 of the slot. It also includes a reference (e.g., a pointer) 4720 to a list 4740 of circuit modules in the slot. This list 4740 includes one or more references (e.g., one or more pointers) 4745 to one or more circuit modules 4800 in the slot.

The slot data structure 4700 also includes a reference to a list 4730 of slot-nets of the slot. The list includes references 4735 to slot-net data structures 4500. In the embodiments described below, the slot data structure does not have references to its child slots. Some of these embodiments order the slots in a pre-specified order on a list, and based on this order, these embodiments identify corresponding child and parent slots. The slot data structure 4700 also includes a field 4725 that specifies the slot's unique identifier.

4. Circuit Modules.

Figure 48:
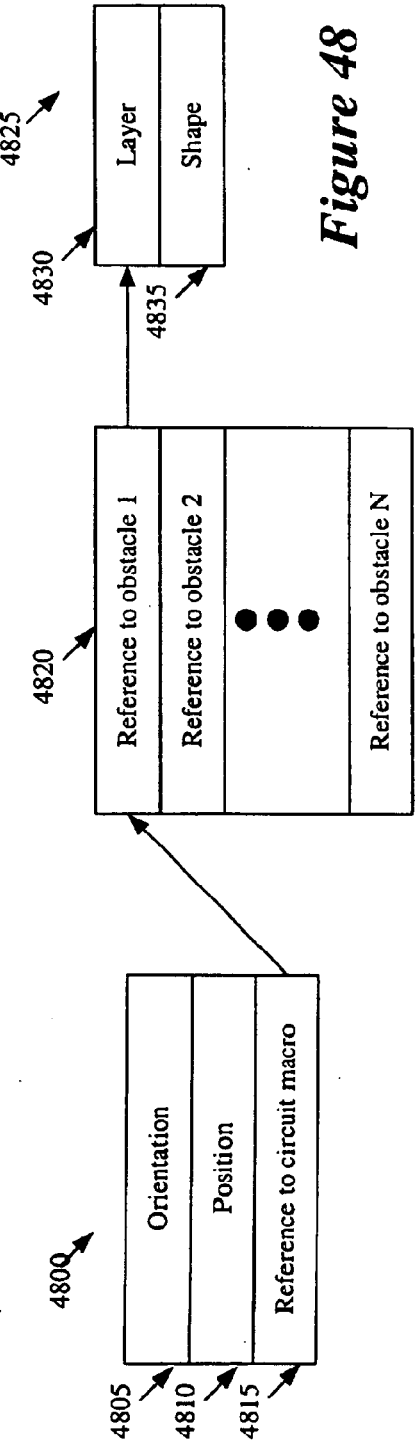
FIG. 48 illustrates a circuit module data structure.

FIG. 48 illustrates the data structure 4800 of a circuit module. This data structure stores the orientation (4805) and the position (4810) of the circuit module. It also includes a reference 4815 to the circuit macro 4820, which contains a description of the circuit module. For instance, the circuit macro refers to data structures 4825 for obstacles within the circuit module. The obstacle data structures specify information about the obstacles, such as the layer (4830) and shape (4835) of the obstacles.

C. Initializer.

Figure 49:
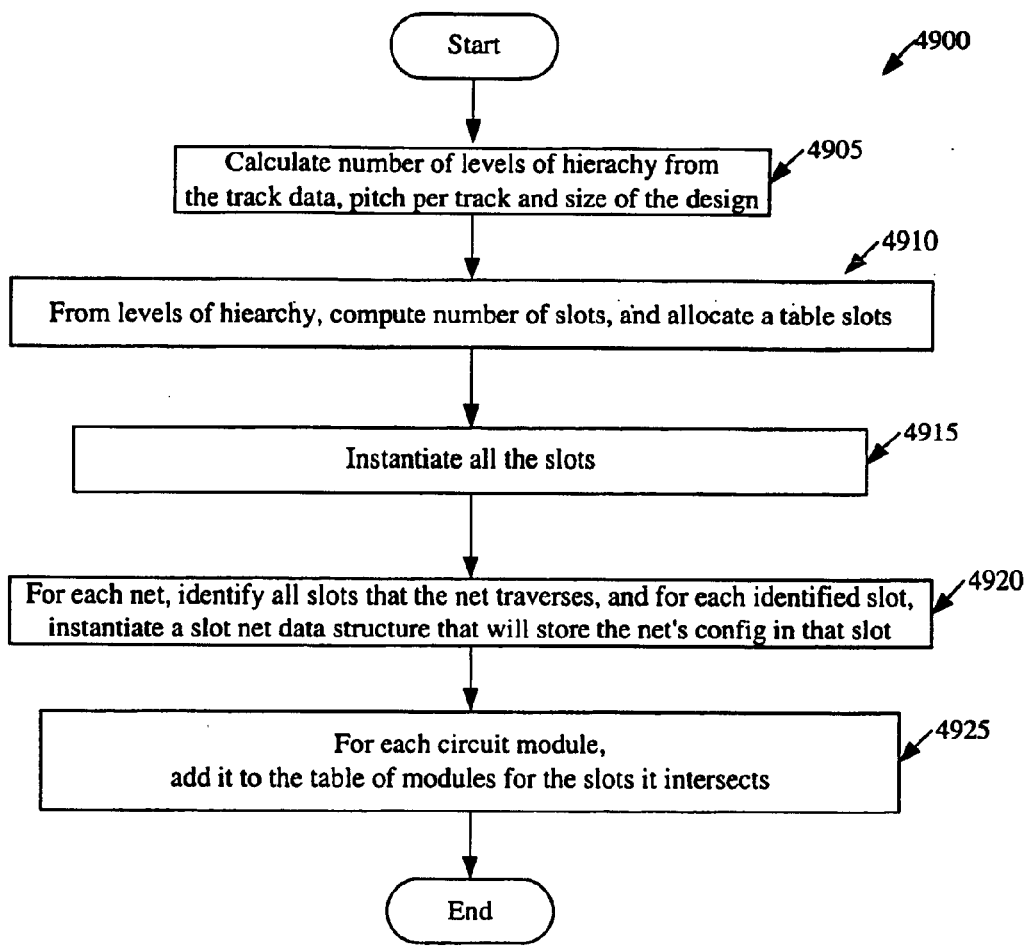
FIGS. 49–51 illustrate a process that is performed by an initializer of the router of FIG. 39.

FIG. 49 illustrates a process 4900 performed by the initializer at the start of the routing operation. Before this process starts, the router typically has received a placed net list, technology definition (including number of layers, preferred wiring direction for each layer, routing pitch for each layer, etc.), and the number of tracks for the lowest level slots (i.e., for the Gcells).

The process initially calculates (at 4905) the number of recursions from the track data for the lowest-level slots, pitch per track, and size of the design. To do this, the process initially multiplies the track data by pitch per track to obtain the dimensions of the lowest level slots. It then repeatedly divides the design size by 4, while the resulting value is bigger than the computed dimensions. With each division, it increments a level counter by one. The process stops the division and the counting, once the resulting value would be smaller than the computed dimensions.

Based on the number of levels, the process then computes (at 4910) the number of slots. At each level there are 16 children. Hence, the total number of slots is the sum of $16**n$, where n varies from 0 to level. At this stage, the process also creates a list of all slots.

Next, the process instantiates (at 4915) slot data structures for the slots at all the recursion levels. The process then (at 4920) (1) for each net, identifies all the slots that the net traverses, and (2) for each identified slot, instantiates a slot-net data structure to store the net's configuration in that slot.

Figure 50:
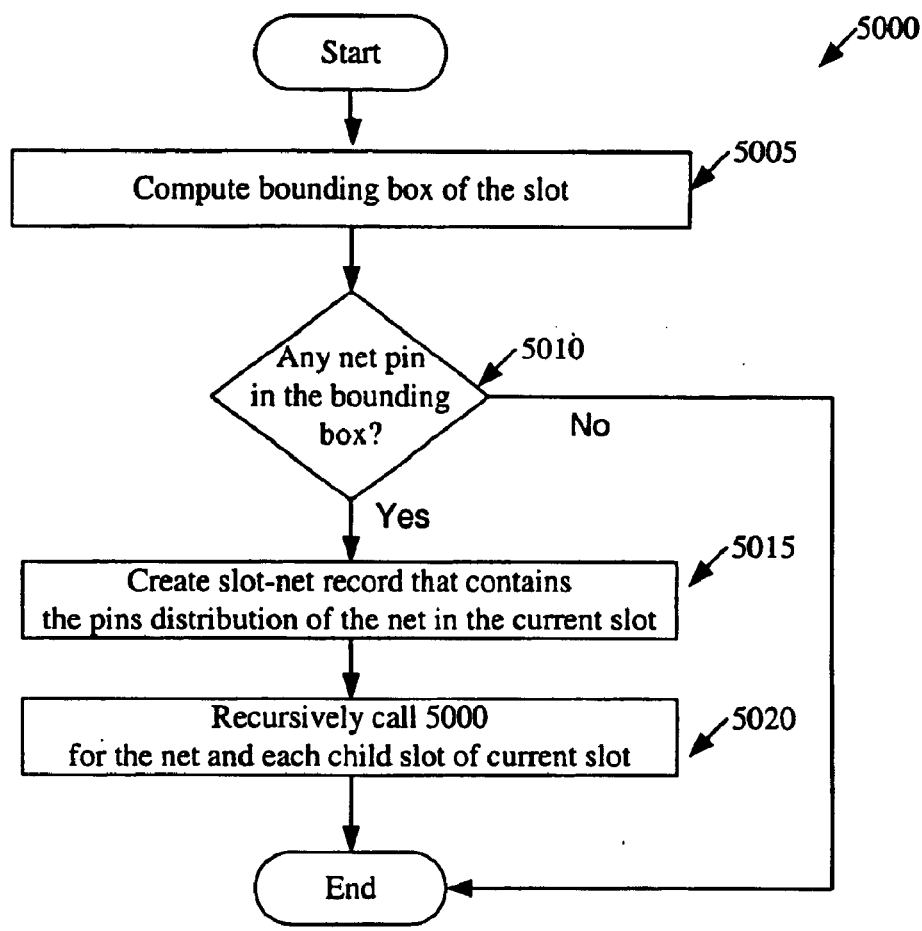

FIG. 50 illustrates a process 5000 that some embodiments use to perform 4920. Specifically, this process is a recursive process that starts at the top-level slot and it is performed for each net. Each time this process is called it receives a slot and a net. As shown in FIG. 50, this process 5000 initially computes (at 5005) the bounding box of the received slot.

It then determines (at 5010) whether any pin of the received net is contained in the bounding box of the received slot. If not, the process ends. If so, the process creates (at 5015) a slot-net record that contains the pin distribution of the net for the current slot. In addition, the process recursively calls (at 5020) itself for the received net and each child-slot of the current slot. The process 5000 then ends.

Figure 51:
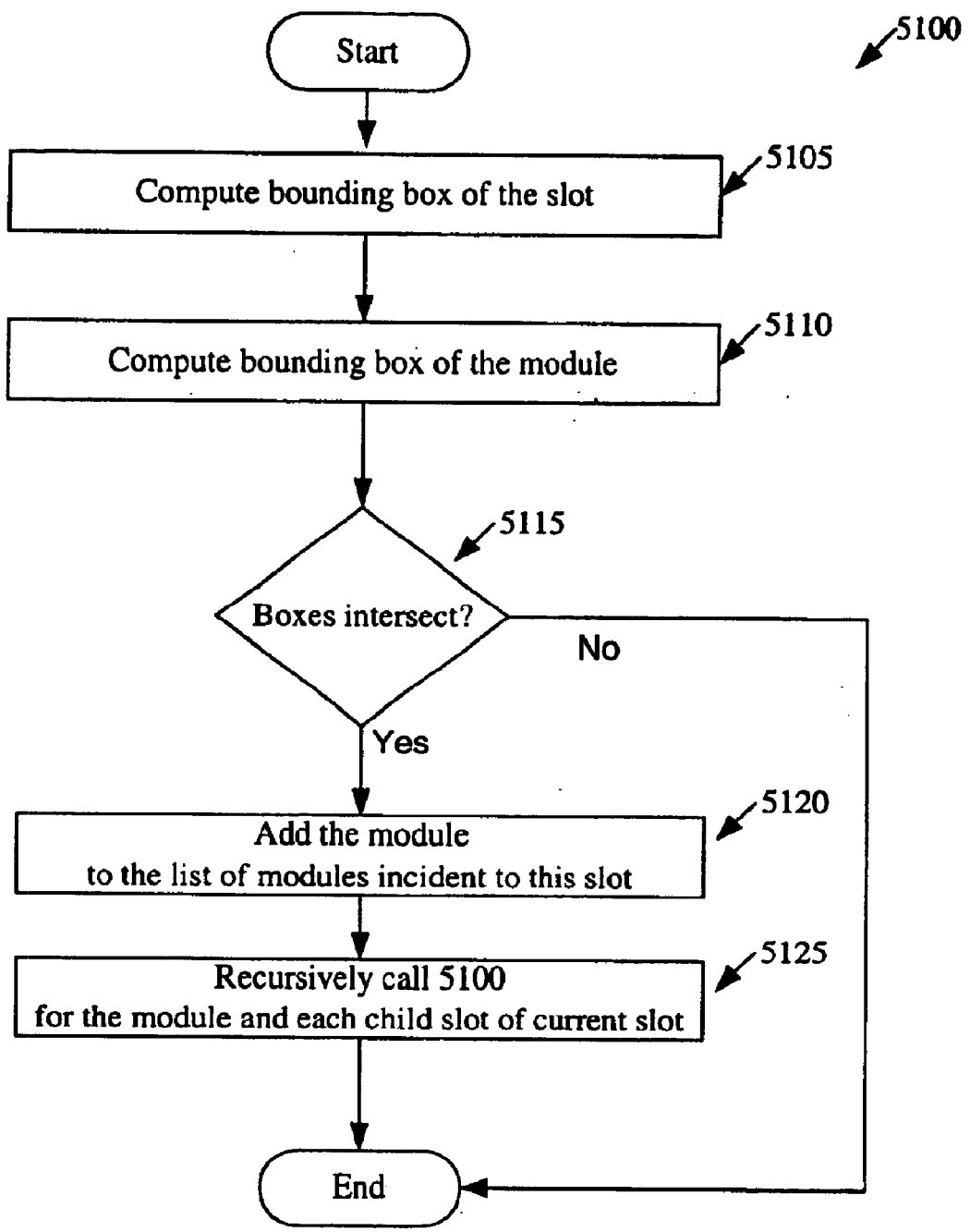

After the process 4900 instantiates slot-net data structures to store the net configurations in the slots, the process 4900 adds (at 4925) each circuit module to the table of modules for the slots that it intersects, and then ends. FIG. 51 illustrates a process 5100 that some embodiments use to perform 4925. Specifically, this process is a recursive process that starts at the top-level slot and it is performed for each circuit module. Each time this process is called, it receives a slot and a circuit module. As shown in FIG. 51, this process 5100 initially computes (at 5105) the bounding box of the received slot.

The process 5100 then computes (at 5110) the bounding box of the received circuit module. It then determines (at 5115) whether the two bounding boxes intersect. If not, the process ends. If so, the process adds (at 5120) the module to the list of circuit modules incident to the current slot. In addition, the process recursively calls (at 5125) itself for the received module and each child-slot of the current slot. The process 5100 then ends.

D. Slot Manager.

Figure 52:
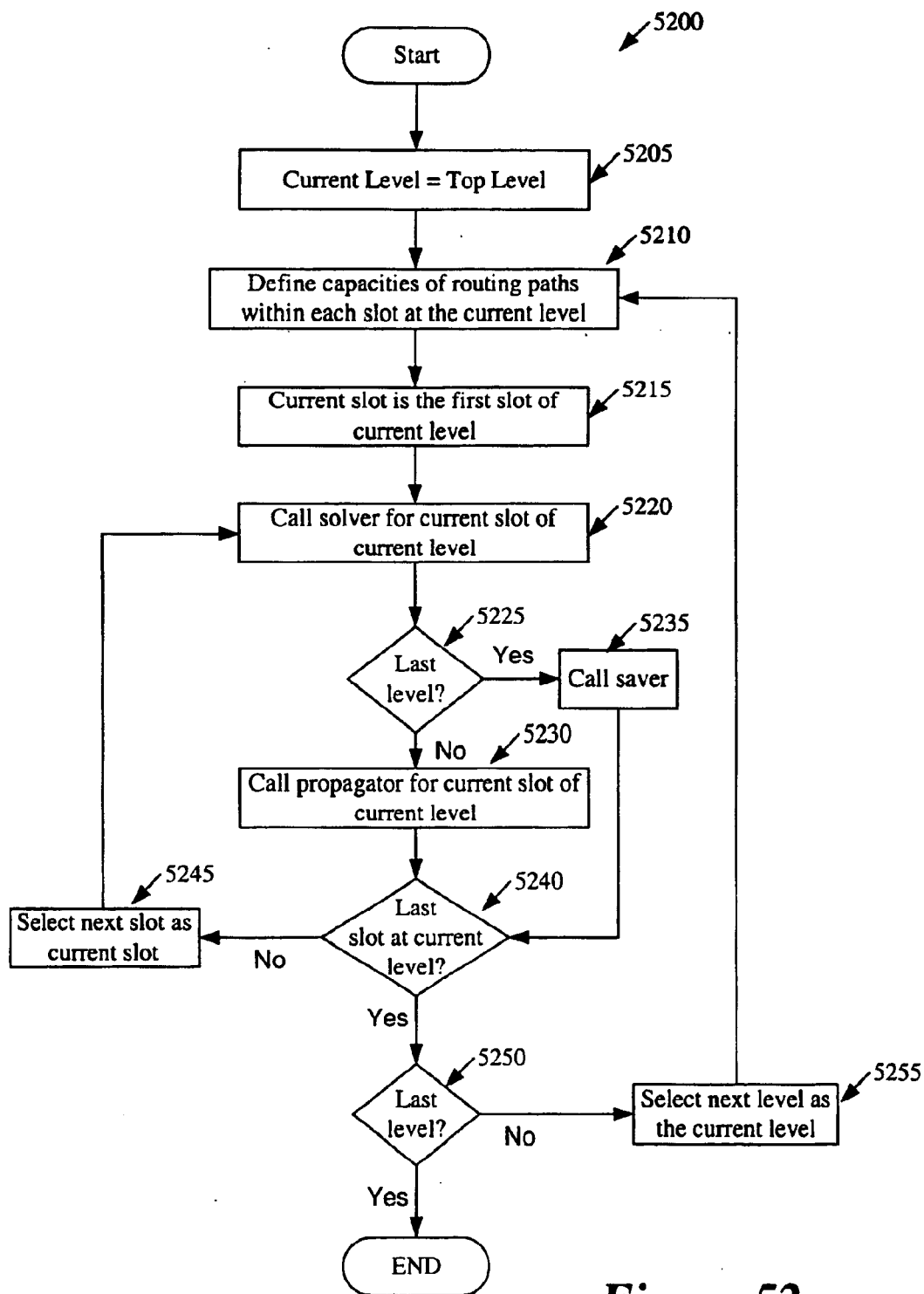
FIG. 52 illustrates a process performed by a slot manager of the router of FIG. 39.

FIG. 52 illustrates a process 5200 performed by the slot manager 3925 after the initializer 3915 completes its operation. Initially, the process 5200 sets (at 5205) the current level as the top-level slot. Next, the process defines the capacity of the routing paths within the slots of the current level. In some embodiments, the process receives, or can retrieve from a storage structure, the routing path capacities for the first level, and thereafter computes the routing path capacities mathematically based on the known geometric relationship between the child slots and the parent slots. In other embodiments, the process in real-time calculates the routing path capacities for all the levels. However, some of these embodiments still compute the routing path capacities of some recursion levels from those of other levels.

As mentioned above, some embodiments calculate the capacities of each path at a particular recursion level from the size of the edge orthogonal to the path. For instance, some embodiments calculate the capacity of each particular path by dividing the size of the corresponding orthogonal edge (i.e., the size of the edge orthogonal to the particular path) with the pitch of metal layer corresponding to the particular path. Some embodiments define the pitch of a metal layer as the line-to-via pitch. Some embodiments define the line-to-via pitch as the minimum required distance between interconnect lines on that metal layer, plus ½ the width of the line, plus ½ the width of the via including the metal overlap.

As mentioned above, in some embodiments, the capacities of the diagonal paths differ from the capacities of the Manhattan paths. This can be modeled by the virtue of the differing size of the edges that are orthogonal to the diagonal and Manhattan paths. It can also be modeled by having the pitch dependent on the type of interconnect line (e.g., having the pitch for diagonal lines differ from the pitch for the Manhattan lines). It can further be modeled by having the pitch dependent on the layer. For instance, in some embodiments, the pitch of the −45° metal layer differs from the pitch of the 45° metal layer.

At 5215, the process sets the current slot as the first slot at the current level. As further described below, the process 5200 examines the slots at the current level in sequence. However, one of ordinary skill will realize that other embodiments might examine the slots in another order. For example, some embodiments might examine the most congested slots first.

It then directs (at 5220) the solver to select routes for all nets in the current slot at the current level. Once the solver selects the routing paths and stores these paths in the slot-net data structure field 4515, the slot manager determines whether the current level is the last recursion level.

If not, the process directs (at 5230) the propagator to define the propagation of the selected routes into the child slots of the next lower recursion level (i.e., into the child slots of the child slots of the current slot). For slots that are after the top-level slot, the propagator also performs a follow-up propagation operation that propagates the paths specified by the propagator at the previous routing level one level further down. In defining the propagation into the next lower recursion level, the propagator might modify the net's configuration in the current child slots by adding virtual pins in the child slots of the current child slots.

If the process determines that the current slot is at the last recursion level (i.e., the current slot is a leaf slot), it directs (at 5235) the saver to link the path structures of each net's route in the current leaf slot to their respective net's main data structures. As mentioned above, the saver also links to the main net data structures the path data structures of the propagation paths that the propagator specifies for a parent slot of a leaf-level slot (i.e., for a grandparent slot of a Gcell). These propagation paths include paths that the propagator identified (1) for the routing paths specified by the solver and (2) for the routing paths specified by the propagator at the previous routing level. In this manner, the path data structures linked to a net's main data structure collectively represent the final route for the net that the router specifies. In some embodiments, such a route is a global route for a net.

From 5230 and 5235, the process transitions to 5240, where it determines whether it has examined the last slot at the current level. If not, the process selects (at 5245) another slot at the current level and returns to 5220 to call the solver for this slot. Otherwise, the process determines (at 5250) whether it is at the last recursion level. If not, the process selects the next recursion level, and returns to 5210 to specify more detailed routes for the nets at the next lower recursion level. When the process determines (at 5250) that it is at the last recursion level, it ends.

E. Solver.

Figure 53:
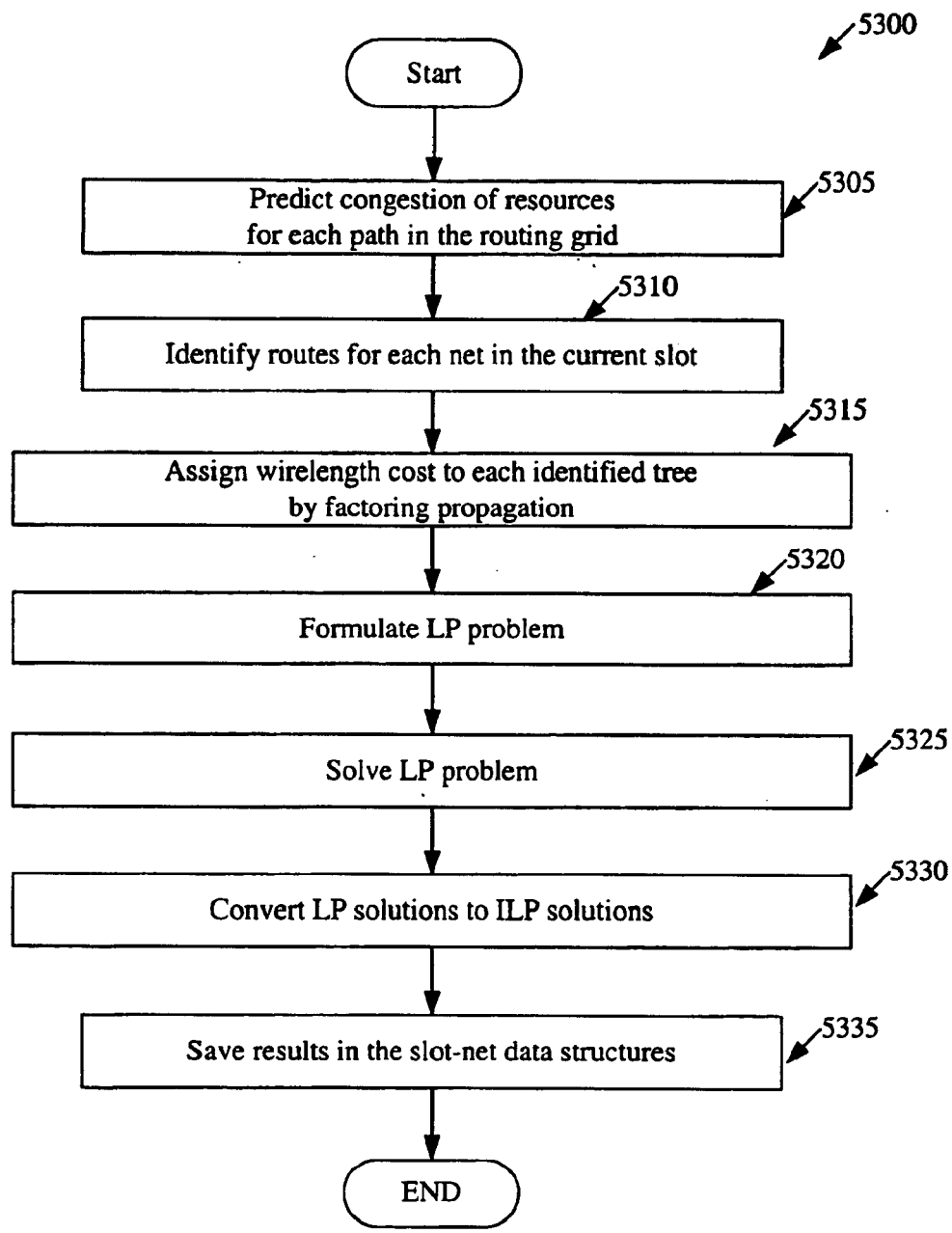
FIG. 53 illustrates a process performed by a solver of the router of FIG. 39.

As discussed above, the solver 3930 is responsible for (1) enumerating one or more routes for each net, (2) directing an LP/ILP solver to select a route for each net, and (3) saving the selected results in the slot-net data structures of the current slot. FIG. 53 illustrates a process 5300 performed by the solver. In some embodiments, this process starts when the slot manager calls the solver and supplies it with a slot to route.

The process 5300 initially predicts (at 5305) congestion of resources for each path in the slot. One manner for predicting the congestion of the paths will be described below by reference to FIGS. 54 and 55. The process next identifies (at 5310) one or more routes for each net in the supplied slot. One manner for identifying routes for the nets in the current slot will be described below by reference to FIGS. 57–60.

After identifying one or more routes for each net in the current slot (i.e., for each net that has a slot-net structure linked to the current slot's data structure), the process 5300 assigns (at 5315) a wirelength cost to each retrieved tree by factoring propagation into the next lower recursion level. In some embodiments, the process uses a greedy technique to account for this propagation. One manner for assigning costs for each retrieved tree will be described below by reference to FIGS. 64.

Once the solver assigns wirelength costs to the enumerated potential routes, the solver formulates (at 5320) the problem for the LP solver 3945, and the LP solver solves (at 5325) the LP problem. One manner for formulating and solving the LP problem will be described below in subsection VI.E.4.

After 5325, the process 5300 converts (at 5330) the LP solution to an integer LP ("ILP") solution. Some embodiments use randomized rounding to perform this conversion. Randomized rounding is a known technique, and numerous examples of this technique can be found in the literature, e.g., one such reference is disclosed in Randomized Algorithm, by Rajeev Motwani and Prabhakar Raghavan, Cambridge University Press (1995, 1997).

One example of a randomized rounding process is as follows. First, the process maps the scores returned by the LP solver to probabilities between 0 and 1. For instance, when the LP solver returns real solutions between 0 and 1, a one-to-one mapping exists between the returned solutions and probabilities between 0 and 1. Second, the rounding process generates a random numbers between 0 and 1 for each net. Third, the rounding process selects the net's solution that is mapped to the generated random number for the net. Fourth, the rounding process measures the quality of the set of selected routes for the nets based on certain objective function or functions (such as those used by the LP solver). Fifth, the rounding process iteratively repeats the second to fourth operations until the solution space has been sufficiently explored. Sixth, the process selects the set of routes that resulted in the best quality score.

Based on the set of routes selected at 5330, the process stores (at 5335) a 42-bit selected route string in each slot-net data structure of the current slot. This 42-bit string specifies the paths in the current slot that the selected route of the net takes. The process then ends.

1. Predicting Remaining Path Capacities.

As mentioned above, the process 5300 predicts (at 5305) the congestion of path resources in the current slot. In some embodiments, the process specifies the path congestions by estimating the remaining capacity of each path in the slot. For instance, in some embodiments, the process computes path capacities by initially (1) estimating the unblocked capacity of each path, (2) estimating the use of each path, and (3) subtracting each path's use estimate from its unblocked-capacity estimate. One manner for estimating the unblocked path capacities will be described below by reference to FIG. 54, while one manner for estimating the path use will be described below by reference to FIG. 55.

a. Estimating Unblocked Capacity of Each Path.

Figure 54A:
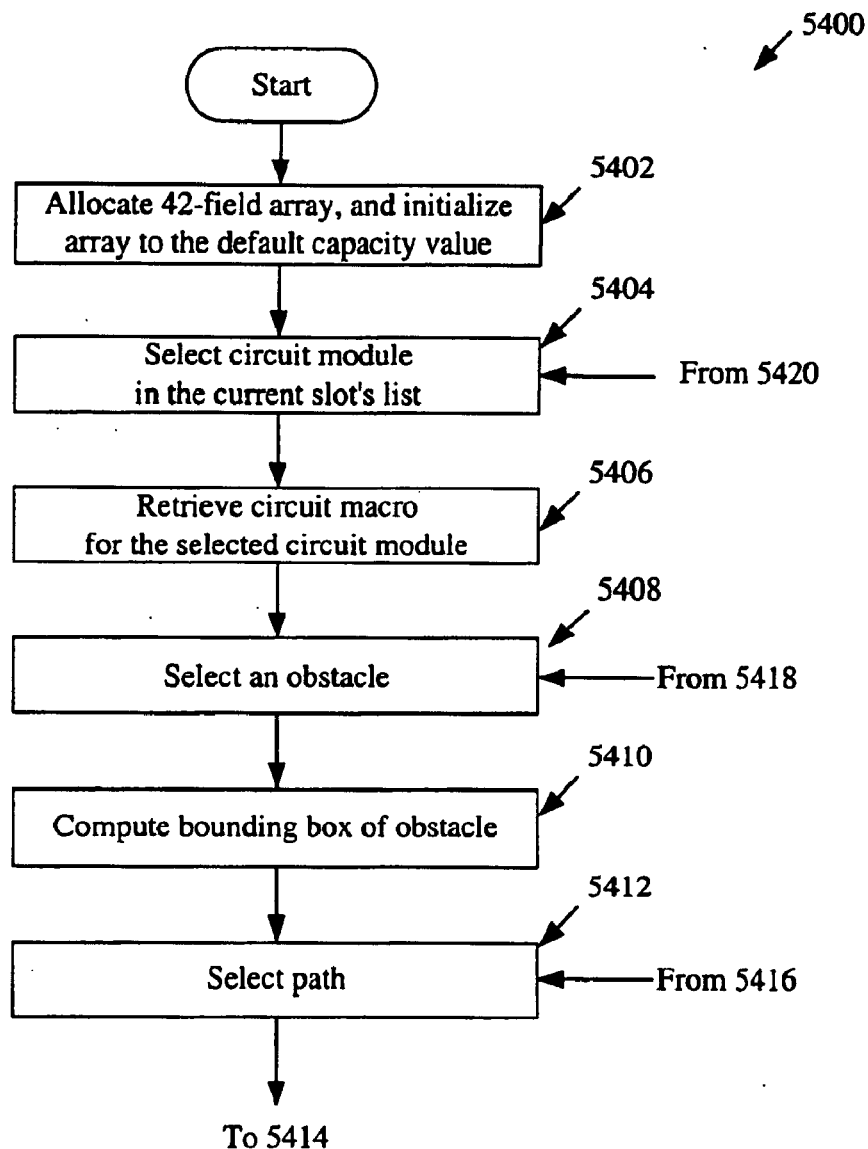
FIGS. 54 and 55 illustrate one manner for predicting the congestion of the paths.
Figure 54B:
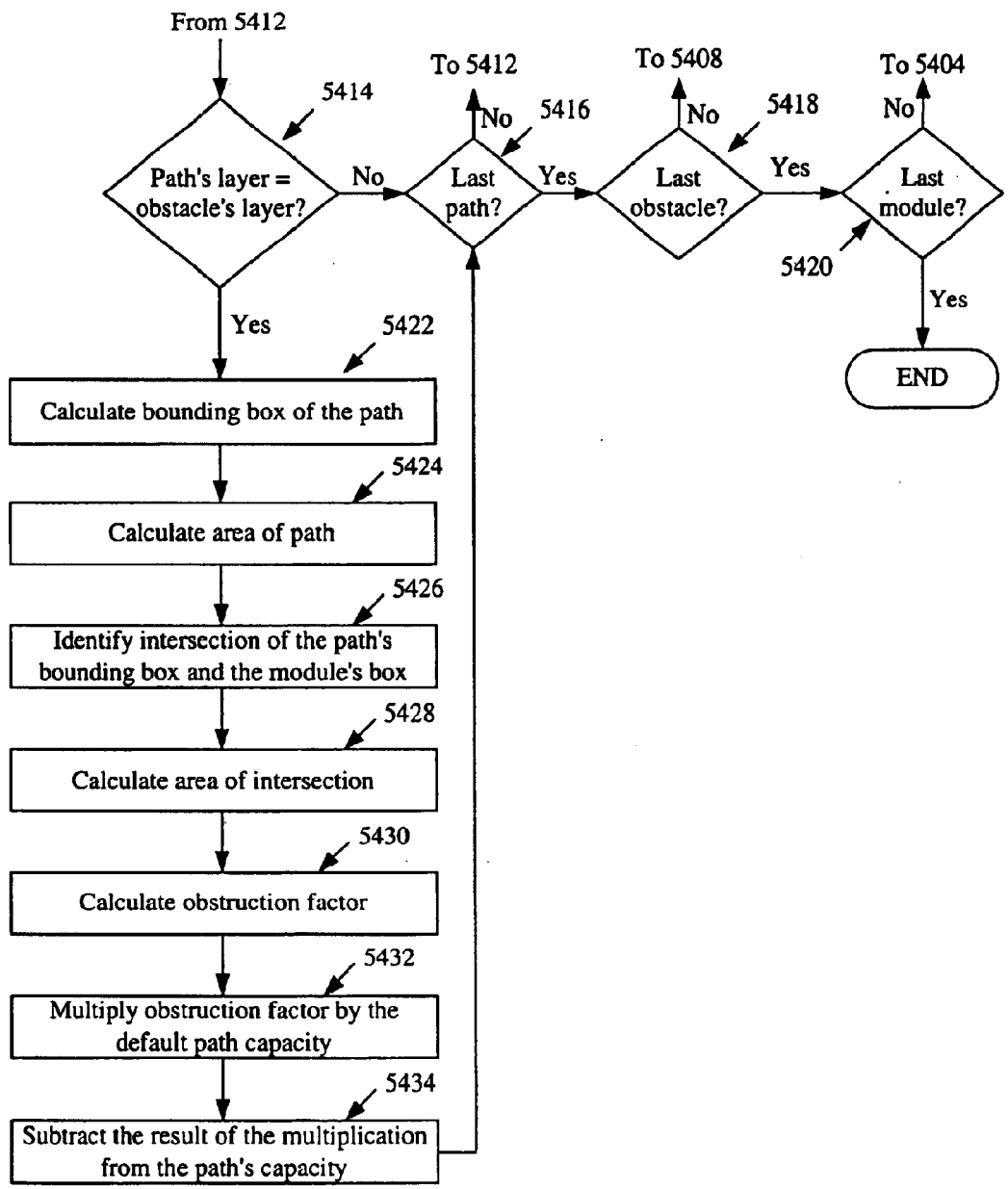

FIG. 54 illustrates a process 5400 for estimating the unblocked capacity of each path in the current slot. Initially, this process allocates (at 5402) a data structure with 42-fields of floating point numbers. Each field is for storing the unblocked capacity of one of the 42 paths. At 5402, the process also initializes each of path's field in the data structure to the default capacity value for the path.

At 5404, the process selects a circuit module in the current slot's list of circuit module. The process then retrieves (at 5406) the circuit macro for the selected circuit module. It then selects (at 5408) an obstacle on the circuit macro, and computes (at 5410) the bounding box of the selected obstacle by using the location of the circuit module.

Next, the process (at 5412) selects one of the 42 paths of the current slot. It then determines (at 5414) whether path selected at 5412 is on the same layer as of the obstacle selected at 5408. If the selected path's layer matches the selected obstacle's layer, the process calculates (at 5422) the bounding box of the selected path. Different embodiments define bounding boxes for paths differently. For instance, some embodiments define the bounding boxes for both Manhattan and non-Manhattan paths as rectangular halos about the paths. Under such an approach, the rectangular halo about a diagonal path is positioned diagonally with respect to the x-y coordinate axis. Other embodiments might define the bounding box of a diagonal path differently. For instance, some embodiments might define such a bounding box in terms of four rectangular halos (four bounding boxes) that encompass the four Manhattan edges about the diagonal path (e.g., the bounding box of diagonal path 26 would include four boxes that encompass edges E1, E4, E13, and E14).

The process then calculates (at 5424) the area of the bounding box of the path. The process next identifies (at 5426) the intersection of the selected path's bounding box and the selected circuit module's bounding box, and calculates (at 5428) the area of this intersection.

It then computes (at 5430) an obstruction factor by dividing the calculated intersection area by the calculated path area. The process next multiplies (at 5432) the obstruction factor by the default path capacity to produce an estimate of the number of tracks of the path obstructed by the obstacle. The process then subtracts (at 5434) the result of this multiplication from the path's current unblocked capacity, which is stored for the path in the 42-field data structure. The process next transitions to 5416, which is described below.

The process also transitions to 5416 from 5414 when the selected path's layer is not the same as the selected obstacle's layer. At 5416, the process determines whether it has examined all the paths in the current slot. If not, the process returns to 5412 to select another path of the current slot.

However, if the selected path is the last path of the current slot, the process determines (at 5418) whether it has examined all the obstacles of the circuit module selected at 5404. If not, the process transitions to 5408 to select another obstacle of the selected circuit module. Otherwise, the process determines (at 5420) whether it has examined all the circuit modules in the current slot. If not, the process transitions to 5404 to select another circuit module in the current slot.

The process 5400 ends when it has examined all the circuit modules in the current slot. At this stage, the 42-field data structure specifies the unblocked capacities of the 42 paths in the current slot. Specifically, at this stage, each of the 42 fields specifies the unblocked capacity of one of the 42 paths.

b. Path Use Estimation.

Figure 55A:
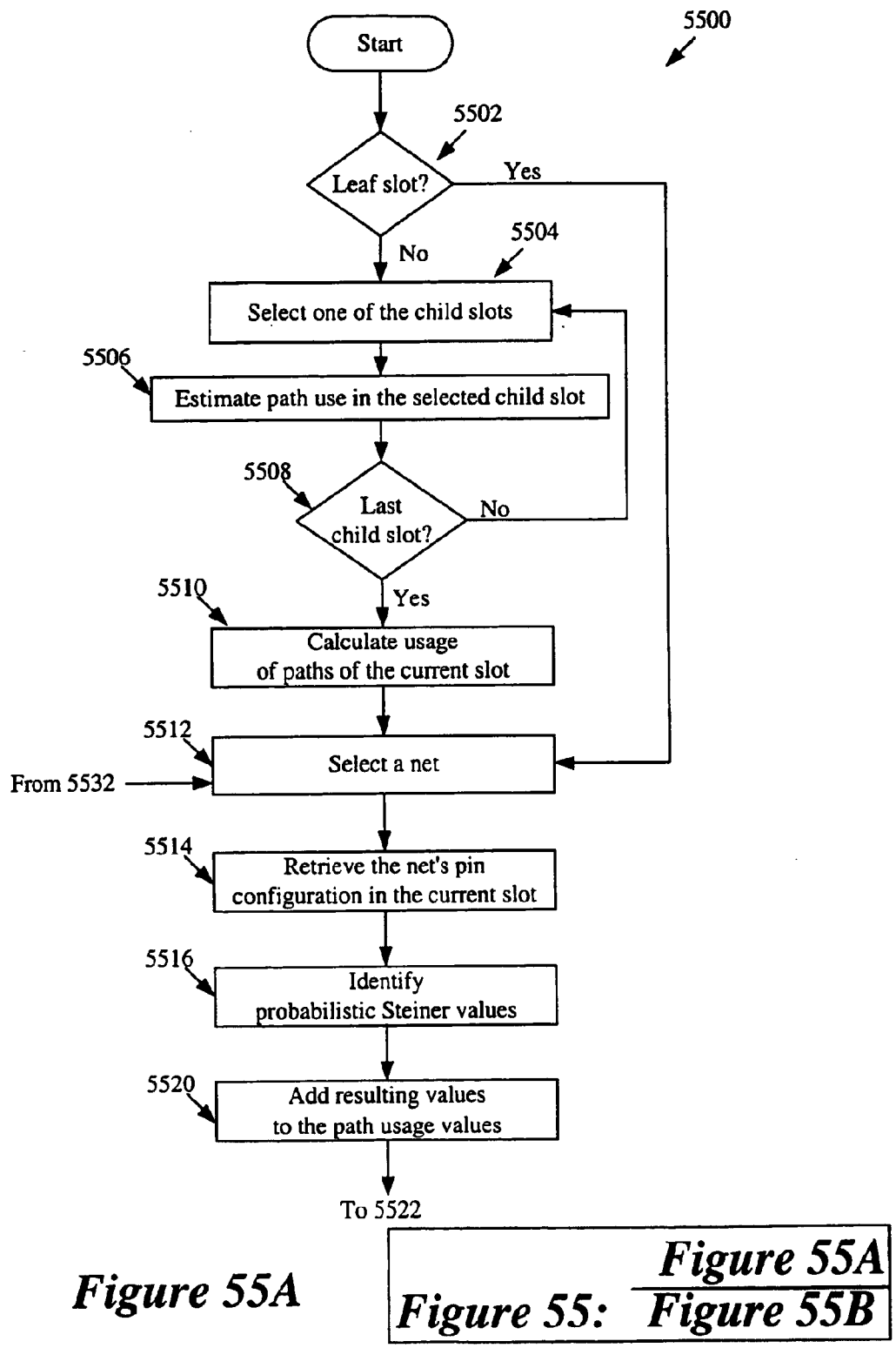
Figure 55B:
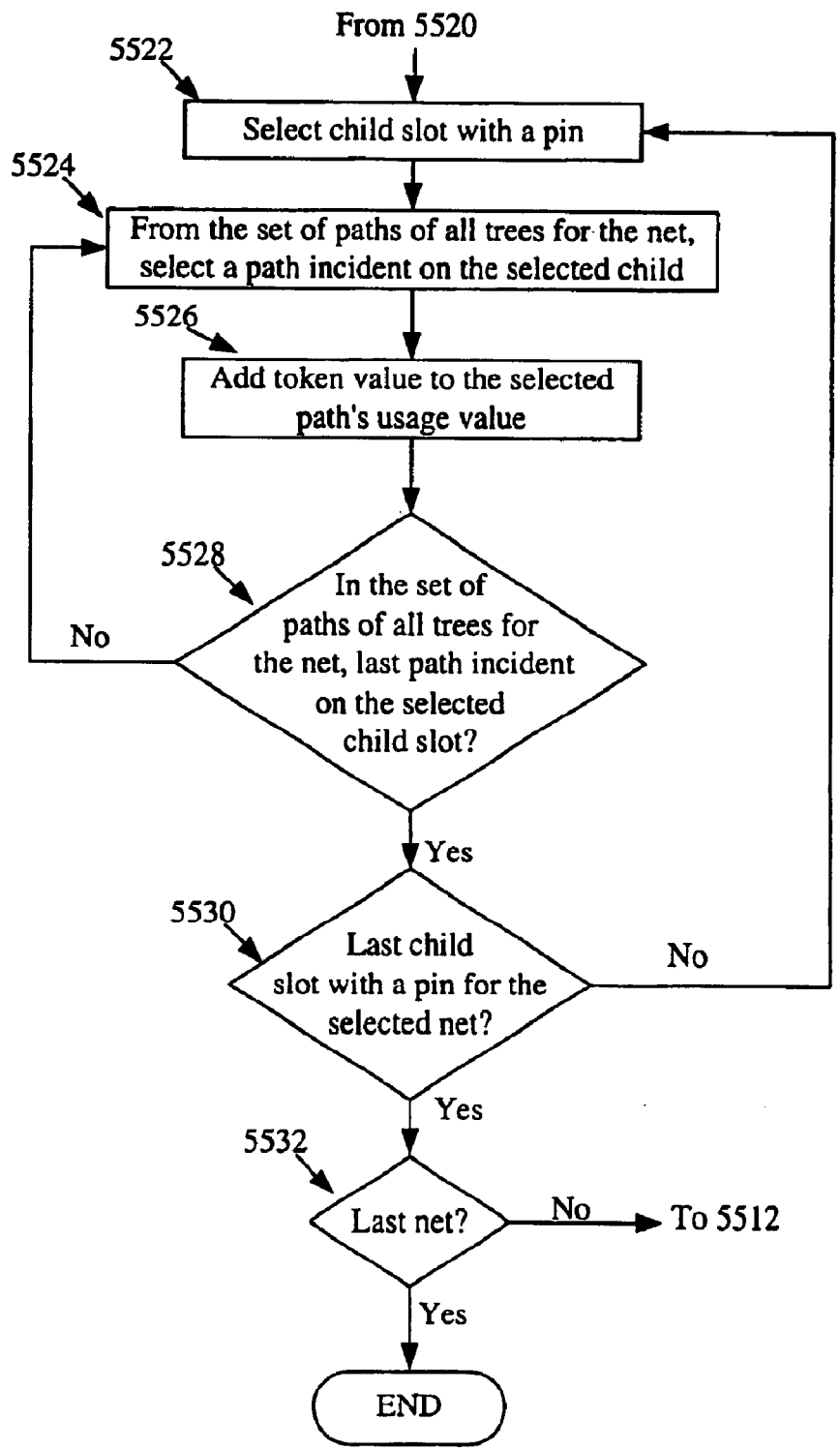

FIG. 55 illustrates a process 5500 for estimating the use of each path in a slot. This process is a recursive process that computes the usage of each path in the current slot in terms of three usage components. One path-usage component represents path usage due to routes between current slot's child slots. Another component represents path congestion due to routes in the current slot's child slots. The third component accounts for the effect of vias on path congestion. One of ordinary skill will understand that other embodiments compute path usage differently. For instance, for each net that is in only one child slot of a leaf slot, some embodiments also include a token path-usage value for each path incident on the child slot that contains the net.

The process 5500 starts each time it receives a current slot. As shown in FIG. 55, the process 5500 initially determines (at 5502) whether the current slot is a leaf slot. If so, the process transitions to 5512, which will be described below. If not, the process performs 5504 to 5510 to compute the usage values due to the routes in the current slot's child slots. Specifically, at 5504, the process selects one of the child slots of the current slot. The process then estimates (at 5506) the use of each path of each child slot of the current slot. In some embodiments, the process does this by recursively calling itself for each of the child slots.

The process next determines (at 5508) whether the child slot selected at 5504 is the last child slot. If not, the process selects (at 5504) another child slot and estimates (at 5506) the path-usage in the newly-selected child slot. Otherwise, the process transitions to 5510 to calculate the path-usage component due to the congestion in the current slot's child slots.

In some embodiments, the process stores the path-usage values calculated at 5510 in a data structure (e.g., an array) with 42-fields for storing the usage values for the 42 paths in the current slot. The process receives this data structure with the current slot in some embodiments, while in other embodiments, the process 5500 does not receive such a data structure but rather initializes the data structure when it starts.

At 5510, the process calculates path-usage component due to the congestion in the child slots. For instance, the process can define a component usage value for path 1 between child slots 1 and 2 in terms of the congestion within child slots 1 and 2 via a formula such as path_1_use=[(0.75)+(0.25)*(1/(Number of recursion levels−Current Level))]

*(½)*(½*(path[1][2]+path[1][5]+path[1][8]

+path[1][11])+⅓*(path[1][1]+path[1][4]+path[1][7])

+path[1][10])+⅙*(path[1][0]+path[1][3]+path[1][6]

+path[1][9])+½*(path[2][0]+path[2][3]+path[2][6]

+path[2][9])+⅓*(path[2][1]+path[2][4]+path[2][7]

+path[2][10])+⅙*(path[2][2]+path[2][5]+path[2][8]

+path[2][11])), where path[i][j] refers to the usage of path j of child slot i. Similar equations can be used to define analogously the component usage values for the other 41 paths in the current slot.

The above equation only examines in the child slots the horizontal paths line that are in line with path 1. Specifically, it examines the path 1's component usage value in terms of all the horizontal paths (i.e., paths 0–11) of child slots 1 and 2. The summation of the usage values in both child slots 1 and 2 is multiplied by ½ to reflect that the capacity of path 1 in the current slot is equally influenced by the capacities of the paths in child slots 1 and 2.

The multipliers ½'s, ⅓'s and ⅙'s are used in the summation for both child slots 1 and 2 for the following reasons. The objective is to guess how many wires can be pushed through a path. Some of these wires will terminate immediately after crossing the path, while some will cross the entire width of the slot incident to the path. It is assumed that there will be a uniform distribution of "endpoints" of the wires using the path, such that for propagate 0 of path 1 ¼ will terminate in slot 0 of child slot 2, ¼ will terminate in slot 1 of child slot 2, ¼ in slot 2 of child slot 2 and ¼ in slot 3 of child slot 2 and beyond. This means that ¾ of the wires that use the path 1 will also use path 0 of child slot 2, ⅔ will use path 1 in child slot 2, and ¼ will use path 3 in child slot 2—which gives a ratio of 3:2:1 (or 3/6, 2/6, 1/6) of relative impact of the usages of these 3 paths on the estimated use of the propagated path.

Also, the summation of usage values in child slots 1 and 2 is multiplied by [(0.75)+(0.25)*(1/(Number of recursion levels−Current Level))]. This multiplication is based on an assumption that most nets routes' include a single path connecting two real pins. If a uniform distribution of pins is assumed in the grandchild slots, then ¾$^{th}$ of the routes using a given path will see congestion from the nets wholly contained in each child slot. As the router moves down the hierarchy, a greater percentage of the routes traverse entire grandchild slots, and hence more nets will see the entire congestion in the grandchild slots, which thereby justifies increasing the multiplier to 1.

From 5502 or 5510, the process transitions to 5512. The process performs operations 5512 to 5528 to compute the component usage values due to the routes between the current slot's child slots. The process computes these component values in terms of the probabilistic-Steiner-tree contributions described above.

At 5512, the process selects a net. The process then retrieves (at 5514) the selected net's pin configuration in the current slot. It next identifies (at 5516) the probabilistic Steiner-tree values for the retrieved pin configuration. As mentioned above, FIG. 28 illustrates the probabilistic Steiner-tree values for the pin configuration of net 505 illustrated in FIG. 5. Some embodiments precompute the probabilistic Steiner-tree values, as described above by reference to FIG. 26. Other embodiments, however, generate these values during the path-use estimation process 5500.

The process then adds (at 5520) each path's probability values to the path's usage value in the 42-field data structure. Next, the process performs 5522–5530 to compute the token usage value to account for the effect of vias for the net on the path congestion. When a net has one or more pins in the child slots of the current slot, these pins are typically on the lower metal layers. Accordingly, vias will need to be added to connect some of these pins to the specified paths for the net. The addition of each via, in turn, will increase the path congestion.

At 5522, the process selects a child slot that contains one of the pins of the net selected at 5512. This net has one or more routes, with each route using one or more paths. Hence, at 5524, the process selects one of the route paths incident on the child slot selected at 5522. It then increments (at 5526) the selected path's usage value by a token amount. In some embodiments, the token amount is 0.5/(Number of Recursion levels−Current Recursion Level).

The process then determines (at 5528) whether it has examined all the paths (of all the trees of the selected net) that are incident on the selected child slot. If not, the process selects (at 5524) another path incident on the selected child slot and then increments (at 5526) the selected path's usage value by the token amount.

On the other hand, if the process determines (at 5528) that it has examined the last path incident on the selected child slot, the process determines (at 5530) whether it has examined the last child slot with a pin for the selected net. If not, the process returns to 5522 to select another child slot that has a pin for the selected net. Otherwise, the process determines (at 5532) whether it has examined the last net in the current slot. If not, the process transitions back to 5512 to select another net and to perform the subsequent operations for this net. The process ends when it determines that it has examined the last net at 5532.

2. Identifying Routes for Each Net in the Current Slot

After estimating (at 5305) the remaining capacity of each path in the current slot, the process identifies (at 5310) one or more routes for each net in the current slot. The embodiments described below initially use each net's configuration with respect to the current slot to identify one or more routes for each net.

These embodiments then generate fake configurations for some or all nets, and identify additional routes for the nets based on the generated fake configurations. Some embodiments use two different approaches to generate fake configurations for a net. One approach adds fake pins to a net's configuration. This approach is described below by reference to FIGS. 56–58. The second approach breaks a net's configuration into two or more configurations and adds fake pins to the new configurations. This approach is described below by reference to FIGS. 60 and 59.

a. Identifying Routes for Each Net Configuration and Generating Detour Possibilities By Adding Fake Pins to the Net Configurations.

Figures 56, 56A, 56B, 56C, 56D:
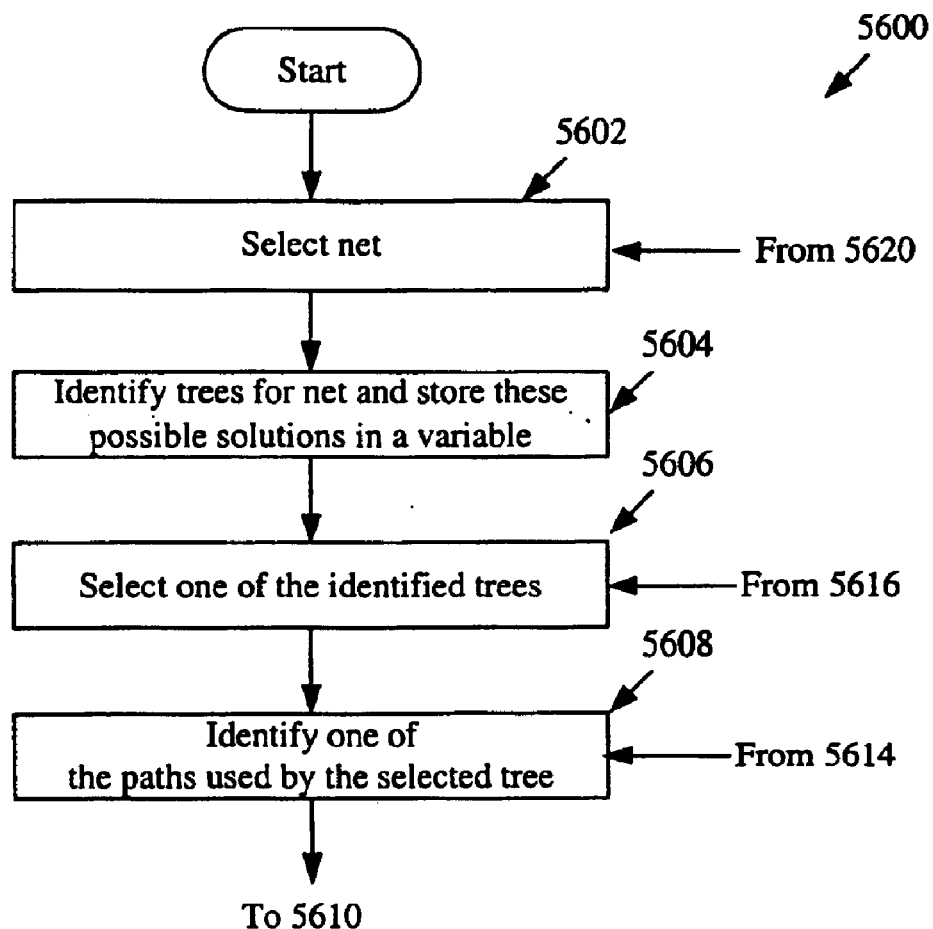
FIG. 56 illustrates a process for identifying routes for each net configuration and generating detour possibilities by adding fake pins to the net configurations.
Figure 56B:
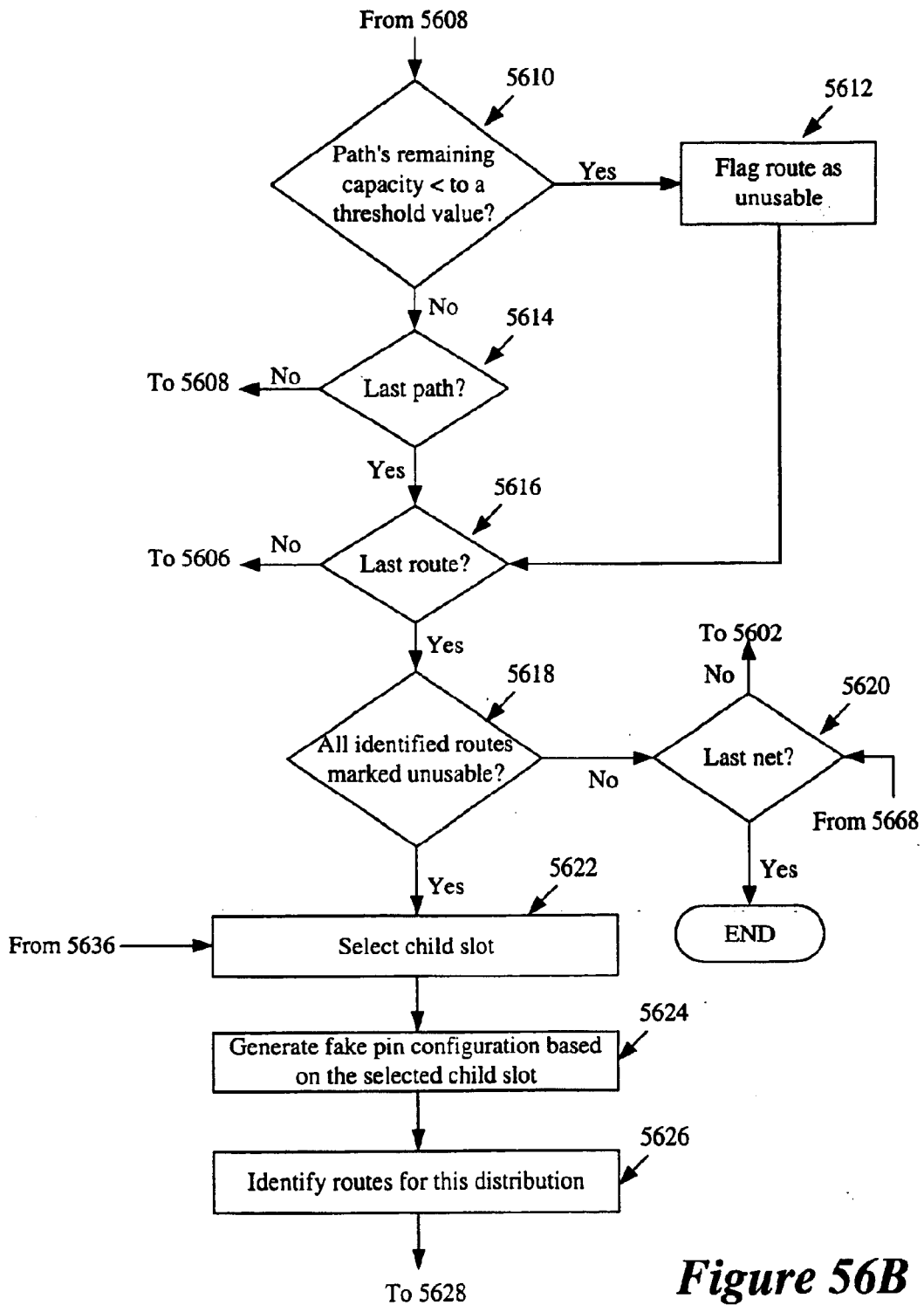
Figure 56C:
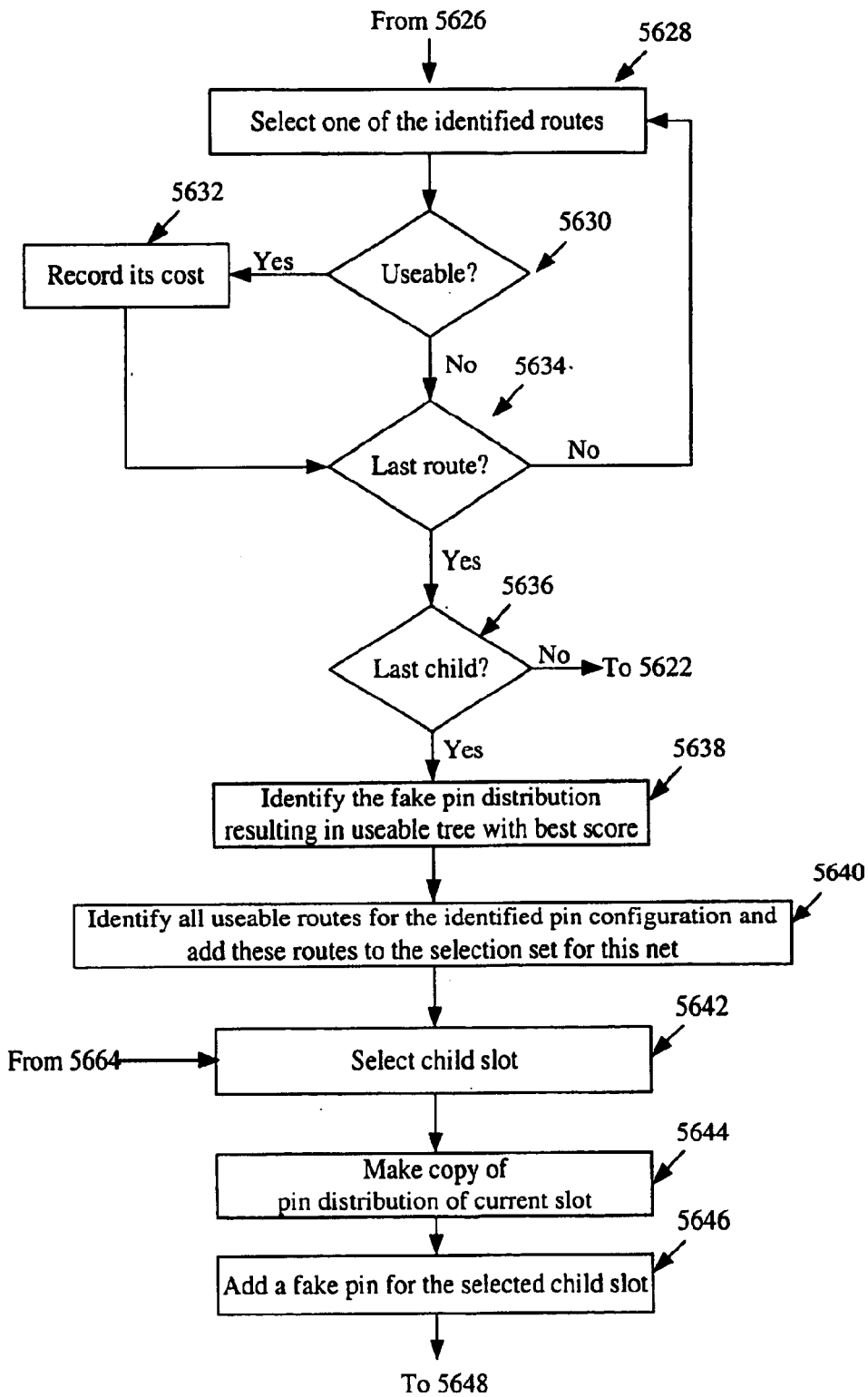
Figure 56D:
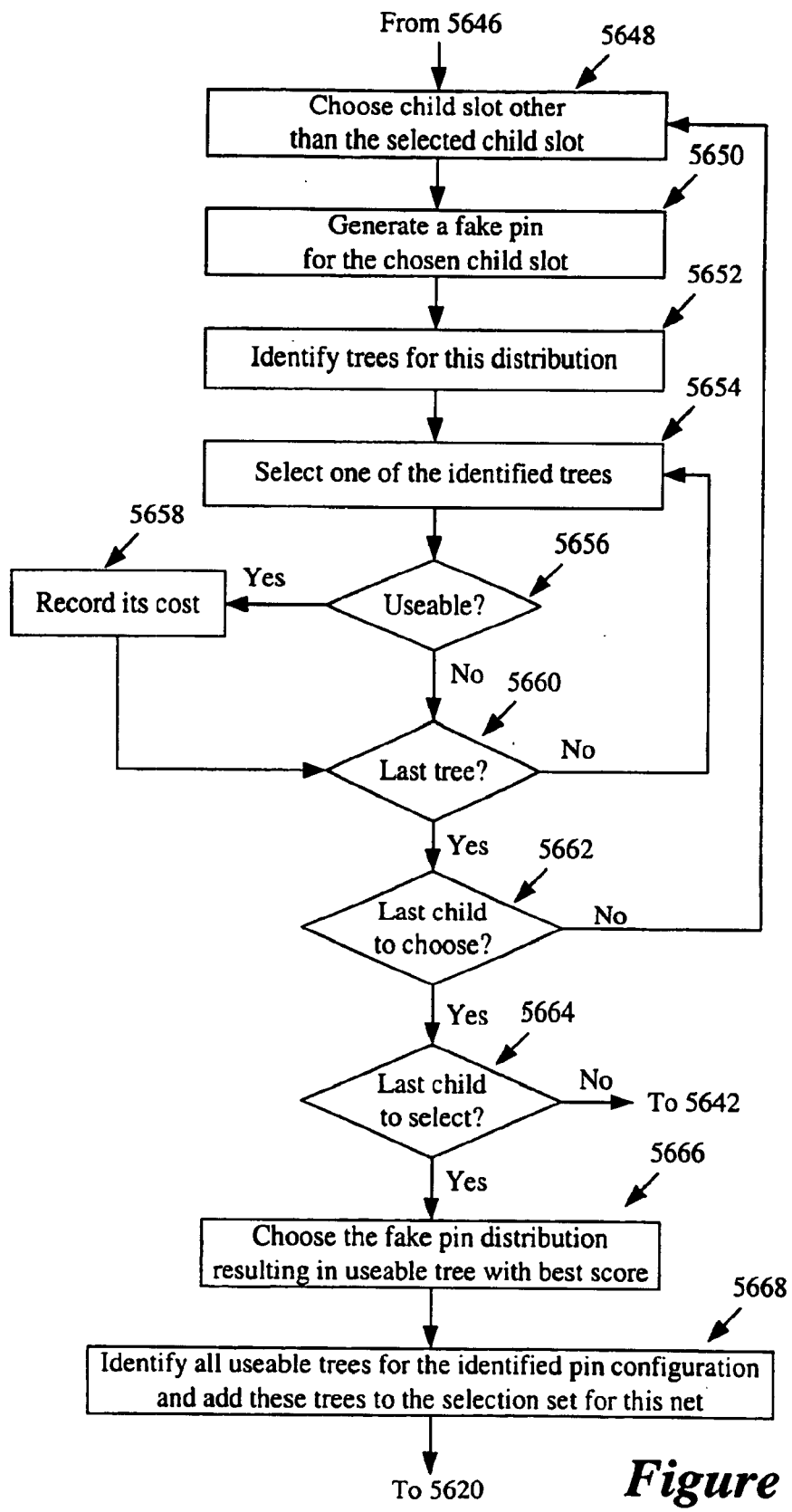

FIG. 56 illustrates a process 5600 for identifying routes for each net configuration and generating detour possibilities by adding fake pins to the net configurations. As shown in this figure, the process 5600 initially selects (at 5602) a net in the current slot. At 5604, the process (1) uses the net's configuration in the current slot to identify routes for the selected net, and (2) stores the identified routes for the selected net in a variable in the solver. The process 5600 identifies trees for the particular net configurations based on one of the approaches described above in Section V.

After identifying and storing the routes based on the selected net's configuration, the process performs some or all of the operations 5606 to 5668 to determine whether it needs to generate detour routes for the selected net, and if so, to generate these detour routes by adding one or two fake pins.

The process 5600 generates detour routes for a selected net where all the optimal routes identified for the net at 5604 use one or more paths that are "at risk". A path is "at risk" if the estimated congestion (path-use plus blockages) is near or over the path's capacity. Some embodiments determine whether a path is "at risk" by determining whether the path's remaining capacity (which was computed at 5305) is less than a threshold amount. Sub-optimal routes can be generated for a varying number of nets by varying the threshold at which a path is defined to be "at risk."

Figure 57:
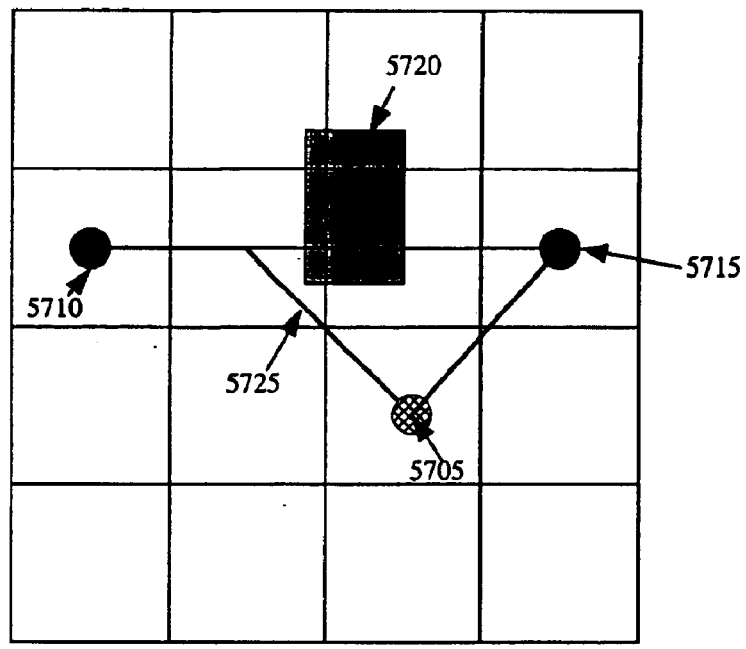
FIGS. 57 and 58 provide examples of how sub-optimal detour routes are generated by adding one or two fake pin configurations.
Figure 58:
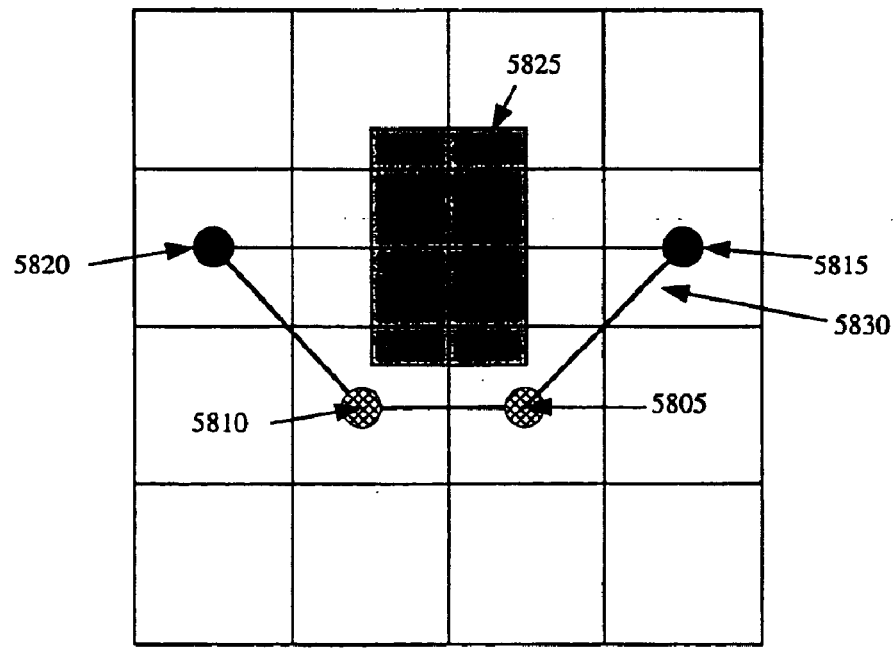

FIGS. 57 and 58 provide illustrative examples of how sub-optimal detour routes are generated by adding one or two fake pin configurations. Specifically, FIG. 57 illustrates a sub-optimal route 5725 for a net that has two pins 5710 and 5715 in child slots 8 and 11. This sub-optimal route is generated by adding a fake pin 5705. This sub-optimal route 5725 avoids horizontal path P7 (between child slots 9 and 10), which is congested due to obstacle 5720. Adding virtual pin 5705 to the pin distribution of the net results in a new pin configuration. The optimal route for this new pin configuration provides a sub-optimal route for the original net having pins 5710 and 5715. This sub-optimal route does not use "at risk" path 7.

FIG. 58 illustrates an example where two fake pins 5805 and 5810 have been added to a net that has pins 5815 and 5820. These two fake pins generate a sub-optimal route 5830 that avoids paths 7 and 33 that are blocked and congested by obstacle 5825.

The process 5600 of FIG. 56 generates detour routes by (1) adding one and then two fake pins to the net configurations, and (2) identifying the best optimal routes for the resulting pin configurations. Even though this process at most adds two fake pins to a net's configuration, one of ordinary skill will realize that other embodiments add more fake pins to the net configurations in order to identify useful detour routes for some or all the nets.

At 5606, the process selects one of the routes identified at 5604. It then identifies (at 5608) one of the paths of the route selected at 5606. At 5610, the process determines whether the remaining capacity of the path selected at 5608 is less than the threshold capacity value. The remaining capacity of the path was computed at 5305.

If the process determines (at 5610) that the path's remaining capacity is less than its threshold capacity value, the process flags (at 5612) the route selected at 5606 as unusable, and then transitions to 5616, which will be described below. If not, the process determines (at 5614) whether it has examined all the paths of the selected route.

If it has not examined all the paths, it transitions back to 5608 to select another path of the selected route. Otherwise, the process transitions to 5616.

At 5616, the process determines whether it has examined all the routes identified at 5604. If not, the process transitions back to 5606 to select another of the identified routes for the selected net. Otherwise, the process determines (at 5618) whether it marked all the identified routes for the selected net as unusable. If not, the net has one or more routes that do not use any "at risk" paths, and hence the process does not generate fake configurations for this net. The process then determines (at 5620) whether it has examined all the nets in the current slot. If it has examined all the nets, the process ends. Otherwise, the process transitions from 5620 to 5602 to select another net in the current slot.

If the process determines (at 5618) that all the identified routes for the selected net are unusable, the process selects (at 5622) a child slot of the current slot. For the selected net, the process then generates (at 5624) a fake pin configuration that indicates the net has a pin in the child slot selected at 5622. In some embodiments, the process generates this fake pin configuration by duplicating the selected net's actual pin configuration in the current slot, and ensuring that the duplicated pin configuration indicates a pin for the child slot selected at 5622. In the example illustrated in FIG. 57, the process generates a fake configuration 0000100101000000 by adding a "1" for the $6^{th}$ child slot to the original configuration 0000100100000000.

The process then identifies (at 5626) routes for the fake pin configuration generated at 5624. The process can identify these routes for the pin configuration by using any one of the methods discussed above in Section V. Next, the process selects (at 5628) one of the routes identified at 5626. The process then determines (at 5630) whether the selected route is usable. The process makes this determination by performing usability-checking operations similar to 5608–5616, which were described above. If process determines (at 5630) that the route selected at 5628 is not usable, the process transitions to 5634, which will be described below. If the selected route is usable, the process records (at 5632) for the generated fake configuration the selected route's cost, and then transitions to 5634.

At 5634, the process determines whether it has examined all the routes identified at 5626 for the generated fake configuration. If not, the process transitions back to 5628 to select another identified route. Otherwise, the process determines (at 5636) whether it has generated a fake pin configuration for all the child slots of the current slot. If not, the process returns to 5622 to select another child slot.

Otherwise, the process identifies (at 5638) the fake pin configuration, if any, that resulted in the useable route with the best cost recorded at 5632. If a configuration is identified at 5638, the process then identifies (at 5640) all the useable routes for the pin configuration identified at 5638, and adds these routes to the set of possible routing solutions for the current net.

Next, the process performs 5642–5668 to generate routes for fake configurations that contain up to 2 fake pins. Specifically, at 5642, the process selects a child slot of the current slot. The process duplicates (at 5644) the selected net's actual pin configuration in the current slot. It then ensures (at 5646) that the duplicated pin configuration indicates a pin for the child slot selected at 5642. In the example illustrated in FIG. 58, the process generates an initial fake configuration 0000100101000000 by adding a "1" for the $6^{th}$ child slot to the original configuration 0000100100000000.

At 5648, the process then selects a child slot other than the one selected at 5642. It then generates (at 5650) a fake pin configuration that indicates the net has a pin in the child slot selected at 5648. In some embodiments, the process generates this fake pin configuration by duplicating the pin configuration identified at 5646, and ensuring that the duplicated pin configuration indicates a pin for the child slot selected at 5648. In the example illustrated in FIG. 58, the process generates a final fake configuration 0000100101100000 by adding a "1" for the $5^{th}$ child slot to the initial fake configuration 0000100101000000.

The process then identifies (at 5652) routes for the fake pin configuration generated at 5650. As at 5604 and 5626, the process can identify these routes for the generated pin configuration by using any one of the methods discussed above in Section V.

Next, the process selects (at 5654) one of the routes identified at 5652. The process then determines (at 5656) whether the selected route is usable. The process makes this determination by performing usability-checking operations similar to 5608–5616, which were described above. If the route selected at 5654 is not usable, the process transitions to 5660, which will be described below. If it is usable, the process records (at 5658) for the generated fake configuration the selected route's cost, and then transitions to 5660.

At 5660, the process determines whether it has examined all the routes identified at 5652 for the fake pin configuration generated at 5650. If not, the process transitions back to 5654 to select another identified route. Otherwise, the process determines (at 5662) whether it has generated a fake pin configuration for all the child slots other than the child slot selected at 5642. If not, the process returns to 5648 to select another child slot other than the one selected at 5642.

Otherwise, the process determines (at 5664) whether it has examined all the child slots as potential first fake pins. If not, the process returns to 5642 to select another child slot. When the process determines (at 5664) that it has examined all the child slots as potential first fake pins, the process identifies (at 5666) the fake pin configuration, if any, that resulted in the useable route with the best cost recorded at 5658. If a configuration was identified at 5666, the process then identifies (at 5668) all the useable routes for the pin configuration identified at 5666, and adds these routes to the set of possible routing solutions for the current net.

From 5668, the process transitions to 5620. At 5620, the process determines whether it has examined all the nets in the current slot. If it has examined all the nets, the process ends. Otherwise, the process transitions from 5620 to 5602 to select another net in the current slot.

b. Breaking Net Configurations into Smaller Pin Configurations and Adding Fake Pins to the Smaller Pin Configurations In some instance, simply adding fake pins to a net configuration does not result in the best sub-optimal route. Such a route can sometimes be generated by (1) generating two or more pin configurations from a net's pin configuration, (2) identifying fake configurations for the generated pin configurations, (3) identifying routes for the configurations, and (4) combining the resulting routes to find one or more sub-optimal routes. Such an approach is especially useful in situations where the congested path is between 2 adjacent "real" pins.

Figure 59:
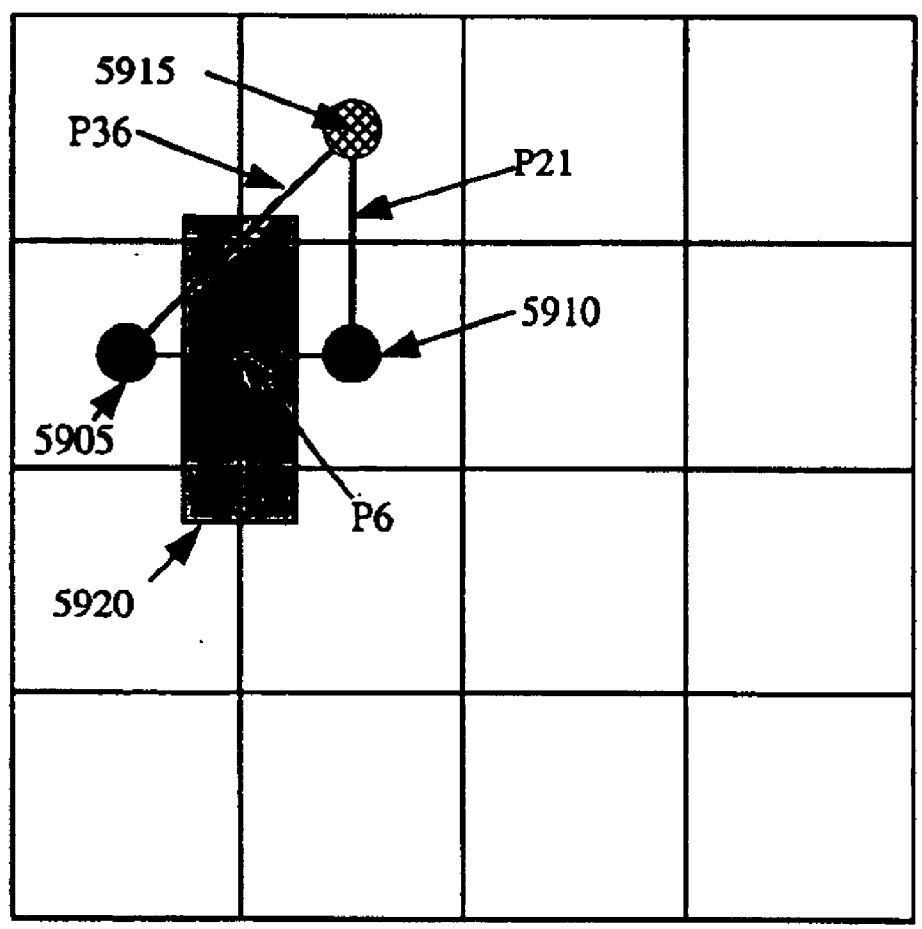
FIG. 59 illustrates another technique for identifying additional routes for a net configuration.

FIG. 59 illustrates an example of such an approach. In this example, a net has two pins 5905 and 5910. If a fake pin 5915 is added to the original net configuration, the route for the resulting net configuration would use paths P6 and P21. However, such a route would not be useable since obstacle 5920 completely obstructs path P6. A more ideal route that uses paths 21 and 36 can be obtained by (1) splitting the pin configuration into two, one that contains pin 5905 and one that contains pin 5910, and (2) adding the fake pins 5915 to both of the resulting pin configurations.

Figure 60A:
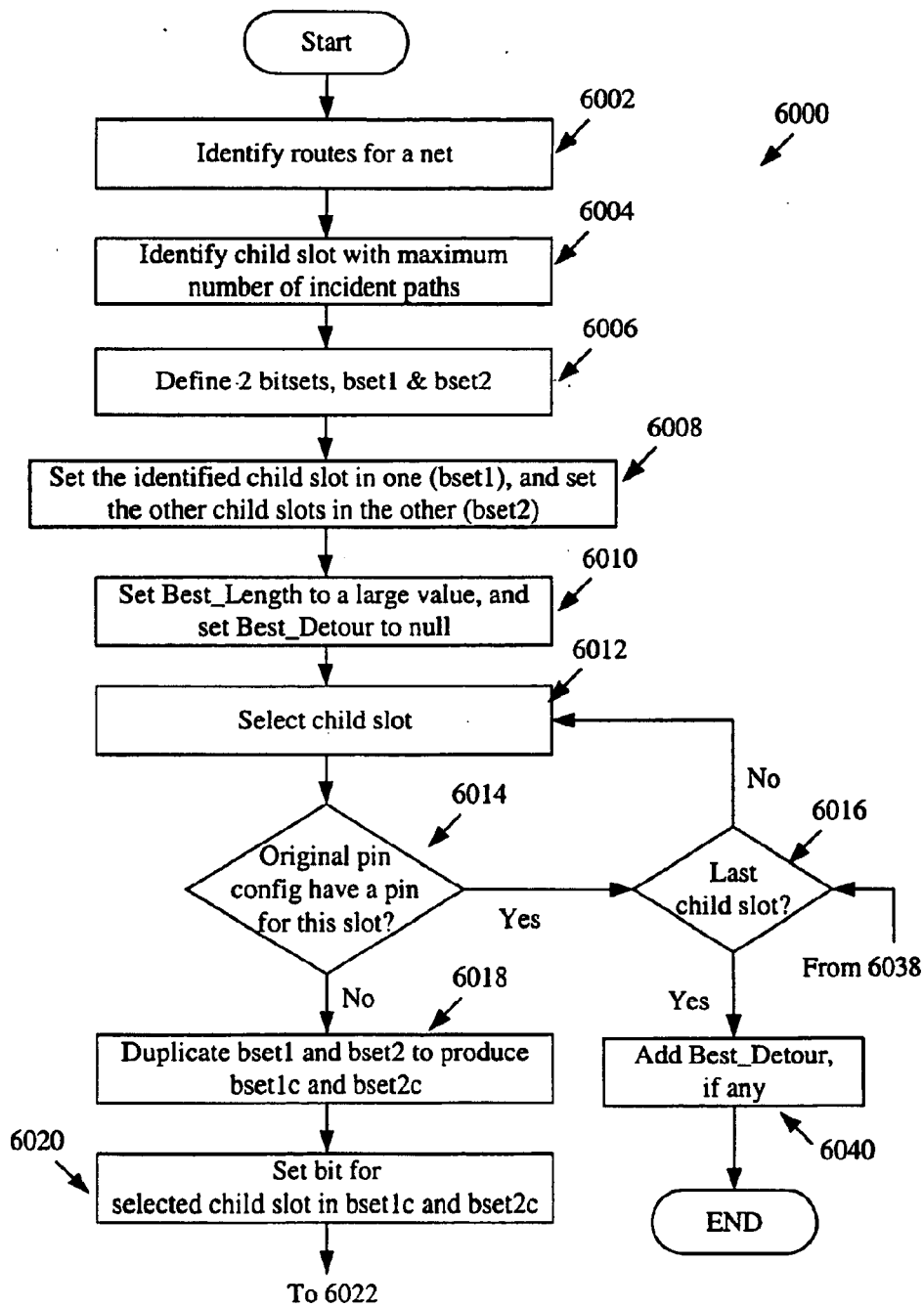
FIG. 60 illustrates a process that identifies additional routes for a net configuration.
Figure 60B:
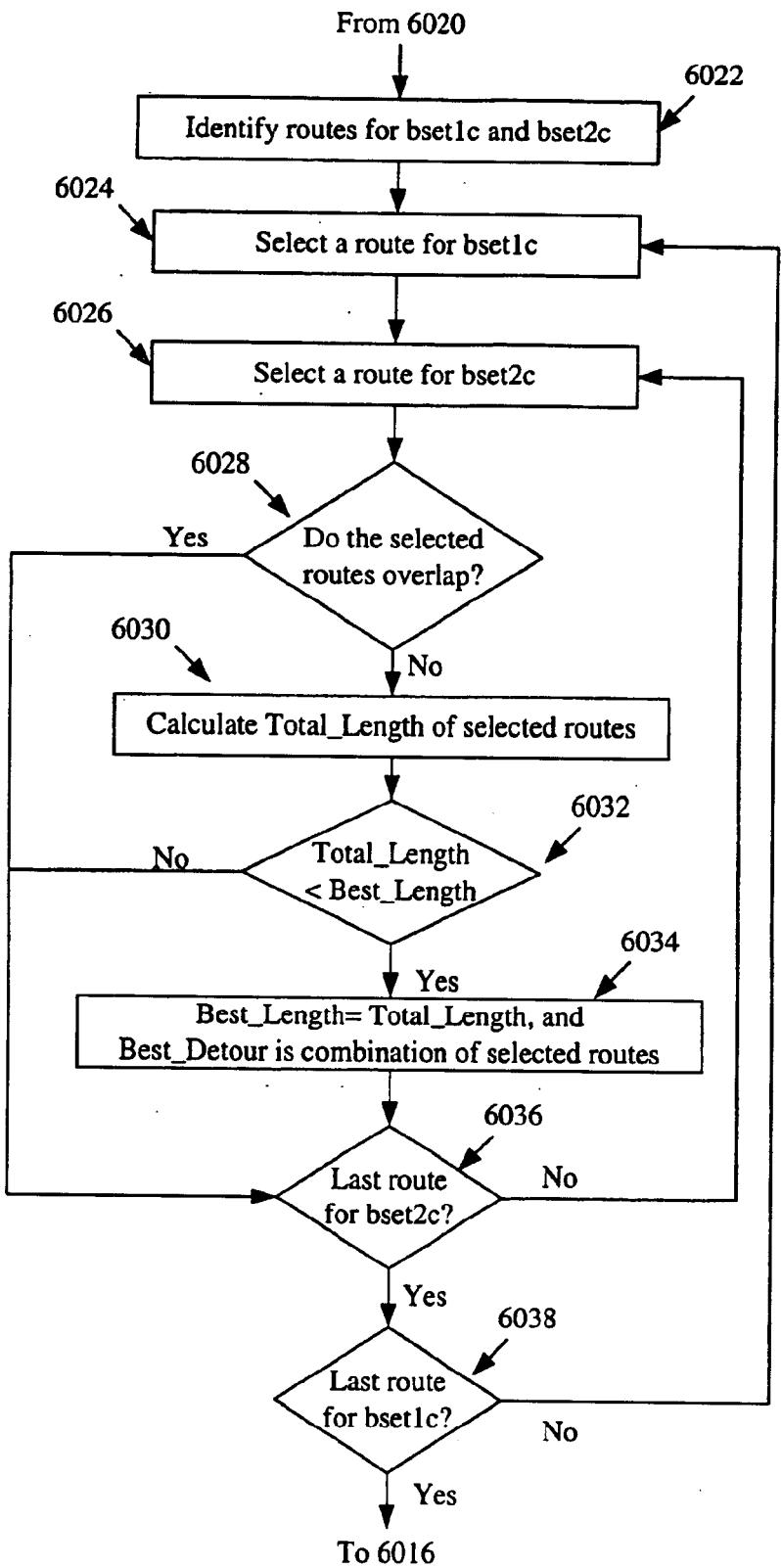

FIG. 60 illustrates a process 6000 that identifies additional routes for a net configuration. This process generates two pin configurations from the net's pin configuration, identifies fake configurations for both the generated pin configurations, identifies routes for the fake configurations, and combines the resulting routes. Some embodiments perform this process for each net in the current slot, while other embodiments only perform this process for some of the nets, such as those for which the process 5600 was not able to find useable routes.

As shown in FIG. 60, the process 6000 starts by identifying (at 6002) one or more routes for a net in the current slot. The process can identify these routes based on the net's pin configuration by using any one of the methods discussed above in Section V. The process then identifies (at 6004) the child slot that has the most number of paths of the identified routes incident upon it. The process then defines (at 6006) two bitsets, bset1 and bset2. In some embodiments, each bitset has 16-bits, all of which are initially defined to be zero.

Next, at 6008, the process sets to 1 the first bitset's bit corresponding to the child slot identified at 6004. At 6008, the process also sets to 1 the second bitset's bit or bits that correspond to the remaining child slots that contain pins of the current net. At 6010, the process initializes two variables, which are the Best_Length variable used to measure the best length of a number of solutions, and the Best_Detour variable used to identify the solution that resulted in the best length. The Best_Length variable is initialized to a large value, while the Best_Detour variable is initialized to null.

At 6012, the process selects one of the current slot's child slots. It then determines (at 6014) whether the current net's pin configuration has the selected child slot's corresponding bit set to 1 (i.e., whether the current net has a pin in the selected child slot). If so, the process determines (at 6016) whether it has tried to generate fake configurations for each child slot of the current slot. If it has not examined all the child slots of the current slot, the process returns to 6012 to select another child slot. If it has, the process transitions to 6040, which will be described below.

If the process determines (at 6014) that the bit corresponding to the selected child slot is not set to 1 in the current net's pin configuration, the process generates (at 6018) two duplicated bitsets, biset1c and bitset2c, from the two bitsets, bitset1 and bitset2. In each duplicate bitset, the process then sets (at 6020) to 1 the bit that corresponds to the selected child slot.

Next, the process identifies (at 6022) one or more routes for each of the duplicated, modified bitsets. The process can identify these routes for the duplicated, modified bitsets by using any one of the methods discussed above in Section V. The process then selects (at 6024) one of the routes for the first duplicated, modified bitset (i.e., for bitset1c), and selects (at 6026) one of the routes for the second duplicated, modified bitset (i.e., for bitset2c). At 6028, the process then determines whether the two selected routes overlap (i.e., whether the two solutions share one or more routing paths between the child slots). If so, the process transitions to 6036, which will be described below.

If not, the process calculates (at 6030) the length of a route that would result by combining the two routes selected at 6024 and 6026. In some embodiments, the process calculates this length by summing the lengths of the two routes selected at 6024 and 6026. At 6032, the process determines whether the length calculated at 6030 is less than the current Best_Length. If not, the process transitions to 6036, which will be described below.

When the length calculated at 6030 is less than the current Best_Length, the two routes selected at 6024 and 6026 represent the best solution that the process 6000 has seen thus far. Accordingly, at 6034, the process defines the Best_Length equal to the length computed at 6030. At 6034, the process also generates a new route as the combination of the two routes selected at 6024 and 6026, and defines the Best_Detour as the generated new route. From 6034, the process transitions to 6036.

At 6036, the process determines whether it has examined all the routes identified (at 6022) for the second duplicated, modified bitset (bitset2c) with the route that was selected at 6024 for the first duplicated, modified bitset (bitset1c). If not, the process returns to 6026 to select another route for the second bitset2c. Otherwise, at 6038, the process determines whether it has examined all the routes identified (at 6022) for the first duplicated, modified bitset (bitset1c). If not, the process returns to 6024 to select another route for the first bitset1c to examine.

When the process determines (at 6038) that it has examined all the identified routes for the first duplicated, modified bitset (bitset1c), it determines (at 6016) whether it has tried to generate fake configurations for each child slot of the current slot. If it has, the process (at 6040) adds the solution (if any) that the process identified as the Best_Detour to the current net's solution pool, and then ends. On the other hand, if the process has not generated fake configuration for each child slot, the process returns to 6012 to select another child slot.

3. Assigning Costs for the Potential Routes

After identifying (at 5310) one or more routes for each net in the current slot, the process 5300 assigns (at 5315) a wirelength cost to each retrieved tree by factoring propagation into the next lower recursion level. In some embodiments, the cost of each route includes the following three component costs: (1) the wirelength cost of the route's path or paths that connect the child slots of the current slot, (2) the path propagation cost of the route's path or paths into the child slots, and (3) the cost in each child slot after selecting the path propagations.

Figure 61:
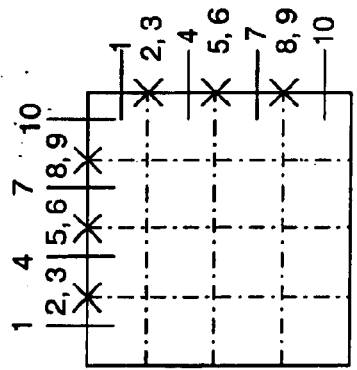
FIG. 61 illustrates one way for propagating a horizontal or vertical path between the current slot's child slots down into the slots of the child slots.
Figure 63:
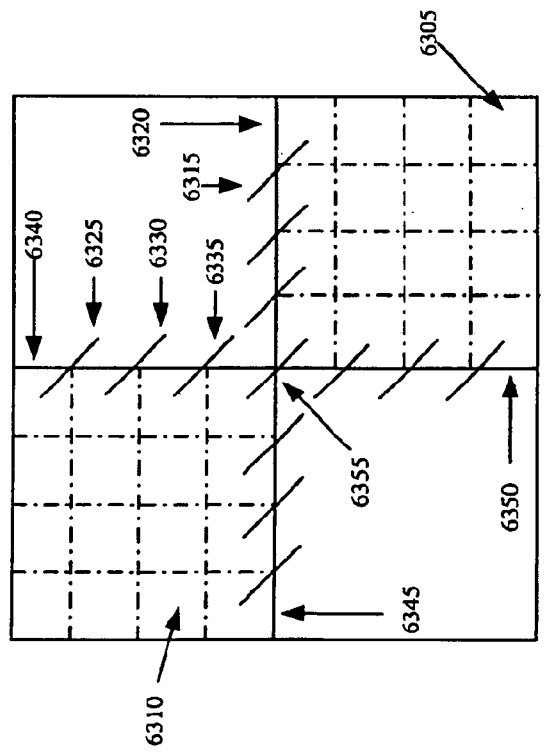
Figure 64A:
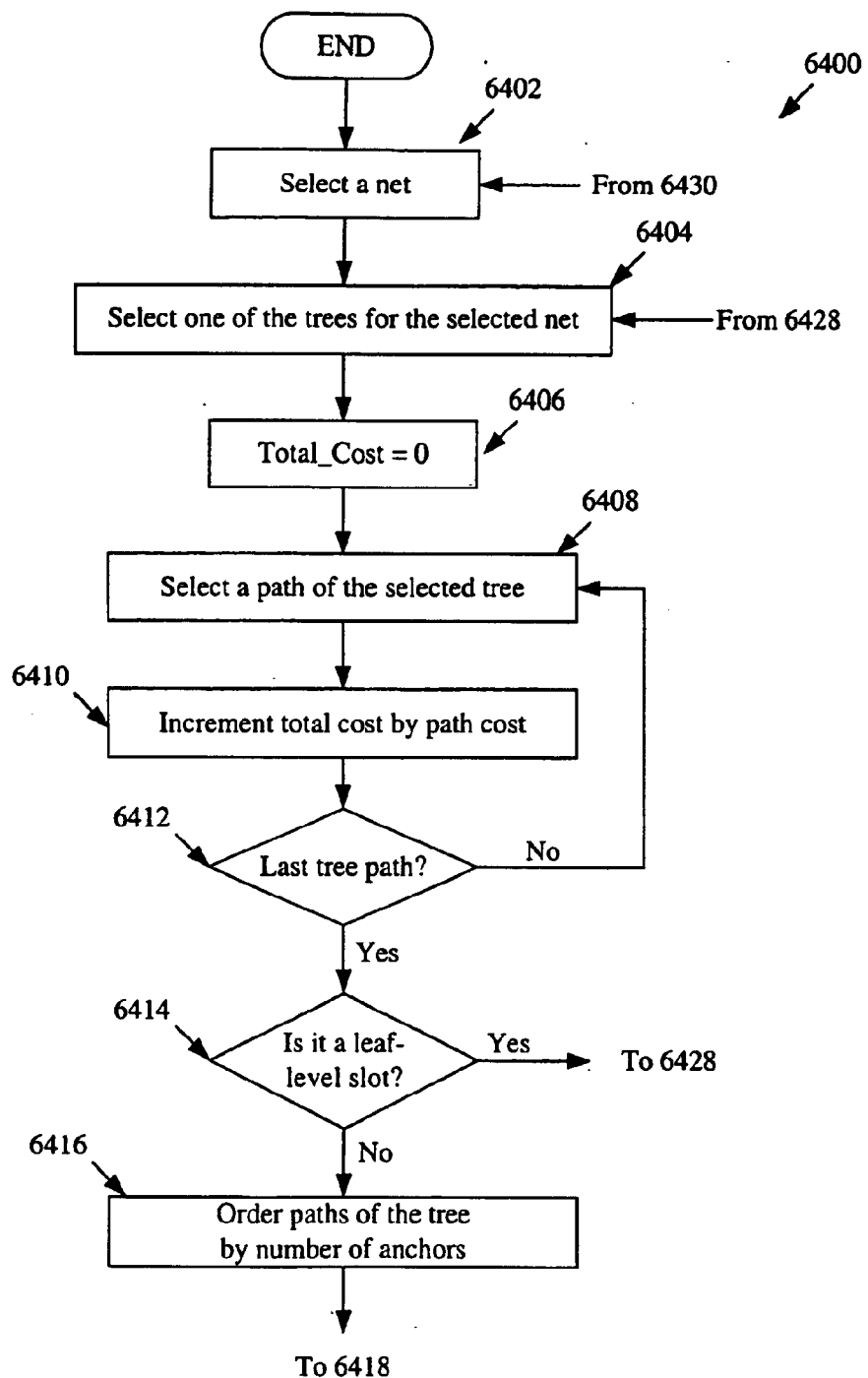
FIG. 64 illustrates a process for calculating the cost of each route in terms of three component costs.
Figure 64B:
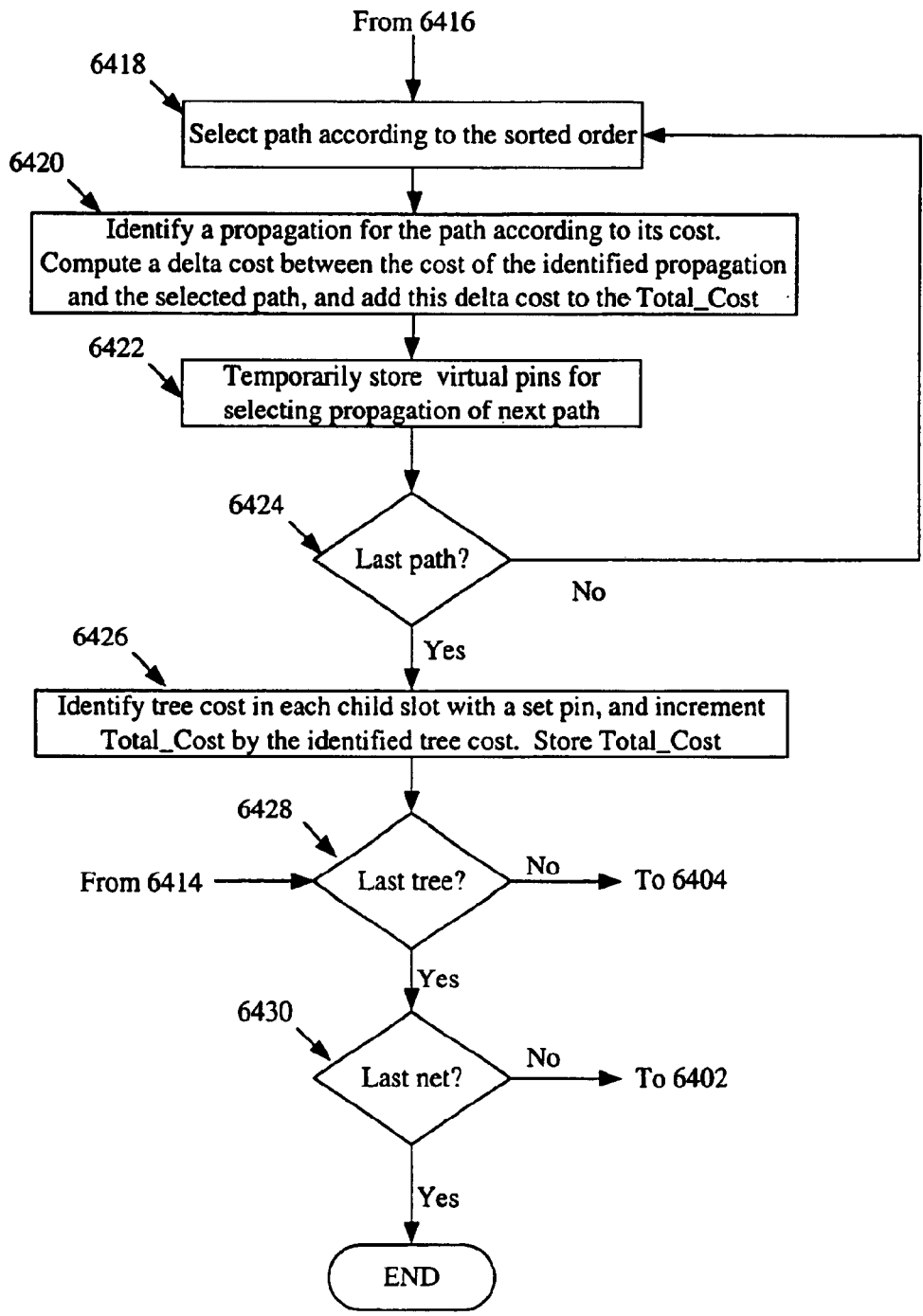

FIG. 64 illustrates a process for calculating the cost of each route in terms of these three component costs. Before explaining this process, the conceptual framework used by this process is explained by reference to FIGS. 61–63. These figures illustrate how some embodiments model propagation of a higher-level route into lower level child slots. Specifically, FIG. 61 illustrates that any horizontal or vertical path between the current slot's child slots can propagate down into the slots of the child slots along one of 10 propagation paths.

Figure 62:
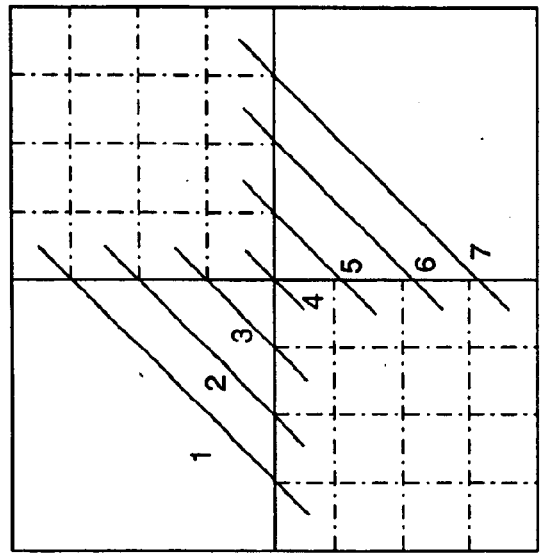
FIGS. 62 and 63 illustrate two different ways for modeling the propagation of a 45° diagonal path into the lower level child slots.

FIGS. 62 and 63 illustrate two different ways for modeling the propagation of a 45° diagonal path into the lower level child slots. The model that FIG. 62 illustrates provides 7 propagation possibilities for a 45° diagonal path. On the other hand, the model illustrated in FIG. 63 provides for 19 propagations for a 45° diagonal path between two diagonally-positioned child slots 6305 and 6310. This is because the model illustrated in FIG. 63 only specifies the path propagations along the edges of child slots 6305 and 6310, which thereby allows a path propagation along an edge of one of the child slots to pair up with anyone of three path propagations along the corresponding edge of the other child slot. For instance, as shown in FIG. 63, the propagation 6315 along edge 6320 can be paired up with anyone of the propagations 6325, 6330, and 6335 along edge 6340. Under this approach, a diagonal path between slots 6305 and 6310 can have 19 propagations, where (1) 9 of the propagations are defined by pairing up three path propagations along edge 6320 with three path propagations along edge 6340, (2) 9 of the propagations are defined by pairing up three path propagations along edge 6345 with three path propagations along edge 6350, and (3) 1 of the propagation 6355 is defined between the top left hand corner of slot 6310 and the bottom right hand corner of slot 6305.

As shown in FIG. 64, the process 6400 initially selects (at 6402) a net. It then selects (at 6404) one of the routes identified (at 5310) for the selected net. The process next initializes (at 6406) the selected-solution's Total_Cost to 0. It then needs to identify the path cost of the route selected at 6404. In some embodiments, one of the LUT's 3965 stores pre-tabulated wirelength costs for each net configuration. In these embodiments, the pre-tabulated wirelength cost of a selected tree can be retrieved from the LUT when the tree is added to the solution set of the net. Alternatively, the process 6400 can use the pin configuration that resulted in the identification of the selected tree for the current net to retrieve the tree's pre-tabulated wirelength cost from the LUT.

In the embodiments described below, however, the process 6400 computes the path cost of the selected route by performing 6408–6412. Specifically, at 6408, the process selects a path of the selected route. It then increments (at 6410) the selected-solution's Total_Cost by the cost of the path selected at 6408. Some embodiments define a path's cost purely based on the relative length of the path compared to other paths. For instance, some embodiments assign a path-cost of 1 for each horizontal or vertical path between slots (e.g., for each path P0–P23 in FIG. 12) and a path-cost of 1.4 for each diagonal path between slots (e.g., for each paths P024–P041). Other embodiments assign a path cost of 5 for each horizontal or vertical path between slots (e.g., for each path P0–P23 in FIG. 12) and a path cost of 7 for each diagonal path between slots (e.g., for each paths P024–P041).

Other embodiments might define the path-costs not purely based on the relative path lengths. To achieve a certain objective (e.g., encourage use of the lower-layer wiring or discourage use of vias), some embodiments might cost the paths that traverse the higher levels more expensive than their relative length cost compared to the lower-layer wiring. For example, some embodiments might assign a path-cost of 1 for each horizontal or vertical path between slots and a path-cost greater than 1.4 for each diagonal path between slots.

At 6412, the process determines whether it has examined all the selected route's paths. If not, the process returns to 6408 to select another path for costing. When the process determines (at 6412) that it has examined all the selected route's paths, it determines (at 6414) whether the current slot is a leaf-level slot. If so, the process transitions to 6428, which will be described below.

If the process determines that the current slot is not a leaf-level slot, the process accounts for the wirelength cost in the child slots. The process uses a greedy technique to factor the propagation of the selected route into the child slots. Specifically, the process orders (at 6416) each of the selected tree's paths by the number of anchors of that path. Some embodiments define an anchor as a pin in either child slot upon which the path is incident. In these embodiments, a path has at most two anchors. Other embodiments might define an anchor as the number of pins in the slots of a child slot; under such an approach, a path can have up to 32 anchors, when it has 16 pins in the 16 slots of each child slot. In some embodiments, the process sorts the paths in the order of descending number of anchors (i.e., places the paths with the most number of anchors first on its sorted list).

Next, at 6418, the process selects a path according to the sorted order (i.e., selects the paths on the sorted list in a top-to-bottom manner). For the selected path, the process selects (at 6420) one of the propagation possibilities. In other words, at this stage, the process selects one of the ways that the selected path can propagate between the two slots that it is incident upon.

As mentioned above by reference to FIG. 61, some embodiments use a propagation model that provides 10 potential propagations for a horizontal or vertical path between the current slot's child slots. Also, some embodiments use a propagation model that provides 7 potential propagations for a 45° path as shown in FIG. 62, while other embodiments use a model that provides 19 potential propagations for a 45° path as shown in FIG. 63.

In some embodiments, the process selects (at 6420) the optimal propagation for the selected path. To select the optimal propagation, the process examines each propagation possibility, adds virtual pins when necessary, costs each propagation possibility, and chooses the propagation possibility that results in the lowest cost propagation and routes. As described below by reference to FIG. 65, each propagation possibility might specify one or two propagation paths that traverse into two or three child slots. Accordingly, the cost of each propagation possibility includes the cost of the propagation path(s) plus the routing cost of the pin configurations in the two or three child slots that the propagation possibility traverses.

Figure 65:
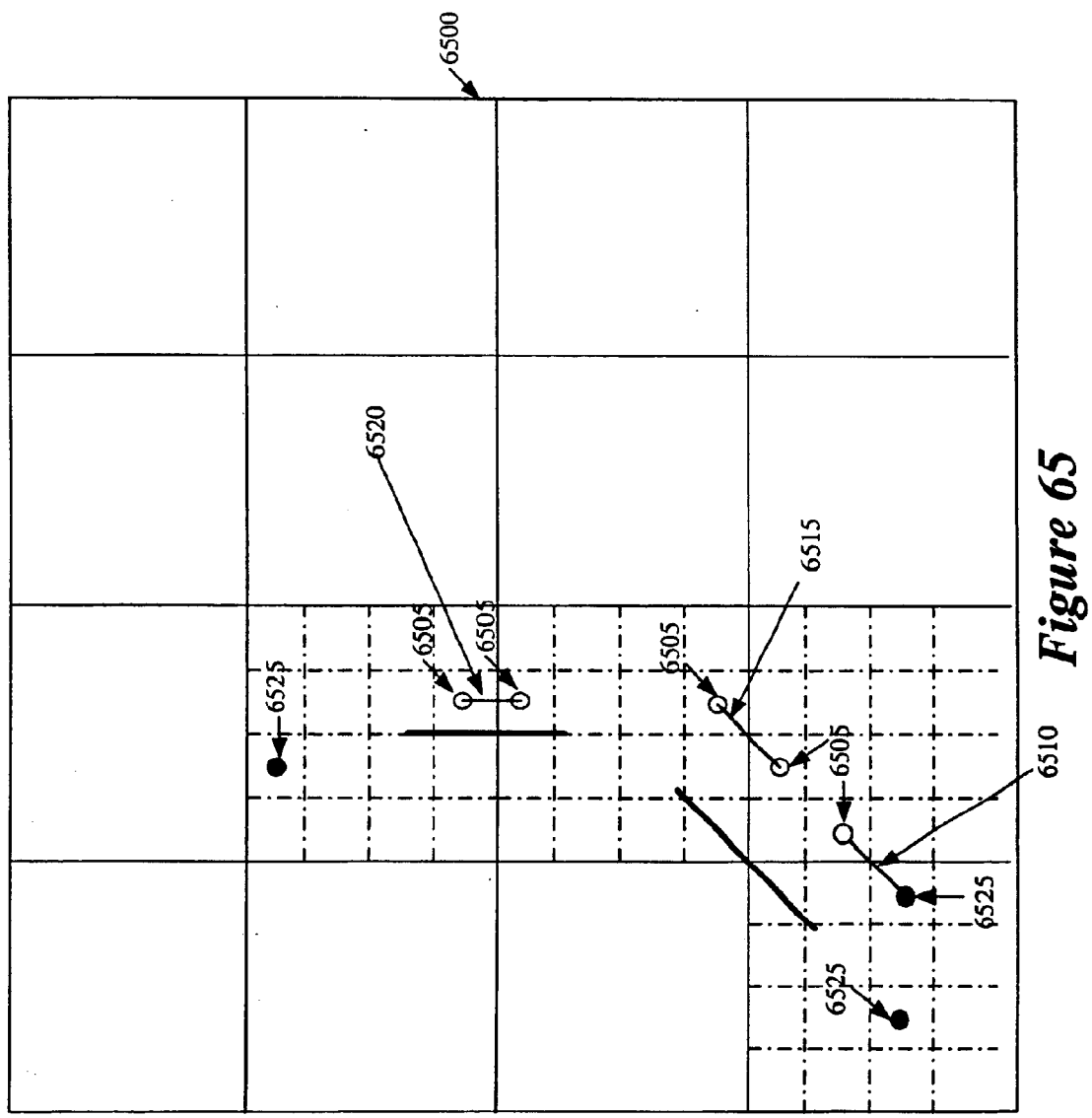
FIG. 65 illustrates one example of a propagation possibility of a path.

FIG. 65 illustrates one example of a propagation possibility of a path. This figure illustrates a net that has actual pins 6525 in slots 0 and 9. The selected route for this net uses paths P17 and P24 that traverse child slot 5 to connect child slots 0 and 9. FIG. 65 illustrates that the path P24 is propagated along paths 6510 and 6515 into three child slots, (i.e., child slots 0, 1, and 5), while path P17 is propagated along path 6520 into two child slots 5 and 9. The propagation path 6510 is between the child slot 7 of the current slot's child slot 0 and the child slot 8 of the current slot's child slot 1. The propagation path 6515 is between the child slot 13 of the current slot's child slot 1 and the child slot 2 of the current slot's child slot 5. The propagation path 6520 is between the child slot 14 of the current slot's child slot 5 and the child slot 2 of the current slot's child slot 9. FIG. 65 illustrates five virtual pins 6505 that have been added to the slots of child slots 1, 5, and 9.

At 6420, the process also (1) computes the delta cost between the cost of the path(s) of the propagation possibility identified at 6420 and the cost of the path selected at 6418, and then (2) increments the Total_Cost with this delta. For instance, in some embodiments, the delta cost is two when the selected path is a Manhattan path with a cost of 5 and the identified propagation is a diagonal path with a cost of 7. Also, in some embodiments, the delta cost is seven when the selected path is a diagonal path with a cost of 7, and the identified propagation includes two diagonal paths, each with a cost of 7. In some embodiments, the delta cost is 0 when the selected path and its identified propagation are both Manhattan paths.

For the propagation selected at 6420, the process, if necessary, temporarily stores (at 6422) virtual pins in the pin configuration records of the incident child slots (i.e., the child slots upon which the propagation identified at 6430 is incident). The process uses these temporarily stored virtual pins in computing the costs of the propagations of other paths (if any) of the selected route.

The process next determines (at 6424) whether it has examined the last path of the selected route. If not, the process returns to 6418 to select the next path on the sorted path list. It then identifies (at 6420) the best propagation for this newly-selected path and temporarily sets (at 6422) any necessary virtual pins.

When the process determines (at 6424) that it has examined all the paths of the selected route, the process increments (at 6426) the selected tree's Total_Cost with the cost of the routes in each child slot that has a pin set for the net. At 6426, the process also stores the selected route's Total_Cost. The solving process 5300 uses each tree's Total_Cost to formulate its LP problem.

At 6428, the process determines whether it has examined all the routes for the net selected at 6402. If not, the process transitions to 6404 to cost the next route for this net. When the process determines (at 6428) that it has examined all the routes for the net selected at 6402, the process determines (at 6430) whether it has examined all the nets in the current slot. If not, the process transitions back to 6402 to select another net in the current slot and to perform the subsequent operations for costing the routes for this net. When the process determines (at 6430) that it has examined all the nets in the current slot, the costing process 6400 ends.

One of ordinary skill will realize that other embodiments compute the wirelength cost of a route differently than the process 6400. For instance, the process 6400 computes this cost by computing the wirelength cost at the current recursion level and the one below it. Other embodiments, on the other hand, might compute this cost by computing the wirelength cost from the current recursion level all the way down to the leaf-level slots. To do this, some embodiments use a recursive process that computes the path-cost at the current recursion level and then recursively call the cost-computing process to compute the wirelength cost for each child slot that is not a Gcell (i.e., for each child slot that is not a child of a leaf-level slot).

4. LP Problem Formulation and Solver

After the solver assigns wirelength costs to the routes of the nets in the current slot, the solver formulates (at 5320) an LP problem for the LP solver 3945, which then solves (at 5325) this LP problem. The basic variables in the LP-problem formulation are the routes for the nets in the current slot. Each tree is represented in the following format: "xN_C", where "x" is a character constant. "N" is the net number, "_" is a character constant, and "C" is a number that identifies the tree in the list of trees for the net. For instance, X26_14 represents the $14^{th}$ tree of net 26.

In some embodiments, each LP solution examined by the LP solver includes a real number value for each tree variable xN_C. The task of the LP solver is to identify an LP solution that minimizes one or more objective functions while satisfying a number of constraints. Specifically, a solution is a viable LP solution only if it satisfies the constraint or constraints of the specified LP problem. The LP solver's task is to identify a viable LP solution (i.e., a solution that satisfies the specified constraints) that minimizes the objective function. In other words, from a set of solutions, the LP solver identifies the viable LP solution that produces the best objective-function value.

Some embodiments use as the LP solver 3945 the "SoPlex" solver, which has been implemented by Roland Wunderling as a part of a Ph.D. thesis entitled "Paralleler und Objektorientierter Simplex-Algorithmus" (in German). Information about this solver is available at the following website: http://www.zib.de/Optimization/Software/Soplex/.

a. Objective Function

Different embodiments use different objective functions. For instance, some embodiments might use an objective function that (1) minimizes total length; (2) maximizes minimum slack across all 42 paths; (3) maximizes total slack; and (4) minimizes maximum usage of any individual path. The embodiments described below, however, try to find an LP solution that minimizes the following objective function:

$$\text{Objective Function} = A*\text{Total\_WireLength} + B*\text{Total\_Via\_Number} - C*\text{Min\_Slack}. \quad (F)$$

In the equation (F), A, B, and C are weighting factors. Also, the Total_WireLength is:

$$\text{Total\_WireLength} = \sum_{Tree} (\text{Length Cost of the Tree}) * (\text{Variable for the Tree}), \quad (G)$$

and the Total_Via_Number is:

$$\text{Total\_Via\_Number} = \sum_{Tree} (\text{Number of Vias for the Tree}) * (\text{Conversion Factor}) * (\text{Variable for the Tree}). \quad (H)$$

The notion of minimum slack is used in two instances in the LP formulation. First, the variable Min_Slack is used as a component of the objective function for quantifying the congestion (i.e., serves as an indicia of the congestion in the objective function). Second, the constant minSlack is used to specify a minimum slack that can be tolerated across all 42 paths.

A path's slack is the remaining capacity of a path after accounting for all congestion (i.e., blockages and wireflow) for a particular solution. A negative slack signifies that a path is over congested. Minimizing the objective function minimizes the negative minimum slack, which, in turn, maximizes the minimum slack. One of ordinary skill will realize that other embodiments might use other congestion indicia in the objective function.

In some embodiments, the weighting factors A and B for the Total_WireLength and Total_Via_Number are set equal to each other, and both these factors are larger than the weighting factor C for the Min_Slack. In other words, these embodiments weight the objective function towards the wirelength and the via count, so that the Min_Slack component makes a difference only when the wirelength and via count components cannot distinguish two LP solutions. These embodiments use the wirelength and via count components in the objective function to select solutions that result in smaller total wirelengths and via counts.

Other embodiments weight the objective function differently. For instance, the LP-formulation listed below in subsection VI.E.4.c weights the objective function towards the wirelength and the via count parameters only for the first attempt of the LP solver to solve the formulated LP problem. If the LP solver cannot solve the formulated problem in its first iteration (i.e., if it cannot find a solution that meets the constraints), the LP problem is reformulated so that the Min_Slack component becomes the primary component in the objective function. Specifically, for the first iteration of the LP solver, the formulation below sets the weighting factors A and B for the Total_WireLength and Total_Via_Number equal to each other, and both these factors have a larger magnitude than the weighting factor C for the Min_Slack. If the LP solver does not solve the LP problem in its first iteration, the weighting factors A, B, and/or C are changed so that the objective function's primary parameter is Min_Slack.

As illustrated by equation (G) above, the Total_WireLength is computed by using the cost of each tree, which was computed at 5315. Also, as illustrated by equation (H) above, the Total_Via_Number is computed by using the number of vias for each tree. A via is a connection that is needed to connect two parts of a route that are on two adjacent metal layers.

For the octagonal wiring model illustrated in FIG. 3, a one to one mapping exists between layers and routing directions. This mapping can be used to easily compute the number of vias for each route. Hence, the number of vias can be counted by traversing the route, and identifying the number of vias necessary to accommodate (1) the changes in direction of the route and (2) the difference, if any, between the layers of pins and paths in the child slots.

To account for the layer difference between a pin in a child slot and path incident upon the child slot, the pin's layer needs to be identified. Different embodiments identify the layer of an actual pin (i.e., a non-virtual pin) in different ways. For instance, some embodiments assume that all actual pins are on layer 2. Other embodiments identify the actual layer of a pin; as mentioned above, some embodiments store a pin's layer as part of the pin's location that is stored in the pin data structure 4300, while other embodiments store the pin's layer as part of a pin macro that is stored with the circuit macro referenced by the slot-data structure. Some embodiments define the layer of a virtual pin (i.e., a pin that is set to account for a propagation of a route into a lower-level child slot) to coincide with the layer of the propagated path for which the virtual pin was set.

FIGS. 66 and 67 present two examples that conceptually illustrates one manner of counting the number of vias. In these examples, the wiring model is as follows: layer 2 is vertical, layer 3 is horizontal, layer 4 is +45°, and layer 5 is −45°. FIGS. 66 and 67 illustrate two routes for connecting child slots 0 and 9. In both these figures, child slot 0 includes a virtual pin 6605 that was set to account for the propagation of a +45° path into slot 6600. Accordingly, the virtual pin 6605 is said to be on the fourth metal layer (i.e., the metal layer for the +45° wiring). Also, child slot 9 includes an actual pin, which is on layer 2.

Route 6610 of FIG. 66 needs two vias. This number can be counted by starting at child slot 0. This slot has one virtual pin in the fourth layer. Path P24 is incident on this slot, and it traverses the fourth layer. Hence, no via is necessary to account for the difference between the layers of pin 6605 and path P24. Path P24 is also incident on child slot 5. Child slot 5 has no pin, but it has path P17 incident upon it. As path P24 is on the fourth layer and path P17 is on the second layer, two vias are needed to account for the changes of path direction in child slot 5. Path P17 is also incident upon child slot 9. Slot 9 has no other paths incident upon it, but it has an actual pin 6615 on layer 2. Given that path P17 and pin 6615 are both on layer 2, no via is necessary to connect pin 6615 and path P17.

Route 6705 of FIG. 67 needs six vias. This number can be counted by starting at child slot 0. This slot has one virtual pin in the fourth layer. Path P12 is incident on this slot, and it traverses the second layer. Hence, two vias are necessary to account for the difference between the layers of pin 6605 and path P12. Path P12 is also incident on child slot 4. Child slot 4 has no pin, but it has path P30 incident upon it. As path P30 is on the fourth layer and path 12 is on the second layer, two vias are needed to account for the changes of path direction in child slot 4. Path 30 is also incident upon child slot 9. Slot 9 has no other paths incident upon it, but it has an actual pin 6615 on layer 2. Hence, two vias are necessary to account for the difference between the layers of pin 6615 and path P30. In sum, six vias are necessary for route 6705. As it can be seen from the examples illustrated in FIGS. 66 and 67, the number of vias provides a useful indicia for distinguishing two routes that have equal lengths.

Also, some embodiments compute the number of vias for each route during the LP formulation 5320. One such embodiment is illustrated by the LP formulation in subsection VI.E.4.c. Other embodiments, however, count the number of vias for each route before 5320, just as they compute the wirelength cost of a route before 5320 at 5315. Alternatively, some embodiments might compute the wirelength cost of each route during the LP formulation 5320.

Figure 68:
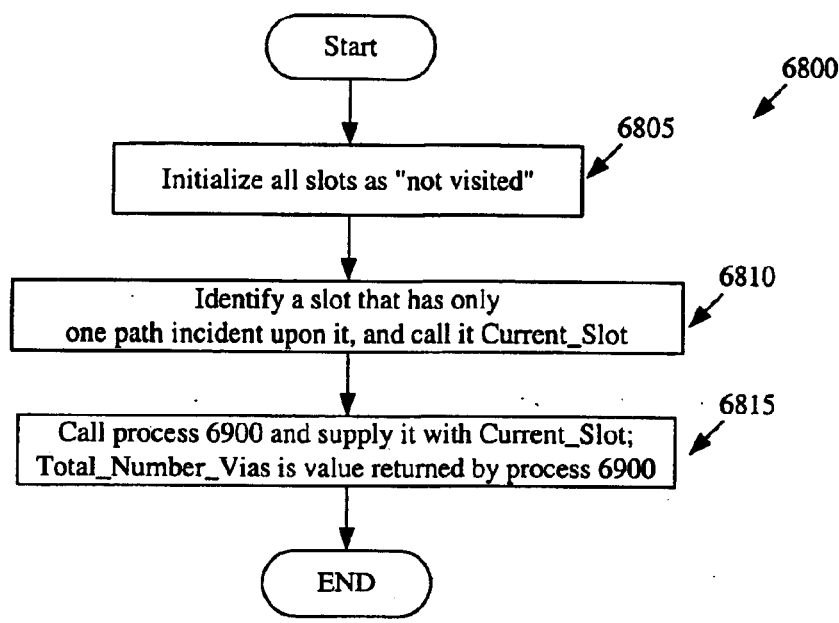
FIGS. 68–70 illustrate three processes that work together to compute the number of vias in a route.
Figure 70:
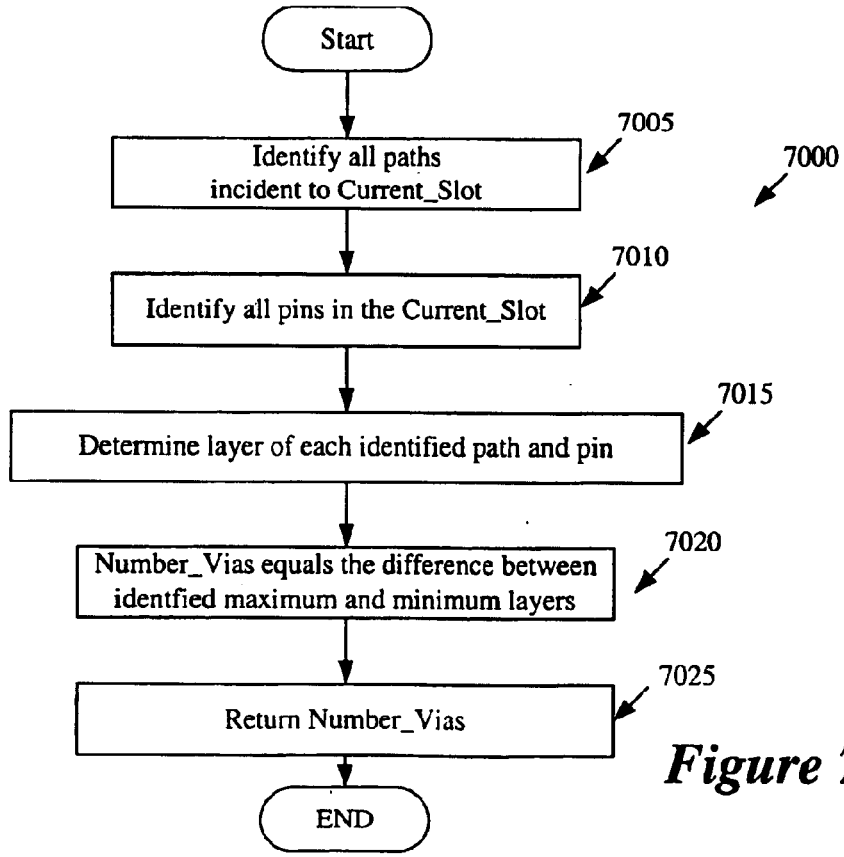
Figure 69:
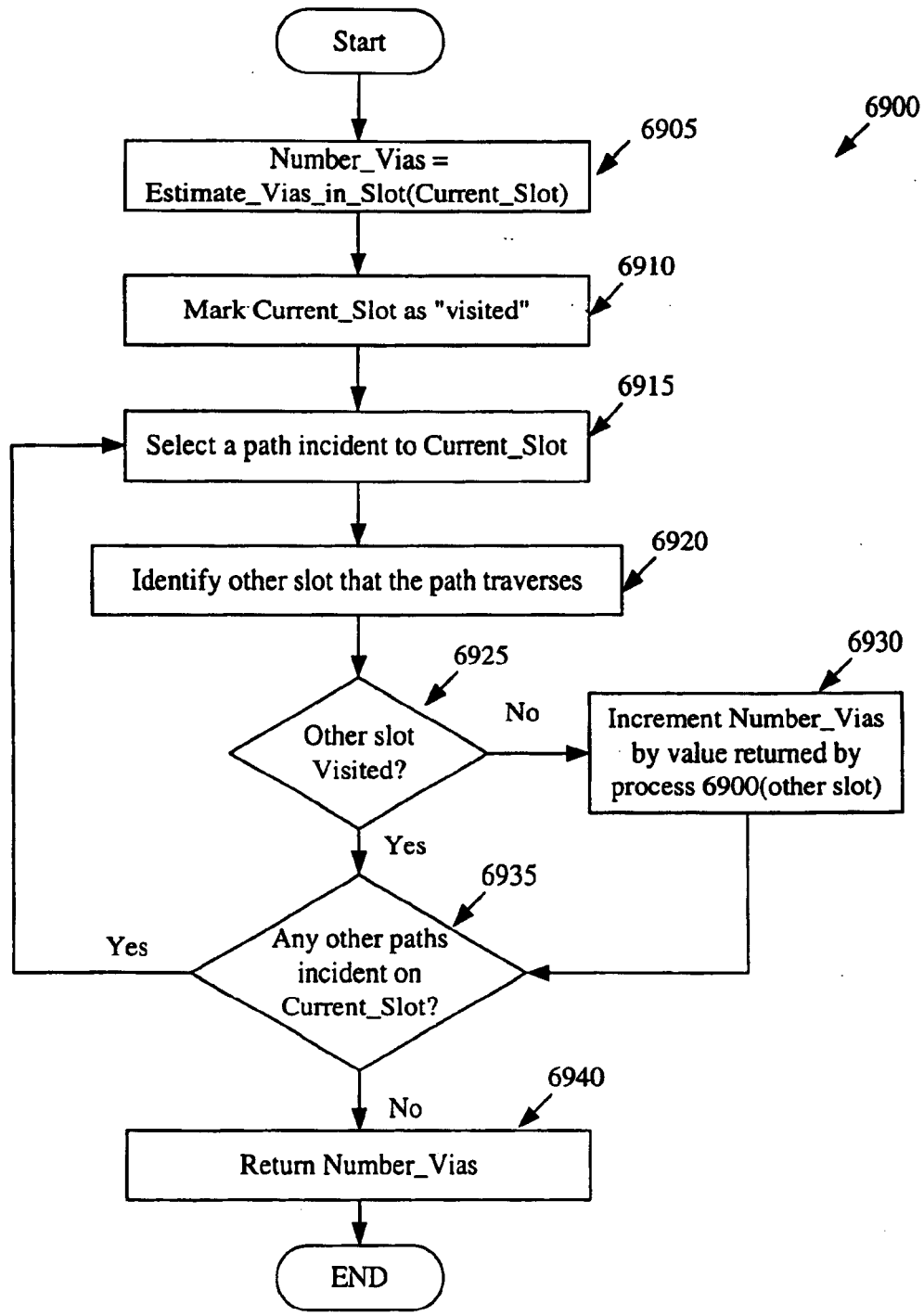

FIGS. 68–70 illustrate three processes that work together to compute the number of vias in a route. Process 6800 of FIG. 68 starts whenever it is called to compute the via count for a tree. This process initially initializes (at 6805) all slots (of the slot currently being solved) as slots that have not been visited.

At 6810, the process 6800 then selects a slot that has only one path of the route incident upon it, and defines this slot as the Current_Slot. It then calls (at 6815) process 6900 of FIG. 69 and supplies this process with the Current_Slot. The value returned by process 6900 is the total number of vias. After calling process 6900, the process 6800 ends.

The process 6900 is a recursive process. It initially computes (at 6905) the number of vias in the Current_Slot. In some embodiments, the process 6900 computes this number by calling the process 7000 of FIG. 70. The process 7000 starts by identifying (at 7005) all the route's paths that are incident on the Current_Slot. It then identifies (at 7010) all the actual and virtual pins in the Current_Slot.

The process 7000 next identifies (at 7015) the layer of each route path identified at 7005 and each pin identified at 7010. Each path's layer can be easily determined as there is a one-to-one mapping between the path's direction type and its layer, when the octagonal wiring model of FIG. 3 is used. For instance, some embodiments map vertical paths to layer 2, horizontal paths to layer 3, +45° paths to layer 4, and –45° paths to layer 5. Also, as described above, some embodiments assume that all actual pins are on layer 2, while other embodiments identify the actual layer of a pin that is stored. In addition, some embodiments define the layer of a virtual pin (i.e., a pin that is set to account for a propagation of a route into a lower-level child slot) to coincide with the layer of the propagated path for which the virtual pin was set.

After identifying the layers of the pins and the paths, the process 7000 then determines (at 7020) the difference between the maximum and minimum layers identified at 7015. This difference represents an estimate of the minimum number of vias that the route needs in the Current_Slot. If the Current_Slot is partitioned into smaller slots, additional vias might be needed to define lower-level route(s) for the current route's net in and/or between the smaller slots. Some embodiments (1) might perform a statistical study to guess the number of vias needed to define routes in slots with certain number of pins and paths, and then (2) might use the results of this statistical study to obtain a better estimate of the number of vias needed in the Current_Slot. At 7025, the process 7000 returns the number of vias in the slot, and then ends.

Once the process 7000 returns the number of vias in the slot, the process 6900 marks (at 6910) the Current_Slot as one that has been visited. It then selects (at 6915) one of the current route's paths that are incident on the Current_Slot. Next, at 6920, it identifies the other slot that the path selected at 6915 is incident upon. At 6925, the process determines whether it has examined the slot identified at 6920 (i.e., determines whether this slot is marked visited). If not, the process 6900 recursively calls itself at 6930. This recursive call specifies the slot identified at 6920 as the Current_Slot for the process that is recursively initiated at 6930. At 6930, the process 6900 increments the number of vias by the value that the recursively-called process returns.

From 6930, the process 6900 transitions to 6935. This process also transitions to 6935 when it determines (at 6925) that the other slot identified at 6920 was previously visited. At 6935, the process 6900 determines whether there are any other paths incident upon the Current_Slot. If so, the process 6900 returns to 6915 to select another incident path. If not, the process 6900 returns the computed number of vias.

As indicated in equation (H) above, the objective function's Total_Via_Number not only depends on the number of vias for each tree, but also on a conversion factor that scales the number of vias to reflect their importance relative to the wirelength. This conversion factor can be obtained by normalizing the wirelength and via costs to the number of tracks, as indicated in equation (I) below.

$$X = 50 * \frac{5}{N}. \quad (I)$$

In this equation, X represents the conversion factor, 5 represents the cost of a Manhattan path, N represents the number of tracks per Manhattan path at the current recursion level, and 50 is a penalty cost associated with using a via. This penalty is measured in terms of the number of tracks that the router would prefer to detour rather than use a via. In some embodiments, a designer can modify this penalty cost. Also, in some embodiments, each Manhattan path represents 8 tracks at the Gcell level (i.e., N equals 8 at the Gcell level). Also, conversion factor X is different for each hierarchical routing level since N is different for each level.

b. Constraints

Different embodiments define different constraints. The embodiments that use the LP formulation described below define the three constraints. First, for each net N, the LP solver must only choose 1 tree from the selection set for the net N. This is expressed as a constraint on the sum of the values of the tree variables for the net (i.e., the sum of these values must equal 1), as indicated in the equation below:

$$netN{:}xN\_A + xN\_B + \ldots xN\_Q = 1.$$

The LP solver will assign a value between 0 and 1 to each route variable. A "1" indicates an unambiguous selection of the tree, and a "0" indicates an unambiguous rejection of the tree. A value between 0 and 1 means that the solver specified a set of selections that need to be resolved by the randomized rounding. Some embodiments might not express the need to select only one tree for each net as a constraint but rather as a relationship to generate candidate LP solutions for each net.

The second constraints relates to the congestion of the paths in the current slot. In some embodiments, the min-Slack has to be greater than a specified amount. As mentioned above, the minSlack is the smallest tolerable slack across all the paths. The slack in each path equals the capacity of the path minus wireflow and blockages across the path. For the first iteration of the LP solver, some embodiments specify that the minSlack has to be zero or greater. If the LP solver cannot solve the formulated problem in its first iteration, some embodiments reformulate the LP problem so that the minSlack is a large negative number, in order to remove the minimum slack as a constraint. However, in some embodiments, this reformulation makes the Min_Slack component of the objective function the primary component of this function, as described above.

Third, the capacity of certain regions needs to be properly shared among the paths that can traverse these regions. For instance, given the models illustrated in FIGS. 61, 62, and 63, diagonal and Manhattan paths must properly share the capacity of overlapping diagonal regions. This is because when the solver is part of a global router that produces global routing results, its global-routing output needs to be converted into boundary pin assignments that can be used by a detailed router.

Figure 72:
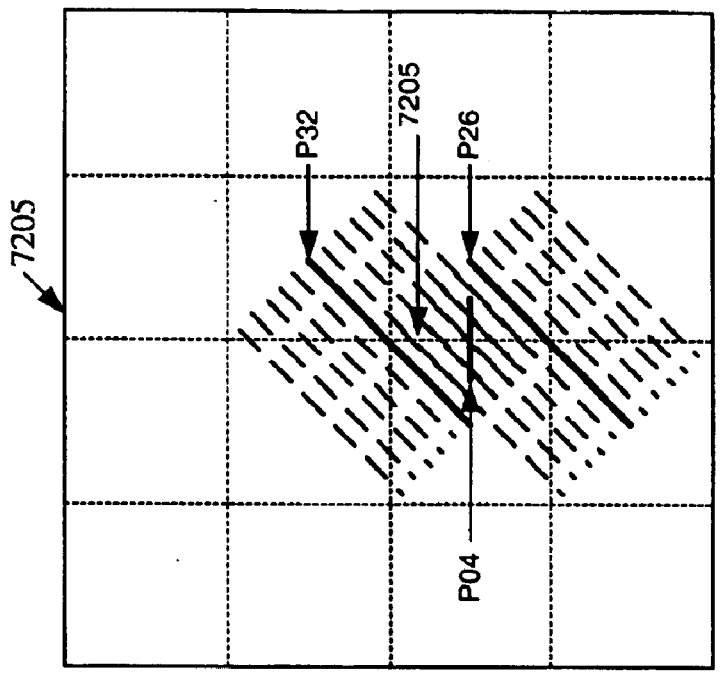
FIGS. 71 and 72 illustrate the need for sharing constraints at the Gcell level.
Figure 71:
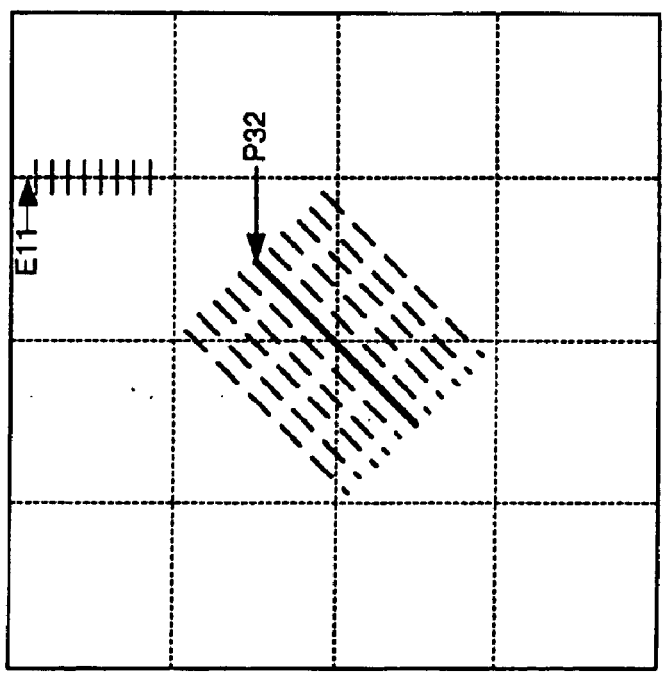

FIGS. 71 and 72 illustrate the need for this sharing constraint at the Gcell level. At the Gcell level, some embodiments define the capacity of the Manhattan paths crossing between the Gcells to be 8 tracks wide. FIG. 71 shows 8 such tracks across edge E11. Also, some embodiments assume that the pitch on the diagonal layers is the same as the pitch on the Manhattan layers and therefore assume that the capacity of a diagonal path is simply square root of two times the capacity of a Manhattan path. Under such assumptions, the capacity of a diagonal path that crosses the above-described Gcells is 11 tracks. FIG. 71 illustrates the 11-track-wide capacity of path P32.

Vertically or horizontally adjacent diagonal paths have overlapping routing regions. For instance, FIG. 72 illustrates two vertically adjacent diagonal paths P32 and P26 that share the capacity (i.e., the five diagonal tracks) of shared diagonal region 7205. The five diagonal tracks of diagonal region 7205 are also shared with the Manhattan path P4 that crosses this region, because, according to the model of FIG. 61, a Manhattan path can traverse between two slots not only in the Manhattan direction but also in the diagonal directions.

To account for the shared capacity of the diagonal regions, the LP formulation below defines three sets of constraints, with each set having two constraints, one for +45° paths and one for −45° paths. These three set of constraints are: (1) diagonal pair constraints, (2) mixed triplet constraints, and (3) diagonal triplet constraints. In the discussion below, +45° paths are referred to as East paths, while −45° paths are referred to as West paths.

Figure 73:
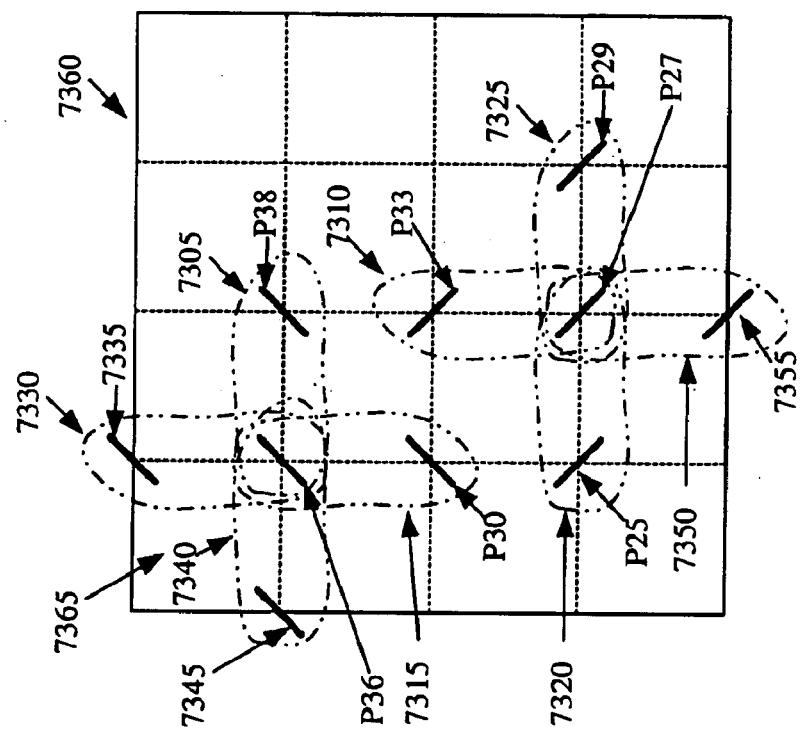
FIG. 73 illustrates a diagonal pair constraint.

FIG. 73 illustrates the first type of constraint, i.e., the diagonal pair constraints. This figure illustrates eight constrained diagonal pairs that have been defined about paths P27 and P36. Two of these are 7305, which includes horizontally-adjacent east paths P36 and P38, and 7310, which includes vertically-adjacent west paths P27 and P33.

The diagonal pair constraints can be classified as interior or periphery constraints depending on whether one of the diagonal paths of the pair is on the periphery of the current slot. Specifically, both pairs 7305 and 7310 are interior diagonal pairs. An interior diagonal pair includes two diagonal paths that are horizontally or vertically adjacent and that are either from the set of east paths P24, P26, P28, P30, P32, P34, P36, P38, and P40 or from the set of west paths P25, P27, P29, P31, P33, P35, P53, P39, and P41. Three other interior constrained diagonal pairs illustrated in FIG. 73 are (1) pair 7315, which includes paths P36 and P30, (2) pair 7320, which includes paths P27 and P25, and (3) pair 7325, which includes paths P27 and P29.

FIG. 73 also illustrates three constrained periphery diagonal pairs. A periphery diagonal pair includes two horizontally- or vertically-adjacent diagonal paths where (1) both are either east paths or west paths, and (2) one of the paths is one of the interior paths P24–P41 and the other path is on the periphery edge of the slot. The three constrained periphery diagonal pairs illustrated in FIG. 73 are: (1) pair 7330, which includes paths P36 and 7335, (2) pair 7340, which includes paths P36 and 7345, and (3) pair 7350, which includes paths P27 and 7355.

The two paths in each constrained diagonal pair share several tracks (i.e., several tracks represented by one path are the same as several tracks represented by the other path). Accordingly, some embodiments constrain the congestion about each constrained diagonal pair to account for this sharing.

For instance, some embodiments constrain the congestion about an interior diagonal pairs to be 1.5 times the capacity of either path in the pair, when the two paths in the pair share about half of the tracks. By way of example, when the two interior diagonal paths P36 and P38 are each 11 tracks wide and share 5 tracks with each other, some embodiments specify a constraint that the congestion about these paths must at most take 16 tracks (i.e., specify that wireflow across P36 plus wireflow across P38 plus any blockages at most take 16 tracks).

Some embodiments also constrain the congestion (i.e., the total wireflow and blockages) about a periphery diagonal pair to be 1.5 times the capacity of the interior diagonal path, when the two paths in the pair share about half of the tracks. For example, in some embodiments, the paths in a periphery diagonal pair 7330 are each 11 tracks wide at the Gcell level. At this level, these paths share 5 tracks with each other. Accordingly, for the Gcell level, some embodiments specify a constraint that the congestion about these path must be 16 tracks or less (i.e., specify that wireflow across P36 plus wireflow across 7335 plus any blockages at most take 16 tracks).

Unlike an interior diagonal pair constraint that requires the LP solver to compute the congestion about both the diagonal paths in the pair, a periphery diagonal pair constraint only requires the LP solver to compute the congestion about the interior diagonal path of the periphery pair for an LP solution. This is because the congestion about the periphery path of a periphery diagonal pair is computed during the propagation operation that preceded the current solve operation.

For instance, the congestion about the periphery path 7335 for the periphery diagonal pair 7330 might have been computed when the Manhattan or diagonal path incident upon slot 7360 or the diagonal path incident upon a slot neighboring slot 7360 were propagated down into the child slot 7365 of slot 7360. Some embodiments keep a record of the capacity of a propagated path between a child slot of a first parent slot and the child slot of a second parent slot that is adjacent to the first parent slot. Some embodiments maintain such a record by (1) creating slot pair record for adjacent child slots of adjacent parent slots, (2) storing the identity of the two adjacent child slots in the slot-pair record, (3) initializing a capacity field that represents the capacity of the propagated periphery path between the two child slots, and (4) decrementing this capacity for use and blockages. These embodiments then identify the capacity of each periphery path by retrieving the slot-pair record that stores this capacity. Some embodiments retrieve the slot-pair record by using the identity of the two child slots on which the periphery path is incident (i.e., the current slot's child slot, and the neighboring slot's child slot).

Figure 74:
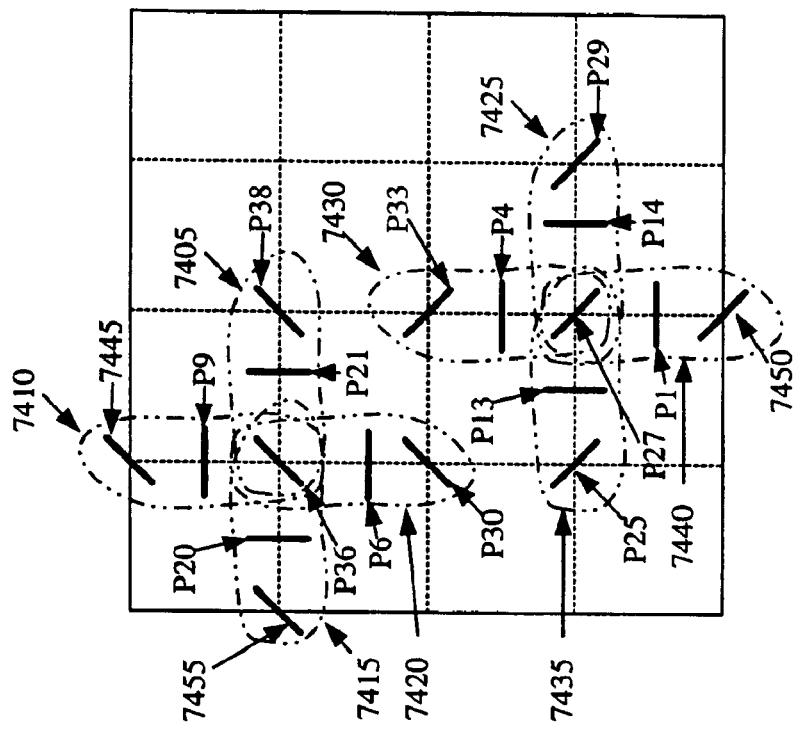
FIG. 74 illustrates a mixed triplet constraint.

FIG. 74 illustrates the second type of constraint, i.e., the mixed triplet constraints. This constraint is similar to the first type of constraint, the diagonal pair constraint, except that the mixed triplet constraint constrains the congestion about an adjacent co-linear diagonal path pair plus the Manhattan path between the diagonal pair.

FIG. 74 illustrates eight constrained mixed triplets, four involving path P36 and four involving path P27. Like the diagonal pair constraints, the mixed triplet constraints can be classified as interior or periphery constraints depending on whether one of the diagonal paths of the triplet is on the periphery of the current slot.

The four constrained mixed triplets about path P36 in FIG. 74 are: (1) interior mixed triplet 7405, which includes paths P21, P36 and P38, (2) periphery triplet 7410, which includes paths P9, P36 and 7445, (3) periphery triplet 7415, which includes paths P20, P36 and 7455, and (4) interior mixed triplet 7420, which includes paths P6, P36 and P30.

The four constrained mixed triplets about path P27 in FIG. 74 are: (1) interior mixed triplet 7425, which includes paths P14, P27 and P29, (2) interior triplet 7430, which includes paths P4, P27 and 7433, (3) interior triplet 7435, which includes paths P13, P27 and P25, and (4) interior mixed triplet 7440, which includes paths P1, P27 and 7450.

The three paths in each constrained mixed triplet share several tracks. For instance, given the diagonal wire model representation of FIGS. 62 and 63, several tracks represented by one of the diagonal paths are the same as several tracks represented by the other diagonal path. Also, given the Manhattan wire-model representation of FIG. 61, a Manhattan path can be propagated into lower-level child slots through several diagonal paths that compete for the same tracks as the diagonal paths neighboring the Manhattan path. Accordingly, some embodiments constrain the congestion about each constrained mixed triplet to account for this sharing.

For instance, when the two diagonal paths in the pair share about half of the tracks, some embodiments constrain the congestion about an interior mixed triplet to be 1.5 times the capacity of one of the diagonal path's in triplet plus the capacity of the Manhattan path in the Manhattan direction only. For example, at the Gcell level, the two interior diagonal paths P36 and P38 are each 11 tracks wide and share 5 tracks with each other, while the Manhattan path P21 is 8-tracks wide in the Manhattan direction and 5-tracks wide in the East direction (i.e., path P21 can use 8 tracks on the vertical layer of wiring and 5 tracks in the East layer wiring). Accordingly, at the Gcell level, some of these embodiments specify a triplet constraint that the congestion (i.e., wireflow plus blockages) about paths P21, P36, and P38 must at most take 24 tracks (i.e., the 16 available East tracks plus the 8 available vertical tracks).

Other embodiments might constrain the congestion an interior mixed triplet to be 1.5 times the capacity of one of the diagonal path's in triplet plus the capacity of the Manhattan path in the Manhattan direction and the opposite diagonal direction, when the two diagonal paths in the pair share about half of the tracks. So, for the above example (where, at the leaf-slot level, the two interior diagonal paths P36 and P38 are each 11 tracks wide and share 5 tracks with each other, while the Manhattan path P21 is 8-tracks wide in the Manhattan direction, 5-tracks wide in the East direction, and 5-tracks wide on the West direction), some of these embodiments specify a triplet constraint that the congestion about paths P21, P36, and P38 must at most take 29 tracks (i.e., the 16 available East tracks plus the 8 vertical tracks plus 5 available West tracks).

In addition, like the periphery diagonal pair constraints, the periphery mixed triplet constraints are analyzed like the interior constraints in some embodiments, except for the computation of the congestion about the periphery path of the triplet during the prior propagation operation. In other words, an interior mixed triplet constraint requires the LP solver to compute the congestion about both the triplets diagonal paths and Manhattan path for an LP solution. The periphery mixed triplet constraint only requires the LP solver to compute the congestion about the triplet's interior diagonal path and the Manhattan path for an LP solution. The LP solver can retrieve the congestion about the periphery path from the slot-pair record for the two child slots that the periphery path traverses.

Figure 75:
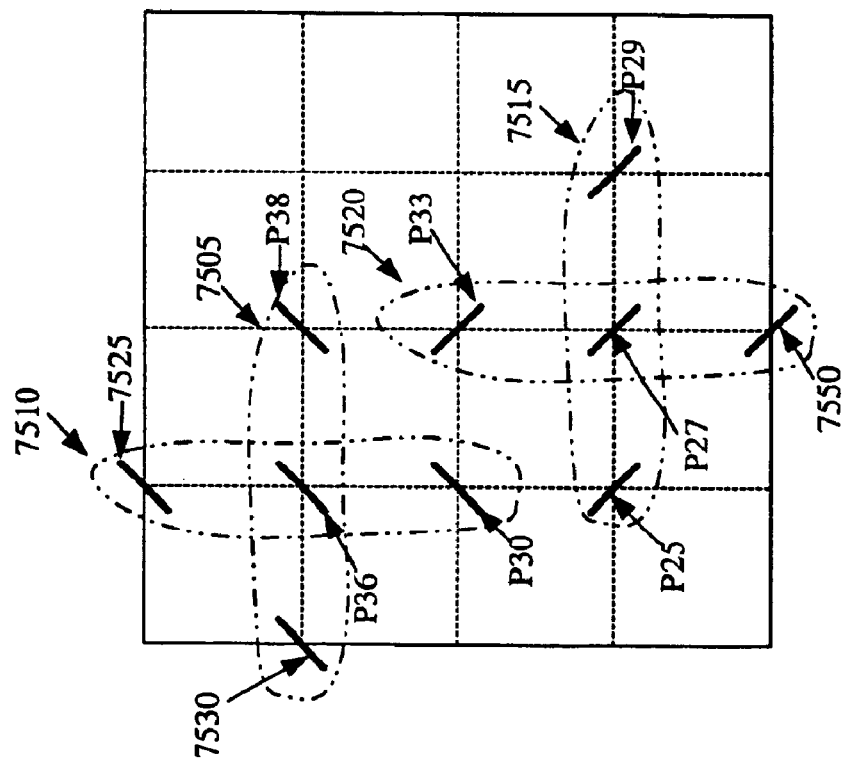
FIG. 75 illustrates a diagonal triplet constraint.

FIG. 75 illustrates the third type of constraint, i.e., the diagonal triplet constraints. This constraint is similar to the first type of constraint, the diagonal pair constraint, except that the diagonal triplet constraint constrains the congestion about three co-linear diagonal paths instead of two. FIG. 75 illustrates four constrained diagonal triplets, two involving path P36 and two involving path P27.

Like the diagonal pair constraints, the diagonal triplet constraints can be classified as interior or periphery constraints depending on whether one of the diagonal paths of the triplet is on the periphery of the current slot. The four constrained diagonal triplets in FIG. 75 are: (1) periphery diagonal triplet 7505, which includes paths P36, P38 and 7530, (2) periphery diagonal triplet 7510, which includes paths P30, P36 and 7525, (3) interior diagonal triplet 7515, which includes paths P25, P27 and P29, and (4) periphery diagonal triplet 7520, which includes paths P27, P33, and 7535.

Given the diagonal wire model representation of FIGS. 62 and 63, the middle path in the triplet shares several tracks with the other two diagonal paths. Accordingly, some embodiments constrain the congestion about each constrained diagonal triplet to account for this sharing.

When the middle diagonal path in the triplet shares about half of its tracks with one of the other diagonal paths and shares the other half with the other diagonal path, some embodiments constrain the congestion about a diagonal triplet to be 2.0 times the capacity of one of the diagonal path's in triplet. For example, in some embodiments at the Gcell level, each diagonal path is 11 tracks wide, and shares 5 tracks with each neighboring co-linear diagonal path. Accordingly, for the Gcell level, some embodiments specify a triplet constraint that the congestion (i.e., wireflow plus blockages) about the three diagonal paths in a triplet (e.g., about paths P25, P27, and P29) must at most take 22 tracks.

In addition, like the periphery diagonal pair and mixed triplet constraints, the periphery diagonal triplet constraints are analyzed like the interior constraints in some embodiments, except for the computation of the congestion about the periphery path of the triplet during the prior propagation operation. Specifically, an interior diagonal triplet constraint requires the LP solver to compute the congestion about all the diagonal paths of the triplet. On the other hand, a periphery diagonal triplet constraint only requires the LP solver to compute the congestion about the triplet's interior diagonal paths. The LP solver can retrieve the congestion about the periphery diagonal path from the slot-pair record for the two child slots that the periphery path traverses.

One of ordinary skill will realize that other embodiments might define other constraints. For instance, some embodiments might define a mixed quintuplet constraint, which constrains the congestion about a Manhattan path and the two pairs of adjacent co-linear diagonal paths. One such quintuplet would include vertical path P13, −45° diagonal paths P25 and P27, and +45° diagonal paths P24 and P26.

The Manhattan path in each quintuplet would share several tracks with the quintuplet's diagonal paths. In addition, the paths in each parallel diagonal pair share several tracks. Accordingly, when the two diagonal paths in each pair share about half of the tracks, some embodiments constrain the congestion about a mixed quintuplet to be about 3.0 times the capacity of one of the diagonal path's in quintuplet plus the capacity of the Manhattan path in the Manhattan direction only. For example, in some embodiments at the leaf-slot level, each diagonal path is 11 tracks wide and shares 5 tracks with its adjacent co-linear diagonal path, while each Manhattan path is 8-tracks wide in the Manhattan direction. Accordingly, at the Gcell level, some of these embodiments specify a quintuplet constraint that the congestion about the quintuplet must at most take 40 or 41 tracks, depending on whether the capacity about each parallel diagonal pair is truncated or not.

c. Formulation

In some embodiment, the solver 3930 formulates the LP problem based on the above-described objective function and constraints. The formulation of the LP problem in some of these embodiments is as follows:

```
[prepSolverILP(slot)]
    initialize variable minSlack to 0 // paths are not allowed
        to be over-constrained
    initialize variable lenAndViaWeight to 100 // initially
        length and via count has priority over minimizing slack
    initialize variable minSlackWeight to −1
    while (! done)
        declare & initialize the LP solver
        declare objective row, and name it "objective"
        for each identified set of trees for a net in the variable
            that stores all sets of identified trees for all nets in the
            current slot
            if set is not empty (i.e., the set contains tree selection
                set for a net in this slot)
                retrieve net index, N, from first tree record in set
                declare a constraint, "rN", to constrain the solver
                    to choose only 1 tree for this net
        for each path, N, in the slot
            declare a constraint, "usageN", to define a variable
                summing the total usage of this path
            declare a constraint, "eSlackN", to define a maxi-
                mum slack value over all paths
            declare a constraint, "mxuseN", to define a maxi-
                mum usage value over all paths
            if path N is a Manhattan path
                declare a constraint, eMtplN, to constrain the sum
                    of usages of Manhattan path N, and adjacent
                    pair "east" paths // this constraint is for the
                    mixed triplet that includes path N and 2 diago-
                    nal east paths adjacent to it
                declare a constraint, wMtplN, to constrain the
                    sum of usages of Manhattan path N, and adja-
                    cent "west" paths // this constraint is for mixed
                    triplet that includes path N and 2 diagonal west
                    paths adjacent to it
                declare a constraint, epairN, to constrain the sum
                    of usages of the 2 "east" paths adjacent to path
                    N // this constraint is for diagonal pair that
                    includes 2 diagonal east paths adjacent to path
                    N
                declare a constraint, wpairN, to constrain the sum
                    of usages of the 2 "west" paths adjacent to path
                    N // this constraint is for diagonal pair that
                    includes 2 diagonal west paths adjacent to path
                    N
            declare a constraint, eDtplN, to constrain the sum
                of usages of the 2 "east" paths adjacent to path
                N, plus a 3rd east path below or to the left of
                the bottom-most/left-most adjacent east path //
                this constraint is for diagonal triplet that
                includes 2 diagonal east paths adjacent to path
                N plus a 3rd east path below or to the left of the
                bottom-most/left-most adjacent east path
            declare a constraint, wDtplN, to constrain the
                sum of usages of the 2 "west" paths adjacent to
                path N, plus a 3rd west path below or to the left
                of the bottom-most/left-most adjacent west
                path // this constraint is for diagonal triplet
                constraints that includes 2 diagonal west paths
                adjacent to path N plus a 3rd west path below
                or to the left of the bottom-most/left-most
                adjacent west path
        define a constraint, "Min_Slack", to limit the value
            of the minimum slack across all paths
        define a constraint, "tLen", to define a variable
            summing the length costs of all chosen trees
        define a constraint, "tVias", to define a variable
            summing the via costs of all paths
// at this point, all the "rows" of the LP are declared. Now
we continue by filling in the columns (i.e. declaring the
variables)
        for each set of trees, treeset, for a net in the variable,
            m_sols, that stores the sets of trees for all nets in the
            current slot
            identify the net to which this set of trees belongs
            for each tree in treeset
                create a variable, "xN_T", where N is the net
                    index and T is the ordinal number of the tree,
                    to represent this tree
                declare xN_T to be present with factor 1.0 in
                    constraint "rowN"
                identify wirelength cost of tree xN_T // com-
                    puted by process 6400 described above
                compute the number of vias, "nVias", required to
                    embed this tree // uses the processes
                    6800–7000 described above
                declare xN_T to be present with factor estLen in
                    constraint "tLen"
                declare xN_T to be present with factor nVias
                    times X in constraint "tVias" // where X is the
                    conversion factor that was described above by
                    reference to equation (I)
                for each path, E, in the slot
                    if this tree uses path E
                    declare xN_T to be present with factor −1.0 in
                        constraint usageE
        for each path, E, in this slot
            create variable, "uE", where E is an integer identifier
                of the path
            declare uE to be present with factor 1.0 in constraint
                "usageE"
            declare uE to be present with factor −1.0 in con-
                straint "mxuseE"
            declare uE to be present with factor 1.0 in constraint
                "eslackE"
            if path E is a Manhattan path
                declare uE to be present with factor 1.0 in con-
                    straint "eMtplE"
                declare uE to be present with factor 1.0 in con-
                    straint "wMtplE"
```

```
    retrieve two pairs of diagonal paths adjacent to
        path E
    for each path, A, in the pairs
        if the direction of path A is "east"
            declare uA to be present with factor 1.0 in
                constraint eMtplE
            declare uA to be present with factor 1.0 in
                constraint epairE
        if the direction of path A is "west"
            declare uA to be present with factor 1.0 in
                constraint wMtplE
            declare uA to be present with factor 1.0 in
                constraint wpairE
    retrieve triple of diagonal paths adjacent to path
        E
    for each path, B, in the triple
        if the direction of path B is "east"
            declare uB to be present with factor 1.0 in
                constraint eDtplE
        if the direction of path B is "west"
            declare uB to be present with factor 1.0 in
                constraint wDtplE
create variable, "slack"
declare slack to be present with factor 1.0 in constraint
    "Min_Slack"
declare slack to be present with factor "minSlack-
    Weight" in the objective function
for each path, E, in this slot
    declare slack to be present in constraint with factor
        1.0 in constraint "eslackE"
    if path E is a manhattan path
        declare slack to be present with factor 1.0 in
            constraint "epairE"
        declare slack to be present with factor 1.0 in
            constraint "wpairE"
        declare slack to be present with factor 1.0 in
            constraint "eMtplE"
        declare slack to be present with factor 1.0 in
            constraint "wMtplE"
        declare slack to be present with factor 1.0 in
            constraint "eDtplE"
        declare slack to be present with factor 1.0 in
            constraint "wDtplE"
create variable, "tV"
declare tV to be present with factor 1.0 in constraint
    "tVias"
declare tc to be present with factor "lenAndViaWeight"
    in the objective function
create variable "tL"
declare tl to be present with factor 1.0 in constraint
    "tLen"
declare tl to be present with factor "lenAndViaWeight"
    in the objective function
// up to here, we have declared constraints and filled in
    the left hand sides of their equations. Now, we'll set
    their right hand sides
    for each set of trees, treeset, for a net in the variable,
        m_sols, that stores the sets of trees for all nets in
        the current slot
        if set is not empty (set contains tree selection set
            for a net in this slot)
            retrieve net index, N, from first tree record in
                set
            set RHS of constraint, "rN", to equal to 1.0
    for each path, E, in this slot
        set the rhs of constraint "usageE" equal to 0.0
        set the rhs of constraint "mxuseE" equal to 0.0
        retrieve capacity estimate, cap(E), produced by
            subtracting estimated path use (computed by
            process 5500) from estimate unblocked value
            (computed by process 5400)
        set the rhs of constraint "eslackE" to cap(E)
        if path E is a manhattan path
            calculate capacity estimate for sharing constraint
                eMtplE, capeMtplE, and set the rhs of con-
                straint eMtplE to this capacity
            calculate capacity estimate for sharing constraint
                wMtplE, capwMtplE, and set the rhs of con-
                straint wMtplE to this capacity
            calculate capacity estimate for sharing constraint
                epairE, capepairE, and set the rhs of constraint
                epairE to this capacity
            calculate capacity estimate for sharing constraint
                wpairE, capwpairE, and set the rhs of con-
                straint wpairE to this capacity
            calculate capacity estimate for sharing constraint
                eDtplE, capeDtplE, and set the rhs of con-
                straint eDtplE to this capacity
            calculate capacity estimate for sharing constraint
                wDtplE, capwDtplE, and set the rhs of con-
                straint wDtplE to this capacity
    set the rhs of constraint "tVias" equal to 0.0
    set the rhs of constraint "tLen" equal to 0.0
    set the rhs of constraint "Min_Slack" equal to variable
        minSlack
    solve the LP
        if no solution exists // remove hard constraint on
            minimum slack, reset weights such that slack is
            priority over length and via count
            set variable minSlackWeight=-500
            set variable minSlack=-1000
            set variable lenAndViaWeight=1
        if solution was found
            exit while loop
```

As indicated above, the third-to-last statement of the formulation tells (at 5325) the LP solver to solve the problem. The LP solver then tries to solve this problem. If the LP solver fails to solve this problem in the first iteration through the while loop described above, the formulation above changes values of certain constants so that the minimum slack is no longer much of a constraint but rather serves as the primary component of the objective function. Specifically, the change to the constants minSlackWeight, minSlack, and lenAndViaWeight effectively makes the capacity constraint (which is the only constraint that would cause the first attempt to fail) ineffective. The LP solver then tries to solve the problem again. The change to the constants minSlackWeight, minSlack, and lenAndViaWeight ensures that the second attempt will produce a solution. One of ordinary skill will understand that other embodiments might change the value of these variables more incrementally to find solutions with different characteristics. However, such incremental changes might reduce the speed of the solver.

The solution that the LP solver returns is one that meets all the constraints and produces the lowest objective-function output. The returned solution may include real numbers for each tree variable xN_C. For instance, if the solver submitted three routes to the LP solver, the LP solver might return a score of 0.8 for one route, 0.1 for the other route, and 0.1 for the last route.

As mentioned above, the process 5300 converts (at 5330) this LP solution into an ILP solution, i.e., a solution that specifies a 0 or 1 as the value of each tree variable xN_C. Also, as mentioned above, some embodiments use randomized rounding to perform this conversion. Based on the set of routes selected at 5330, the solver 3930 stores (at 5335) a 42-bit selected route string in each slot-net data structure of the current slot. This 42-bit string specifies the paths in the current slot that the selected route of the net takes.

One of ordinary skill will understand that despite the above description of the solver, other embodiments might use different approaches to solve the routing problem at any particular level of the routing hierarchy. For instance, some embodiments might define objective functions and constraints in a different manner than those described above. For instance, some embodiments might use the cost of a route as a constraint, and have the objective function simply minimize congestion. Also, instead of using an LP solver to generate an LP solution and converting the LP solution into an ILP solution, other embodiments use an ILP solver to generate an ILP solution. Yet other embodiments use a sequential approach to embed routes for each net in the current slot.

F. Propagator

After the solver specifies the route for each slot-net of the current slot, the slot manager 3925 calls the propagator 3935 when the current slot is not at a leaf slot. The propagator then determines how the routing paths specified by the solver for the current routing level propagate down into the child slots of the current slot. For slots that are after the top-level slot but before the leaf-level slot, the propagator also performs a follow-up propagation operation that propagates the paths specified by the propagator at the previous routing level one level further down. For each net in the current slot, the propagator might have to modify the net's pin distribution within each child slot to account for the propagations that it identifies.

Two different propagators are described below. The first propagator enumerates several propagation solutions for each net's route and then uses the LP solver 3945 and ILP converter 3950 to select a propagation solution for each net. The second propagator, on the other hand, is a sequential propagator that uses a greedy approach to select and embed a propagation for the route of each net in the current slot. In the embodiments described below, both these propagators also use a sequential propagator to perform the follow-up propagation, when applicable.

Some embodiments use the first propagator when they use the seven-permutation propagation model of FIG. 62 for diagonal paths, and use the second propagator when they use the nineteen-permutation propagation model of FIG. 63 for diagonal paths. Some of these embodiments use the ten-permutation propagation model of FIG. 61 for Manhattan paths, in conjunction with either of these models.

1. ILP Propagator

Like the solver, the ILP propagator enumerates and costs several propagation solutions for each net's route into the affected child slots. The propagator then formulates an LP problem and feeds these solutions to the LP solver 3945, which, in turn, returns a number of real-number solutions. These real-number solutions are then converted into integer solutions by the ILP solver 3950. These integer solutions specify a particular configuration for each net within each affected child slot, and the propagator stores each net's configuration in the net's slot-net data structure for the affected child slot.

Figure 76:
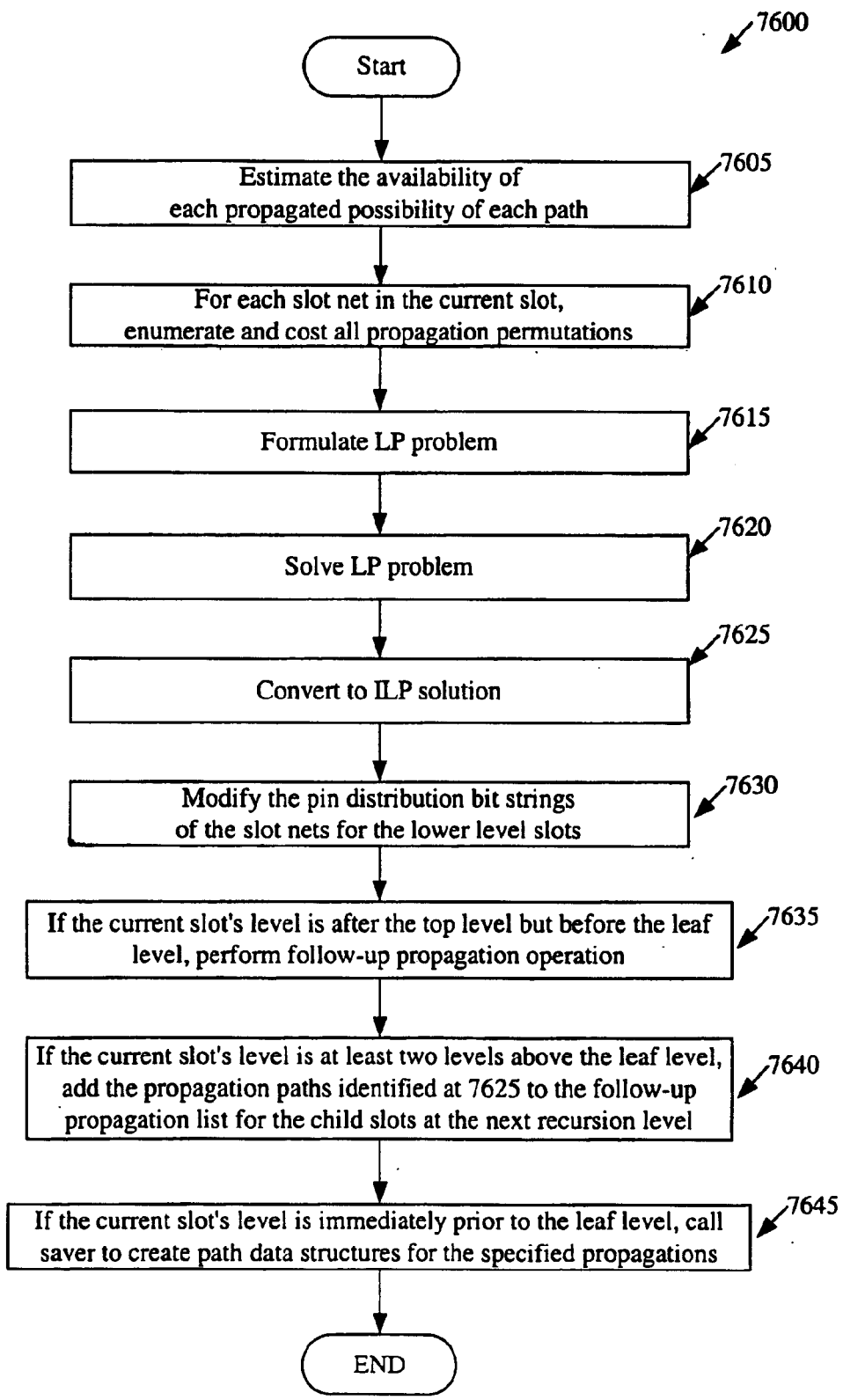
FIG. 76 illustrates a process that an ILP propagator performs in some embodiments.

FIG. 76 illustrates a process 7600 that the ILP propagator performs in some embodiments. In some embodiments, this process starts when the slot manager calls the propagator and supplies it with a current slot. The process 7600 initially estimates (at 7605) the availability of each propagation possibility of each path. One manner of estimating the availability of the propagations will be described below by reference to FIGS. 77 and 78.

After estimating the availability of each propagation possibility of each path, the ILP process 7600 enumerates and costs (at 7610) all propagation permutations for each slot-net in the current slot. One manner of enumerating and costing the propagations will be described below by reference to FIGS. 79 and 80.

After enumerating and costing the potential propagation permutations, the LP propagator formulates an LP problem for the LP solver 3945. One manner of formulating the LP propagation problem will be described below in Section VI.F.1.d. The process 7600 then converts (at 7625) the LP solution returned by the LP solver to an ILP solution. In some embodiments, the process performs randomized rounding to make this conversion. One manner of performing randomized rounding was described above in Section VI.E.

Based on the propagations specified at 7625, the process then modifies (at 7630) the 16-bit pin distributions of the slot-nets in the child slots of the current slot, when necessary. If at this stage there is no slot-net data structure to modify for a particular net, the propagator will instantiate one and record the 16-bit pin distribution in it.

When the current slot's level is at least two levels above the leaf level, the process 7600 adds (at 7635) the propagation paths that it identified at 7625 to the follow-up propagation list for the next lower recursion level. When the current slot's level is after the top level but before the leaf level, the propagator then performs (at 7640) a follow-up propagation operation. This operation propagates the routing paths specified by the propagator at the previous routing level one level further down. One manner of performing follow-up propagation is explained below by reference to FIGS. 65 and 81.

When the current slot's level is the level immediately before the leaf level (i.e., when the current slot is a grandparent of Gcells), the process 7600 next calls (at 7645) the saver to link to the dBNets 4110 the path data structures of the propagation paths specified at 7625 and, when applicable, for the propagation paths specified at 7640. The process then ends.

a. Estimating Congestion of the Propagations.

As mentioned above, the process 7600 estimates (at 7605) the remaining availability of each propagation possibility for each path in the current slot. In some embodiments, the process 7600 computes this estimate by (1) estimating the blocked capacity of each propagation of each path, (2) estimating the use of each propagation of each path, and (3) summing each propagation's blocked capacity and use. The estimation of the blocked capacity of each propagation is described below by reference to FIG. 77, while the estimation of the use of each propagation is described below by reference to FIG. 78.

(1) Estimated Blocked Capacity of Each Path.

Figure 77A:
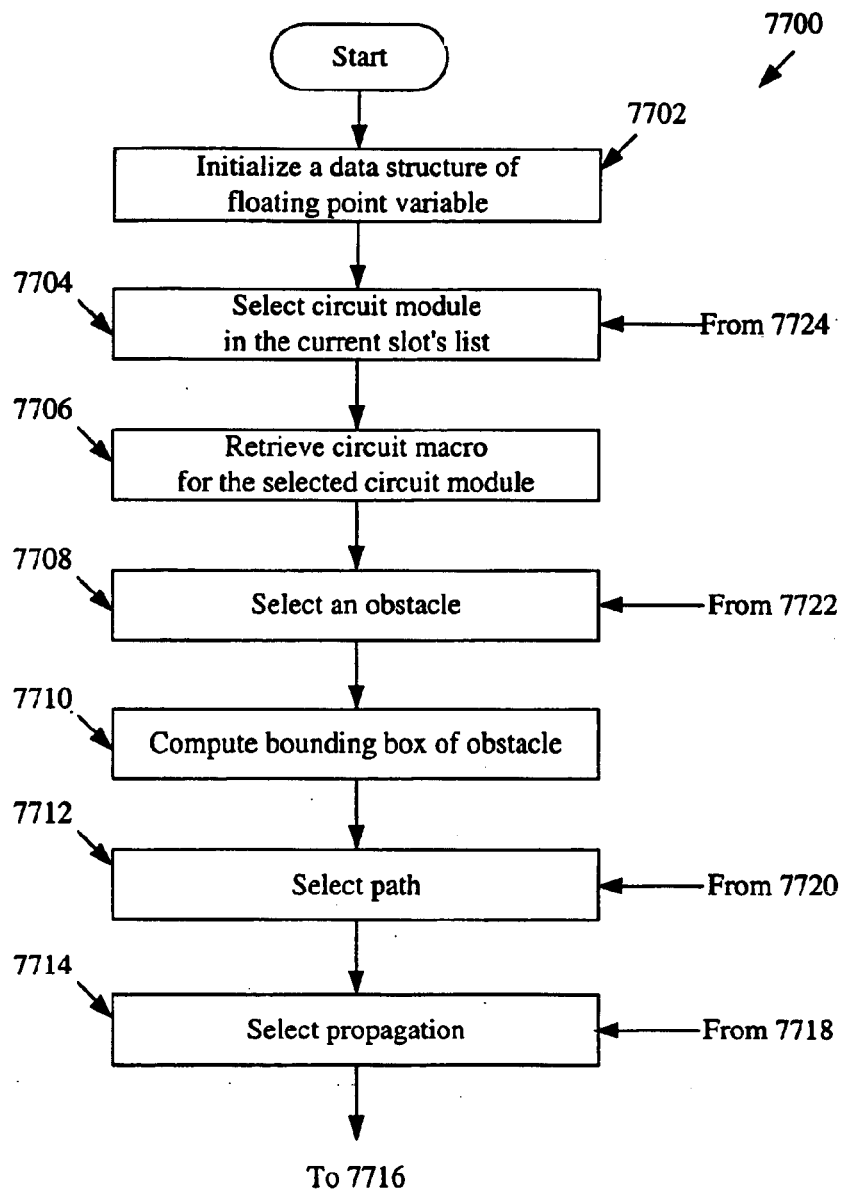
FIGS. 77 and 78 illustrate one manner of estimating the availability of the propagations.
Figure 77B:
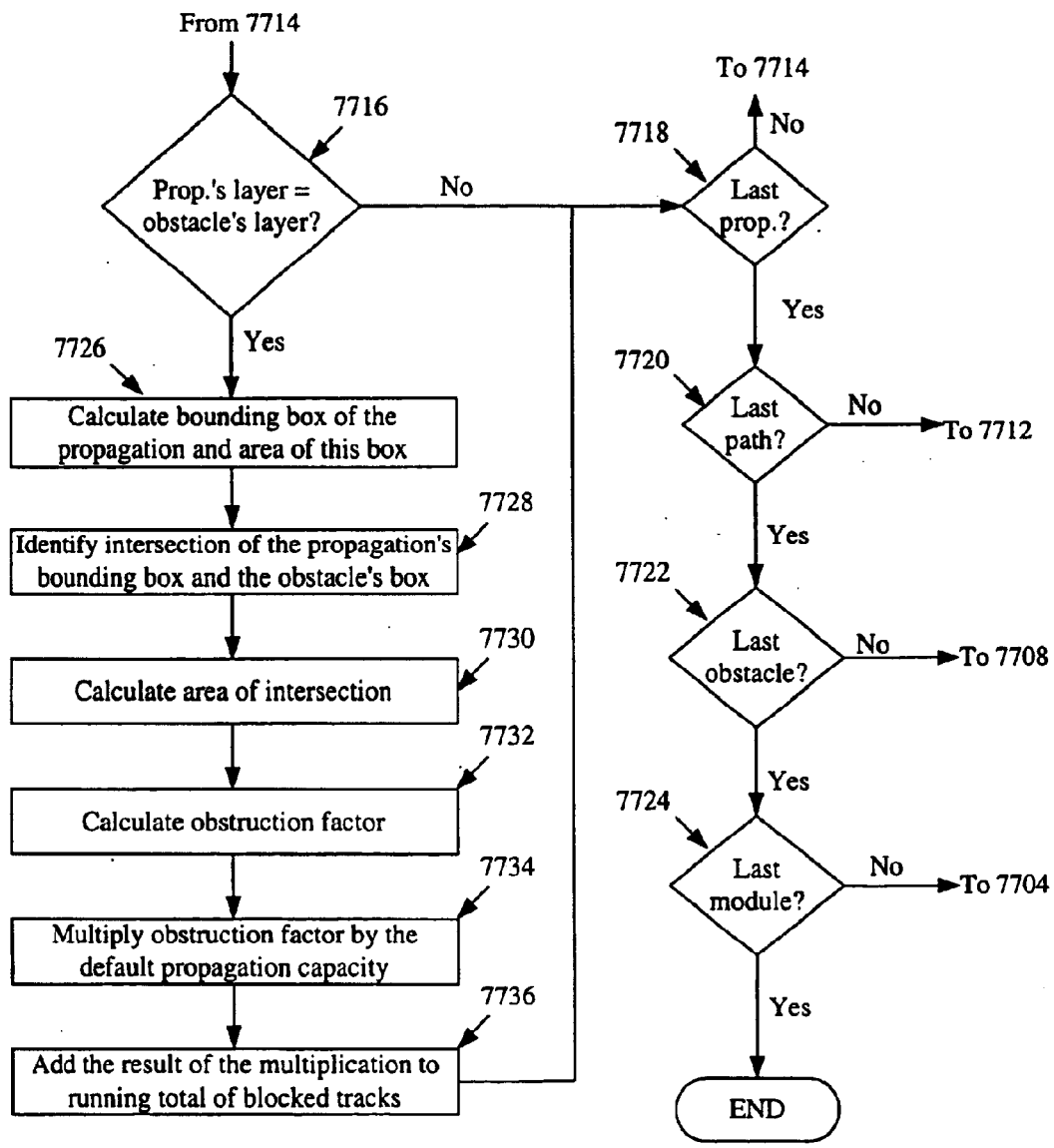

FIG. 77 illustrates a process 7700 for estimating the blocked capacity of each propagation of each path in the current slot. The propagation process 7600 performs process 7700 at 7605. Initially, this process allocates (at 7702) a data structure (e.g., a matrix) that has at least one field for storing the blocked capacity of each propagation of each path in the current slot. At 7702, the process also initializes each field in the data structure to 0.

At 7704, the process selects a circuit module in the current slot's list of circuit modules. The process then retrieves (at 7706) the circuit macro for the selected circuit module. It then selects (at 7708) an obstacle on the circuit macro, and computes (at 7710) the bounding box of the selected obstacle.

Next, the process (at 7712) selects one of the 42 paths of the current slot. It then selects (at 7714) one of the propagations of the path selected at 7712. The process next determines (at 7716) whether path selected at 7712 is on the same layer as the obstacle selected at 7708.

If the selected path's layer matches the selected obstacle's layer, the process calculates (at 7726) the bounding box of the selected propagation. At 7726, the process also calculates the area of the bounding box of the propagation. The process next identifies (at 7728) the intersection of the selected propagation's bounding box and the selected circuit module's bounding box, and calculates (at 7730) the area of this intersection. The process computes (at 7732) an obstruction factor by dividing they calculated intersection area by they calculated propagation area. The process next multiplies (at 7734) the obstruction factor by the default propagation capacity, and then adds (at 7736) the result of this multiplication to the propagation's blocked capacity that is stored in the data structure allocated at 7702. The process then transitions to 7718, which is described below.

If the process determined at 7716 that the selected path's layer is not the same as the selected obstacle's layer, the process transitions to 7718. At 7718, the process determines whether it has examined all the propagations for the path selected at 7712. If not, the process returns to 7714 to select another propagation for the selected path. On the other hand, if the process determines (at 7718) that it has examined all the propagations for the path selected at 7712, the process determines (at 7720) whether it has examined all the paths of the current slot. If not, the process returns to 7712 to select another path of the current slot.

Alternatively, if the selected path is the last path of the current slot, the process determines (at 7722) whether it has examined all the obstacles of the circuit module selected at 7704. If not, the process transitions to 7708 to select another obstacle of the selected circuit module. Otherwise, the process determines (at 7724) whether it has examined all the circuit modules in the current slot. If not, the process transitions to 7704 to select another circuit module in the current slot. However, if the process examined all the circuit modules in the current slot, the process ends.

b. Estimated Use of Each Path Propagation.

Figure 78:
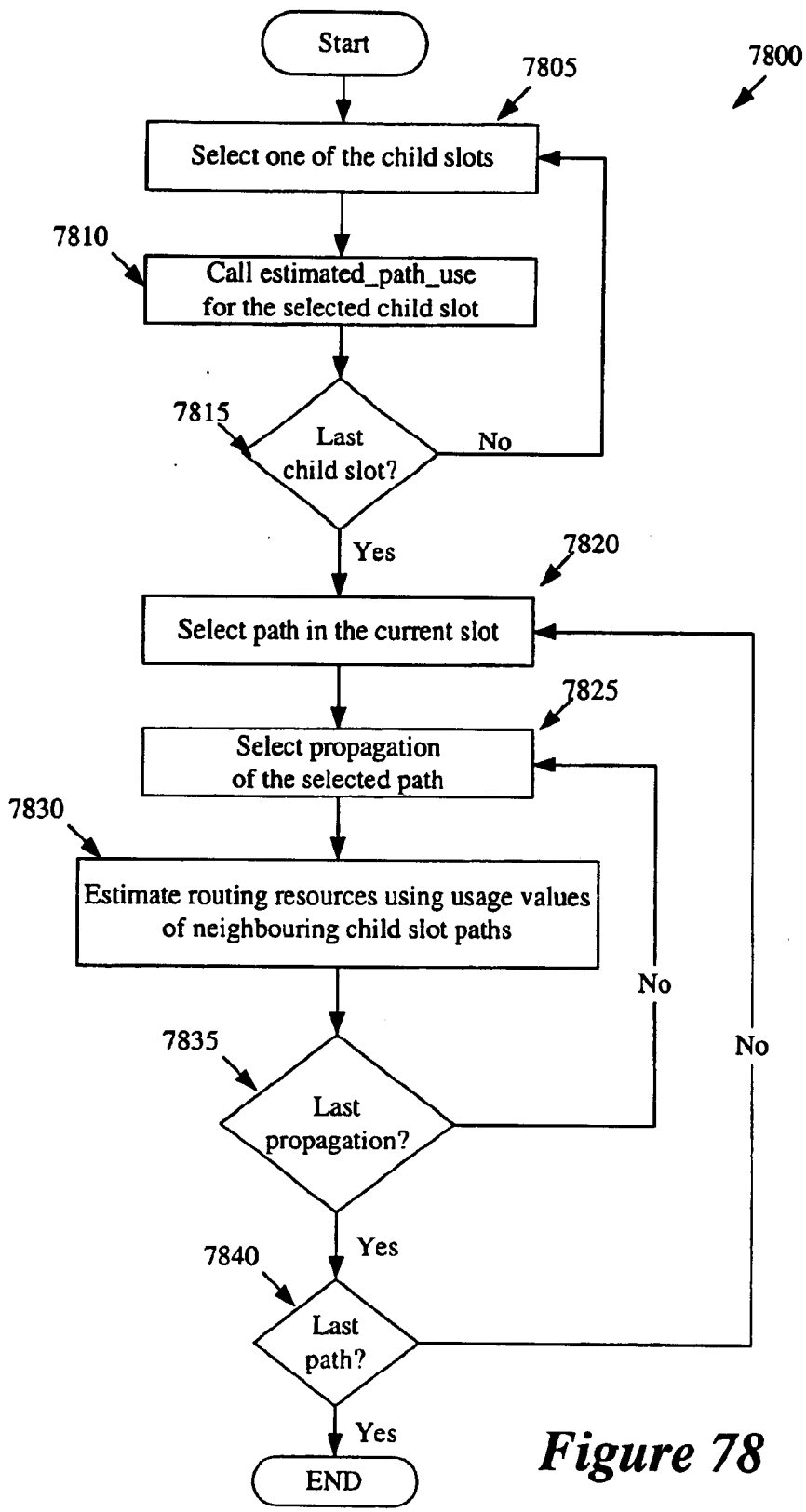

FIG. 78 illustrates a process 7800 for estimating the use of each propagation of each path in the current slot. This process starts each time the propagator calls it at 7605. In some embodiments, the process 7800 receives from the propagator a data structure (e.g., a matrix) of floating-point variables for storing the estimated use of each propagation. In other embodiments, the process 7800 does not receive such a data structure, but rather creates this structure when it starts. In some embodiments, the received or created data structure has at least one entry for each propagation possibility.

As shown in FIG. 78, the process 7800 initially selects (at 7805) one of the child slots of the current slot. It then calls (at 7810) the path-use estimating process 5500 of FIG. 55 for the selected child slot. The path-use estimating process 5500 computes and returns an estimated usage value for each path of the selected child slot. As the estimating process 5500 was described above, it will not be described here in order to not obscure the description of the invention with unnecessary detail.

After 7810, the process 7800 determines (at 7815) whether it has computed the path usage values for all the child slots of the current slot. If it has not, it returns to 7805 to select another child slot, and computes (at 7810) the path-usage values for the newly-selected child slot. When the process determines (at 7815) that it has examined all the current slot's child slots, it selects (at 7820) one of the 42 paths in the current slot.

At 7825, the process selects one of the propagations for the selected path. It then computes (at 7830) an estimate of the use of the selected path propagation based on that path-usage values of the neighboring child slot paths. For instance, in some embodiments of the invention, the process uses the formula below to compute the usage of propagate 0 of path 1:

prop_0-path_1_use=(½)*(½*path[1][2]+⅓*path[1][1]+⅙*path[1][0]+½*path[2][0]+⅓*path[2][1]+⅙*path[2][2]), where path[i][j] refers to the usage of path j of child slot i. Similar equations can be used to analogously define the propagation usage values for the other propagation possibilities.

The equation above defines a propagation usage value for propagation 0 of path 1 between child slots 1 and 2 in terms of the congestion within child slots 1 and 2. This equation only examines the horizontal path in the child slots that are in line with propagation 0 of path 1. Specifically, it examines the component usage value of propagate 0 of path 1 in terms of the horizontal paths 0, 1, and 2 of child slots 1 and 2. The summation of the usage values in both child slots 1 and 2 is multiplied by ½ to reflect that the capacity of propagation 0 of path 1 in the current slot is equally influenced by the capacities of the child paths in child slots 1 and 2.

The multipliers ½'s, ⅓'s and ⅙'s are used in the summation for both child slots 1 and 2 for the following reasons. The objective is to guess how many wires can be pushed through a propagate path. Some of these wires will terminate immediately after crossing the propagate path, while some will cross the entire width of the slot incident to the path. It is assumed that there will be a uniform distribution of "endpoints" of the wires using the path, such that for propagate 0 of path 1 ¼ will terminate in slot 0 of child slot 2, ¼ will terminate in slot 1 of child slot 2, ¼ in slot 2 of child slot 2 and ¼ in slot 3 of child slot 2 and beyond. This means that ¾ of the wires that use the path 1 will also use path 0 of child slot 2, 2/4 will use path 1 in child slot 2, and ¼ will use path 3 in child slot 2—which gives a ratio of 3:2:1 (or 3/6, 2/6, 1/6) of relative impact of the usages of these 3 paths on the estimated use of the propagated path.

At 7835, the process determines whether it has examined all the potential propagations of the path selected at 7820. If not, the process transitions back to 7825 to select another propagation for the selected path, and computes (at 7830) an estimate of the use of the newly-selected propagation.

When the process determines (at 7835) that it has examined all the propagations for the path selected at 7820, the process determines (at 7840) whether it has examined all the paths of the current slot. If it has not examined all paths, the process transitions back to 7820 to select another path of the current slot, and then performs operations 7825–7835 to compute the use of the propagation possibilities of the newly-selected path. When the process determines (at 7840) that it has examined all the paths in the current slot, the process ends.

c. Enumerating and Assigning Costs For Each Propagation

Figure 79A:
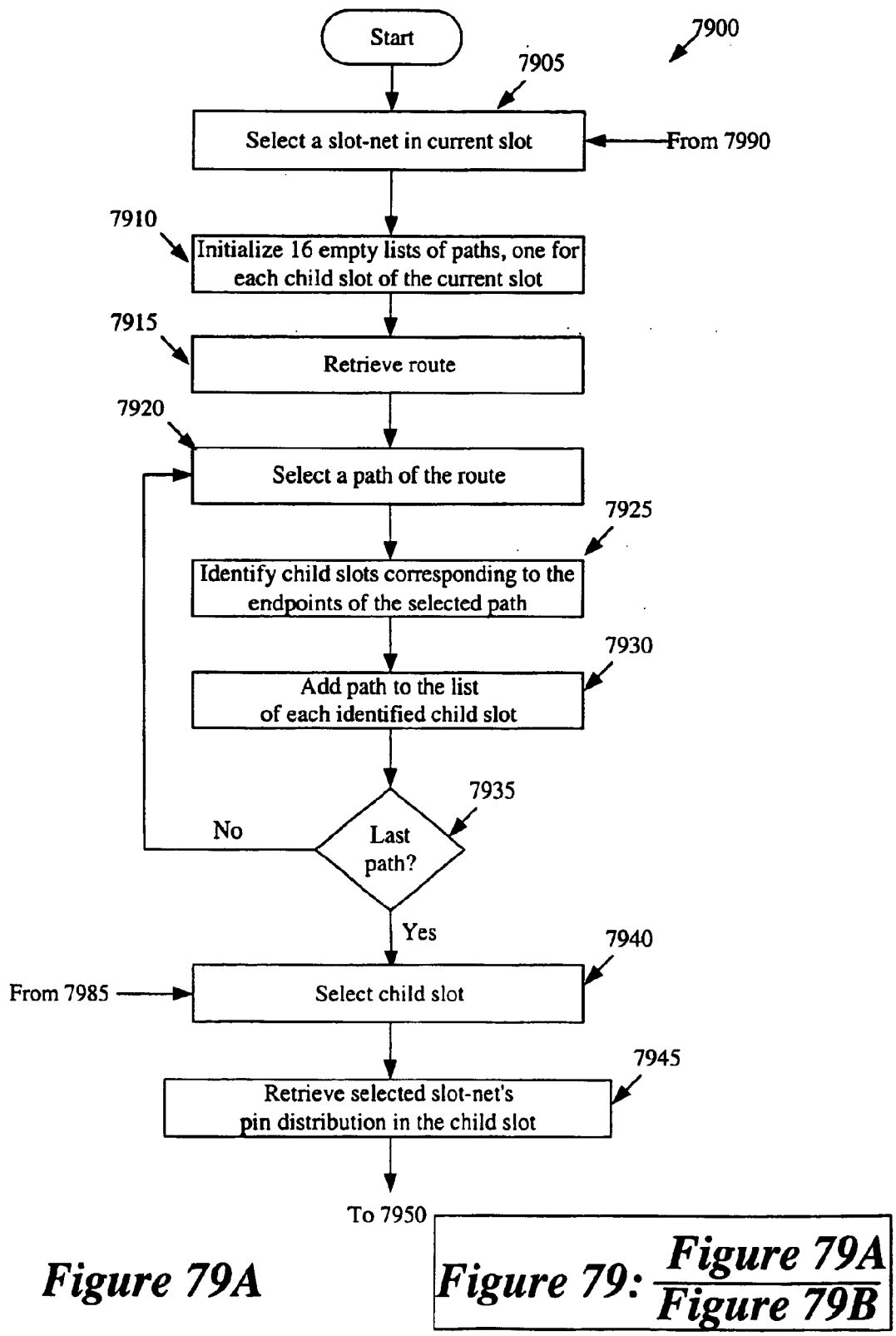
Figure 79B:
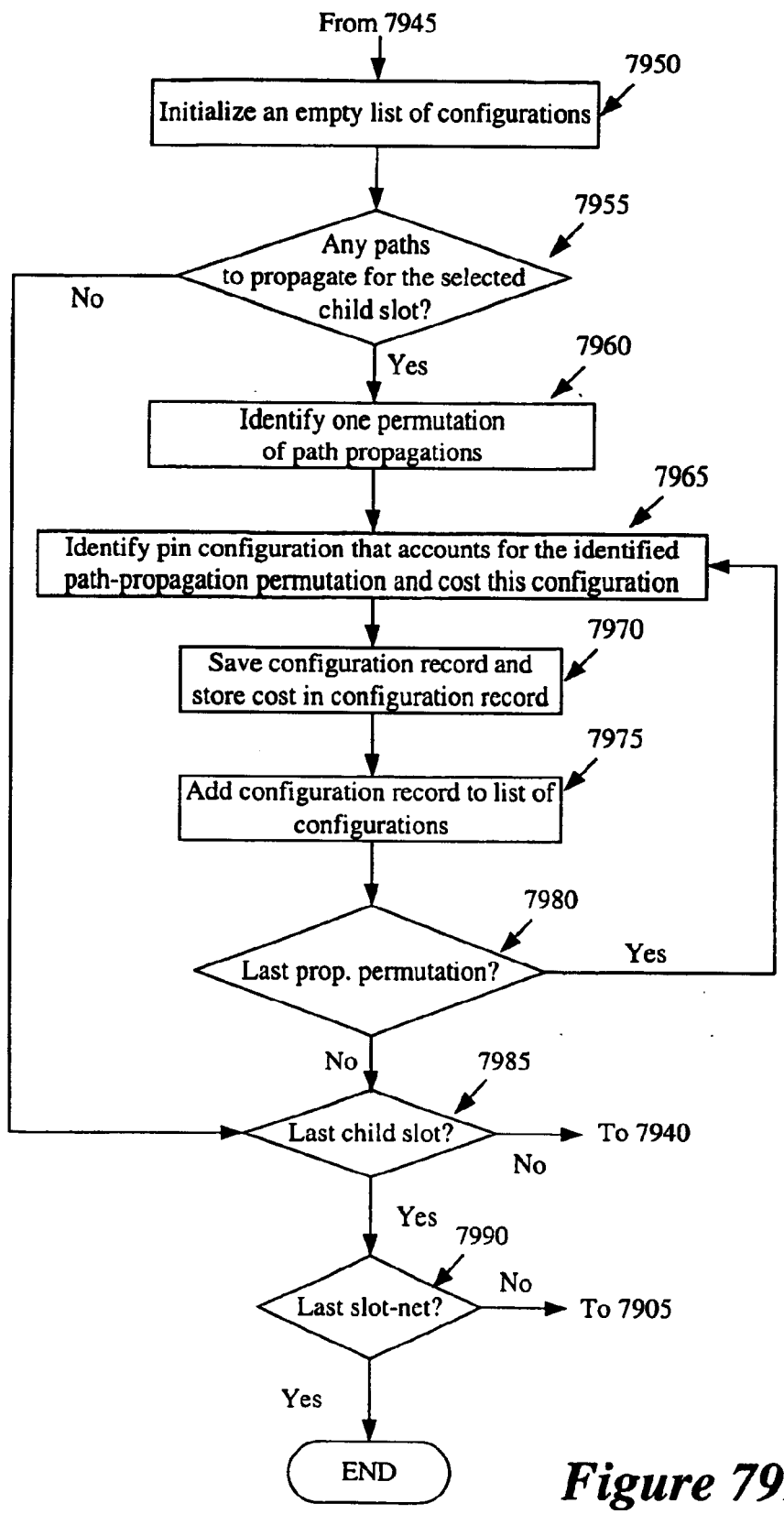

After estimating the availability of each propagation possibility of each path, the process 7600 enumerates and costs (at 7610) all propagation permutations for each slot-net in the current slot. FIG. 79 illustrates one manner of enumerating and costing the propagations.

As shown in FIG. 79, the process 7900 starts by selecting (at 7905) a slot-net of the current slot. The process then initializes (at 7910) 16 empty lists, one for storing the paths incident on a particular child slot. The process next retrieves (at 7915) the route for the slot-net selected at 7905.

At 7920, the process selects one of the paths of the retrieved route. It then identifies the two child slots corresponding to the end points of the selected path. The process adds the selected path to the path list of each child slot identified at 7925. At 7935, the process determines whether it has examined all the paths of the route retrieved at 7915. If not, the process returns to 7920 to select another path of the route.

When the process determines that it has added all the paths of the route to their corresponding child slots' lists, the process selects (at 7940) one of the child slots of the current slot and retrieves the list of paths of the selected child slot. The process selects the child slot at 7940 in order to enumerate and cost all the possible propagation permutations of the selected slot-net in the selected child slot. At 7945, the process retrieves the selected slot-net's pin distribution in the selected child slot.

At 7950, the process initializes an empty list to store all possible path propagation configurations in the child slot selected at 7940. At 7955, the process determines whether the selected child slot's path list is empty (i.e., whether the slot-net's route has any paths that traverse the child slot). When the slot-net's route does not traverse the selected child slot, the process does not need to identify propagation configurations for the slot-net's route through the selected child slot. Accordingly, the process transitions to 7985 to determine whether it has examined all the child slots of the current slot. The flow of the process 7900 from 7985 will be described below.

If the process determines (at 7955) that the slot-net's route traverses the selected child slot and that it therefore needs to identify propagation configurations for the slot-net's route in the selected child slot, the process 7900 performs 7960–7980 to enumerate, cost, and store all the possible propagation permutations of the selected slot-net in the selected child slot.

In some embodiments, the process 7900 uses a recursive function to perform 7955–7980. This function identifies each path-propagation permutation by (1) selecting one possible propagation for a path on the selected child slot's path list, (2) setting a virtual pin to account for the selected propagation, (3) recursively repeating the first two operations for each of the subsequent paths on the path list when such paths exist. For each identified propagation permutation, the process 7900 then performs 7970–7975 to cost and save each permutation, and add each permutation to a list of propagation configurations.

More specifically, at 7960, the process 7900 identifies one permutation of path propagations in the selected child slot. When the slot-net's route has only one path that is incident on the selected child slot, the identified propagation permutation is one of the propagation possibilities for the path incident on the selected child slot. On the other hand, when the slot-net's route has more than one path incident on the selected child slot, each identified permutation is a unique combination of propagations for each of the paths incident on the selected child slot.

As illustrated in FIG. 61, a horizontal vertical path has ten propagation possibilities in some embodiment of the invention. On the other hand, a diagonal path has seven propagation possibilities in some embodiment as illustrated in FIG. 62, while it has nineteen propagation possibilities in other embodiments as illustrated in FIG. 63. One of ordinary skill will understand that other embodiments use other propagation models for horizontal, vertical, or diagonal paths.

After identifying one permutation of path propagations in the selected child slot, the process identifies (at 7965) a pin configuration that accounts for the path propagations of the permutation identified at 7960. Such a pin configuration is the same as the slot-net's pin distribution in the selected child slot except that it might include one or more virtual pins to account for path propagations of the identified permutation.

The process then computes (at 7970) the cost of the pin configuration identified at 7965. In some embodiments, this cost is the wirelength cost of the route necessary for connecting the selected child slot's pins that are specified by the identified pin configuration. As before, some embodiments retrieve this cost from a pre-tabulated table that specifies the cost of the optimal Steiner routes for each pin configuration, while other embodiments compute this cost in real time based on the costs of the route paths.

At 7970, the process stores the identified propagation permutation (i.e., the identified path propagations) and its cost in a configuration record. The data structure for such a record is illustrated in FIG. 80. The propagator creates a list of this data structure and uses this list to keep track of all the configurations generated by the propagator. This data structure includes a reference to the net's dbNet data structure. It also contains a child-slot identifier that identifies for the propagator the identity of the child slot for the configuration. This structure also includes a name from which path propagations can be derived. It further stores the wirelength cost and a list of paths.

After 7970, the process adds (at 7975) the configuration record created at 7970 to a list of configuration for the selected child slot. The process then determines (at 7980) whether it has examined all the path-propagation permutations in the selected child slot. As mentioned above, some embodiments perform this determination as part of a recursive function that identifies all the path-propagation permutations.

If the process determines (at 7980) that it has not examined all path-propagation permutations, it identifies (at 7960) another permutation and then costs and stores (at 7965–7975) this permutation. When the process has examined all path-propagation permutation, it determines (at 7985) whether it has examined all the child slots. If not, the process returns to 7940 to select another child slot.

When the process determines (at 7985) that it has examined all the child slots, the process determines (at 7990) whether it has generated the propagation permutations for all slot-nets in the current slot. If not, the process returns to 7905 to select another slot-net, and then performs subsequent operations to enumerate and cost the propagation permutations for the newly-selected slot-net. The process ends when it has examined all the slot-nets in the current slot.

d. LP Problem Formulation and Solving

The ILP propagator 3935 formulates the LP problem by providing the LP solver 3945 with one or more objective functions, a number of solutions, and several constraints. The LP solver then needs to use the objective functions to select the optimal solution in view of constraints.

The basic variables in the LP-propagation formulation are the configuration records, nXtYeApB . . . , where the lower case letters are keywords (n=net; t=child slot; e=path; p=propagation), and the upper-case letters represent numbers (from 0 to the number of nets in the design for 'n'; from 0–15 for 't'; from 0–41 for 'e'; and from 0–9 for 'p').

This LP solver returns an LP solution that includes a real number value for each configuration variable. As mentioned above, the process 7600 then converts this LP solution into an ILP solution, i.e., a solution that specifies a 0 or 1 as the value of each configuration variable. Instead of using an LP solver to generate an LP solution and converting the LP solution into an ILP solution, other embodiments use an ILP solver to generate an ILP solution.

As mentioned above, some embodiments use as the LP solver the "SoPlex" solver, which has been implemented by Roland Wunderling as a part of his Ph.D. thesis entitled "Paralleler und Objektorientierter Simplex-Algorithmus" (in German). Information about this solver is available at the following website:

http://www.zib.de/Optimization/Software/Soplex/.

Also, as mentioned above, the task of the LP solver is to identify an LP solution that minimizes one or more objective functions while satisfying a number of constraints. The embodiments described below specify the following objective function for the LP propagation.

minimize: LlnXtYeApB+ . . . +LLnQtWeDpCeApD+ . . .

This objective function minimizes the total length. Specifically, each term in this function represents a configuration (i.e., a complete selection of propagations of paths for a net in a child slot), and is multiplied by the estimated length of that configuration (Ll, LL).

Also, the embodiments described below specify three constraints. The first constraint requires the LP solver to pick only one configuration for every slot-net, as indicated below.

nXtY: nXtYeApB . . . eQpZ+nxtYeApC . . . eQpR+ . . . =1;

One such constraint is defined for each slot-net across the 16 child-slots of the most recently solved slot. This constraint serves to limit number of selected configurations to 1 per slot-net.

The second constraint is a propagation consistency constraint, which serves to ensure coherency between child slots (e.g., if propagation B is chosen for path A in child slot Y, then the same choice must be made in the other child slot incident to path A). This constraint can be specified as follows:

nXeYpZ: nXt0eYpZeQp1+nXt0eYpZeQp2+ nXt0eYpZeQp7 . . . -nXtleYpZeSp1-nXtleYpZeSp2- nXtleYpZeSp3=0

Note that there will be as many positive terms as there are configurations specifying propagation B for path A in child slot Y for net X, and there will be as many negative terms as there are configurations specifying propagation B for path A in child slot W for net X.

The third constraint is a capacity constraint. Some embodiments map the slot-net configurations in the child slots to usage of paths between the grandchild slots (i.e., map each propagation in the child slots to use of paths between the grandchild slots). These embodiments then ensure that the capacity of the paths between grandchild slot are respected.

The formulation of the LP-propagation problem in some of these embodiments is as follows:
[prepPropagationILP(slot)]
    initialize slack=0
    while we don't have a solution
        initialize a new LP solver
        declare the objective function, "objective"
        for each path of the slot
            for each propagation of the path
                retrieve all paths comprising the propagation
                for each path of the propagation
                      retrieve the (child-slot, grandchild-slot) pairs that serve as endpoints of the path (a child-slot, grandchild-slot pair may occur in more than one propagation)
                      if this (child-slot, grandchild-slot) pair has not yet been processed
                      create a constraint "tAsBtCsD", where A is a child-slot, B is a grandchild-slot of child-slot A, C is a child-slot, and D is a grandchild-slot of child-slot C. This constraint will limit the use of the path between the grandchild-slots.
    declare a constraint "totlen" to define a total length variable
    for each slot-net X
        for each path Y in the route for the slot-net
            for each propagation Z of that path
                declare a constraint, "nXeYpZ", to force the LP solver to choose the same propagation for an identical path in both of its incident child-slots
        for each child-slot upon which the route of the current slot-net is incident
            declare a constraint, "nXtY", where Y is the number of the child-slot. This is destined to select one configuration per slot-net in each child-slot
// finished declaring constraints, now turn to variables
    for each slot-net
        for each child-slot upon which the route of the current slot-net is incident
            identify all configurations of slot-net in child-slot
            // done according to process 7900
            for each generated configuration
                create variable "nAtBeCpD" where A, B, C, D are integers identifying the net, slot, path and propagation, respectively of the config
                for each path in the config
                      if propagation for the path is "unuseable", add a penalty to the config cost // where unuseability determined based on the congestion estimate obtained from the estimates produced by processes 7700 and 7800
                declare nAtBeCpD to be present in constraint "nAeCpD" with factor 1.0 if B is the lesser index of the 2 child-slots incident to this path, −1.0 otherwise
                for each sub-path in the propagation of the path
                      retrieve the 2 (child-slot, grandchild-slot) pairs that serve as endpoints of the sub-path
                      declare nAtBeCpD to be present in the constraint corresponding to this pair of (child-slot, grandchild-slot)s with factor 0.5
                declare nAtBeCpD to be present in constraint "nAtB" with factor 1.0
                declare nAtBeCpD to be present in constraint "totLen" with factor equal to the config cost, stored in the configuration's data structure, plus any penalty
    create variable "tl" to represent the total length of the configs selected
    declare tl to be present in constraint "totLen" with factor −1.0
    declare tl to be present in the objective function with factor 1.0
    set the rhs of constraint "totLen"=0.0 for each path of the slot
   for each propagation of the path
      retrieve all paths comprising the propagation
      for each path of the propagation
         retrieve the (child-slot, grandchild-slot) pairs that serve as endpoints of the path (a child-slot, grandchild-slot pair may occur in more than one propagation)
         if this (child-slot, grandchild-slot) pair has not yet been processed
            create a constraint "tAsBtCsD", where A is a child-slot, B is a grandchild-slot of child-slot A, C is a child-slot, and D is a grandchild-slot of child-slot C. This constraint will limit the use of the path between the grandchild-slots.
            set the rhs of constraint "tAsBtCsD" to the default capacity of the propagation-path plus the local variable "slack" value minus the sum of the estimate path use of the propagation and the blocked capacity of the propagation path // where the estimated path use was computed by process 7800 and the blocked capacity was computed by process 7700
for each slot-net A
   for each path B in the route of the slot-net
      for each propagation C of that path
         set rhs of constraint "nAeBpC" to 0.0.
   for each child-slot B upon which the route for this slot-net is incident
      set the rhs of constraint "nAtB" equal to 1.0
solve the LP
if a solution was found, break out of while loop; otherwise set slack=slack+1 and start again As indicated above, the second-to-last line of the formulation tells (at 7620) the LP solver to solve the problem. The LP solver then tries to solve this problem. Each time the LP solver fails to solve this problem, the formulation above increments the slack value until the LP solver is able to solve the problem.

The LP solver returns a real-number optimal solution. The process 7600 then converts this solution to an integer LP ("ILP") solution. Some embodiments use randomized rounding to perform this conversion, as described above. One of ordinary skill will understand that, instead of using an LP solver to generate an LP solution and converting the LP solution into an ILP solution, other embodiments use an ILP solver for the propagator to generate an ILP solution.

e. Follow-Up Propagation

When the current slot's level is at least two levels above the leaf level, the process 7600 adds the propagation paths that it identified at 7625 to the follow-up propagation list for the next lower recursion level. FIG. 65 illustrates one example of propagation paths that can be added to the follow-up propagation list. As mentioned above, this figure illustrates a net that has actual pins 6525 in slots 0 and 9. The selected route for this net uses paths P17 and P24 that traverse child slot 5 to connect child slots 0 and 9.

FIG. 65 illustrates that the path P24 is propagated into child slots 0 and 5 by paths 6510 and 6515, while the path P17 is propagated into child slots 5 and 9 by path 6520. The propagation path 6510 is between the child slot 7 of the current slot's child slot 0 and the child slot 8 of the current slot's child slot 1. The propagation path 6515 is between the child slot 13 of the current slot's child slot 1 and the child slot 2 of the current slot's child slot 5. The propagation path 6520 is between the child slot 14 of the current slot's child slot 5 and the child slot 2 of the current slot's child slot 9.

FIG. 65 illustrates five virtual pins that have been added to the slots of child slots 1, 5, and 9.

When the current slot's level is at least two levels above the leaf level, the process 7600 adds the propagation paths 6510, 6515, and 6520 to the follow-up propagation list for the next lower recursion level. The propagator will then use this list when performing follow-up propagation for a child slot of the current slot. This propagation operation propagates the paths on the follow-up propagation list one level further down.

Figure 81:
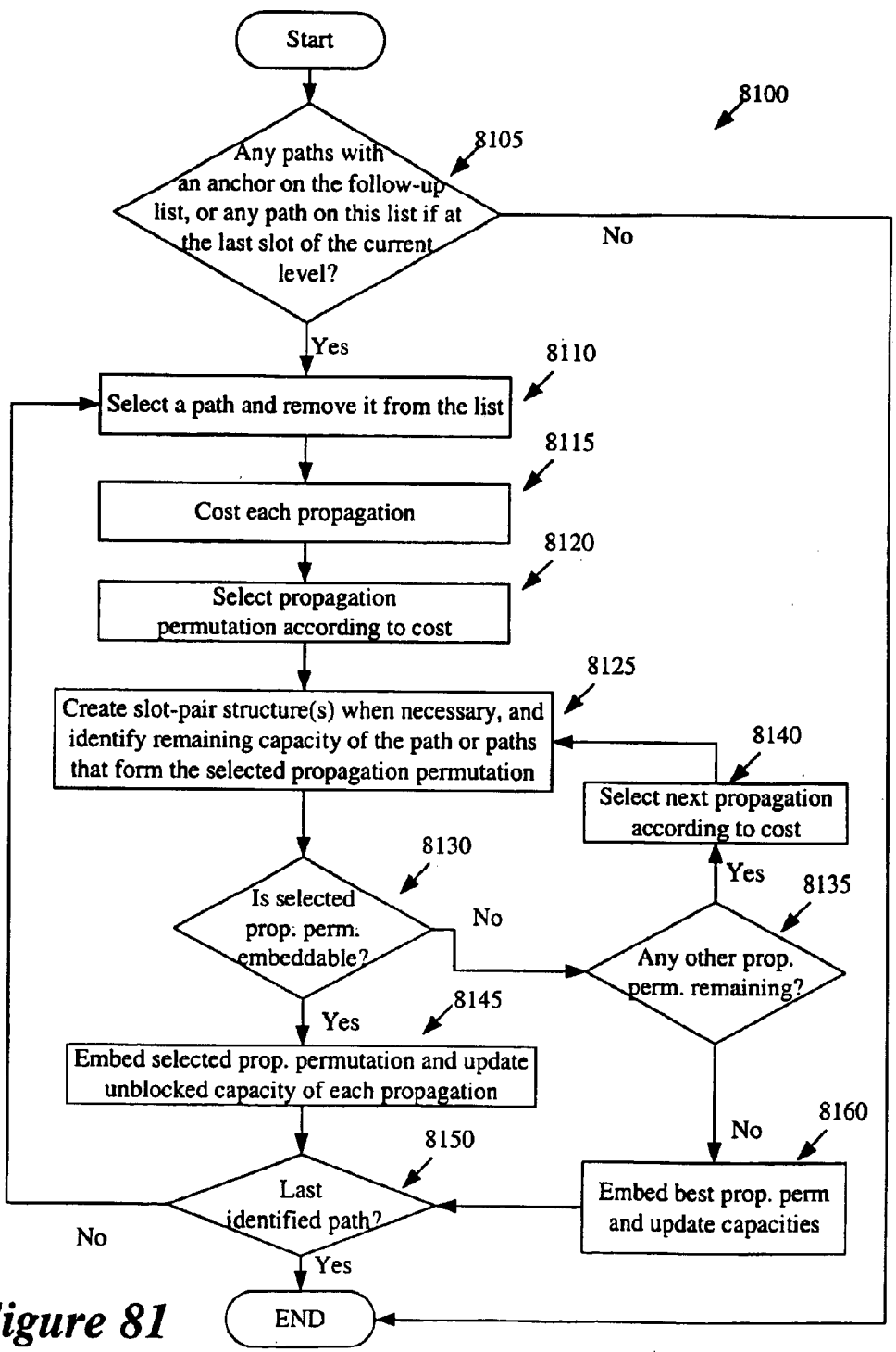
FIG. 81 illustrates a process for performing follow-up propagation for the current slot when the current slot is below the top-level slot but above the leaf-level slot.

FIG. 81 illustrates a process 8100 for performing follow-up propagation for the current slot when the current slot is below the top-level slot but above the leaf-level slot. By definition, such a current slot is a child slot of a previous parent slot. As shown in FIG. 81, the process 8100 initially determines (at 8105) either (1) whether the follow-up propagation list includes any path that has at least one anchor, or (2) whether the current slot is the last slot of the current level and the follow-up propagation list still includes one or more paths.

If the process identifies no paths at 8105, the process ends. Otherwise, the process 8100 selects (at 8110) one of the identified paths, and removes this path from the follow-up propagation list. Next, the process costs (at 8115) each propagation permutation of the selected path. The cost of each propagation permutation includes the cost of its propagation path(s) plus the routing cost of the pin configurations in the two or three child slots that the propagation permutation traverses.

Next, the process selects (at 8120) the lowest cost propagation permutation. The selected propagation permutation includes one and in some cases two propagation paths. For instance, in the example illustrated in FIG. 65, the propagation of path P24 resulted in two propagation paths 6510 and 6515, while the propagation of path 17 resulted in one propagation path 6520.

For each propagation path, some embodiments maintain a slot-pair record, which stores the identity of the child slots that the path joins and the remaining capacity of the path. Accordingly, at 8125, the process determines whether a slot-pair data structure exists for each propagation path that forms the propagation permutation selected at 8120. When such a structure does not exist for a propagation path of the selected propagation permutation, the process (at 8125) creates a slot pair structure for the path, stores in the structure the identity of the child slots that the path traverses, and initializes the capacity field of the structure. The initialized capacity for a propagation path is the default capacity of the path minus any blockages on the path. When a slot-pair structure already exists for a propagation path of the selected propagation permutation, the process identifies (at 8125) the path's remaining capacity from this structure.

At 8130, the process determines whether the selected propagation permutation can be embedded in the current slot's child slots. In other words, the process determines whether the propagation path or paths that form the selected propagation permutation have a remaining capacity greater than a threshold value. In some embodiments, the threshold value is 0. In these embodiments, the selected propagation permutation is embeddable when all the paths that form it have a remaining capacity greater than zero.

If the process determines that the selected propagation permutation cannot be embedded, it determines (at 8135) whether there are additional propagation permutations for the path selected at 8120. If so, the process selects (at 8140) the next cheapest propagation permutation and then transitions to 8125.

Figure 82:
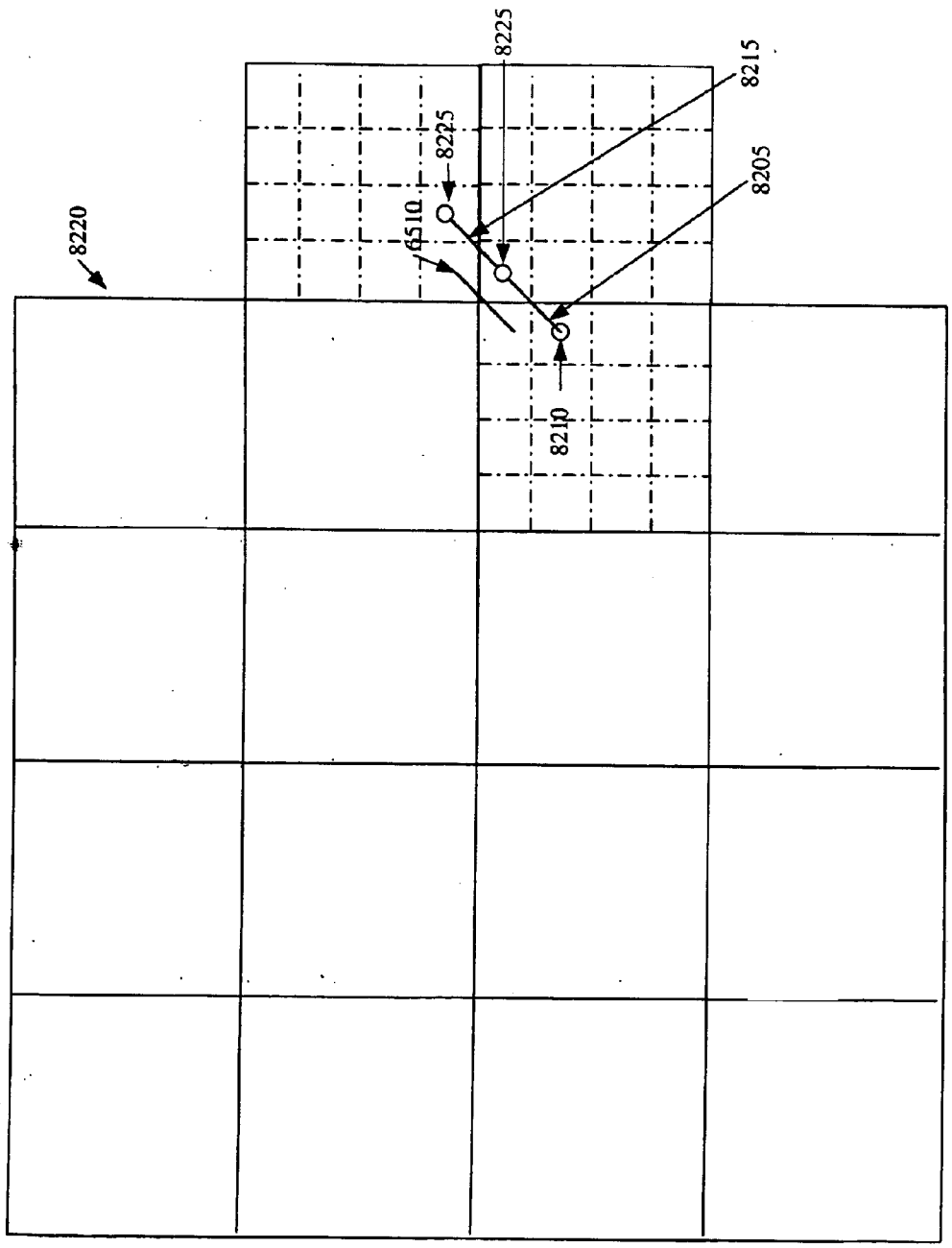
FIG. 82 illustrates a path from a follow-up path list that is propagated.

When the process determines (at 8135) that there are no additional propagation permutations to examine, the process embeds (at 8160) the best propagation permutation that it examined at 8130. This embedding might entail setting virtual pins in the pin distributions of affected child slots (i.e., setting virtual pins in the current slot's grandchild slots that the selected propagation permutation's path or paths traverse). One example of setting such virtual pins is illustrated in FIG. 82. This figure illustrates (1) a path 6510 from the follow-up path list that is propagated into slot 11 of child slot 7 by path 8205, and (2) a virtual pin 8210 that has been set in slot 11 to account for this propagation. This figure also illustrates that the path 6510 has been propagated along path 8215 into slot 12 of child slot 4 and slot 1 of child slot 8 of the slot adjacent to the current slot 8220. This figure also illustrates two virtual pins that have been set in slots 12 and 1 of the adjacent slot's child slots 4 and 8.

At 8160, the process also updates the available capacity of the propagation path or paths used by the embedded propagation permutation. As mentioned above, the available capacity of a propagation path can be computed as the default capacity of the path minus the sum of its blocked capacity and its path use estimate, where the blocked and use values are computed according to the processes 7700 and 7800. Some embodiments might not factor the path use estimate computed by using process 7800 in the available capacity of each propagation path.

When the current slot's level is at least two levels above the leaf level, the process (at 8160) also adds the embedded propagation path(s) to the follow-up propagation list for the next lower recursion level. From 8160, the process transitions to 8150, which will be described below.

When the process determines (at 8130) that a selected propagation permutation can be embedded, it embeds (at 8145) the propagation permutation selected at 8120 or 8140. This embedding might entail setting virtual pins in the pin distributions of affected child slots (i.e., setting virtual pins in the current slot's grandchild slots that the selected propagation permutation's path or paths traverse). At 8145, the process also updates the available capacity of the propagation path or paths used by the embedded propagation permutation. When the current slot's level is at least two levels above the leaf level, the process (at 8145) also adds the embedded propagation path(s) to the follow-up propagation list for the next lower recursion level. From 8145, the process transitions to 8150.

At 8150, the process determines whether it has examined all the paths that it identified at 8105. If not, the process returns to 8110 to select another unexamined path that it identified at 8105. If so, the process ends.

2. Sequential Propagator

Some embodiments of the invention use a sequential propagation approach to identify how to propagate the routes specified by the solver into the current slot's child slots. Some of these embodiments use such an approach when they use the diagonal propagation model of FIG. 63.

Figure 83A:
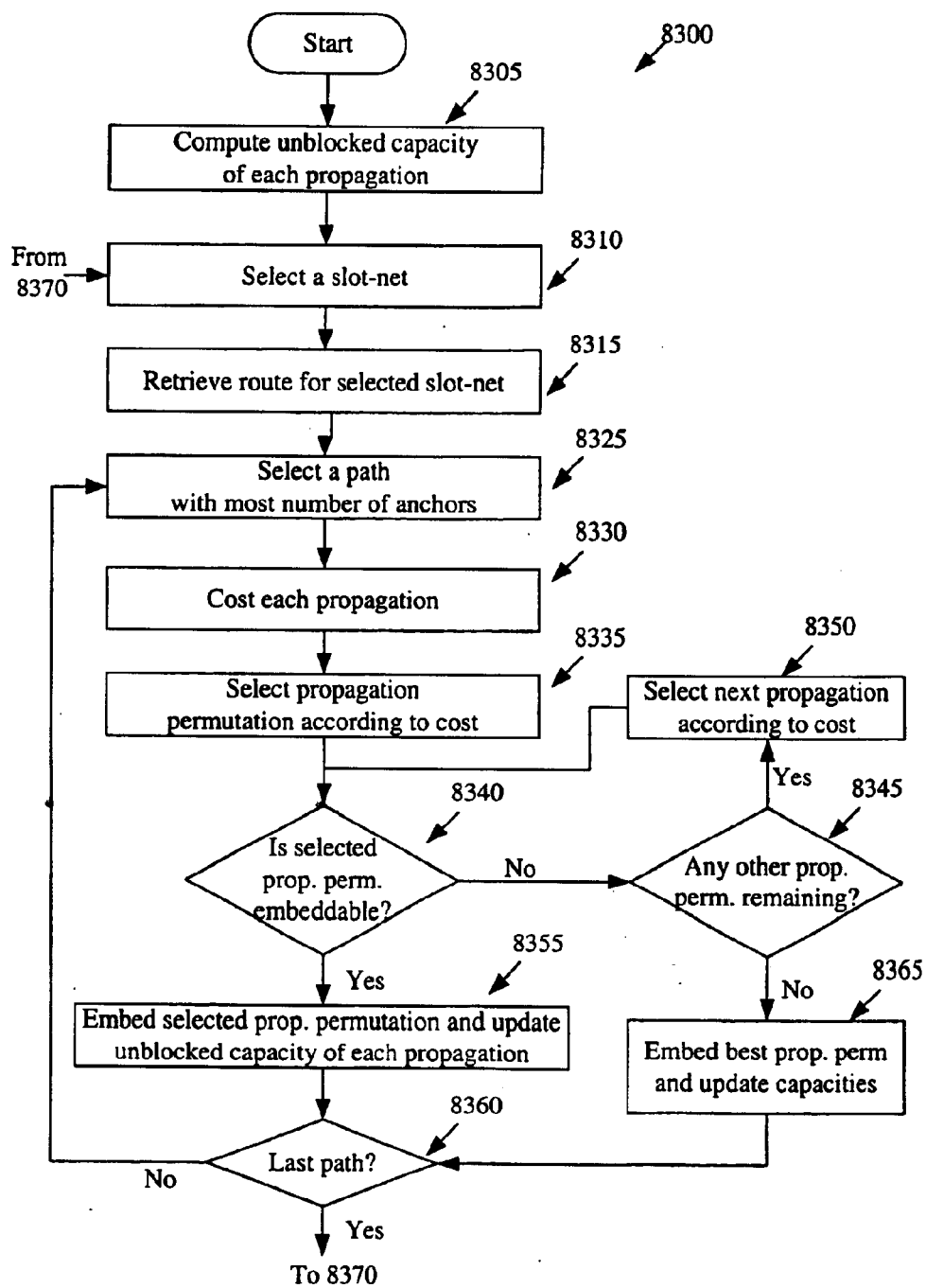
FIG. 83 illustrates one a sequential-propagation process that is used in some embodiments.
Figure 83B:
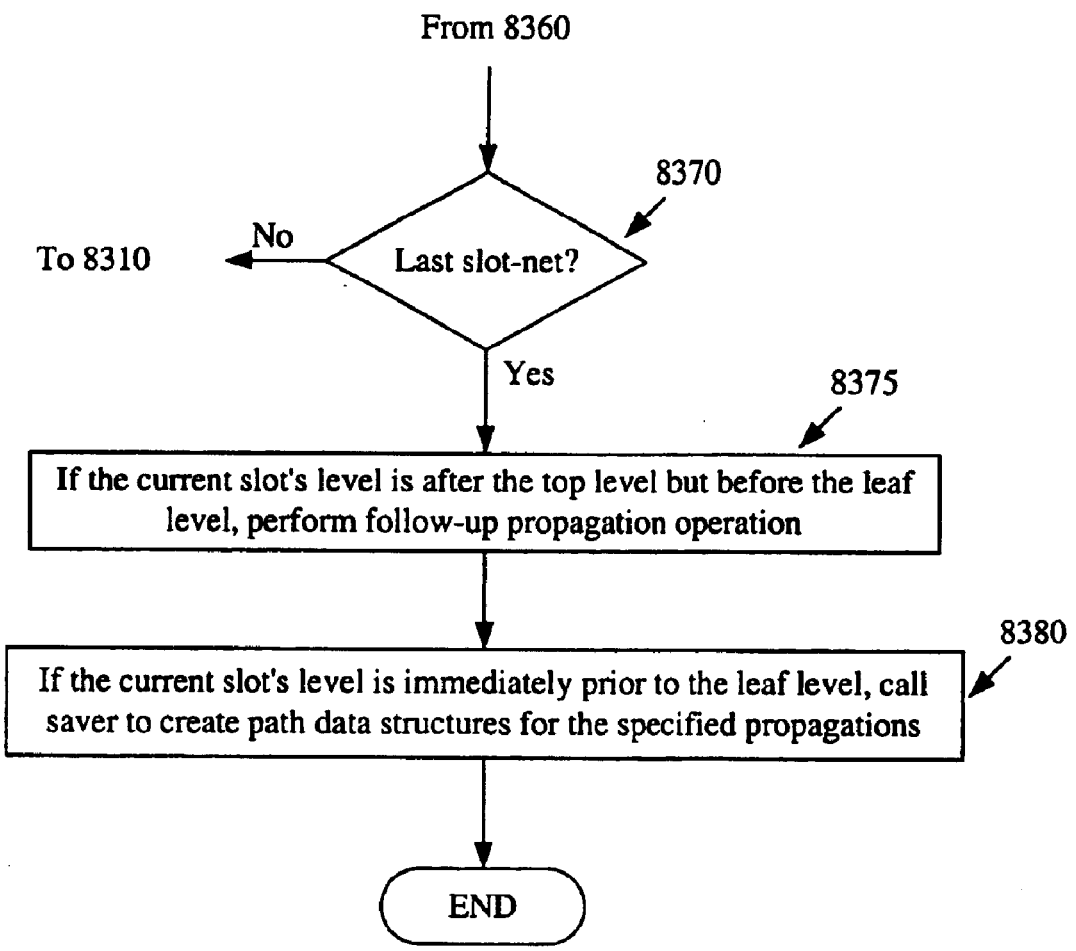

FIG. 83 illustrates one a sequential-propagation process that is used in some embodiments. As shown in this figure, this process starts by computing (at 8305) the available capacity of each propagation between the child slots of the current slot's child slots. The available capacity of each propagation path equals the default capacity of the path minus its blocked capacity plus its path use estimate. As mentioned above, processes 7700 and 7800 can be used to compute the blocked and path use values. Some embodiments might not factor the path use estimate computed by using process 7800 in the available capacity of each propagation path.

After computing the available propagation capacities, the process selects (at 8310) a slot-net in the current slot. It then retrieves (at 8315) the route for the selected slot-net. At 8325, the process then selects a path with the most number of anchors. As mentioned above, some embodiments define an anchor as a pin in either child slot upon which the path is incident. In these embodiments, a path has at most two anchors. Other embodiments might define anchor as the number of pins in the slots of a child slot; under such an approach, a path can have up to 32 anchors, when it has 16 pins in the 16 slots of each child slot.

Next, the process costs (at 8330) each propagation permutations of the selected path. The cost of each propagation permutation includes the cost of the permutation's propagation path(s) plus the routing cost of the pin configurations in the two or three child slots that the propagation permutation traverses.

Next, the process selects (at 8335) the lowest cost propagation permutation. The selected propagation permutation includes one and in some cases two propagation paths. For instance, in the example illustrated in FIG. 65, the propagation of path P24 resulted in two propagation paths 6510 and 6515, while the propagation of path 17 resulted in one propagation path 6520.

At 8340, the process determines whether the selected propagation permutation can be embedded in the current slot's child slots. In other words, the process determines whether embedding the selected propagation permutation will cause any propagation path for this permutation to be over congested.

If the process determines that the selected propagation permutation cannot be embedded, it determines (at 8345) whether there are additional propagation permutations for the path selected at 8325. If so, the process selects (at 8350) the next cheapest propagation permutation and returns to 8340 to determine whether the newly-selected permutation can be embedded.

When the process determines (at 8345) that there are no additional propagation permutations to examine, the process embeds (at 8365) the best propagation permutation that it encountered at 8340. This embedding might entail setting virtual pins in the pin distributions of affected child slots (i.e., setting virtual pins in the current slot's grandchild slots that the selected propagation permutation's path or paths traverse). When the current slot's level is at least two levels above the leaf level, this embedding also entails adding the propagation paths used by the selected propagation permutation to the follow-up propagation list for the next lower recursion level. At 8365, the process also updates the available capacity of the propagation paths of the embedded propagation permutation. From 8365, the process transitions to 8360, which will be described below.

When the process determines (at 8340) that a selected propagation permutation can be embedded, it embeds (at 8355) the selected propagation permutation. This embedding might entail setting virtual pins in the pin distributions of affected child slots (i.e., setting virtual pins in the current slot's grandchild slots that the selected propagation permutation's path or paths traverse). When the current slot's level is at least two levels above the leaf level, this embedding also entails adding the propagation paths used by the selected propagation permutation to the follow-up propagation list for the next lower recursion level. At 8355, the process also updates the available capacity of the propagation paths of the embedded propagation permutation. From 8355, the process transitions to 8360.

At 8360, the process determines whether it has examined all the paths of the selected slot-net's route. If not, the process returns to 8325 to select another path of this route. If so, the process determines (at 8370) whether it has examined all the slot-nets in the current slot.

If the process has not examined all the slot-nets in the current slot, the process returns to 8310 to select another slot-net. Otherwise, the process transitions to 8375. When the current slot's level is after the top level but before the leaf level, the sequential propagator then performs (at 8375) a follow-up propagation operation. This operation propagates the routing paths specified by the propagator at the previous routing level one level further down. When the current slot's level is the level immediately before the leaf level (i.e., when the current slot is a grandparent of Gcells), the sequential propagator calls (at 8380) the saver to link to the dBNets the path data structures of any propagation path embedded at 8355, 8365, and 8375. The process then ends.

VII. The Computer System

Figure 84:
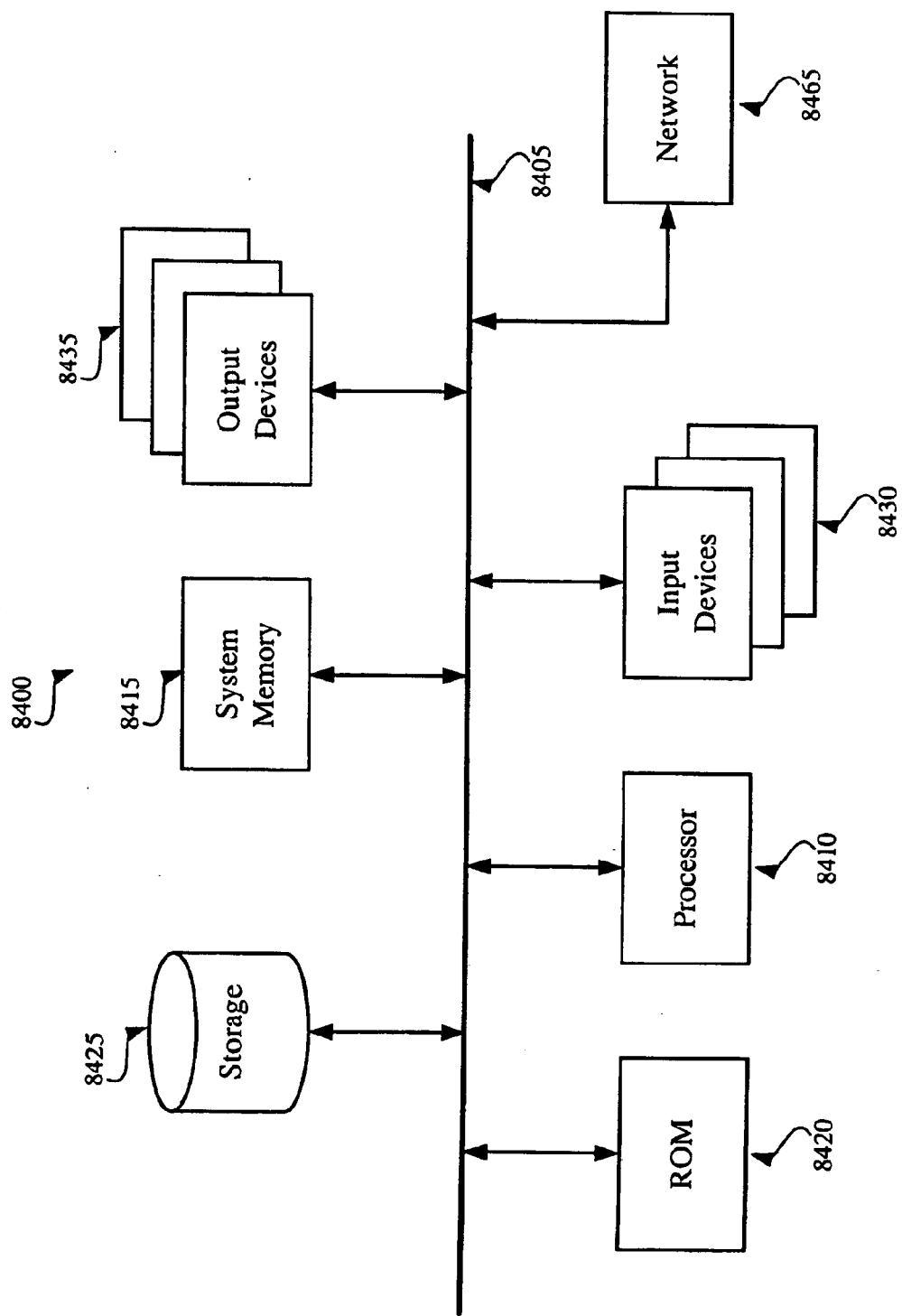
FIG. 84 presents a computer system used to implement some embodiments of the invention.

FIG. 84 presents a computer system with which one embodiment of the present invention is implemented. Computer system 8400 includes a bus 8405, a processor 8410, a system memory 8415, a read-only memory 8420, a permanent storage device 8425, input devices 8430, and output devices 8435.

The bus 8405 collectively represents all system, peripheral, and chipset buses that communicatively connect the numerous internal devices of the computer system 8400. For instance, the bus 8405 communicatively connects the processor 8410 with the read-only memory 8420, the system memory 8415, and the permanent storage device 8425.

From these various memory units, the processor 8410 retrieves instructions to execute and data to process in order to execute the processes of the invention. The read-only-memory (ROM) 8420 stores static data and instructions that are needed by the processor 8410 and other modules of the computer system. The permanent storage device 8425, on the other hand, is read-and-write memory device. This device is a non-volatile memory unit that stores instruction and data even when the computer system 8400 is off. Some embodiments of the invention use a mass-storage device (such as a magnetic or optical disk and its corresponding disk drive) as the permanent storage device 8425. Other embodiments use a removable storage device (such as a floppy disk or zip® disk, and its corresponding disk drive) as the permanent storage device.

Like the permanent storage device 8425, the system memory 8415 is a read-and-write memory device. However, unlike storage device 8425, the system memory is a volatile read-and-write memory, such as a random access memory. The system memory stores some of the instructions and data that the processor needs at runtime. In some embodiments, the invention's processes are stored in the system memory 8415, the permanent storage device 8425, and/or the read-only memory 8420.

The bus 105 also connects to the input and output devices 8430 and 8435. The input devices enable the user to communicate information and select commands to the computer system. The input devices 8430 include alphanumeric keyboards and cursor-controllers.

The output devices 8435 display images generated by the computer system. For instance, these devices display IC design layouts. The output devices include printers and display devices, such as cathode ray tubes (CRT) or liquid crystal displays (LCD).

Finally, as shown in FIG. 84, bus 8405 also couples computer 8400 to a network 8465 through a network adapter (not shown). In this manner, the computer can be a part of a network of computers (such as a local area network ("LAN"), a wide area network ("WAN"), or an Intranet) or a network of networks (such as the Internet).

Any or all of the components of computer system 8400 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, several embodiments were described above by reference to a hierarchical router, one of ordinary skill will realize that other embodiments of the invention are implemented with other router types, such as maze routers.

Also, even though several embodiments were described by reference to an LP-problem formulation, one of ordinary skill will realize that these embodiments can be practiced by applications that do not utilize an LP solver. The above-described track sharing constraints provide one such example. Any type of router can account for these sharing constraints in determining whether to embed routes.

In addition, other embodiments might use different set of partitioning lines to divide the circuit layout. For example, some embodiments might use partitioning grids that define different-shaped and/or different-sized sub-regions than the sub-regions defined by the 4×4 grid illustrated in FIG. 5. Thus, one of ordinary skill in the art would understand that the invention is not to be limited by the foregoing illustrative details, but rather is to be defined by the appended claims.

We claim:

1. For an electronic design automation application that partitions a region of a design layout into a plurality of sub-regions, wherein a plurality of edges exist between said sub-regions, a method of pre-computing attributes of routes for nets in the region, the method comprising:

a) for a first set of sub-regions, wherein each sub-region of the first set includes only one contact point, identifying a first set of potential routes, wherein each route in the first set of potential routes traverses the first set of sub-regions through the contact point of each sub-region of the first set; wherein the contact points are located at the same location in each sub-region and each of a plurality of sets of potential routes has at least two routes;

b) for each particular edge, identifying an edge-intersect cost that is dependent on the number of routes in the first set of potential routes that intersect the particular edge; and c) storing the identified edge-intersect costs for the first set of sub-regions.

2. The method of claim 1, wherein the edge-intersect cost of a particular edge equals the number of potential routes that intersect the particular edge.

3. The method of claim 1 further comprising:

a) for a second set of sub-regions, identifying a second set of potential routes, wherein each route in the second set of potential routes traverses the second set of sub-regions;

b) for each particular edge, identifying an edge-intersect cost that is dependent on the number of routes in the second set of potential routes that intersect the particular edge; and c) storing the identified edge-intersect costs for the second set of sub-regions.

4. For an electronic design automation application that partitions a region of a design layout into a plurality of sub-regions, wherein a plurality of edges exist between said sub-regions, a method of pre-computing attributes of routes for nets in the region, the method comprising:

a) for a first set of sub-regions, wherein each sub-region of the first set includes a contact point, identifying a first set of potential routes, wherein each route in the first set of potential routes traverses the first set of sub-regions through the contact point of each sub-region of the first set;

b) for each particular edge, identifying an edge-intersect cost that is dependent on the number of routes in the first set of potential routes that intersect the particular edge; and c) storing the identified edge-intersect costs for the first set of sub-regions;

wherein identifying the edge-intersect cost for each particular edge comprises identifying an edge-intersect probability for each particular edge, wherein the edge-intersect probability for each particular edge equals the number of potential routes of the first set of potential routes that intersect the particular edge divided by the number of potential routes in the first set of potential routes.

5. The method of claim 4, wherein the cost for each particular edge equals the edge-intersect probability for the particular edge.

6. The method of claim 4, wherein identifying the cost for each particular edge further comprises deriving the cost for each particular edge from the edge-intersect probability of the particular edge.

7. For an electronic design automation application that partitions a region of a design layout into a plurality of sub-regions, wherein a plurality of paths exist between said sub-regions, a method of pre-computing attributes of routes for nets in the region, the method comprising:

a) for a first set of sub-regions, wherein each sub-region of the first set includes only one contact point, identifying a first set of potential routes that traverse the first set of sub-regions through the contact point of each sub-region of the first set; wherein the contact points are located at the same location in each sub-region and each of a plurality of sets of potential routes has at least two routes;

b) for each particular path, identifying a path-use cost that is dependent on the number of routes in the first set of potential routes that use the particular path; and c) storing the identified path-use costs for the first set of sub-regions.

8. The method of claim 7, wherein the path-use cost of a particular path equals the number of potential routes that use the particular path.

9. The method of claim 7 further comprising:

a) for a second set of sub-regions, identifying a second set of potential routes that traverse the second set of sub-regions;

b) for each particular path, identifying a path-use cost that is dependent on the number of routes in the second set of potential routes that use the particular path; and c) storing the identified path-use costs for the second set of sub-regions.

10. For an electronic design automation application that partitions a region of a design layout into a plurality of sub-regions, wherein a plurality of paths exist between said sub-regions, a method of pre-computing attributes of routes for nets in the region, the method comprising:

a) for a first set of sub-regions, wherein each sub-region of the first set includes a contact point, identifying a first set of potential routes that traverse the first set of sub-regions through the contact point of each sub-region of the first set;

b) for each particular path, identifying a path-use cost that is dependent on the number of routes in the first set of potential routes that use the particular path; and c) storing the identified path-use costs for the first set of sub-regions;

wherein identifying the path-use cost for each particular path comprises identifying an path-use probability for each particular path, wherein the path-use probability for each particular path equals the number of potential routes of the first set of potential routes that use the particular path divided by the number of potential routes in the first set of potential routes.

11. The method of claim 10, wherein the cost for each particular path equals the path-use probability for the particular path.

12. The method of claim 10, wherein identifying the cost for each particular path further comprises deriving the cost for each particular path from the path-use probability of the particular path.

* * * * *

UNITED STATES PATENT AND TRADEMARK OFFICE
CERTIFICATE OF CORRECTION

PATENT NO. : 6,907,593 B1
DATED : June 14, 2005
INVENTOR(S) : Steven Teig et al.

It is certified that error appears in the above-identified patent and that said Letters Patent is hereby corrected as shown below:

Title page,
Item [57] ABSTRACT, reads "Some embodiments provide a method of pre-computing attributes of routes for nets in a region of a design layout. The pre-computed attributes are used by an electronic design automation application that partitions a design-layout region into a plurality of sub-region." and should read -- A method for pre-computing net route attributes for a region of an integrated circuit (IC) is presented. In one embodiment, the pre-computed attribute is the intersect cost associated with a group of previously indentified sub-region edges. In another embodiment, the pre-computed attribute is the usage cost associated with a group of previously identified sub-region paths. Such pre-computed numbers may be used by an electronic design automation application that indentifies routes for nets in the IC region. --.

Signed and Sealed this

Twenty-first Day of March, 2006

JON W. DUDAS
*Director of the United States Patent and Trademark Office*